US008653508B2

(12) United States Patent
Endo et al.

(10) Patent No.: US 8,653,508 B2
(45) Date of Patent: Feb. 18, 2014

(54) CONJUGATED POLYMER, INSOLUBILIZED POLYMER, ORGANIC ELECTROLUMINESCENCE ELEMENT MATERIAL, COMPOSITION FOR ORGANIC ELECTROLUMINESCENCE ELEMENT, POLYMER PRODUCTION PROCESS, ORGANIC ELECTROLUMINESCENCE ELEMENT, ORGANIC EL DISPLAY AND ORGANIC EL LIGHTING

(75) Inventors: Kyoko Endo, Kanagawa (JP); Koichiro Iida, Kanagawa (JP); Kazuki Okabe, Kanagawa (JP); Hideki Gorohmaru, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 448 days.

(21) Appl. No.: 12/867,834

(22) PCT Filed: Feb. 13, 2009

(86) PCT No.: PCT/JP2009/052425
§ 371 (c)(1), (2), (4) Date: Nov. 4, 2010

(87) PCT Pub. No.: WO2009/102027
PCT Pub. Date: Aug. 20, 2009

(65) Prior Publication Data

US 2011/0042661 A1 Feb. 24, 2011

(30) Foreign Application Priority Data

Feb. 15, 2008 (JP) ................................ 2008-034170
May 1, 2008 (JP) ................................ 2008-119941

(51) Int. Cl.
*H01L 35/24* (2006.01)

(52) U.S. Cl.
USPC .................................... 257/40; 257/E51.001

(58) Field of Classification Search
USPC ............................................ 257/40, E51.001
See application file for complete search history.

(56) References Cited

U.S. PATENT DOCUMENTS 4,564,492 A 1/1986 Bott et al.
6,034,206 A 3/2000 Yamamoto et al.

(Continued)

FOREIGN PATENT DOCUMENTS

CN 1882632 A 12/2006
JP 2004-505169 2/2004

(Continued)

OTHER PUBLICATIONS

Office Action issued Jan. 29, 2012, in Chinese Patent Application No. 200980104874.9 (with English-language translation).

(Continued)

*Primary Examiner* — Anthony Ho
(74) *Attorney, Agent, or Firm* — Oblon, Spivak, McClelland, Maier & Neustadt, L.L.P.

(57) ABSTRACT

An object of the present invention is to provide a conjugated polymer which has a high hole transportability and is excellent in solubility and depositability. Another object of the present invention is to provide an organic electroluminescence element which is capable of low voltage driving and has a high luminous efficiency and drive stability. The conjugated polymer of the present invention is a conjugated polymer containing a specific structure as the repeating unit, where the conjugated polymer contains an insolubilizing group as a substituent, the weight average molecular weight (Mw) is 20,000 or more and the dispersity (Mw/Mn) is 2.40 or less.

21 Claims, 1 Drawing Sheet

9: CATHODE
8: ELECTRON INJECTION LAYER
7: ELECTRON TRANSPORT LAYER
6: HOLE BLOCKING LAYER
5: LIGHT EMITTING LAYER
4: HOLE TRANSPORT LAYER
3: HOLE INJECTION LAYER
2: ANODE
1: SUBSTRATE

(56) References Cited

U.S. PATENT DOCUMENTS

| | | | | |
|---|---|---|---|---|
| 2003/0006411 | A1 | 1/2003 | Kido et al. | |
| 2003/0068527 | A1 | 4/2003 | Noguchi et al. | |
| 2004/0262574 | A1 * | 12/2004 | Suzuki et al. | 252/301.16 |
| 2005/0238917 | A1 | 10/2005 | Yasuda et al. | |
| 2007/0096082 | A1 | 5/2007 | Gaynor et al. | |
| 2007/0102695 | A1 | 5/2007 | Inbasekaran et al. | |
| 2007/0228364 | A1 | 10/2007 | Radu et al. | |
| 2011/0105711 | A1 | 5/2011 | Inbasekaran et al. | |

FOREIGN PATENT DOCUMENTS

| | | |
|---|---|---|
| JP | 2005-285749 | 10/2005 |
| JP | 2005306998 | 11/2005 |
| JP | 2007-514298 | 5/2007 |
| JP | 2007-528916 | 10/2007 |
| JP | 2007-324280 | 12/2007 |
| JP | 2008-223012 | 9/2008 |
| KR | 10-2005-0026687 | 3/2005 |
| TW | I276675 | 3/2007 |
| WO | WO 02/10129 A2 | 2/2002 |
| WO | WO 02/10129 A3 | 2/2002 |
| WO | WO 2004-014985 A1 | 2/2004 |
| WO | WO 2008/038747 A1 | 4/2008 |

OTHER PUBLICATIONS

Steffen Jungermann, et al., "Novel Photo-Cross-Linkable Hole-Transporting Polymers: Synthesis, Characterization, and Application in Organic Light Emitting Diodes", Macromolecules, vol. 39, No. 26, (2006), pp. 8911-8919.

Extended European Search Report issued May 30, 2012 in Patent Application No. 09711008.4.

International Search Report issued Apr. 14, 2009, in PCT / JP2009 / 052425.

U.S. Appl. No. 13/617,286, filed Sep. 14, 2012, Iida, et al.

Chinese Office Action issued Sep. 27, 2012 in Patent Application No. 200980104874.9 with English Translation.

Korean Office Action issued Nov. 15, 2012, in Korea Patent Application No. 10-2010-7017649 (with English translation).

Chinese Office Action issued Jan. 22, 2013 in Patent Application No. 200980104874.9 with English Translation.

Office Action issued Jul. 17, 2013, in Taiwanese Patent Application No. 098104786 filed Feb. 13, 2009 (with English translation).

Office Action Issued on Oct. 12, 2013, in Chinese Patent Application No. 200980104874.9 with English Translation.

Office Action issued Nov. 19, 2013, in Japanese Patent Application No. 2009-031985 filed Feb. 13, 2009 (with English translation).

* cited by examiner

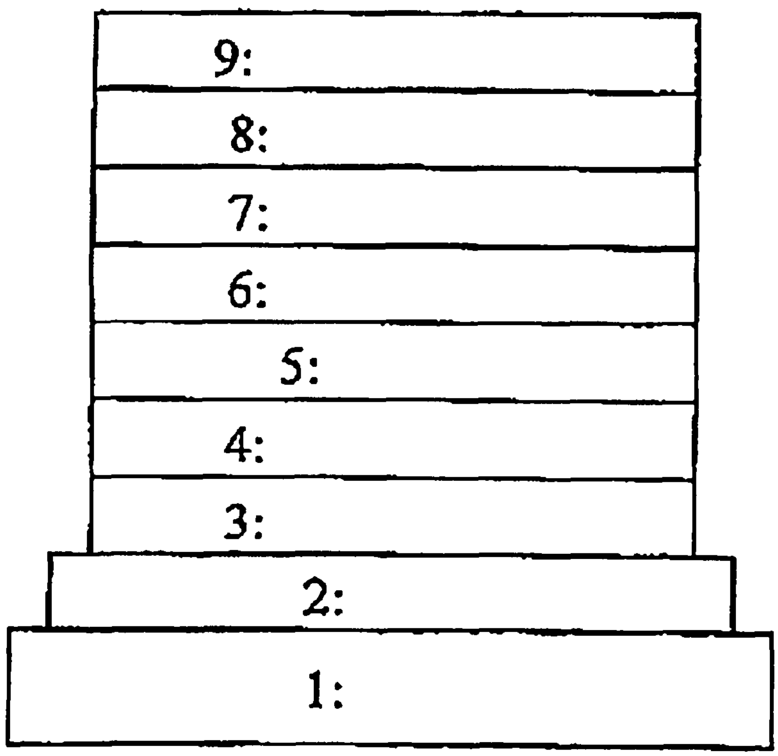
9: CATHODE
8: ELECTRON INJECTION LAYER
7: ELECTRON TRANSPORT LAYER
6: HOLE BLOCKING LAYER
5: LIGHT EMITTING LAYER
4: HOLE TRANSPORT LAYER
3: HOLE INJECTION LAYER
2: ANODE
1: SUBSTRATE

CONJUGATED POLYMER, INSOLUBILIZED POLYMER, ORGANIC ELECTROLUMINESCENCE ELEMENT MATERIAL, COMPOSITION FOR ORGANIC ELECTROLUMINESCENCE ELEMENT, POLYMER PRODUCTION PROCESS, ORGANIC ELECTROLUMINESCENCE ELEMENT, ORGANIC EL DISPLAY AND ORGANIC EL LIGHTING

CROSS REFERENCE TO RELATED APPLICATIONS

The present application is a 35 U.S.C. §371 national stage patent application of International patent application PCT/JP09/052425, filed on Feb. 13, 2009, the text of which is incorporated by reference, and claims the benefit of the filing date of Japanese application nos. JP 2008-034170, filed on Feb. 15, 2008, and JP 2008-119941, filed on May 1, 2008, the text of each also being incorporated by reference.

TECHNICAL FIELD

The present invention relates to a conjugated polymer useful particularly as a hole injection layer and a hole transport layer of an organic electroluminescence element; a composition for an organic electroluminescence element, containing the conjugated polymer; an insolubilized polymer obtained by insolubilizing the polymer; an organic electroluminescence element material containing the conjugated polymer; an organic electroluminescence element having a layer containing the insolubilized polymer; and an organic EL display and an organic EL lighting each equipped with the organic electroluminescence element.

The present invention also relates to a polymer production process and a polymer obtained the production process.

BACKGROUND ART

Recently, development of an electroluminescent device (organic electroluminescence element) using an organic material in place of an inorganic material such as ZnS is proceeding. For achieving high efficiency and long life of the electroluminescent device, a hole transport layer is generally provided between an anode and a light emitting layer.

A polymer having a repeating unit represented by the following formula (1) is disclosed in Patent Documents 1 and 2, and an organic electroluminescence element using, for the hole injection layer, a polymer having a repeating unit represented by formula (1) is proposed in Patent Document 3. However, the organic electroluminescence element described in this patent document has a high drive voltage and fails in obtaining sufficiently high luminous efficiency.

[Chem. 1]

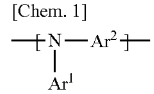

(1)

(wherein each of $Ar^1$ and $Ar^2$ independently represents an aromatic hydrocarbon group which may have a substituent, or an aromatic heterocyclic group which may have a substituent).

Also, Patent Documents 4 and 5 each discloses a polymer compound having repeating units represented by the following formulae, but when a device is produced using such a compound, this incurs a problem that a flat film is not obtained or the drive life of the obtained device is short.

[Chem. 2]

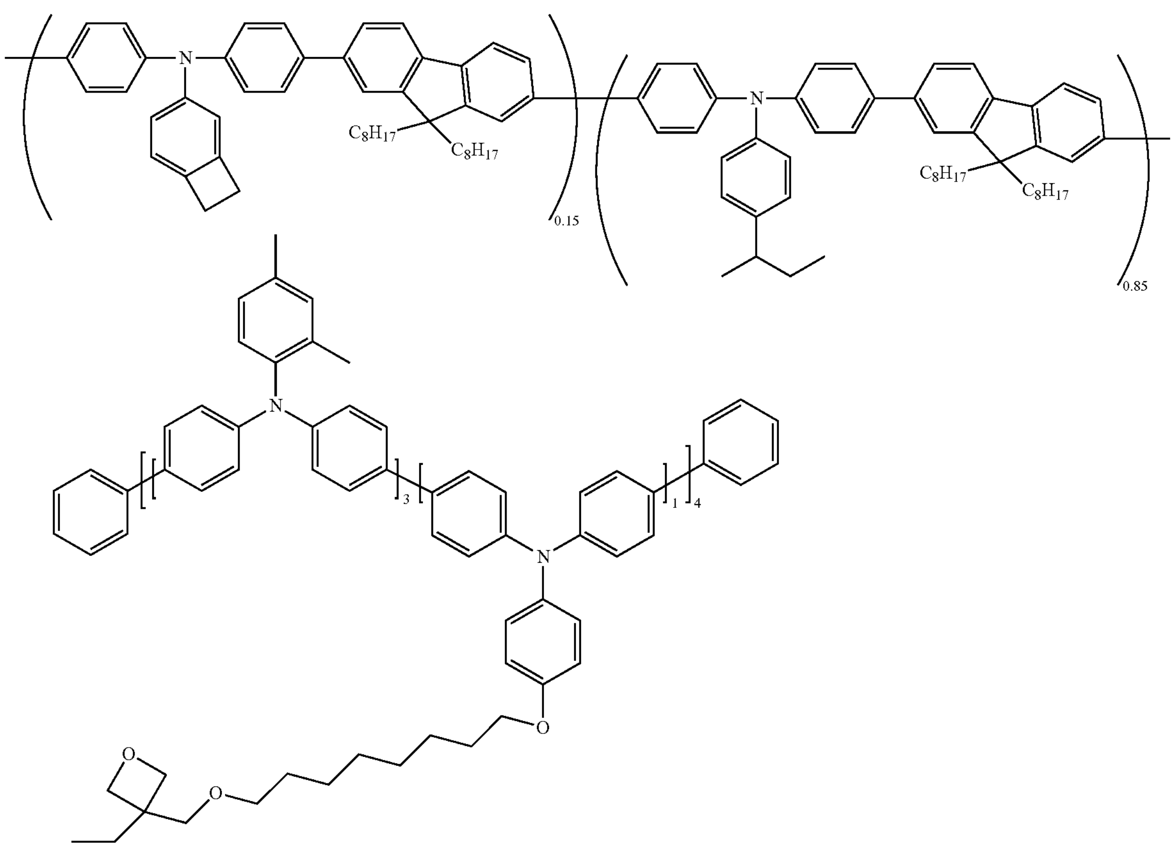

Furthermore, Patent Document 6 discloses a polymer compound having a repeating unit represented by the following formula, but when a device is produced using such a compound, this causes a problem that the charge transporting ability is low and the drive voltage of the obtained device is high.

[Chem. 3]

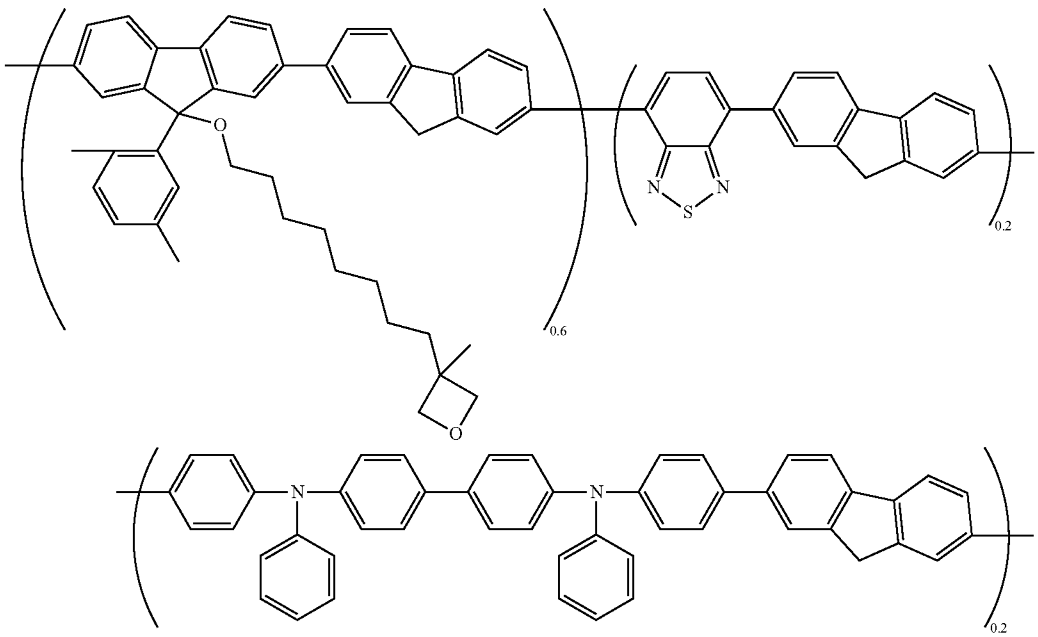

Patent Document 1: U.S. Pat. No. 6,034,206

Patent Document 2: JP-A-2005-285749 (the term "JP-A" as used herein means an "unexamined published Japanese patent application")

Patent Document 3: International Publication No. 2004/014985, pamphlet

Patent Document 4: International Publication No. 2008/038747, pamphlet

Patent Document 5: International Publication No. 2005/053056, pamphlet

Patent Document 6: International Publication No. 2002/010129, pamphlet

DISCLOSURE OF THE INVENTION

Problems that the Invention is to Solve

An object of the present invention is to provide a conjugated polymer endowed with high hole transportability and excellent in solubility and depositability. Another object of the present invention is to provide an organic electroluminescence element capable of low voltage driving and assured of high luminous efficiency and long drive life.

Means for Solving the Problems

As a result of intensive studies, the present inventors have found that when a polymer having a small weight average molecular weight or a conjugated polymer having a large dispersity is deposited by a wet film formation method, a flat film is not obtained in some cases due to crystallization or the like of a low molecular weight component such as cyclic oligomer and when the non-flat film is used for the light emitting layer and/or charge transport layer of an organic electroluminescence element, a uniform luminous plane is not obtained.

Furthermore, a compound having a small weight average molecular weight or a polymer having a large dispersity contains a low molecular weight component such as cyclic oligomer, and this component sometimes works out to a trap for electric charge to reduce the charge transportability. The low charge transportability of the light emitting layer and/or charge transport layer when used for an organic electroluminescence element adversely affects the drive voltage, luminous efficiency and drive stability. Accordingly, in the below-described conjugated polymer having a specific repeating unit, the weight average molecular weight and dispersity are set to specific values, as a result, it has been found that the polymer has high hole transportability and is excellent in solubility for solvent and depositability and use of this conjugated polymer makes it possible to obtain an organic electroluminescence element capable of low voltage driving and assured of high luminous efficiency and long drive life.

That is, the gist of the present invention resides in the followings.

The present invention includes a conjugated polymer comprising a repeating unit represented by the following formula (I), wherein the conjugated polymer contains an insolubilizing group as a substituent, the weight average molecular weight (Mw) is 20,000 or more, and the dispersity (Mw/Mn, here Mn indicates a number average molecular weight) is 2.40 or less (hereinafter referred to as a "conjugated polymer (I) of the present invention"):

[Chem. 4]

(I)

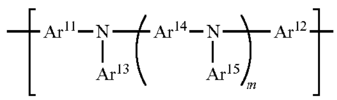

(wherein m represents an integer of 0 to 3, each of $Ar^{11}$ and $Ar^{12}$ independently represents a direct bond, an aromatic hydrocarbon group which may have a substituent, or an aromatic heterocyclic group which may have a substituent, and each of $Ar^{13}$ to $Ar^{15}$ independently represents an aromatic hydrocarbon group which may have a substituent, or an aromatic heterocyclic group which may have a substituent, provided that a case of both $Ar^{11}$ and $Ar^{12}$ being a direct bond is excluded, here, the conjugated polymer has, as a substituent, a group containing at least one insolubilizing group in one molecule).

In the conjugated polymer of the present invention, the insolubilizing group is preferably a crosslinking group or a dissociable group.

In the conjugated polymer of the present invention, the crosslinking group is preferably selected from the following crosslinking group family T:

<Crosslinking Group Family T>

[Chem. 5]

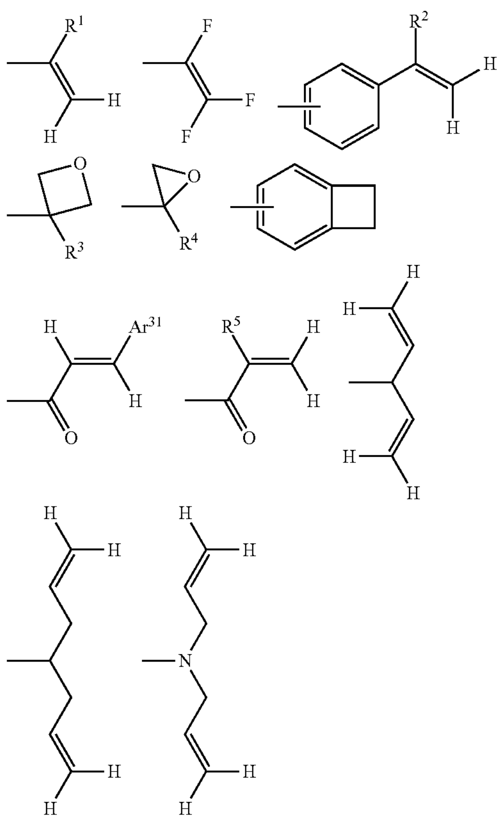

(wherein each of $R^1$ to $R^5$ independently represents a hydrogen atom or an alkyl group, and $Ar^{31}$ represents an aromatic hydrocarbon group which may have a substituent, or an aromatic heterocyclic group which may have a substituent, here the benzocyclobutene ring may have a substituent and substituents may combine with each other to form a ring).

In the conjugated polymer of the present invention, the crosslinking group is preferably a group represented by the following formula (II):

[Chem. 6]

(II)

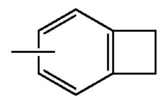

(wherein the benzocyclobutene ring may have a substituent, and substituents may combine with each other to form a ring).

The present invention also includes a conjugated polymer containing a repeating unit represented by the following formula (I'), wherein the conjugated polymer has, as a substituent, a group containing a group represented by the following formula (II), the weight average molecular weight (Mw) is 20,000 or more, and the dispersity (Mw/Mn, here Mn indicates a number average molecular weight) is 2.40 or less (hereinafter referred to as a "conjugated polymer (I') of the present invention"):

[Chem. 7]

(I')

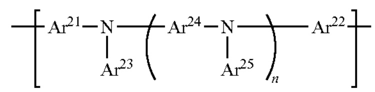

(wherein n represents an integer of 0 to 3, each of $Ar^{21}$ and $Ar^{22}$ independently represents a direct bond, an aromatic hydrocarbon group which may have a substituent, or an aromatic heterocyclic group which may have a substituent, and each of $Ar^{23}$ to $Ar^{25}$ independently represents an aromatic hydrocarbon group which may have a substituent, or an aromatic heterocyclic group which may have a substituent, provided that a case of both $Ar^{21}$ and $Ar^{22}$ being a direct bond is excluded, here, the conjugated polymer has, as a substituent, a group containing at least one group represented by the following formula (II) in one molecule):

[Chem. 8]

(II)

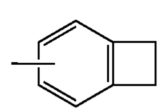

(wherein the benzocyclobutene ring may have a substituent, and substituents may combine with each other to form a ring).

Hereinafter, the "conjugated polymer of the present invention" indicates both the "conjugated polymer (I) of the present invention" and the "conjugated polymer (I') of the present invention".

The present invention also includes, as described below, a composition for organic electroluminescence elements, an organic electroluminescence element, and an organic EL display, each using the conjugated polymer of the present invention.

The present invention includes an insolubilized polymer obtained by insolubilizing the conjugated polymer of the present invention.

The present invention includes an organic electroluminescence element material containing the conjugated polymer of the present invention.

The present invention includes a composition for organic electroluminescence elements, containing the conjugated polymer of the present invention.

The composition for organic electroluminescence elements of the present invention preferably further contains an electron-accepting compound.

The present invention includes an organic electroluminescence element comprising a substrate having thereon an anode, a cathode and one organic layer or two or more organic layers between the anode and the cathode, wherein at least one layer of the organic layers contains the insolubilized polymer of the present invention.

In the organic electroluminescence element of the present invention, the insolubilized polymer-containing organic layer is preferably a hole injection layer or a hole transport layer.

In the organic electroluminescence element of the present invention, when the organic electroluminescence element has, as organic layers, a hole injection layer, a hole transport layer and a light emitting layer, all of the hole injection layer, hole transport layer and light emitting layer are preferably formed by a wet film formation method.

The present invention includes an organic EL display comprising the organic electroluminescence element of the present invention.

The present invention includes an organic EL lighting comprising the organic electroluminescence element of the present invention.

The present invention includes a polymer production process comprising: a step of reacting arylamines represented by the following formula (I-1) and aryls represented by the following formula (I-2) in the presence of a palladium compound, a phosphine compound and a base to cause a condensation reaction between a part of the arylamines and the aryls, and a step of additionally adding aryls represented by the following formula (I-2) to further cause a polymerization reaction:

[Chem. 9]

$$Ar^1\text{—}NH_2 \qquad \text{(I-1)}$$

$$X\text{—}Ar^2\text{—}X \qquad \text{(I-2)}$$

(wherein each of $Ar^1$ and $Ar^2$ independently represents an aromatic hydrocarbon group which may have a substituent, or an aromatic heterocyclic group which may have a substituent, and X represents an elimination group).

In the polymer production process of the present invention, a condensation reaction is performed using the aryls in an amount of 20 to 75 mol % based on the arylamines, and then the aryls are additionally added to allow the aryls to reach a ratio of 80 to 110% based on the arylamines.

The present invention includes a conjugated polymer produced using the polymer production process of the present invention.

The present invention also includes a conjugated polymer comprising at least one repeating unit selected from the group consisting of the following repeating unit family A and at least one repeating unit selected from the group consisting of the following repeating unit family B, wherein the weight average molecular weight (Mw) is 20,000 or more, and the dispersity (Mw/Mn, here Mn indicates a number average molecular weight) is 2.40 or less:

<Repeating Unit Family A>

[Chem. 10]

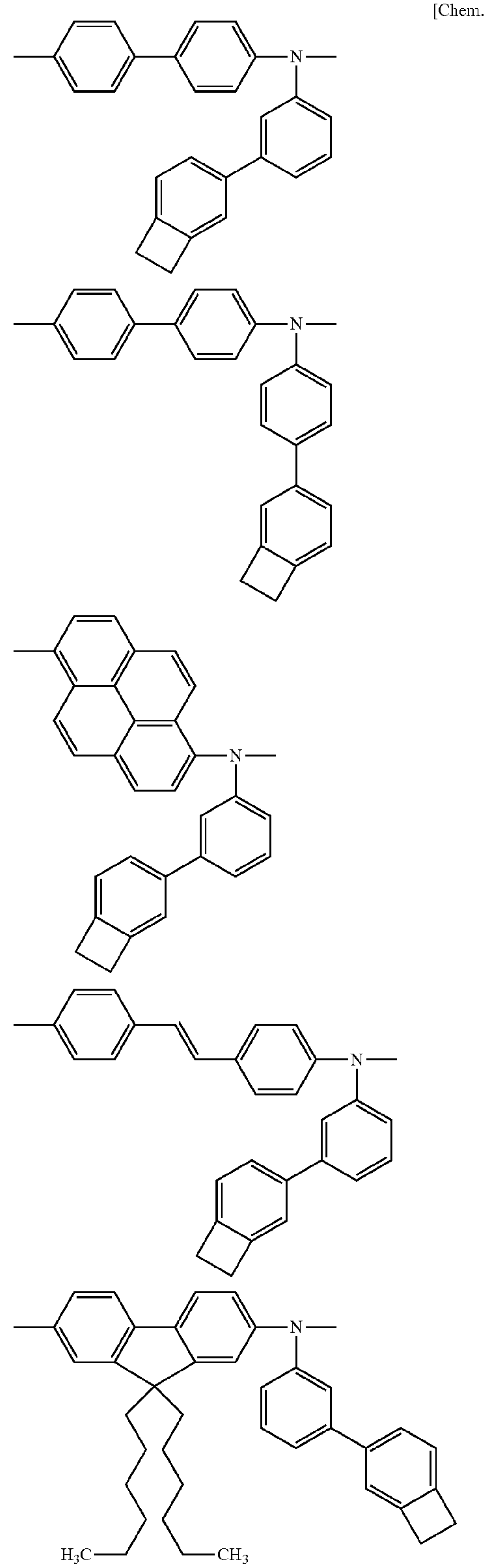

-continued
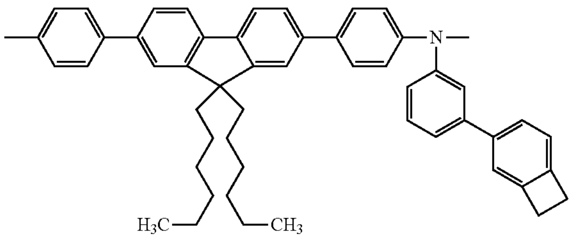
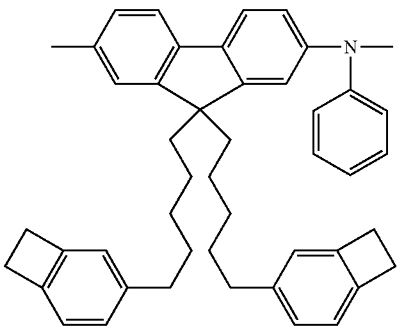
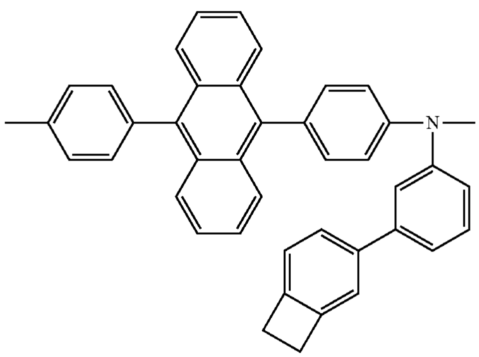
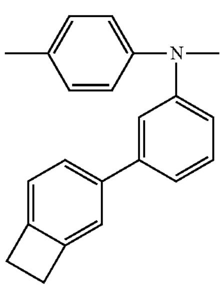
<Repeating Unit Family B>
[Chem. 11]
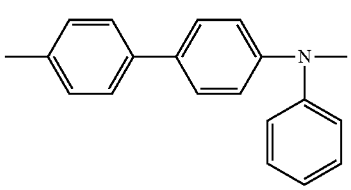
-continued
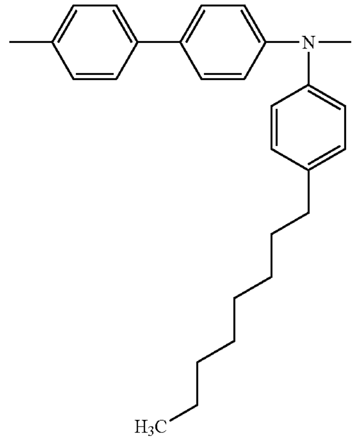
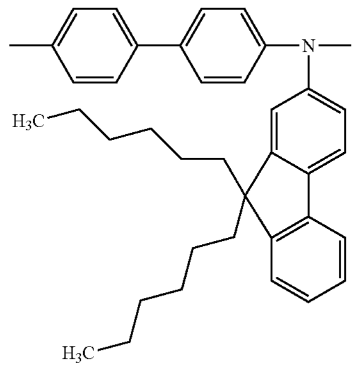
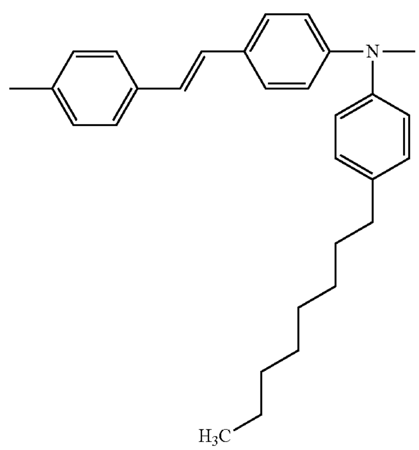
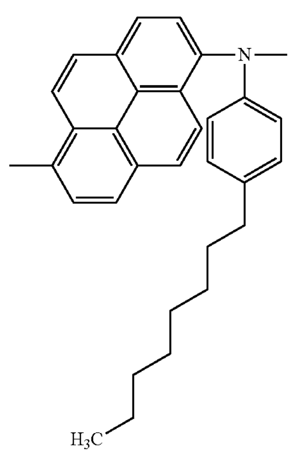

-continued

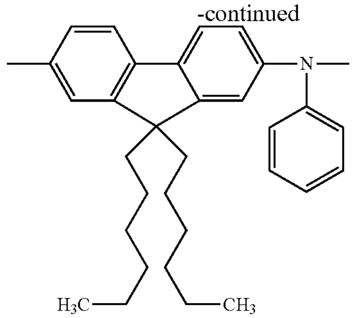

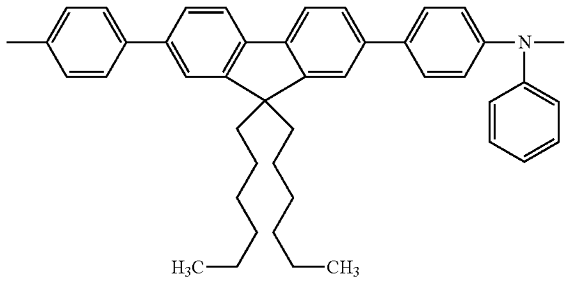

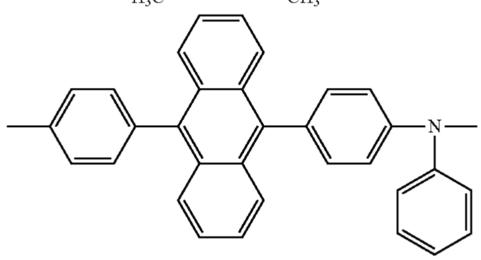

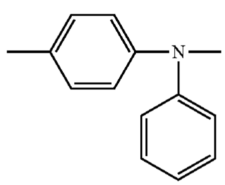

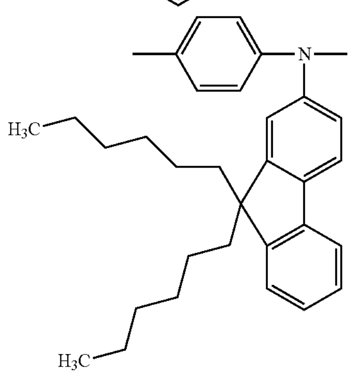

Furthermore, the present invention includes an organic electroluminescence element material, a composition for organic electroluminescence elements, an organic electroluminescence element, an organic EL display and an organic EL lighting, each using the polymer produced by the polymer production process of the present invention.

Advantage of the Invention

The conjugated polymer of the present invention has high hole transportability and sufficient solubility for solvent and when deposited, the surface flatness is enhanced. For this reason, an organic electroluminescence element having a layer containing an insolubilized polymer obtained by insolubilizing the conjugated polymer of the present invention can be driven at a low voltage and endowed with high luminous efficiency, high heat resistance and long drive life.

Accordingly, the organic electroluminescence element having a layer (hereinafter sometimes referred to as an "insolubilized layer") containing an insolubilized polymer obtained by insolubilizing the conjugated polymer of the present invention is considered to allow application to a flat panel display (for example, a display for OA computers or a wall-hanging television), a light source utilizing the property as a surface light emitter (for example, a light source of copiers or a backlight source of liquid crystal displays or meters/gauges), a display board and marker light, and its technical value is high.

Also, the conjugated polymer of the present invention intrinsically has excellent solubility for solvent and electrochemical durability and therefore, can be effectively used not only for organic electroluminescence elements but also for electrophotographic photoreceptors, photoelectric conversion devices, organic solar cells, organic rectifying devices and the like.

Furthermore, the polymer production process of the present invention can produce a polymer having stable performances and a narrow molecular weight distribution.

BRIEF DESCRIPTION OF THE DRAWINGS

[FIG. 1] A cross-sectional view schematically showing one example of the structure of the organic electroluminescence element of the present invention.

DESCRIPTION OF REFERENCE NUMERALS AND SIGNS

1 Substrate
2 Anode
3 Hole injection layer
4 Hole transport layer
5 Light emitting layer
6 Hole blocking layer
7 Electron transport layer
8 Electron injection layer
9 Cathode

BEST MODE FOR CARRYING OUT THE INVENTION

Constitutional requirements described below are only an example (a representative example) of the embodiment of the present invention, and the present invention is not limited to these contents.

<1. Conjugated Polymer (I)>

The conjugated polymer (I) of the present invention is a conjugated polymer comprising a repeating unit represented by the following formula (I), and this conjugated polymer is characterized by containing an insolubilizing group as a substituent and having a weight average molecular weight (Mw) of 20,000 or more and a dispersity (Mw/Mn, here Mn indicates a number average molecular weight) of 2.40 or less.

[Chem. 12]

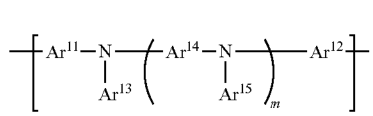

(I)

(wherein m represents an integer of 0 to 3, each of $Ar^{11}$ and $Ar^{12}$ independently represents a direct bond, an aromatic hydrocarbon group which may have a substituent, or an aromatic heterocyclic group which may have a substituent, and each of $Ar^{13}$ to $Ar^{15}$ independently represents an aromatic hydrocarbon group which may have a substituent, or an aromatic heterocyclic group which may have a substituent, provided that a case of both $Ar^{11}$ and $Ar^{12}$ being a direct bond is excluded, here, the conjugated polymer has, as a substituent, a group containing at least one insolubilizing group in one molecule).

[1-1. Structural Characteristics]

As shown in the repeating unit represented by formula (I), the conjugated polymer (I) of the present invention comprises a repeating unit having a conjugated structure and therefore, has adequate charge transportability and sufficient solubility for solvent. Also, formation of an insolubilized polymer by an insolubilizing group is easy, and this considered to allow for keeping the surface flatness at the deposition.

The conjugated polymer (I) of the present invention may contain two or more kinds of repeating units represented by formula (I).

[1-2. $Ar^{11}$ to $Ar^{15}$]

In formula (I), each of $Ar^{11}$ and $Ar^{12}$ independently represents a direct bond, an aromatic hydrocarbon group which may have a substituent, or an aromatic heterocyclic group which may have a substituent, and each of $Ar^{13}$ to $Ar^{15}$ independently represents an aromatic hydrocarbon group which may have a substituent, or an aromatic heterocyclic group which may have a substituent. Here, $Ar^{11}$, $Ar^{12}$ and $Ar^{14}$ are a divalent group, and $Ar^{13}$ and $Ar^{15}$ are a monovalent group.

Examples of the aromatic hydrocarbon group which may have a substituent include a group derived from a 6-membered monocyclic ring or a 2- to 5-condensed ring, such as benzene ring, naphthalene ring, anthracene ring, phenanthrene ring, perylene ring, tetracene ring, pyrene ring, benzopyrene ring, chrysene ring, triphenylene ring, acenaphthene ring, fluoranthene ring and fluorene ring.

Examples of the aromatic heterocyclic group which may have a substituent include a group derived from a 5- or 6-membered monocyclic ring or a 2- to 4-condensed ring, such as furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisoxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, benzimidazole ring, perymidine ring, quinazoline ring, quinazolinone ring and azulene ring.

In view of solubility for solvent and heat resistance, each of $Ar^{11}$ to $Ar^{15}$ is independently, preferably a group derived from a ring selected from the group consisting of a benzene ring, a naphthalene ring, an anthracene ring, a phenanthrene ring, a triphenylene ring, a pyrene ring, a thiophene ring, a pyridine ring and a fluorene ring.

Each of $Ar^{11}$, $Ar^{12}$ and $Ar^{14}$ is also preferably a divalent group formed by connecting one kind of or two or more kinds of rings selected from the groups above through a direct bond or a —CH═CH— group, more preferably a biphenylene group or a terphenylene group.

The substituent other than the later-described insolubilizing group, which the aromatic hydrocarbon group and aromatic heterocyclic group of $Ar^{11}$ to $Ar^{15}$ may have, is not particularly limited, but examples thereof include one member or two or more members selected from the following [Substituent Family Z]:

[Substituent Family Z]

an alkyl group preferably having a carbon number of 1 to 24, more preferably a carbon number of 1 to 12, such as methyl group and ethyl group;

an alkenyl group preferably having a carbon number of 2 to 24, more preferably a carbon number of 2 to 12, such as vinyl group;

an alkynyl group preferably having a carbon number of 2 to 24, more preferably a carbon number of 2 to 12, such as ethynyl group;

an alkoxy group preferably having a carbon number of 1 to 24, more preferably a carbon number of 1 to 12, such as methoxy group and ethoxy group;

an aryloxy group preferably having a carbon number of 4 to 36, more preferably a carbon number of 5 to 24, such as phenoxy group, naphthoxy group and pyridyloxy group;

an alkoxycarbonyl group preferably having a carbon number of 2 to 24, more preferably a carbon number of 2 to 12, such as methoxycarbonyl group and ethoxycarbonyl group;

a dialkylamino group preferably having a carbon number of 2 to 24, more preferably a carbon number of 2 to 12, such as dimethylamino group and diethylamino group;

a diarylamino group preferably having a carbon number of 10 to 36, more preferably a carbon number of 12 to 24, such as diphenylamino group, ditolylamino group and N-carbazolyl group;

an arylalkylamino group preferably having a carbon number of 6 to 36, more preferably a carbon number of 7 to 24, such as phenylmethylamino group;

an acyl group preferably having a carbon number of 2 to 24, more preferably a carbon number of 2 to 12, such as acetyl group and benzoyl group;

a halogen atom such as fluorine atom and chlorine atom;

a haloalkyl group preferably having a carbon number of 1 to 12, more preferably a carbon number of 1 to 6, such as trifluoromethyl group;

an alkylthio group preferably having a carbon number of 1 to 24, more preferably a carbon number of 1 to 12, such as methylthio group and ethylthio group;

an arylthio group preferably having a carbon number of 4 to 36, more preferably a carbon number of 5 to 24, such as phenylthio group, naphthylthio group and pyridylthio group;

a silyl group preferably having a carbon number of 2 to 36, more preferably a carbon number of 3 to 24, such as trimethylsilyl group and triphenylsilyl group;

a siloxy group preferably having a carbon number of 2 to 36, more preferably a carbon number of 3 to 24, such as trimethylsiloxy group and triphenylsiloxy group;

a cyano group;

an aromatic hydrocarbon group preferably having a carbon number of 6 to 36, more preferably a carbon number of 6 to 24, such as phenyl group and naphthyl group; and an aromatic heterocyclic group preferably having a carbon number of 3 to 36, more preferably a carbon number of 4 to 24, such as thienyl group and pyridyl group.

Each of these substituents may further have a substituent, and examples thereof include the groups exemplified in Substituent Family Z.

The molecular weight of the substituent other than the later-described insolubilizing group, which the aromatic hydrocarbon group and aromatic heterocyclic group of $Ar^{11}$ to $Ar^{15}$ may have, is preferably 500 or less, more preferably 250 or less, inclusive of the further substituted group.

In view of solubility, each of the substituents which the aromatic hydrocarbon group and aromatic heterocyclic group of $Ar^{11}$ to $Ar^{15}$ may have, is independently, preferably an alkyl group having a carbon number of 1 to 12 or an alkoxy group having a carbon number of 1 to 12.

Incidentally, when m is an integer of 2 or more, the repeating unit represented by formula (I) has two or more $Ar^{14}$'s and two or more $Ar^{15}$'s. In this case, each $Ar^{14}$ or $Ar^{15}$ may be the same as or different from every other $Ar^{14}$ or $Ar^{15}$. Furthermore, $Ar^{14}$'s or $Ar^{15}$'s may combine directly or through a linking group to form a cyclic structure.

[1-3. Description of m]

In formula (I), m represents an integer of 0 to 3.

m is usually 0 or more and is usually 3 or less, preferably 2 or less. When m is an integer of 2 or less, synthesis of the monomer as a raw material is more easy.

[1-4. Ratio, etc. of Repeating Unit]

The conjugated polymer (I) of the present invention is a polymer comprising one kind of or two or more kinds of repeating units represented by formula (I).

In the case where the conjugated polymer (I) of the present invention contains two or more kinds of repeating units, the polymer includes a random copolymer, an alternate copolymer, a block copolymer and a graft copolymer. The polymer is preferably a random copolymer in view of solubility for solvent and is preferably an alternate copolymer from the standpoint that the charge transportability is more enhanced.

[1-5. Insolubilizing Group]

The conjugated polymer (I) of the present invention has a group containing an insolubilizing group as a substituent.

The insolubilizing group is a group capable of causing a reaction under heat and/or irradiation with active energy ray, and this group has an effect of reducing the solubility in an organic solvent or water after the reaction as compared with that before reaction.

In the present invention, the insolubilizing group is preferably a dissociable group or a crosslinking group.

The conjugated polymer (I) has a group containing an insolubilizing group as a substituent, and the position having the insolubilizing group may be in the repeating unit represented by formula (I) or may be in a portion other than the repeating unit represented by formula (I), for example, in the terminal group.

(1-5-1. Dissociable Group)

The conjugated polymer (I) of the present invention preferably has a dissociable group as the insolubilizing group because of excellent charge transportability after insolubilization (after dissociation reaction).

The "dissociable group" as used herein indicates a group capable of dissociating at 70° C. or more from the aromatic hydrocarbon ring to which the group is bonded and further exhibiting solubility for solvent. The expression "exhibiting solubility for solvent" as used herein means that the compound in the state before causing a reaction under heat and/or irradiation with an active energy ray is dissolved in an amount of 0.1 wt % or more in toluene at ordinary temperature. The solubility of the compound in toluene is preferably 0.5 wt % or more, more preferably 1 wt % or more.

The dissociable group is preferably a group capable of thermally dissociating without forming a polar group on the aromatic hydrocarbon ring side, more preferably a group capable of thermally dissociating by a retro Diels-Alder reaction.

Furthermore, the dissociable group is preferably a group capable of thermally dissociating at 100° C. or more and preferably a group capable of thermally dissociating at 300° C. or less.

Specific examples of the dissociable group are set forth below, but the present invention is not limited thereto.

Specific examples of the dissociable group which is a divalent group include those in the following <Divalent Dissociable Group Family A>.

<Divalent Dissociable Group Family A>

[Chem. 13]

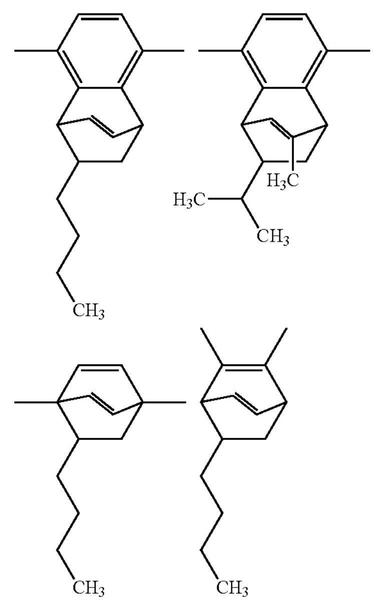

Specific examples of the dissociable group which is a monovalent group include those in the following <Monovalent Dissociable Group Family B>.

<Monovalent Dissociable Group Family B>

[Chem. 14]

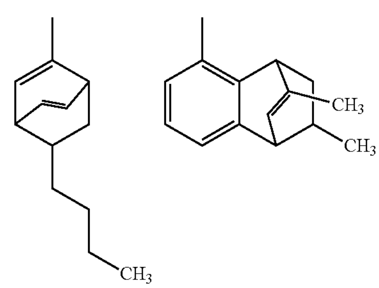

(Position and Ratio of Dissociable Group)

In the present invention, the number of dissociable groups contained in one polymer chain is preferably 5 or more on average, more preferably 10 or more on average, still more preferably 50 or more on average. If the number of dissociable groups is less than the lower limit above, the polymer compound before heating sometimes exhibits low solubility for a coating solvent and moreover, the effect of reducing the solubility of the compound after heating in solvent may decrease.

The number of dissociable groups in the conjugated polymer (I) of the present invention is, per molecular weight of 1,000 of the polymer, usually 0.01 or more, preferably 0.1 or more, more preferably 0.2 or more, and is usually 10 or less, preferably 5 or less. Within this range, an appropriate difference in the solubility is advantageously obtained between before and after insolubilization (dissociation reaction).

The method for calculating the number of dissociable groups in the conjugated polymer (I), per molecular weight of 1,000 of the polymer, is the same as the method for calculating the number of crosslinking groups per molecular weight of 1,000 of the polymer described later in (Ratio of Crosslinking Group) of (1-5-2. Crosslinking Group).

(1-5-2. Crosslinking Group)

Also, the conjugated polymer (I) preferably has a crosslinking group, because a large difference in the solubility for solvent can be created between before and after the reaction caused under heat and/or irradiation with an active energy ray (insolubilizing reaction).

The "crosslinking group" as used herein indicates a group capable of reacting with another group that is located in the vicinity and has the same or different molecules, under heat and/or irradiation with an active energy ray to produce a new chemical bond.

In view of easy occurrence of insolubilization, examples of the crosslinking group include the groups set forth in Crosslinking Group Family T.

[Crosslinking Group Family T]

[Chem. 15]

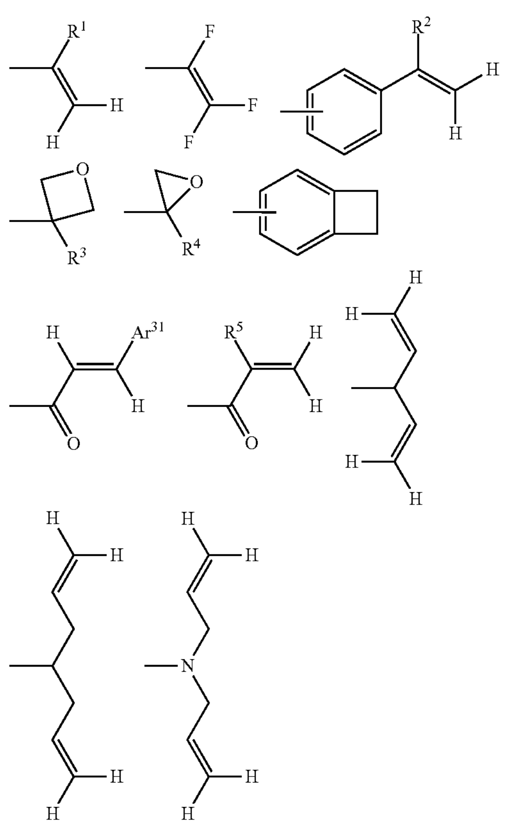

(wherein each of $R^1$ to $R^5$ independently represents a hydrogen atom or an alkyl group, and $Ar^{31}$ represents an aromatic hydrocarbon group which may have a substituent, or an aromatic heterocyclic group which may have a substituent).

A group capable of causing an insolubilization reaction by cationic polymerization, such as cyclic ether group (e.g., epoxy, oxetane) and vinyl ether group, is preferred in view of high reactivity and easiness of insolubilization. Above all, an oxetane group is preferred in the light of easiness of controlling the cationic polymerization rate, and a vinyl ether group is preferred from the standpoint that a hydroxyl group likely to incur deterioration of the device at the cationic polymerization is hardly produced.

A group capable of causing a cyclization addition reaction, such as arylvinylcarbonyl group (e.g., cinnamoyl) and benzocyclobutene ring-derived group, is preferred in view of more enhancing the electrochemical stability.

Among the crosslinking groups, a benzocyclobutene ring-derived group is particularly preferred, because the structure after insolubilization is stable.

Specifically, the crosslinking group is preferably a group represented by the following formula (II):

[Chem. 16]

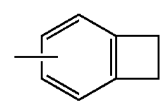

(II)

(wherein the benzocyclobutene ring may have a substituent, and substituents may combine with each other to form a ring).

The crosslinking group may be directly bonded to the aromatic hydrocarbon group or aromatic heterocyclic group in the molecule but may also be bonded through a divalent group. As for the divalent group, the crosslinking is preferably bonded to the aromatic hydrocarbon group or aromatic heterocyclic group through a divalent group formed by connecting, in an arbitrary order, from 1 to 30 groups selected from a —O— group, a —C(═O)— group and $—CH_2—$ group (which may have a substituent). Specific examples of the crosslinking group through such a divalent group, that is, the crosslinking group-containing group, are set forth in the following <Crosslinking Group-Containing Group Family T'>, but the present invention is not limited thereto.

<Crosslinking Group-Containing Group Family T'>

[Chem. 17]

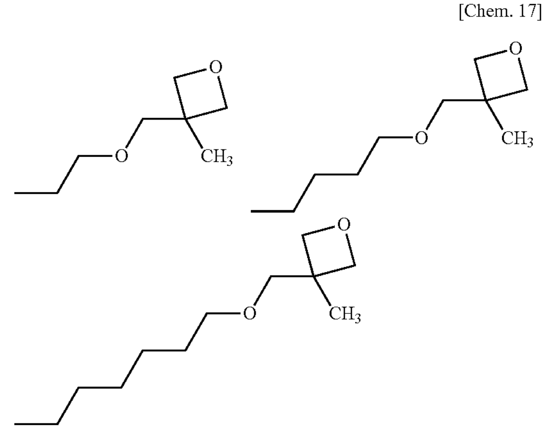

-continued
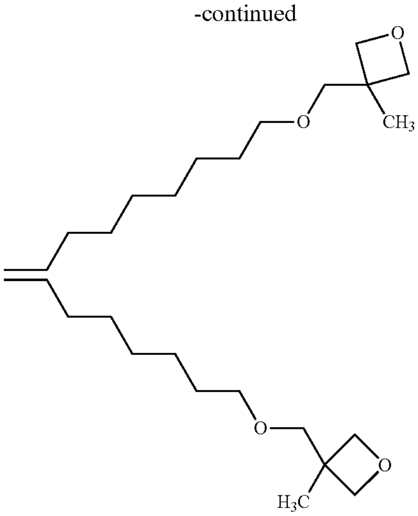
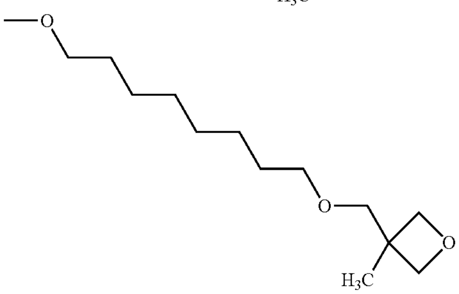
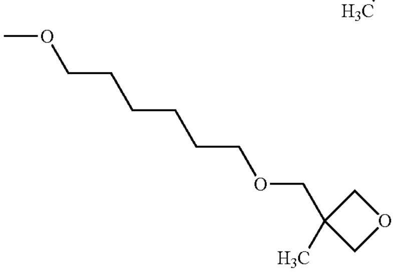
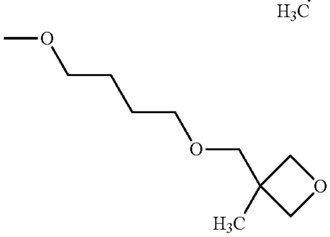
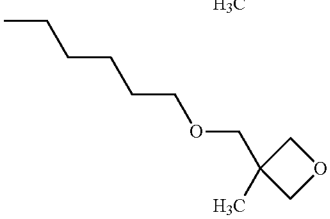
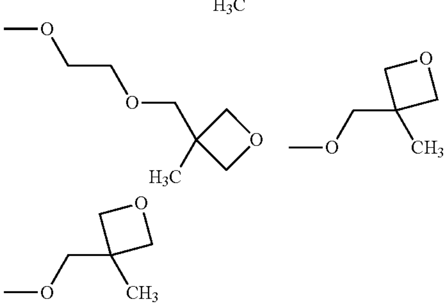
-continued
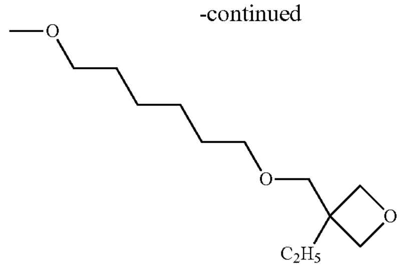
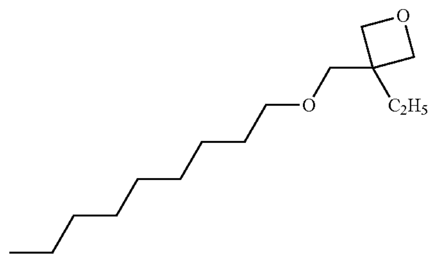
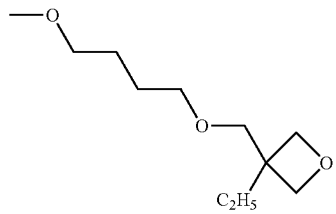
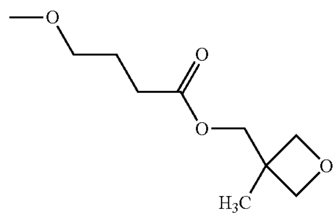
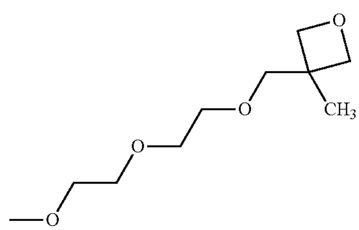
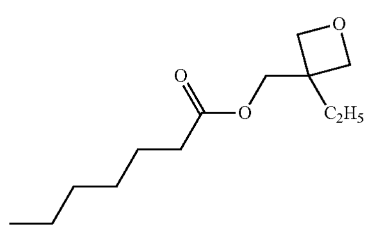
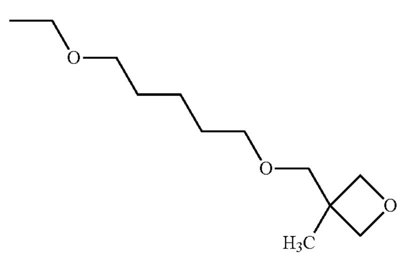

-continued
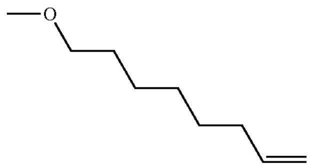
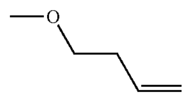
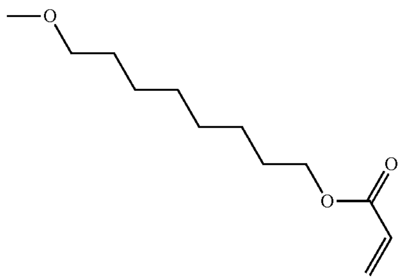
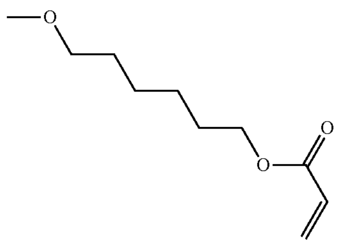
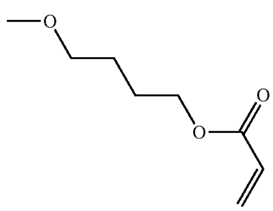
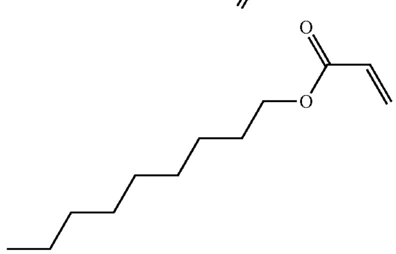
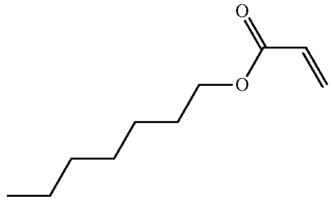
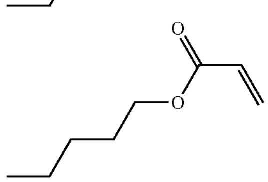
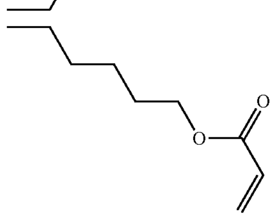
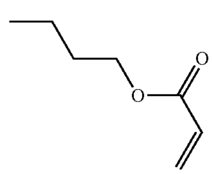
-continued
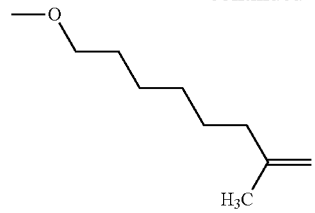
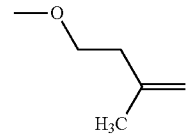
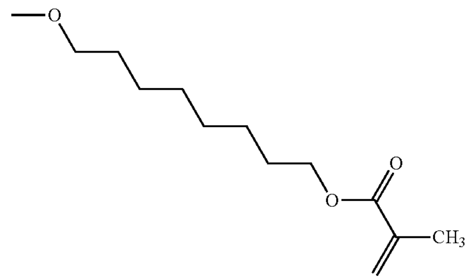
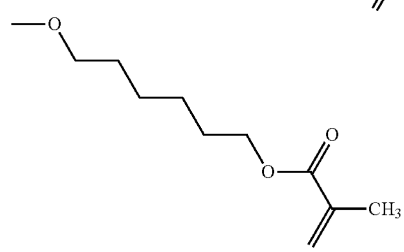
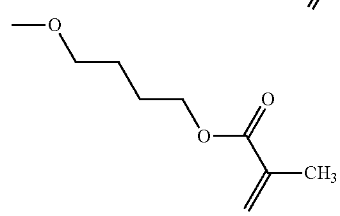
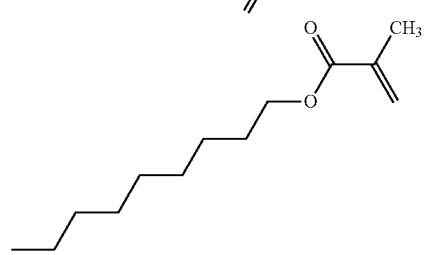
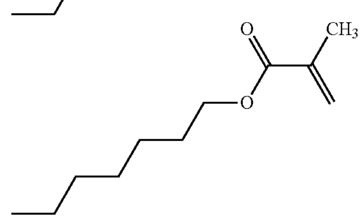
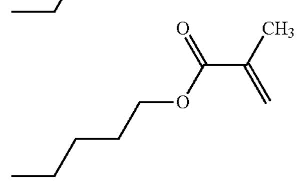
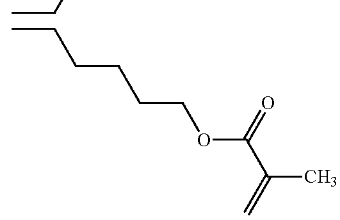

-continued
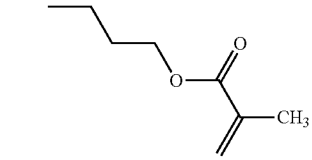
[Chem. 18]
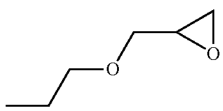
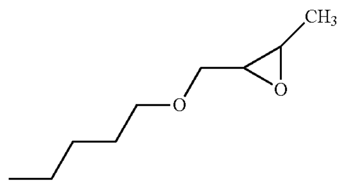
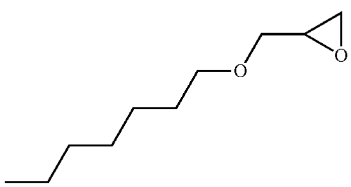
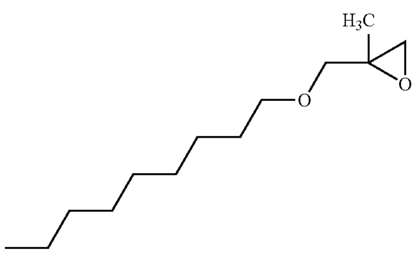
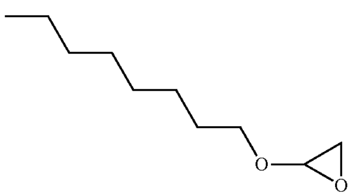
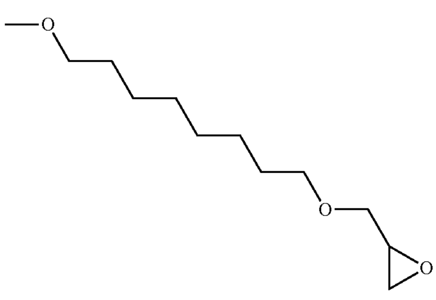
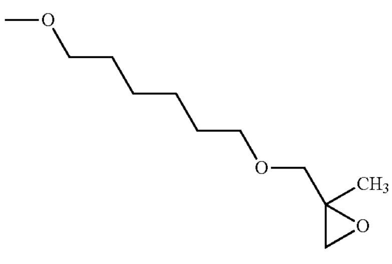
-continued
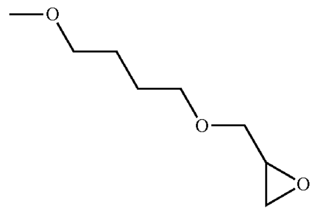
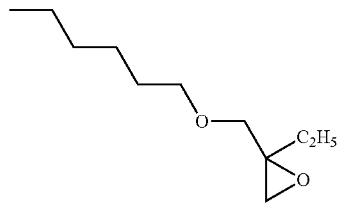
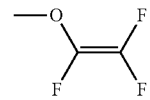
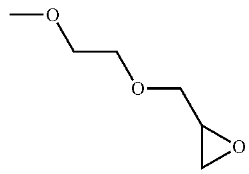
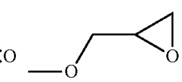
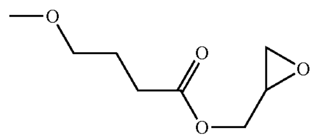
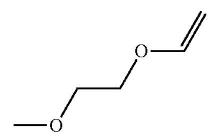
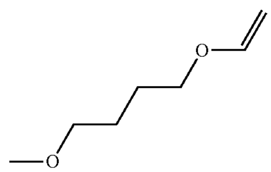
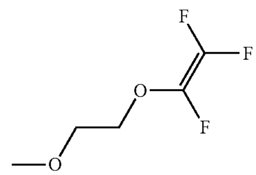
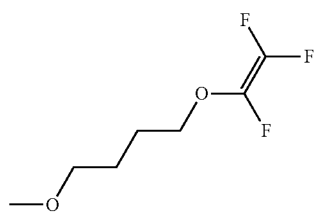
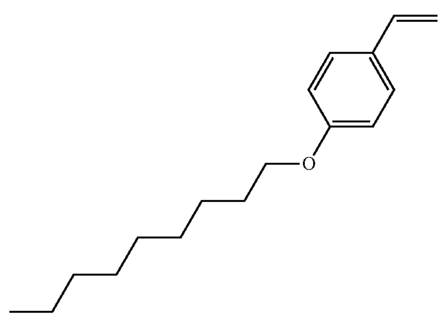
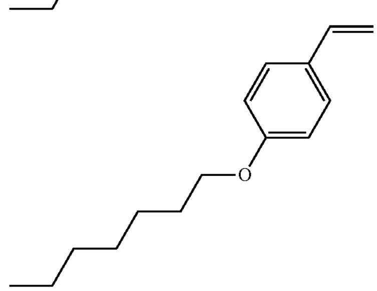

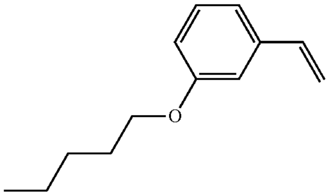
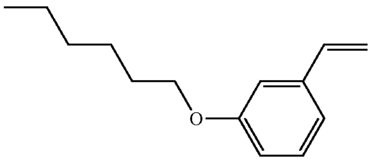
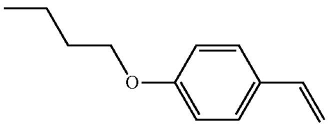
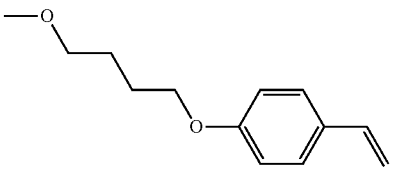
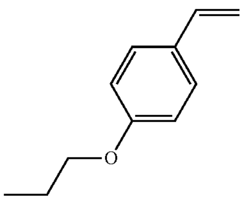
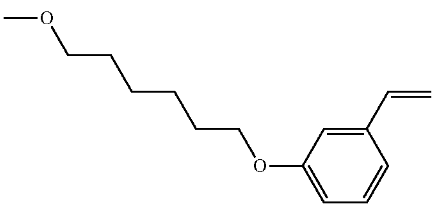
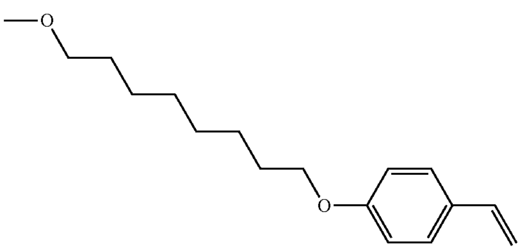
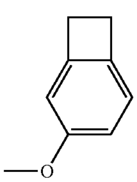
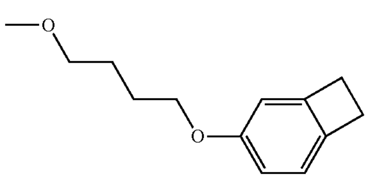
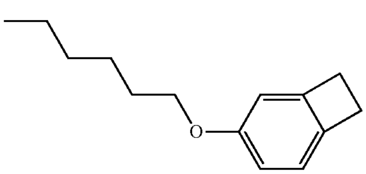
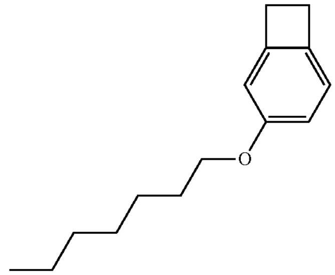
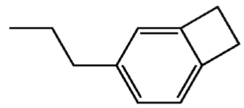
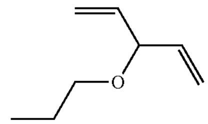
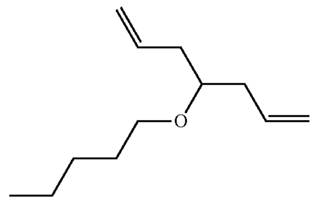
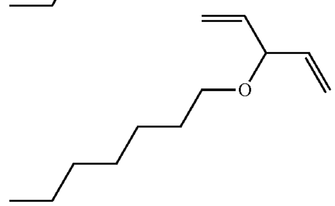
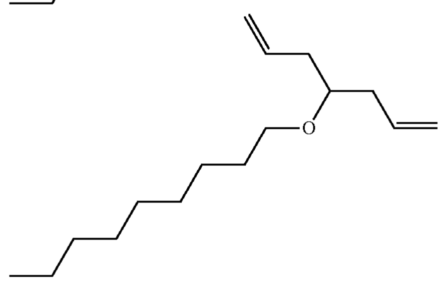
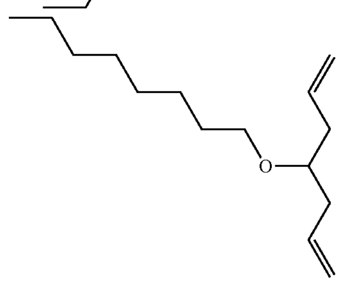
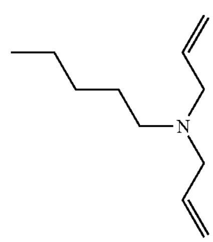
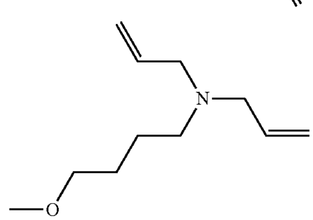
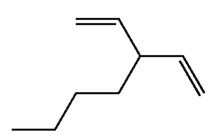
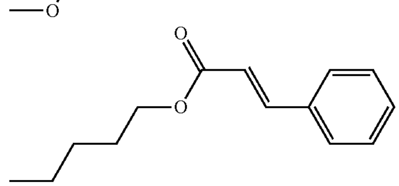

-continued

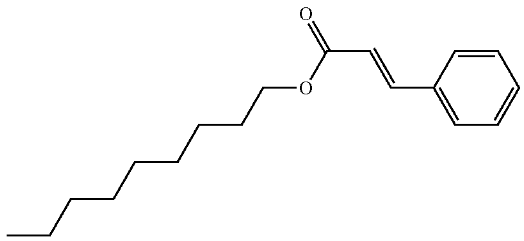

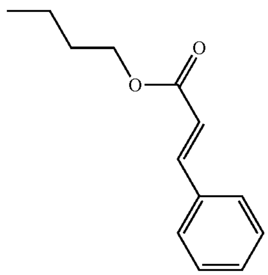

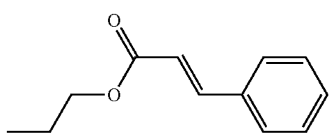

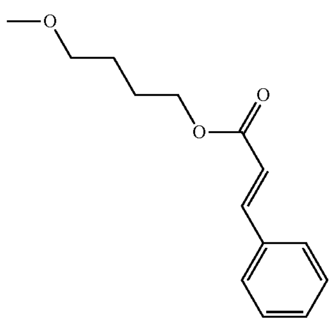

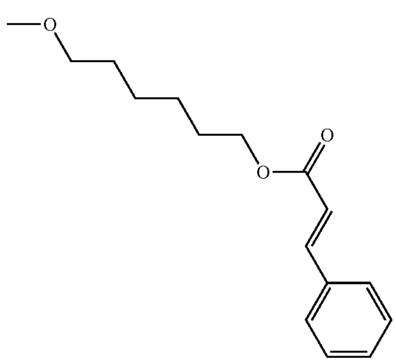

-continued

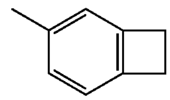

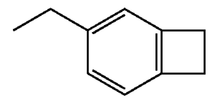

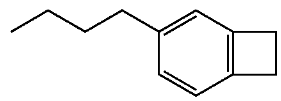

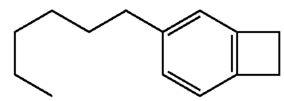

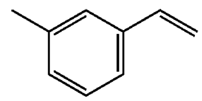

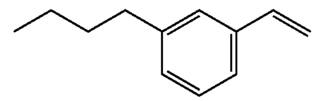

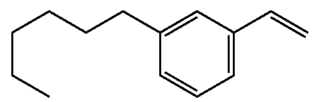

(Ratio of Crosslinking Group)

In the conjugated polymer (I) of the present invention, the number of crosslinking groups present in one polymer chain is preferably 1 or more on average, more preferably 2 or more on average, and is preferably 200 or less, more preferably 100 or less.

Also, the number of crosslinking groups contained in the conjugated polymer (I) of the present invention can be expressed by the number per molecular weight of 1,000.

When the number of crosslinking groups contained in the conjugated polymer (I) of the present invention is expressed by the number per molecular weight of 1,000, this is usually 3.0 or less, preferably 2.0 or less, more preferably 1.0 or less, and usually 0.01 or more, preferably 0.05 or more, per molecular weight of 1,000.

If the number of crosslinking groups exceeds the upper limit above, a flat film may not be obtained due to cracking or the crosslinking density becomes excessively large to increase the proportion of an unreacted group represented by formula (I) in the crosslinked layer, which may affect the life of the obtained device. On the other hand, the number of crosslinking groups is less than the above-described lower limit, insolubilization of the crosslinked layer is insufficient and a multilayer stack structure may not be formed by a wet film formation method.

Here, the number of crosslinking groups per molecular weight of 1,000 of the conjugated polymer is calculated from the molar ratio of monomers charged at the synthesis and the structural formula excluding terminal groups in the conjugated polymer.

This is described, for example, by referring to Target 18 synthesized in Synthesis Example 18 later.

[Chem. 19]

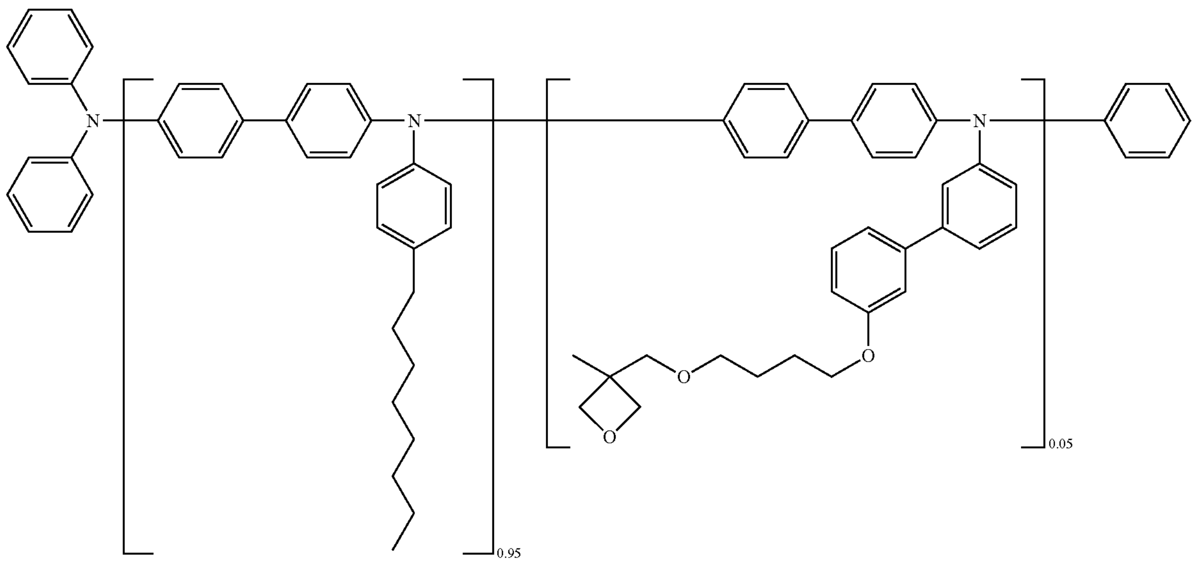

In Target 18, the molecular weight of the repeating unit excluding terminal groups is 362.33 on average, and the number of crosslinking group is 0.05 on average per one repeating unit. Calculation by simple proportionality results in that the number of crosslinking groups per molecular weight of 1,000 is 0.138.

[1-6. Molecular Weight, etc. of Conjugated Polymer (I)]

The weight average molecular weight (Mw) of the conjugated polymer (I) of the present invention is usually 20,000 or more, preferably 40,000 or more, and is usually 2,000,000 or less, preferably 1,000,000 or less.

Also, the number average molecular weight (Mn) is usually 1,000,000 or less, preferably 800,000 or les, more preferably 500,000 or less, and is usually 5,000 or more, preferably 10,000 or more, more preferably 20,000 or more.

If the weight average molecular weight exceeds the upper limit above, purification may be difficult due to high molecular weight impurities, whereas if the weight average molecular weight is less than the above-described lower limit, the glass transition temperature, melting point, vaporization temperature or the like lowers, and the heat resistance may be seriously impaired.

The dispersity (Mw/Mn; Mw indicates the weight average molecular weight and Mn indicates the number average molecular weight) of the conjugated polymer of the present invention is usually 2.40 or less, preferably 2.10 or less, more preferably 2.00 or less, and is preferably 1.00 or more, more preferably 1.10 or more, still more preferably 1.20 or more. If the dispersity exceeds the upper limit above, the effects of the present invention may not be obtained, for example, the purification becomes difficult or the solubility for solvent or the charge transportability decreases.

The weight average molecular weight and number average molecular weight are usually determined by SEC (size exclusion chromatography) measurement. In the SEC measurement, the elution time of a higher molecular weight component is shorter, and the elution time of a lower molecular weight component is longer. By using a calibration curve calculated from the elution time of polystyrene (standard sample) having a known molecular weight, the elution time of the sample is converted into the molecular weight, whereby the weight average molecular weight and the number average molecular weight are calculated.

The SEC measurement conditions are as follows.

Two columns, TSKgel GMHXL (produced by Tosoh Corporation), or two columns having separation efficiency equal to or greater than that, which are a column having:

a particle diameter: 9 mm, a column size: 7.8 mm (inner diameter)×30 cm (length), and a guaranteed theoretical number of steps: about 14,000 TP/30 cm, are used, and the column temperature is set to 40° C.

A moving bed incapable of adsorbing to the packing material is selected from tetrahydrofuran and chloroform, and the flow rate is set to 1.0 ml/min. The injection concentration is 0.1 wt %, and the injection amount is 0.10 ml. As for the detector, RI is used.

Using the calibration curve calculated from the elution time of polystyrene (standard sample) having a known molecular weight, the elution time of the sample is converted into the molecular weight, whereby the molecular weight distribution is determined. Incidentally, in the SEC measurement, the elution time of a higher molecular weight component is shorter, and the elution time of a lower molecular weight component is longer.

In this connection, the instrument for measuring the weight average molecular weight (Mw) and dispersity (Mw/Mn) of the present invention is not limited to the above-described measuring instrument as long as the same measurement as above can be performed, and other measuring instruments may be used, but it is preferred to use the above-described measuring instrument.

[1-7. Specific Examples of $Ar^{11}$ to $Ar^{15}$]

Specific preferred examples of the $Ar^{11}$ to $Ar^{15}$ in the present invention are set forth below, but the present invention is not limited thereto. In the formulae, T represents any one of insolubilizing groups, and Z represents a substituent. In the case where a plurality of T's or Z's are present in one $Ar^{11}$ to $Ar^{15}$, each T or Z may be the same as or different from every other T or Z.

<Specific Examples of $Ar^{11}$, $Ar^{12}$ and $Ar^{14}$>
[Chem. 20]
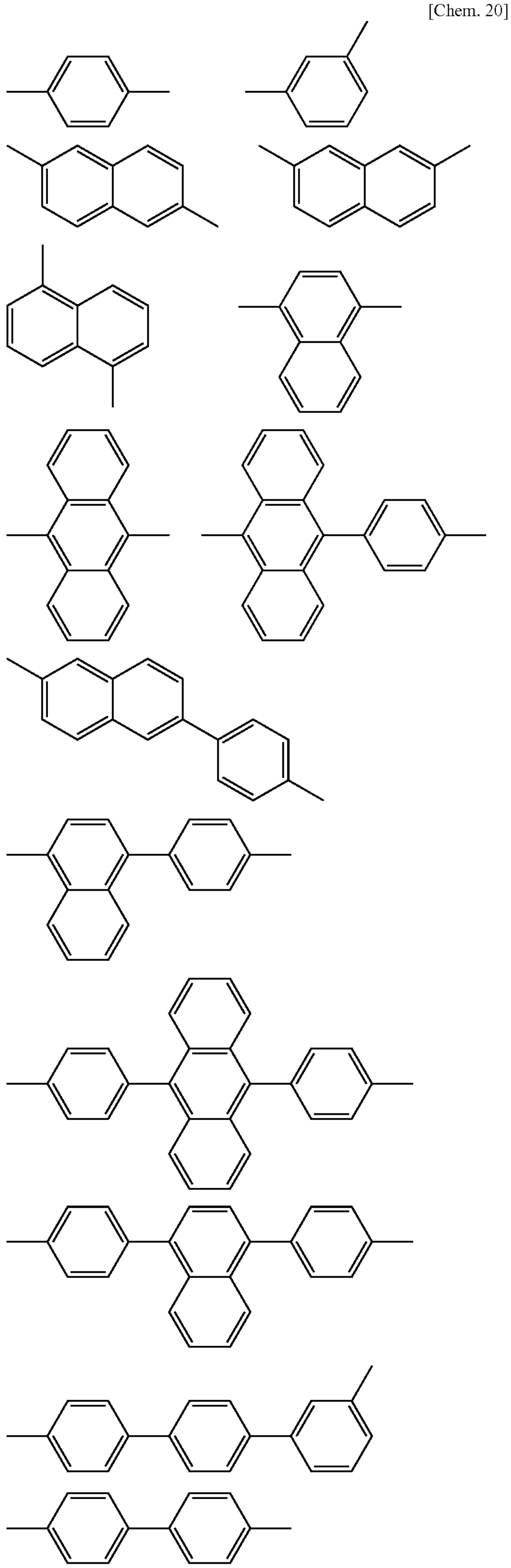
-continued
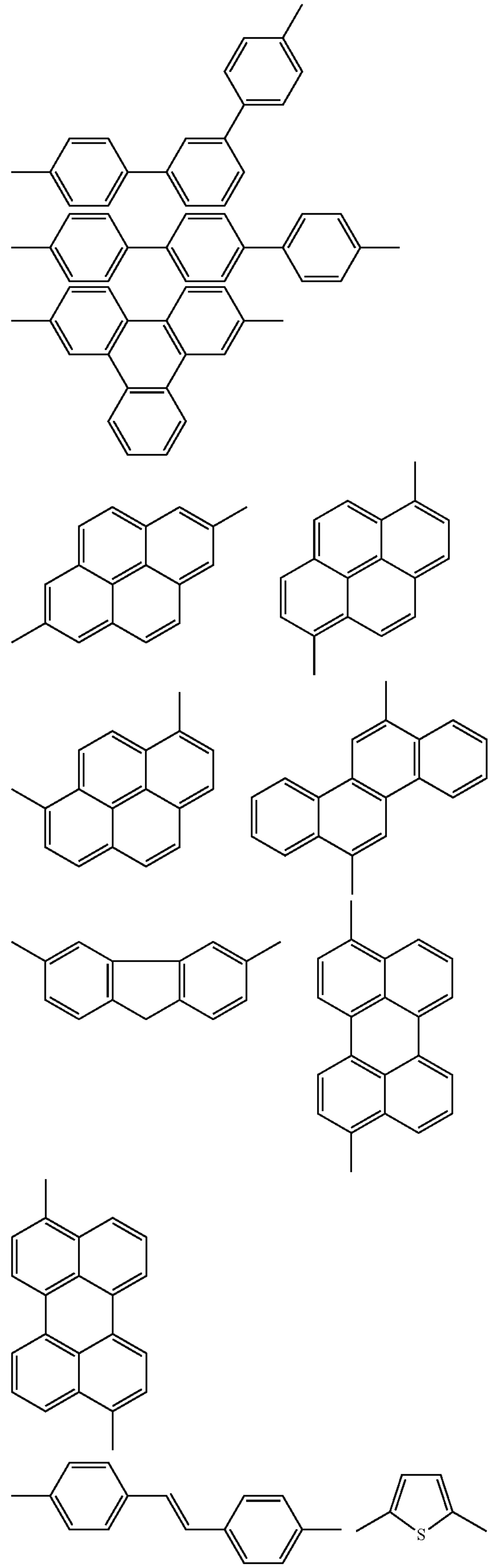

-continued
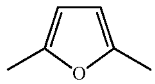
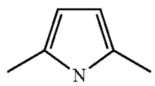
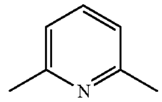
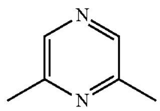
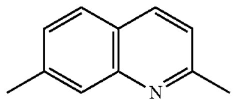
[Chem. 21]
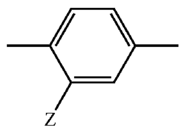
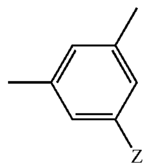
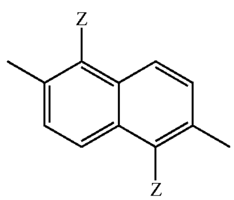
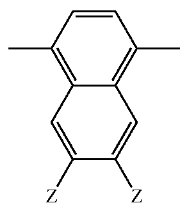
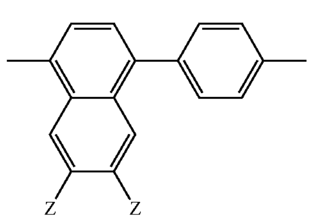
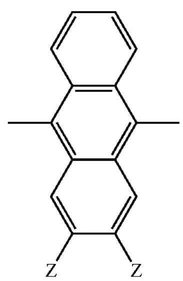
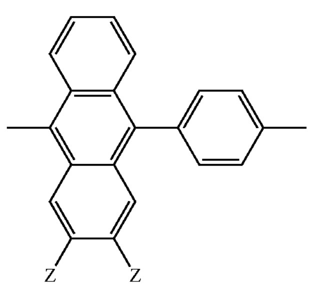
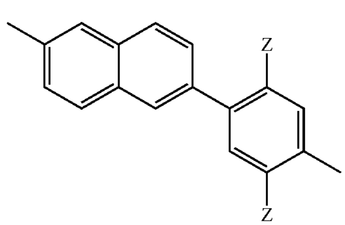
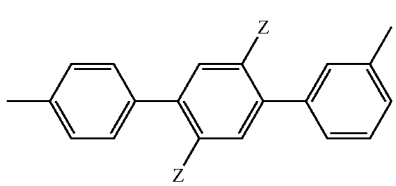
-continued
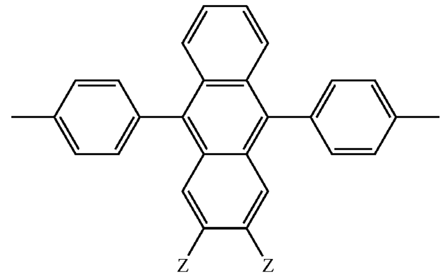
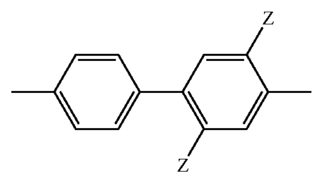
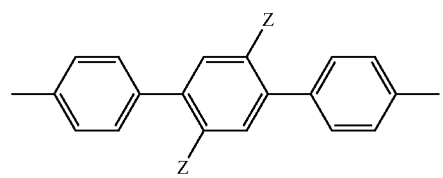
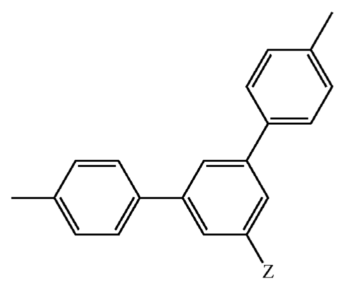
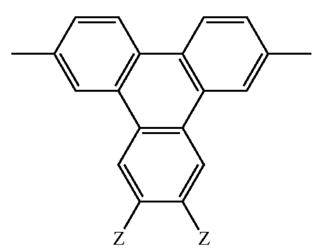
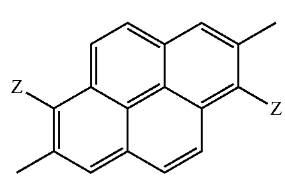
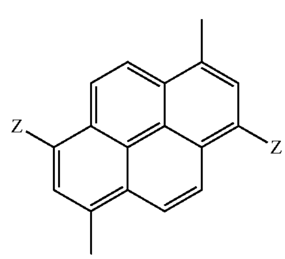

-continued
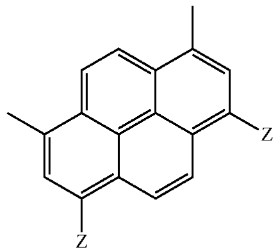
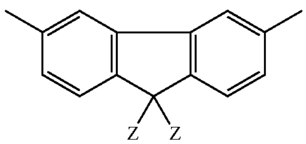
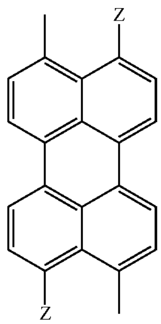
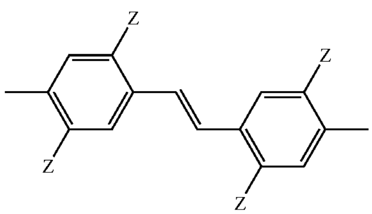
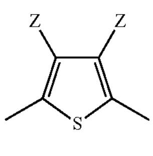
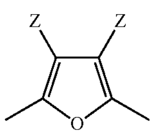
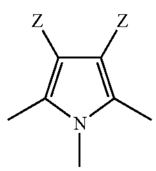
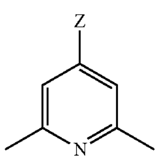
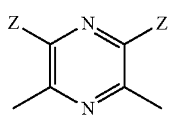
<Specific Examples of $Ar^{13}$ and $Ar^{15}$>
[Chem. 22]
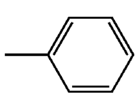
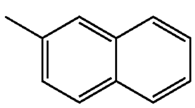
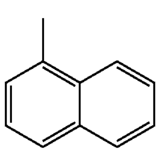
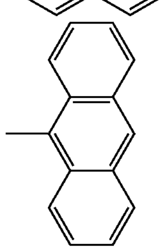
-continued
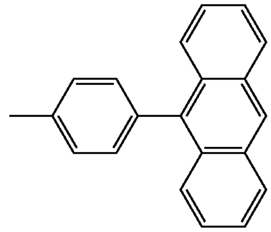
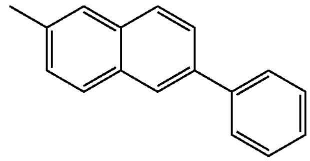
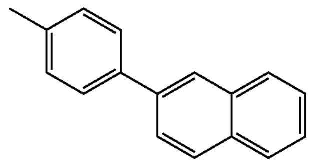
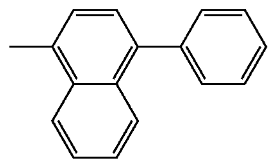
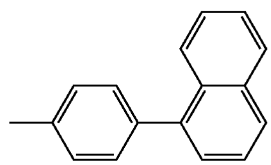
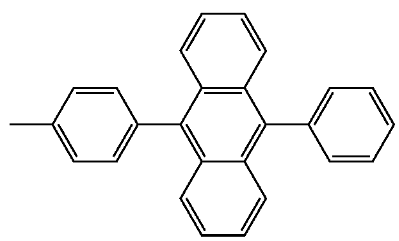
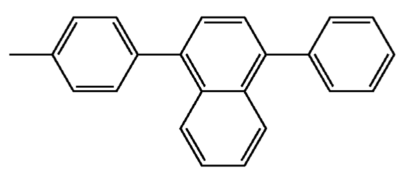
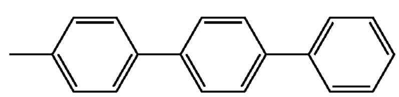
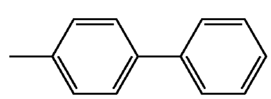
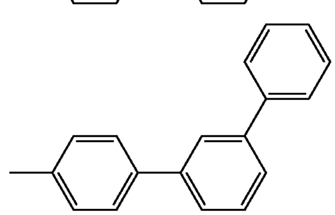

-continued
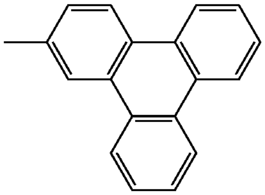
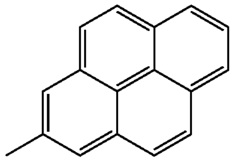
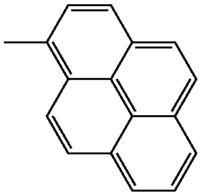
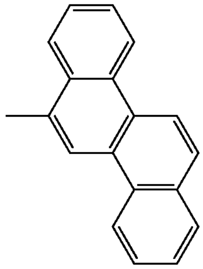
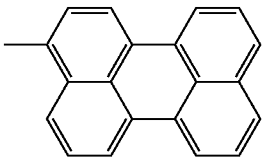
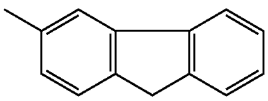
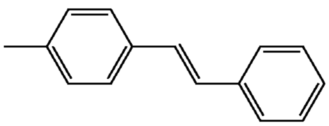
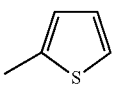
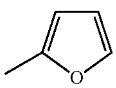
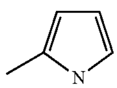
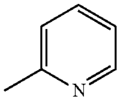
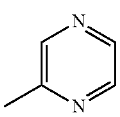
[Chem. 23]
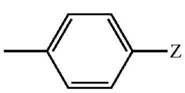
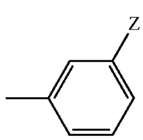
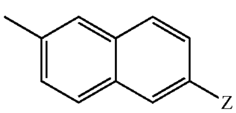
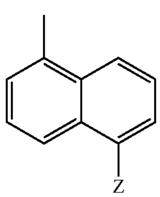
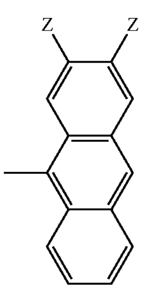
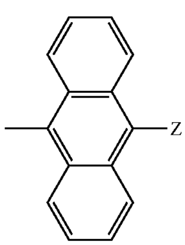
-continued
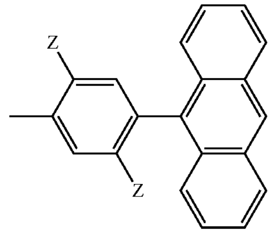
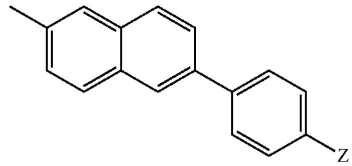
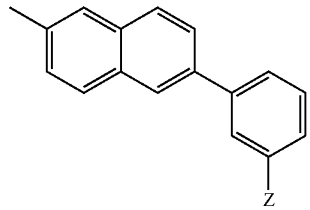
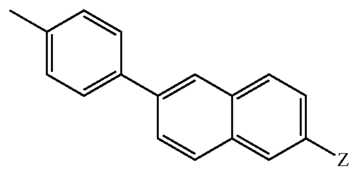
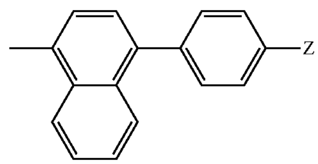
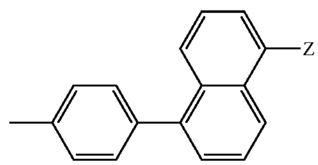
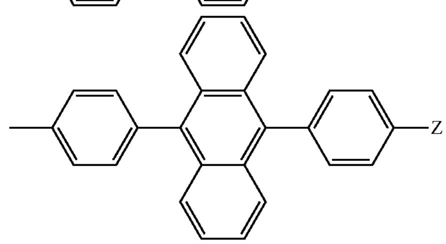
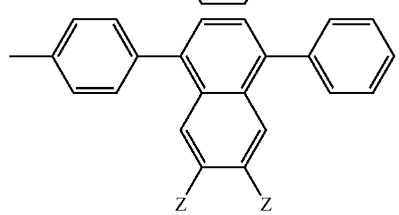
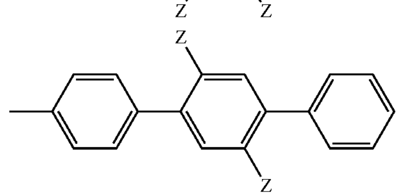

-continued
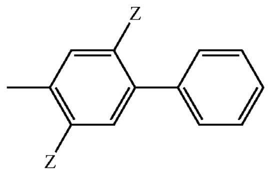
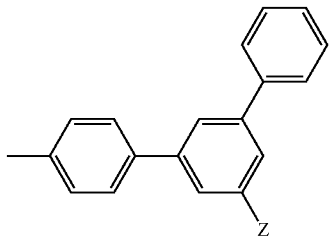
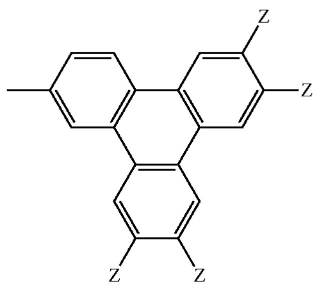
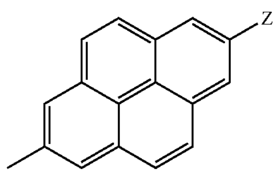
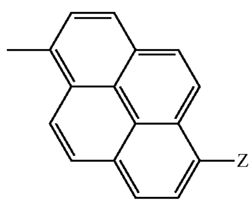
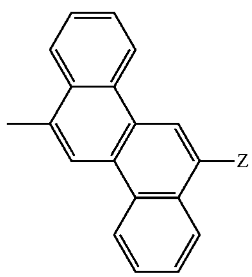
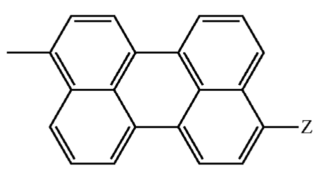
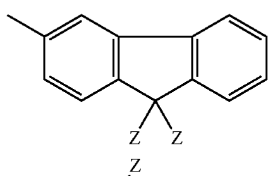
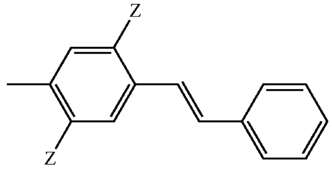
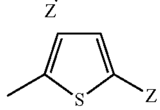
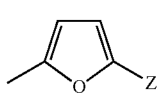
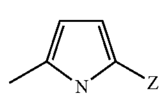
-continued
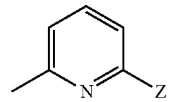
[Chem. 24]
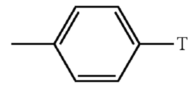
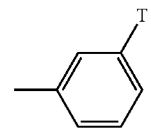
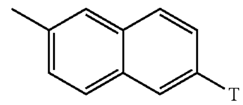
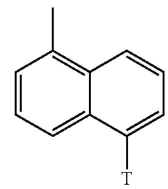
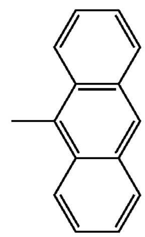
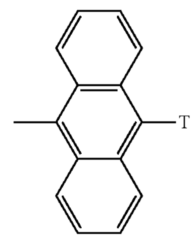
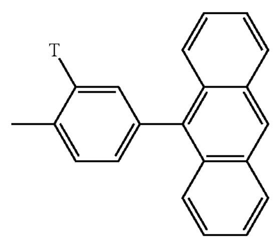
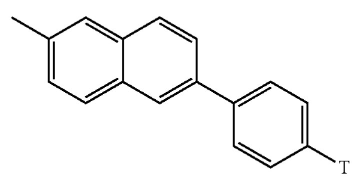
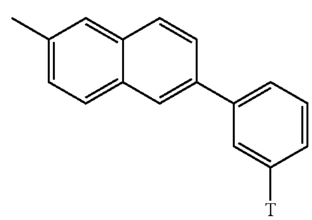
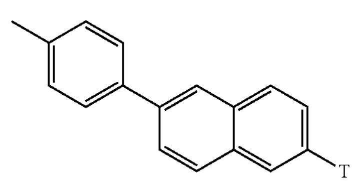
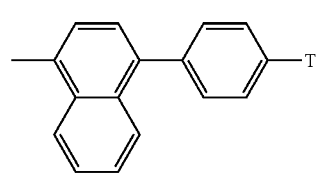

-continued

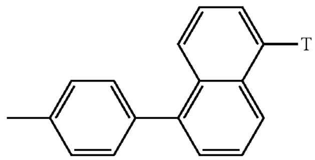

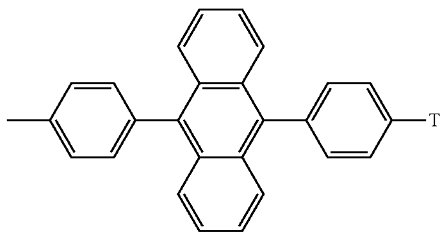

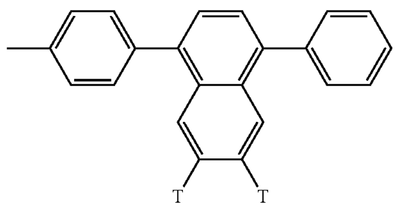

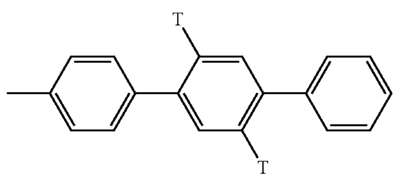

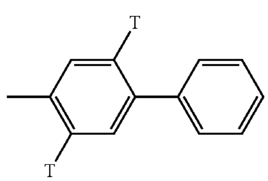

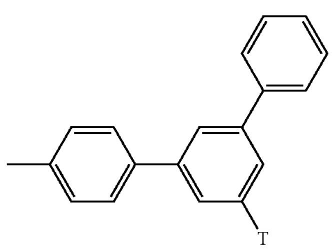

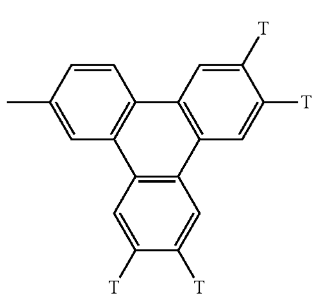

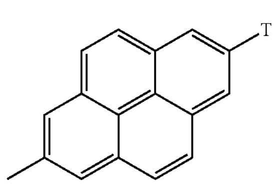

-continued

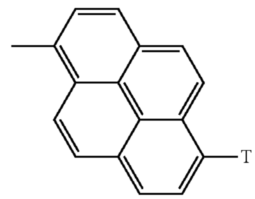

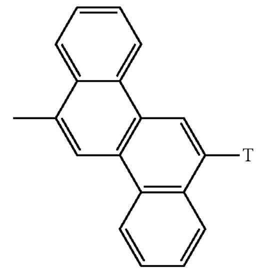

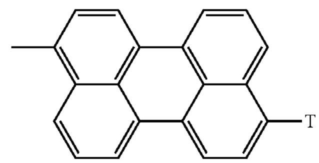

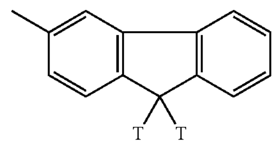

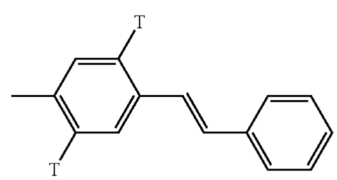

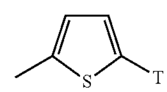

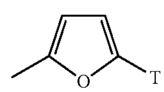

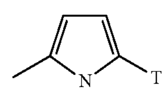

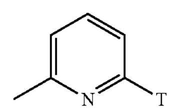

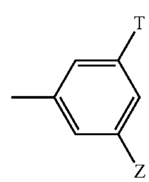

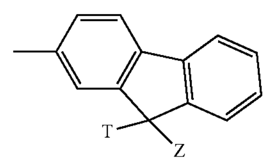

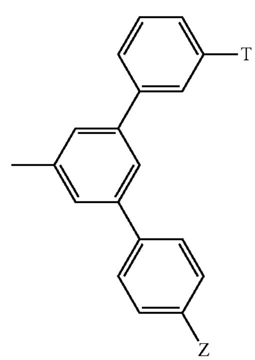

Furthermore, specific examples particularly preferred as the repeating unit contained in the conjugated polymer (I) of the present invention are set forth below, but the present invention is not limited thereto.

Specific examples of the repeating unit contained in the conjugated polymer (I) of the present invention, when the repeating unit does not have an insolubilizing group, are set forth in the following <Repeating Unit Family C>, but the present invention is not limited thereto.

<Repeating Unit Family C>
[Chem. 25]
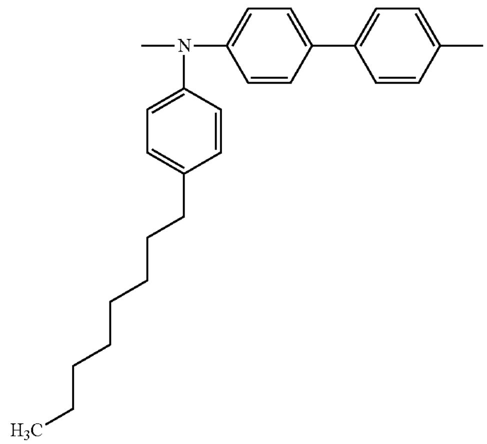
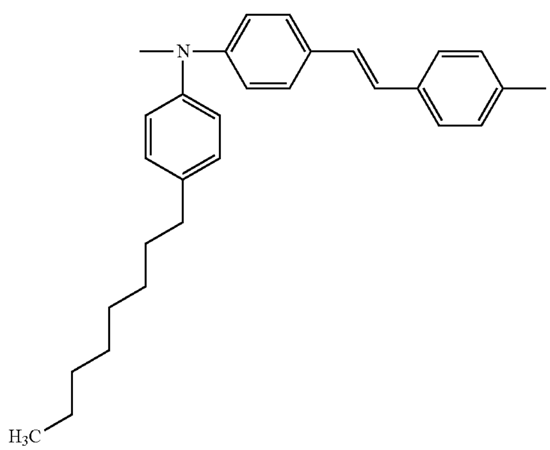
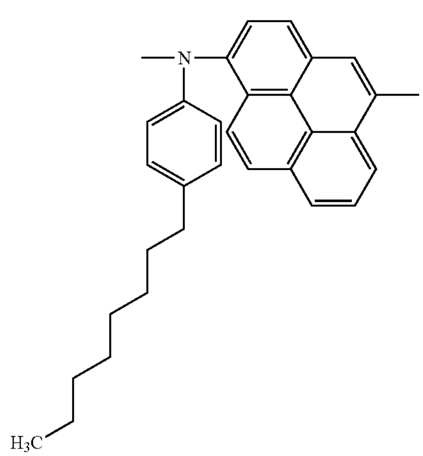
-continued
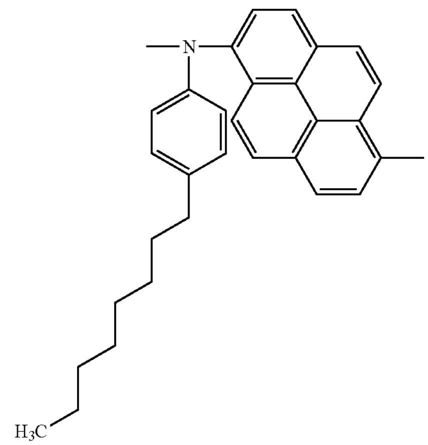
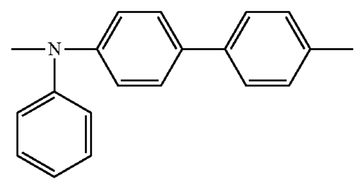
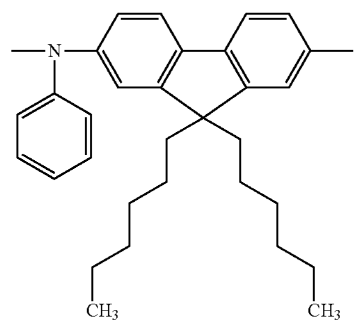
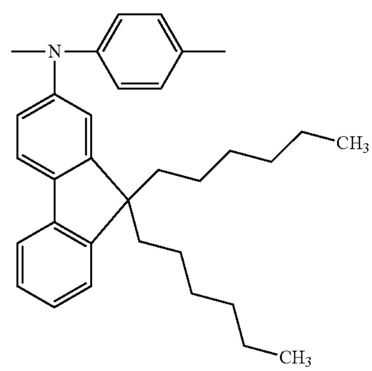
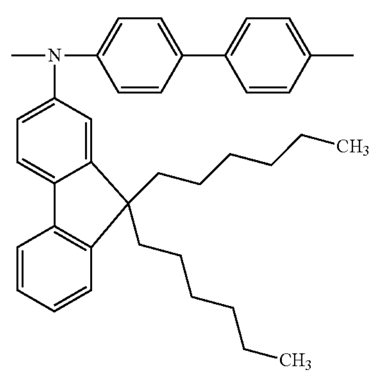

-continued
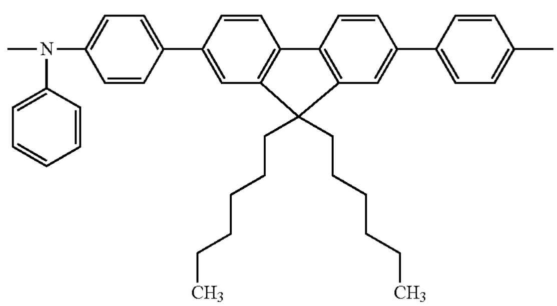
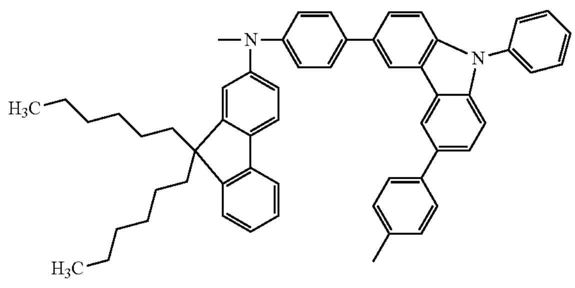
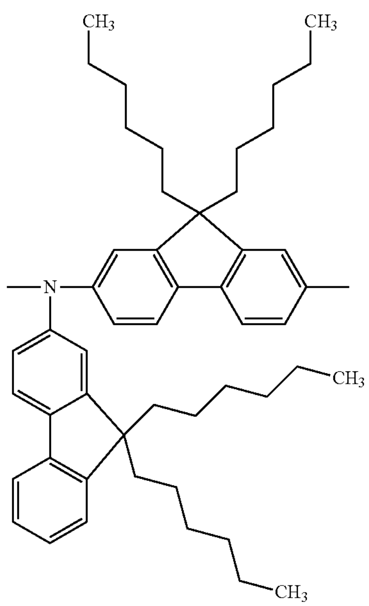
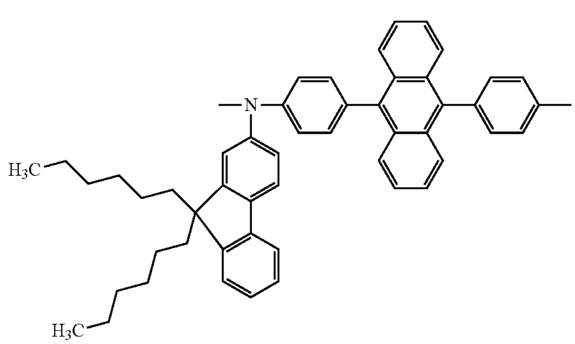
-continued
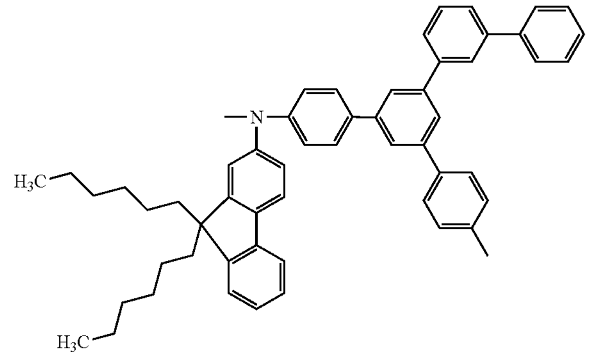
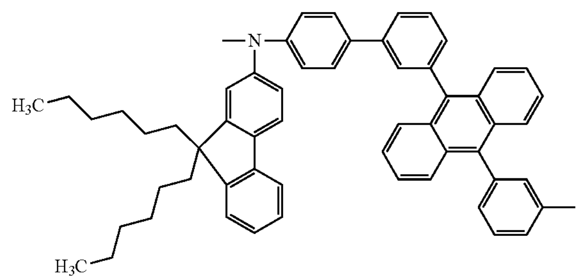
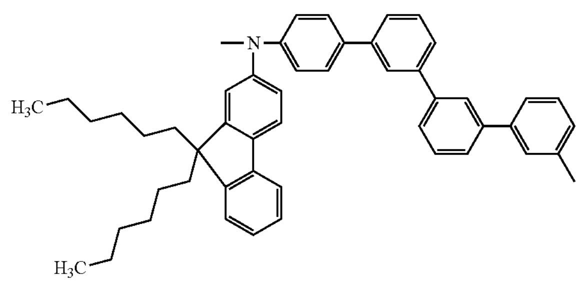
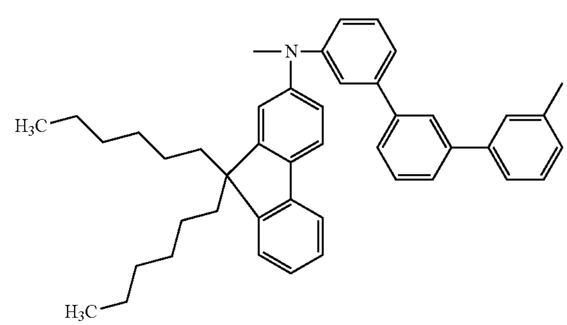
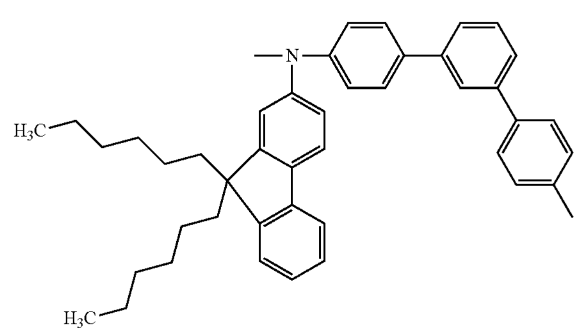

-continued
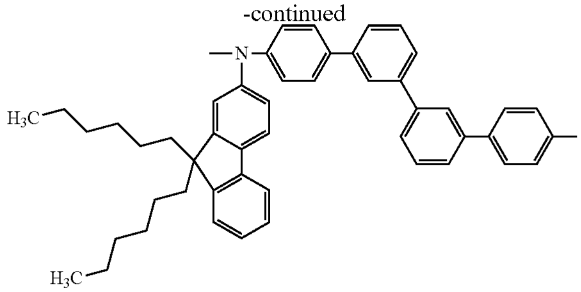
[Chem. 26]
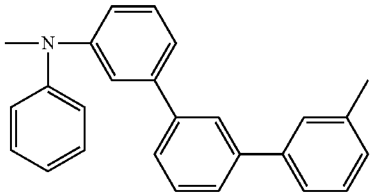
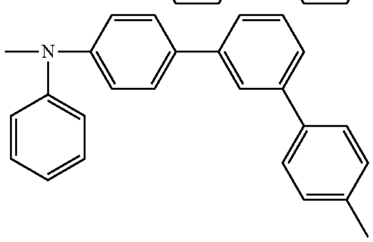
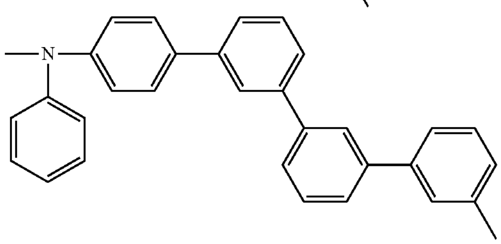
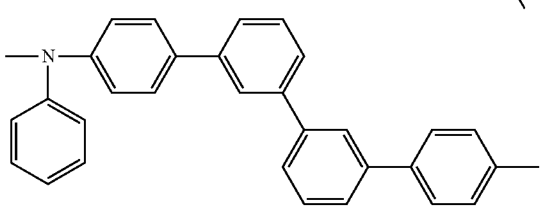
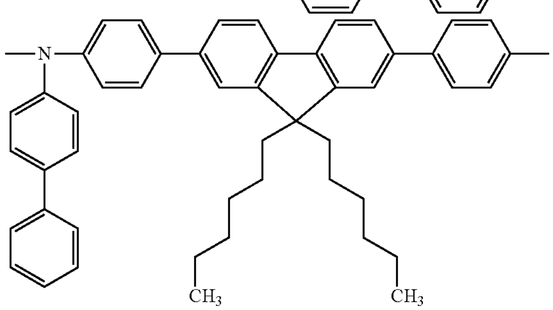
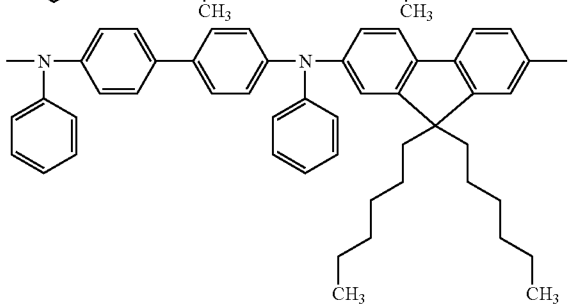
-continued
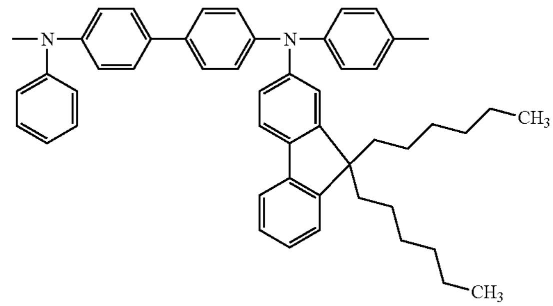 [SMILES: CCCCCCC1(CCCCCC)c2ccccc2-c2ccc(N(c3ccc(C)cc3)c3ccc(-c4ccc(N(C)c5ccccc5)cc4)cc3)cc21]
Specific examples of the repeating unit contained in the conjugated polymer (I) of the present invention, when the repeating unit has an insolubilizing group, are set forth in the following <Repeating Unit Family D>, but the present invention is not limited thereto.
<Repeating Unit Family D>
[Chem. 27]
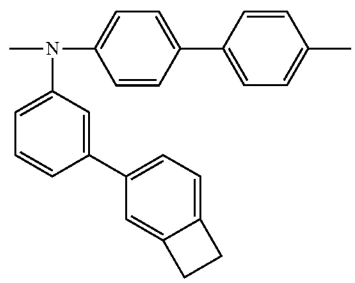
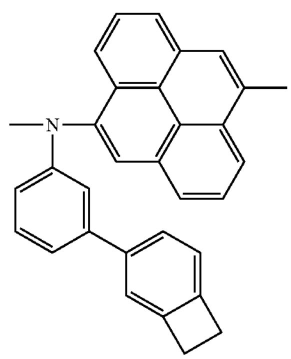
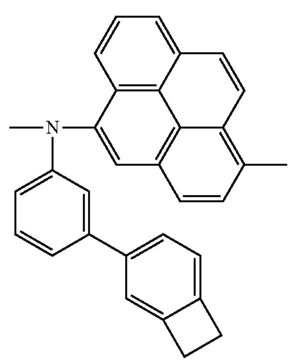

-continued
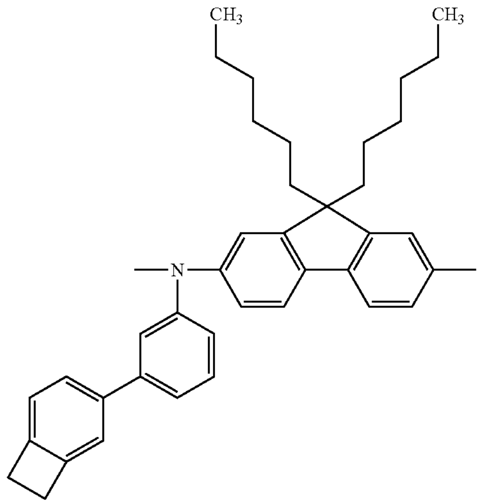
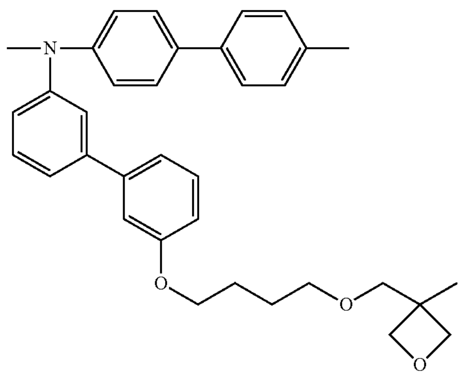
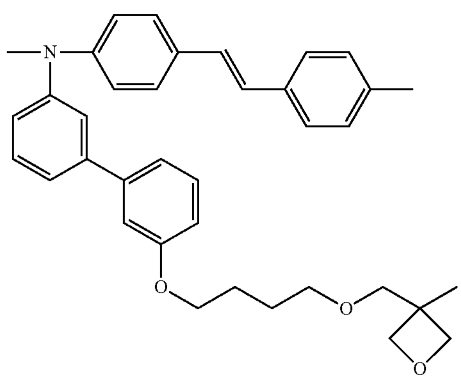
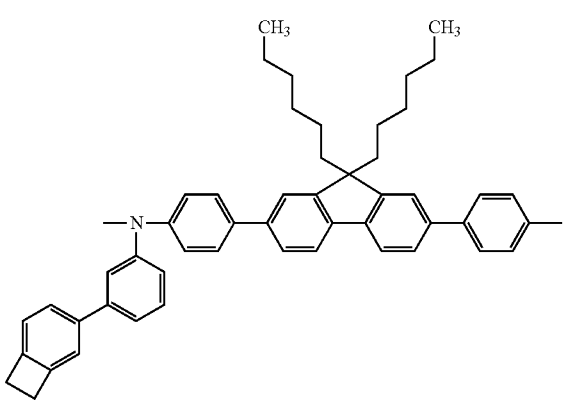
-continued
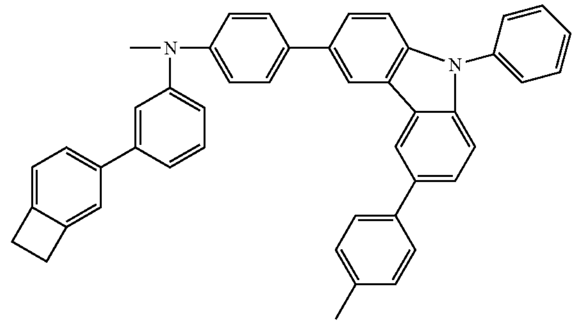
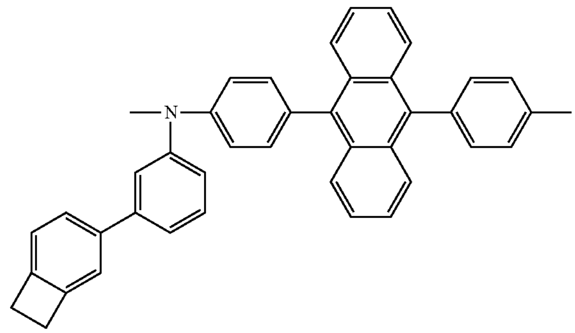
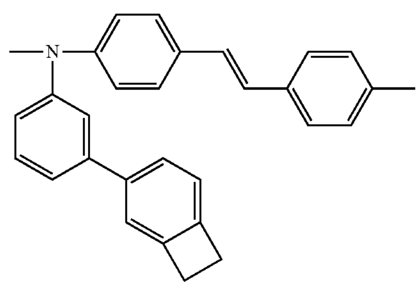
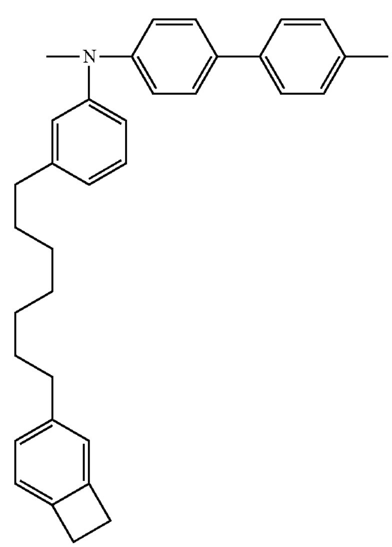

-continued

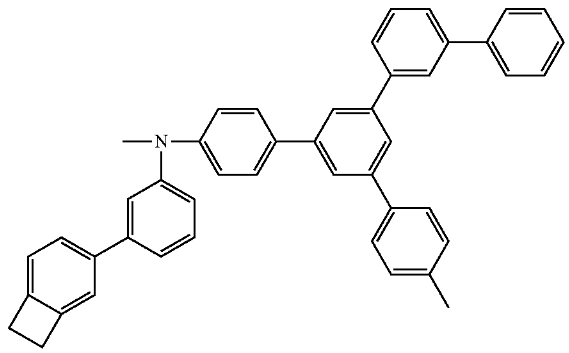

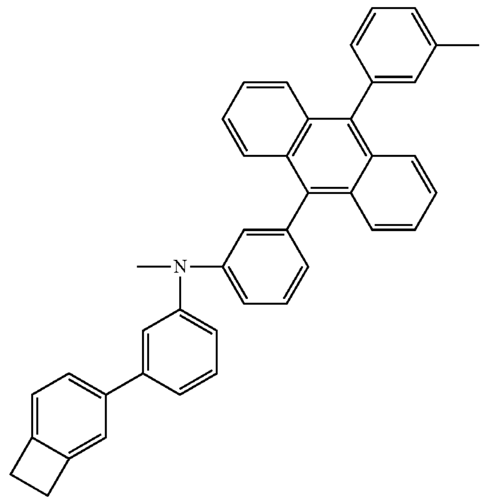

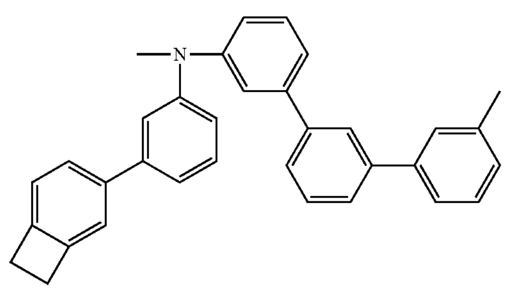

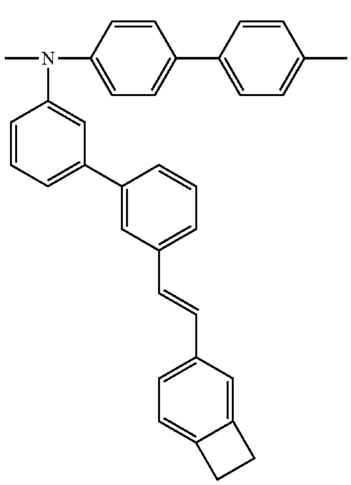

-continued

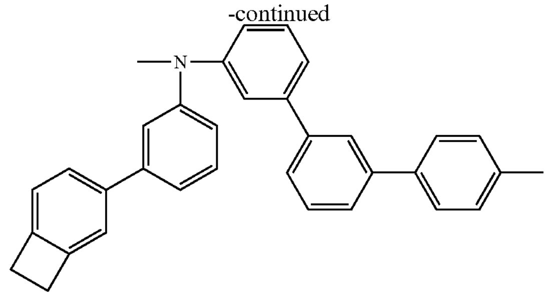

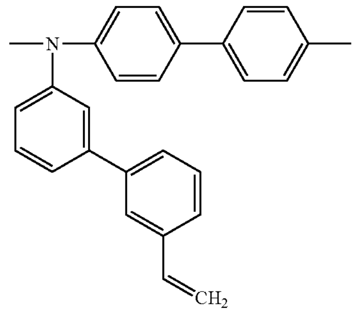

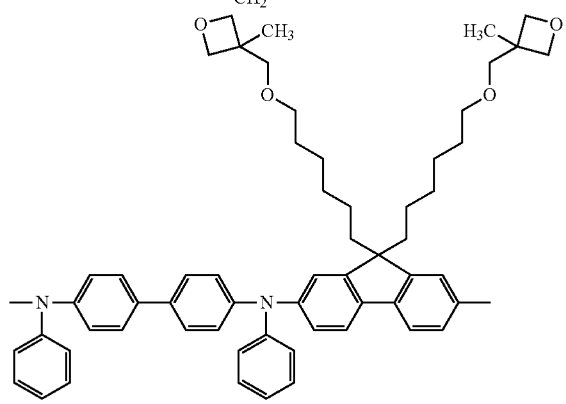

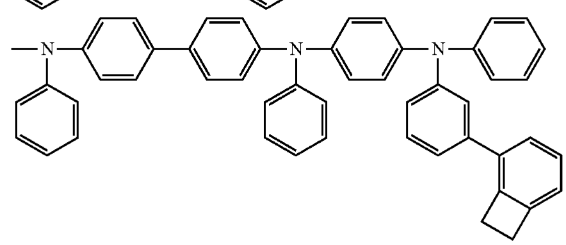

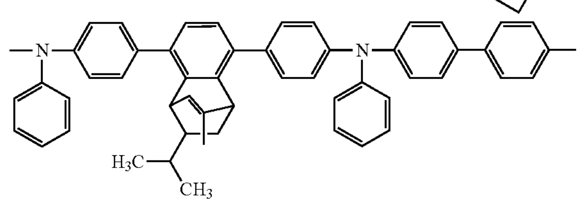

Also, specific examples of the conjugated polymer (I) include polymers described in [EXAMPLES] (Synthesis Examples) later, but the present invention is not limited thereto.

[1-8. Glass Transition Temperature and Other Physical Properties]

The glass transition temperature of the conjugated polymer (I) of the present invention is usually 50° C. or more and in view of drive stability including heat resistance of an organic electroluminescence element, preferably 80° C. or more, more preferably 100° C. or more, and is usually 300° C. or less.

The ionization potential of the conjugated polymer (I) of the present invention is, in view of excellent charge transportability, usually 4.5 eV or more, preferably 4.8 eV or more, and is usually 6.0 eV or less, preferably 5.7 eV or less.

[2. Conjugated Polymer (I')]

The conjugated polymer (I') of the present invention is a conjugated polymer containing a repeating unit represented by the following formula (I'), and this conjugated polymer is characterized by having, as a substituent, a group containing a group represented by the following formula (II) and by having a weight average molecular weight (Mw) of 20,000 or more and a dispersity (Mw/Mn, here Mn indicates a number average molecular weight) of 2.40 or less.

[Chem. 28]

(I')

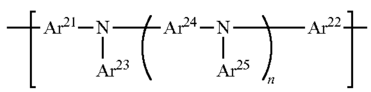

(wherein n represents an integer of 0 to 3, each of $Ar^{21}$ and $Ar^{22}$ independently represents a direct bond, an aromatic hydrocarbon group which may have a substituent, or an aromatic heterocyclic group which may have a substituent, and each of $Ar^{23}$ to $Ar^{25}$ independently represents an aromatic hydrocarbon group which may have a substituent, or an aromatic heterocyclic group which may have a substituent, provided that a case of both $Ar^{21}$ and $Ar^{22}$ being a direct bond is excluded, here, the conjugated polymer has, as a substituent, a group containing at least one group represented by the following formula (II) in one molecule):

[Chem. 29]

(II)

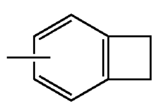

(wherein the benzocyclobutene ring may have a substituent, and substituents may combine with each other to form a ring).

[2-1. Structural Characteristics]

The conjugated polymer (I') of the present invention contains a repeating unit represented by formula (I') and therefore, has high charge transportability and excellent redox stability.

Furthermore, the conjugated polymer (I') of the present invention has, as a substituent, a group containing a group represented by formula (II), so that the solubility in an organic solvent can be reduced without decreasing the redox stability.

[2-2. $Ar^{21}$ to $Ar^{25}$]

In formula (I'), each of $Ar^{21}$ and $Ar^{22}$ independently represents a direct bond, an aromatic hydrocarbon group which may have a substituent, or an aromatic heterocyclic group which may have a substituent, and each of $Ar^{23}$ to $Ar^{25}$ independently represents an aromatic hydrocarbon group which may have a substituent, or an aromatic heterocyclic group which may have a substituent. Here, $Ar^{21}$, $Ar^{22}$ and $Ar^{24}$ are a divalent group, and $Ar^{23}$ and $Ar^{25}$ are a monovalent group.

Examples of the aromatic hydrocarbon group which may have a substituent and the aromatic heterocyclic group which may have a substituent of $Ar^{21}$ to $Ar^{25}$ are the same as those described in [1-2. $Ar^{11}$ to $Ar^{15}$], and preferred examples are also the same.

[2-3. Formula (II)]

The conjugated polymer (I') of the present invention has, as a substituent, a group containing a group represented by formula (II) as a substituent.

[Chem. 30]

(II)

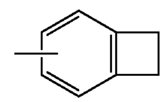

(wherein the benzocyclobutene ring may have a substituent, and substituents may combine with each other to form a ring).

The benzocyclobutene ring in formula (II) may have a substituent, and specific examples thereof include those described in [Substituent Family Z]. Preferred examples are also the same.

The conjugated polymer (I') of the present invention may have the group of formula (II) through a divalent group described in [1-5-2. Crosslinking Group].

[2-4. Description of n]

In formula (I'), n represents an integer of 0 to 3.

m has the same meaning as m described in [1-3. Description of m], and preferred examples are also the same.

[2-5. Molecular Weight of Conjugated Polymer (I')]

The weight average molecular weight (Mw), number average molecular weight (Mn) and dispersity (Mw/Mn) of the conjugated polymer (I') of the present invention have the same meanings as those described in [1-6. Molecular Weight of Conjugated Polymer (I)], and the ranges thereof are the same. Furthermore, preferred ranges are also the same.

[2-6. Ratio, etc. of Repeating Unit]

The conjugated polymer (I') of the present invention may be sufficient if it is a polymer having at least one kind of a repeating unit represented by formula (I').

The conjugated polymer (I') of the present invention may contain two or more different kinds of repeating units. The expression "may contain two or more kinds of repeating units" means that the polymer may contain two or more kinds of repeating units represented by formula (I') or may contain a repeating unit other than the repeating unit represented by formula (I').

The conjugated polymer (I') of the present invention contains the repeating unit represented by formula (I') in a ratio of, in terms of the charged molar ratio, usually 0.1 or more, preferably 0.3 or more, more preferably 0.5 or more, and usually 1 or less. Within this range, high charge transportability and excellent redox stability are advantageously obtained.

Specific examples of the repeating unit represented by formula (I') are, when the repeating unit has a group containing a group represented by formula (II), set forth in the following <Repeating Unit Family E>, but the present invention is not limited thereto.

<Repeating Unit Family E>
[Chem. 31]
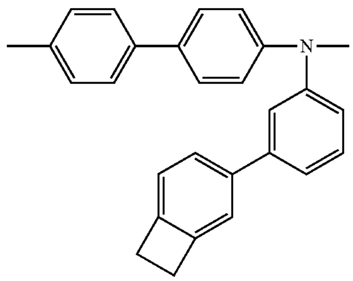
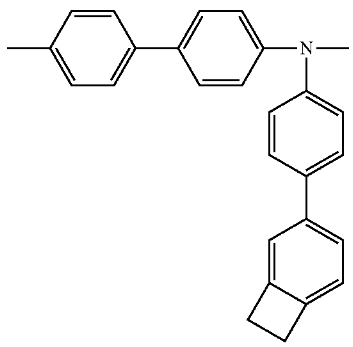
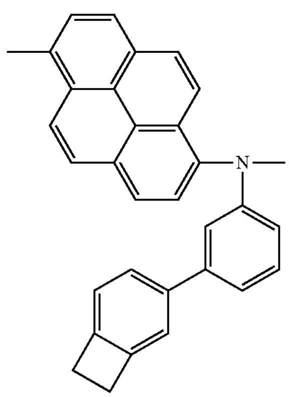
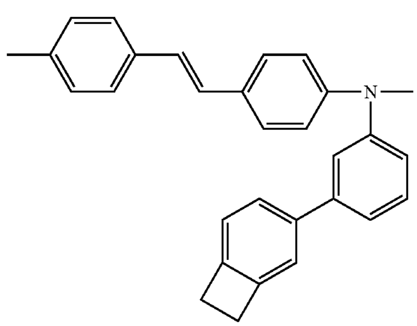
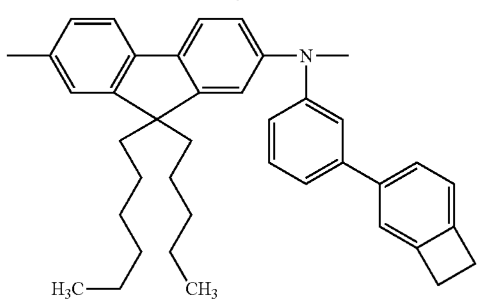
-continued
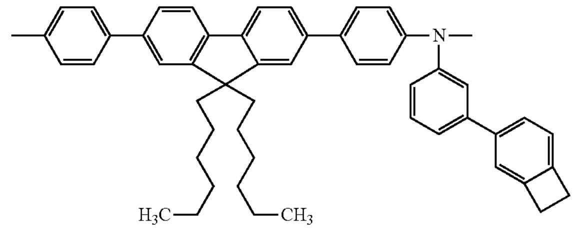
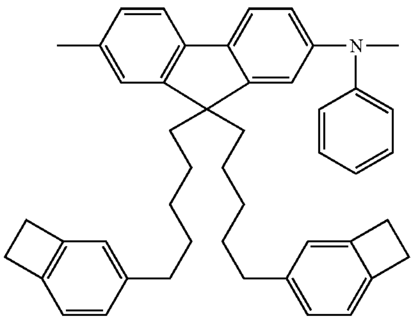
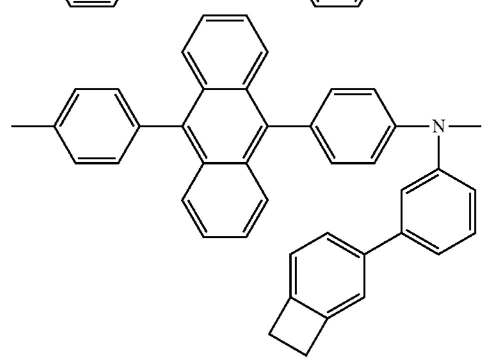
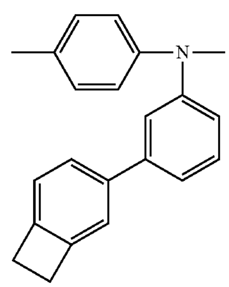
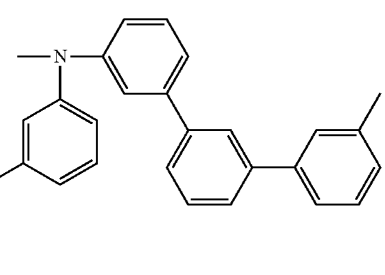
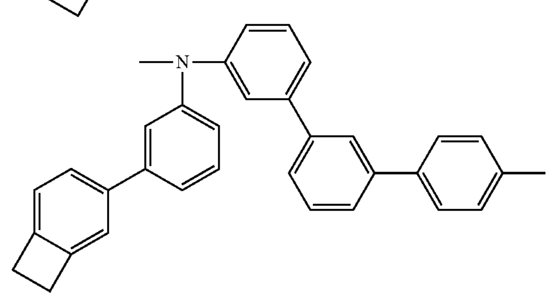

-continued

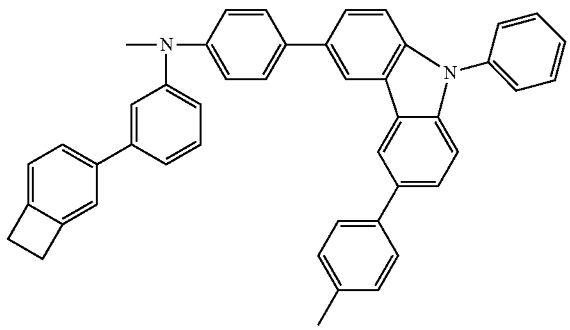

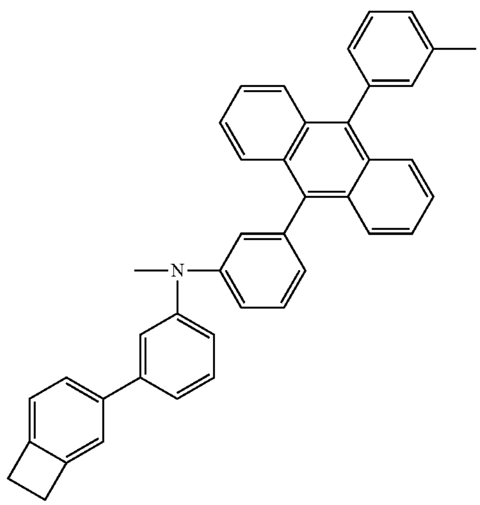

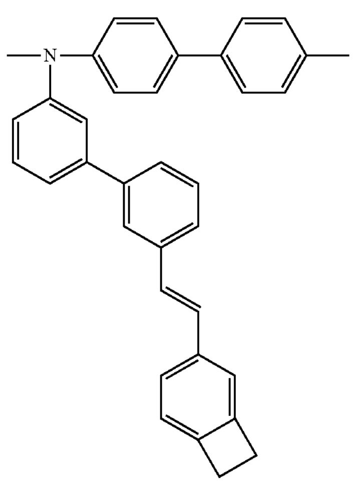

-continued

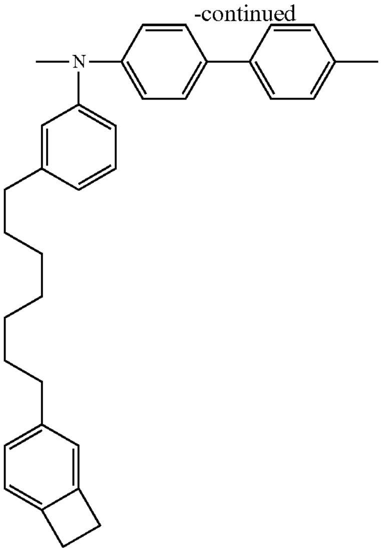

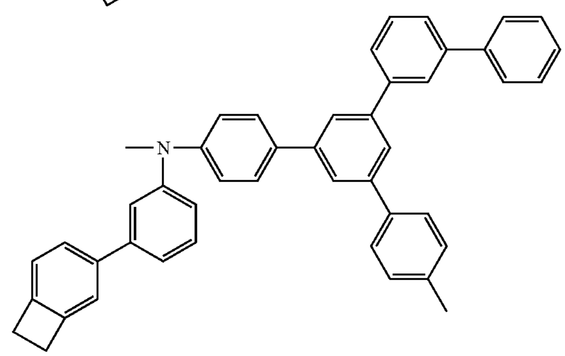

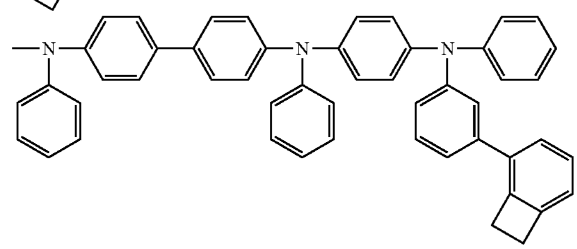

Specific examples of the repeating unit represented by formula (I') are, when the repeating unit does not have a group containing a group represented by formula (II), the same as those set forth in <Repeating Unit Family C>.

In the case where the conjugated polymer (I') of the present invention contains two or more kinds of repeating units, the polymer includes a random copolymer, an alternate copolymer, a block copolymer and a graft copolymer. A random copolymer is preferred in view of solubility for solvent. The conjugated polymer (I') of the present invention is preferably an alternate copolymer because the charge transportability is more enhanced.

Specific examples of the conjugated polymer (I') of the present invention include polymers described in [EXAMPLES] (Synthesis Examples) later, but the present invention is not limited thereto.

[2-7. Ratio of Group Containing Group Represented by Formula (II)]

The ratio of the group represented by formula (II) contained in one polymer chain of the conjugated polymer (I') of the present invention is the same as in the case where in [1-5-2. Crosslinking group] (Ratio of Crosslinking Group), the crosslinking group is a group represented by formula (II). The preferred range is also the same.

The number of groups containing a group represented by formula (II), contained in the conjugated polymer (I') of the present invention, when expressed by the number per molecular weight of 1,000, is the same as in the case where in [1-5.2. Crosslinking Group] (Ratio of Crosslinking Group), the crosslinking group is a group represented by formula (II). The preferred range is also the same.

[2-8. Glass Transition Temperature and Other Physical Properties]

The glass transition temperature and ionization potential of the conjugated polymer (I') of the present invention are the same as those described in [1-8. Glass Transition Temperature and Other Physical Properties]. Preferred ranges are also the same.

<3. Particularly Preferred Conjugated Polymer>

In view of high charge transportability and excellent redox stability, the conjugated polymer of the present invention is preferably a conjugated polymer having at least one repeating unit selected from the group consisting of the following Repeating Unit Family A and at least one repeating unit selected from the group consisting of the following Repeating Unit Family B, which is a conjugated polymer having a weight average molecular weight (Mw) of 20,000 or more and a dispersity (Mw/Mn) of 2.40 or less.

<Repeating Unit Family A>

[Chem. 32]

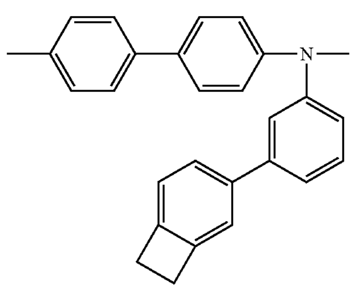

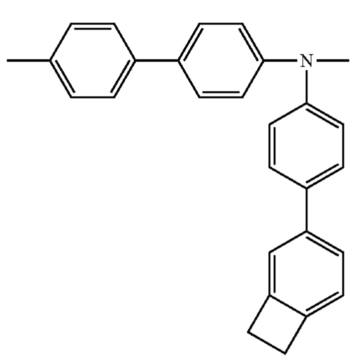

-continued

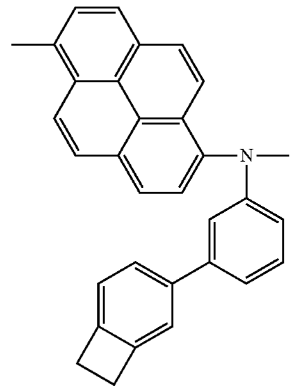

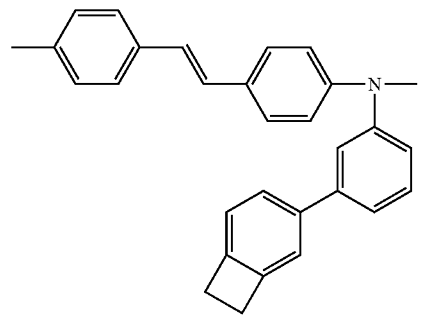

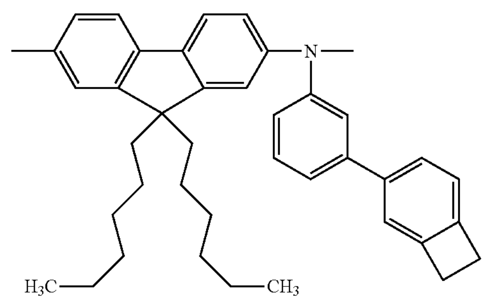

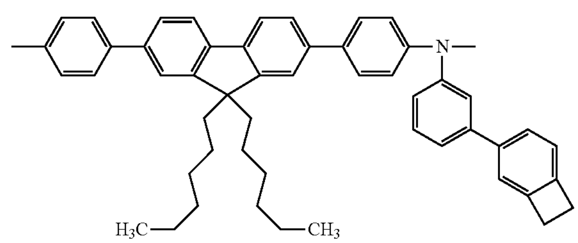

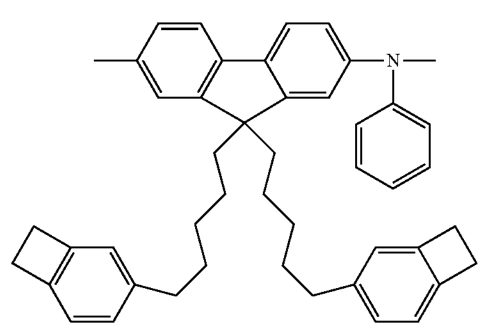

-continued
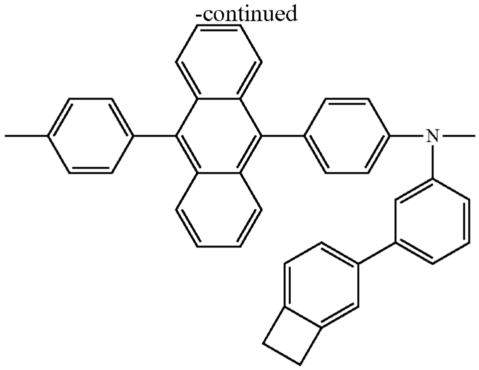
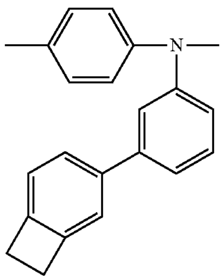
<Repeating Unit Family B>
[Chem. 33]
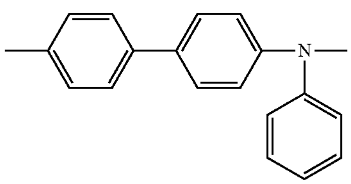
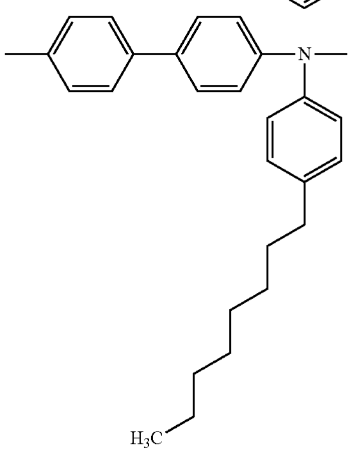
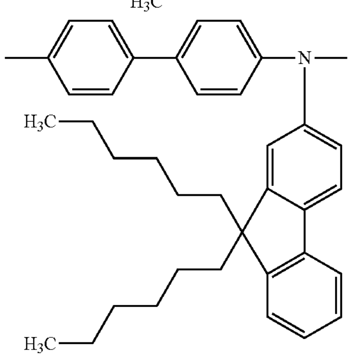
-continued
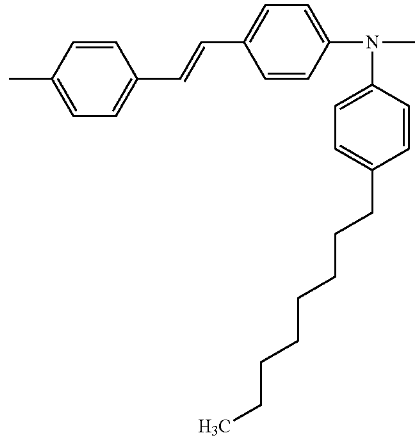
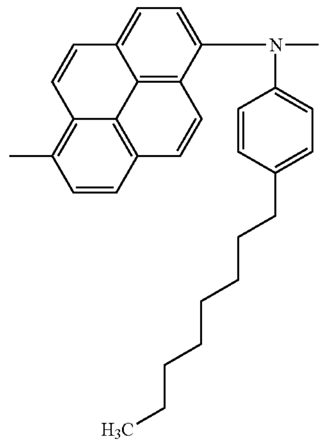
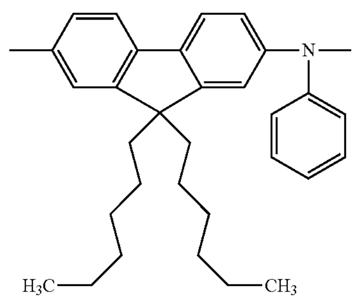
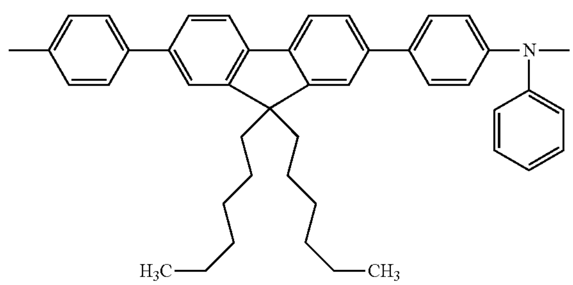
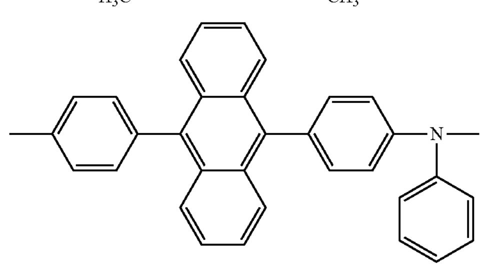

-continued

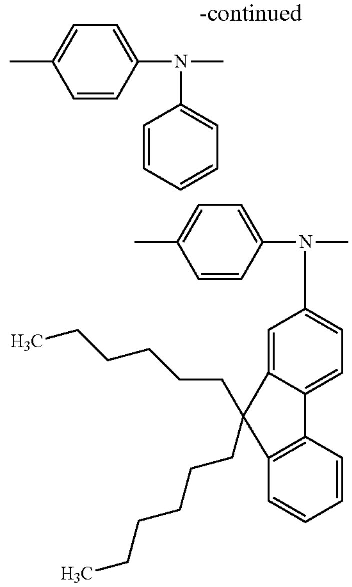

<4. Synthesis Method of Conjugated Polymer of the Present Invention>

The conjugated polymer of the present invention can be synthesized using a known method after selecting raw materials according to the structure of the target compound, but in view of easy control of the molecular weight distribution, the polymer is preferably synthesized by the method described in <5. Production Process of Polymer> below.

<5. Production Process of Polymer>

The polymer production process of the present invention is characterized by comprising a step of reacting arylamines represented by the following formula (I-1) and aryls represented by the following formula (I-2) in the presence of a palladium compound, a phosphine compound and a base to cause a condensation reaction between a part of the arylamines and the aryls, and a step of additionally adding aryls represented by the following formula (I-2) to further cause a polymerization reaction:

[Chem. 34]

$$Ar^1—NH_2 \tag{I-1}$$

$$X—Ar^2—X \tag{I-2}$$

(wherein each of $Ar^1$ and $Ar^2$ independently represents an aromatic hydrocarbon group which may have a substituent, or an aromatic heterocyclic group which may have a substituent, and X represents an elimination group).

When the polymer production process of the present invention is used, a polymer having stable performances and a narrow molecular weight distribution can be produced.

One kind of the arylamines represented by formula (I-1) and one kind of the aryls represented by formula (I-2) may be polymerized, or two or more kinds of the arylamines and two or more kinds of the aryls may be polymerized.

[5-1. $Ar^1$ and $Ar^2$]

Each of $Ar^1$ and $Ar^2$ independently represents an aromatic hydrocarbon group which may have a substituent, or an aromatic heterocyclic group which may have a substituent Specific preferred examples of $Ar^1$ include those set forth in <Specific Examples of $Ar^{13}$ and $Ar^{15}$>.

Also, specific preferred examples of $Ar^2$ include those set forth in <Specific Examples of $Ar^{11}$, $Ar^{12}$ and $Ar^{14}$>.

[5-2. Initial Amount Added (Initial Abundance) of Aryls Represented by Formula (I-2)]

The initial addition of aryls represented by formula (I-2) may be at the same time as that of arylamines represented by formula (I-1) or may be after mixing with a catalyst and the like. An initial addition at the same time is preferred in view of unfailingly contributing to the initial amount added of aryls represented by formula (I-2).

The amount added of aryls represented by formula (I-2) at the initiation of reaction is, based on arylamines represented by formula (I-1), usually 75 mol % or less, preferably 65 mol % or less, more preferably 55 mol % or less, and is usually 20 mol % or more, preferably 30 mol % or more, more preferably 40 mol % or more. If the amount added of the aryls represented by formula (I-2) exceeds the upper limit above, the weight average molecular weight may not fall in the above-described range, whereas if the amount added is less than the lower limit, the residual amount of monomers may increase.

[5-3. Method for Adding Aryls Represented by Formula (I-2)]

In additionally adding aryls represented by formula (I-2), the aryls are preferably added little by little in parts up to the below-described specific amount (entire addition amount) while confirming the progress of the polymerization reaction. The single addition amount of aryls represented by formula (I-2) which is added in parts may vary depending on the progress degree of polymerization but is usually 48 mol % or less, preferably 45 mol % or less, and is usually 1 mol % or more.

The specific amount (entire addition amount) of the aryls represented by formula (I-2) is usually 80 mol % or more and usually 110 mol % or less, based on the amount added of the arylamines represented by formula (I-1).

[5-4. Reasons Why the Effects of the Present Invention are Obtained]

Here, unlike conventional production processes, why the effects of the present are obtained by the production process of the present invention is described by referring to the repeating unit represented by formula (I).

An arylamine moiety in the repeating unit represented by formula (I) is unfailingly formed by adding from 20 to 75 mol % of aryls represented by formula (I-2), and the polymerization reaction is then initiated by adding aryls represented by formula (I-2). Thanks to this addition method, the polymerization reaction smoothly proceeds and, for example, a polymer having a weight average molecular weight (Mw) of 20,000 or more can be formed with a dispersity of 2.40 or less.

Furthermore, by the polymer production process of the present invention, the ratio of the insolubilizing group contained in the polymer can be adjusted. By setting the weight average molecular weight (Mw) to the above-described range, the probability of allowing an insolubilizing group to be contained in the polymer chain rises, as a result, good deposition can be achieved. If the weight average molecular weight (Mw) is out of the range above, it is presumed that the probability of allowing an insolubilizing group to be contained in the polymer chain decreases and a low insolubilization ratio results.

[5-5. Elimination Group]

In formula (I-2), X represents an elimination group. The “elimination group” as used in the present invention indicates an atom or atomic group that is released in a desorption reaction or a condensation reaction.

The elimination group is not particularly limited, but examples thereof include halogens and esters such as phosphoric acid esters, sulfonic acid esters and carboxylic acid esters. Among these, halogens and sulfonic acid esters are preferred and in the light of having appropriate reactivity, halogens are more preferred.

[5-6. Catalyst]

The catalyst used in the polymer production process of the present invention includes a palladium compound and a phosphine compound. Examples of the palladium compound include a tetravalent palladium compound such as sodium hexachloropalladate(IV) tetrahydrate and potassium hexachloropalladate(IV), a divalent palladium such as palladium(II) chloride, palladium(II) bromide, palladium(II) acetate, palladium(II) acetylacetonate, palladium(II) dichlorobis(benzonitrile), palladium(II) dichlorobis(acetonitrile), palladium(II) dichlorobis(triphenylphosphine), palladium (II) dichlorobis(tri-o-tolylphosphine), palladium(II) dichlorobis(cycloocta-1,5-diene) and palladium(II) trifluoroacetate, and a zerovalent palladium such as dipalladium(0) tris (dibenzylidene acetone), dipalladium(0) tris(dibenzylidene acetone)-chloroform complex and palladium(0) tetrakis (triphenylphosphine), with a zerovalent palladium being preferred because of its high reactivity.

The amount used of the palladium compound for use in the polymer production process of the present invention is, in terms of palladium, usually 0.01 mol % or more, preferably 0.02 mol % or more, and usually 20 mol % or less, preferably 5 mol % or less, based on the arylamines of formula (I-2).

The phosphine compound used in the polymer production process of the present invention includes a trialkylphosphine compound, and examples thereof include triethylphosphine, tricyclohexylphosphine, triisopropylphosphine, tri-n-butylphosphine, triisobutylphosphine and tri-tert-butylphosphine, with tri-tert-butylphosphine being preferred.

The amount used of the phosphine compound is preferably 0.1 times by mol or more and preferably 10 times by mol or less, based on the palladium compound.

[5-7. Base]

The base for use in the polymer production process of the present invention is not particularly limited and includes a carbonate of sodium, potassium, cesium or the like and an alkoxide of an alkali metal such as lithium, sodium and potassium, but an alkali metal alkoxide is preferred.

The amount of the base used is usually 0.5 times by mol or more, preferably 1 times by mol or more, and usually 10 times by mol or less, based on aryls represented by formula (I-2).

[5-8. Solvent]

The solvent for use in the polymer production process of the present invention is sufficient if it is usually inert to reaction and does not inhibit the reaction. Examples thereof include an aromatic hydrocarbon-based solvent such as toluene and xylene, an ether-based solvent such as tetrahydrofuran and dioxane, acetonitrile, dimethylformamide, and dimethylsulfoxide. Among these, an aromatic hydrocarbon-based solvent such as toluene and xylene is preferred.

In the polymer production process of the present invention, the reaction temperature is not particularly limited so long as it is a temperature at which the polymer can be produced, but the reaction temperature is usually 20° C. or more, preferably 50° C. or more, and is usually 300° C. or less, preferably 200° C. or less.

As for the purification method of the obtained polymer, known techniques including the methods described in *Bunri Seisei Gijutsu Handbook* (*Handbook of Separation Purification Technology*), edited by CSJ (1993), *Kagaku Henkan-ho ni yoru Biryou Seibun oyobi Nan-Seisei Busshitsu no Kodo Bunri* (*Altitude Separation by Chemical Conversion Method for Trace Components and Substances Difficult of Purification*), IPC (1988), and "Bunri to Seisei (Separation and Purification" of *Jikken Kagaku Koza* (*Dai* 4-*Han*) 1 (*Experimental Chemistry Course* (4*th ed.*) 1), CSJ (1990), can be used. Specific examples of the purification method include extraction (including suspension washing, boiling washing, ultrasonic washing, acid-base washing), adsorption, occlusion, melting, crystallization (including recrystallization or reprecipitation from solvent), distillation (distillation under normal pressure, distillation under reduced pressure), evaporation, sublimation (sublimation under normal pressure, sublimation under reduced pressure), ion exchange, dialysis, filtration, ultrafiltration, reverse osmosis, pressure osmosis, band dissolution, electrophoresis, centrifugation, floatation, precipitation separation, magnetic separation, and various kinds of chromatography (form classification: column, paper, thin-layer, capillary; mobile phase classification: gas, liquid, micelle, supercritical fluid; separation mechanism: adsorption, partition, ion exchange, molecular sieve, chelate, gel filtration, exclusion, affinity).

As regards the method for identifying a product and analyzing purity, there may be appropriately employed, if desired, a gas chromatograph (GC), a high-performance liquid chromatograph (HPLC), a high-speed amino acid analyzer (organic compound), a capillary electrophoretic measurement (CE), a size exclusion chromatograph (SEC), a gel permeation chromatograph (GPC), a cross-fractionation chromatograph (CFC), a mass spectroscopy (MS, LC/MS, GC/MS, MS/MS), a nuclear magnetic resonator (NMR (1HNMR, 13CNMR)), a Fourier transform infrared spectrophotometer (FT-IR), an ultraviolet visible near-infrared spectrophotometer (UV.VIS, NIR), an electron spin resonator (ESR), a transmission electron microscope (TEM-EDX), an electron probe microanalyzer (EPMA), a metal element analysis (ion chromatograph, inductively-coupled plasma-emission spectrometry (ICP-AES), atomic absorption spectrometry (AAS), fluorescent X-ray analyzer (XRF)), a non-metal element analysis, or a trace analysis (ICP-MS, GF-AAS, GD-MS).

[5-9. Polymer Produced by Polymer Production Process of the Present Invention, Use, etc.]

The polymer produced by the polymer production process of the present invention (hereinafter, sometimes simply referred to as a "polymer by the present invention") has a large weight average molecular weight (Mw) and a small dispersity (Mw/Mn).

Therefore, the polymer by the present invention has excellent solubility for solvent and high charge transportability and can be suitably used as an organic electroluminescence element material.

Examples of the repeating unit contained in the polymer produced by the polymer production process of the present invention include those set forth in <Repeating Unit Family C> and <Repeating Unit Family D>.

Other examples include those set forth in the following <Other Repeating Unit Family K>, but the present invention is not limited thereto.

<Repeating Unit Family K>

[Chem. 35]

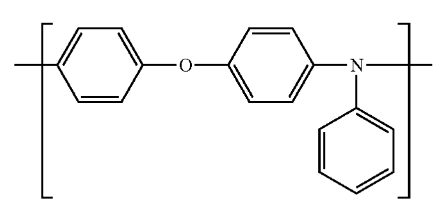

-continued

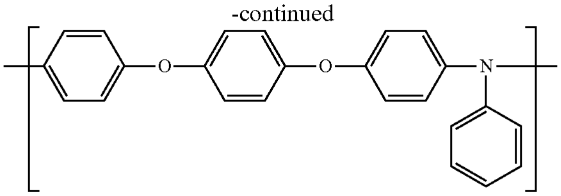

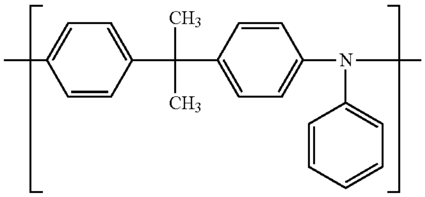

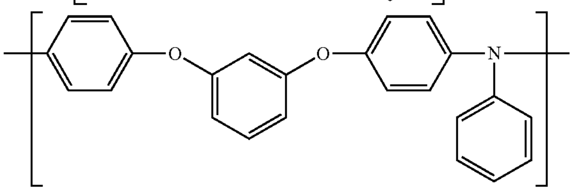

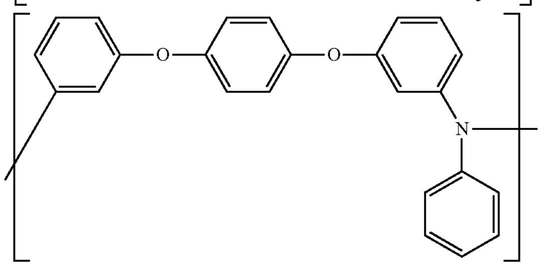

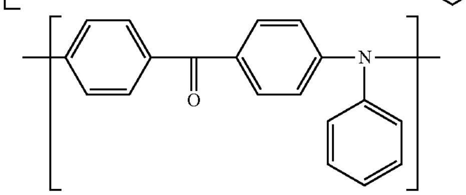

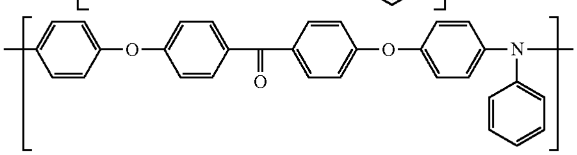

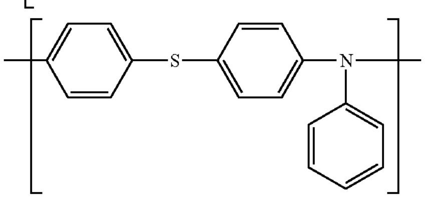

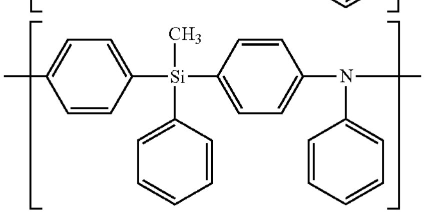

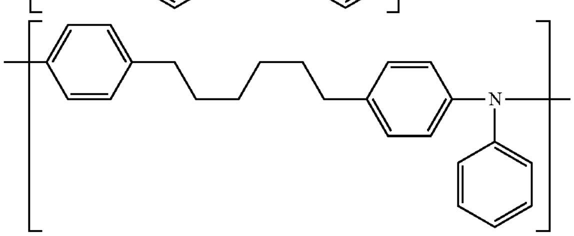

-continued

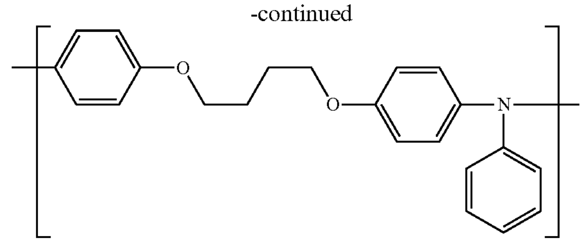

[5-10. Synthesis of Conjugated Polymer of the Present Invention]

The method for producing the conjugated polymer (I) of the present invention by the polymer production process of the present invention is described below.

For example, when m is 1, $Ar^2$ in formula (I-2) becomes as follows.

[Chem. 36]

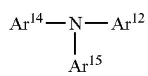

Similarly, for example, when m is 2, $Ar^2$ in formula (I-2) becomes as follows.

[Chem. 37]

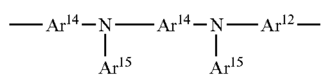

<6. Use of Conjugated Polymer>

The conjugated polymer of the present invention is preferably used as a charge transport material, more preferably as an organic electroluminescence element material. In the case of use as an organic electroluminescence element material, the conjugated polymer is preferably used as a charge transport material of a hole injection layer and/or a hole transport layer in an organic electroluminescence element.

Furthermore, the conjugated polymer of the present invention is preferably used for an organic layer formed by a wet film formation method, because an organic electroluminescence element can be easily produced.

[7. Insolubilized Polymer]

The conjugated polymer of the present invention, when having in its molecule an insolubilizing group or a group represented by formula (II), can form an insolubilized polymer by causing an insolubilization reaction under heating and/or irradiation with active energy such as light, as described below in Composition of Organic electroluminescence element. The insolubilized polymer is, as described in detail below, preferably used as a hole injection layer and/or a hole transport layer.

The insolubilization ratio of the insolubilized polymer of the present invention is, as measured by the method described in the following [Method for Measuring Insolubilization Ratio], usually 70% or more, preferably 80% or more, and is usually 120% or less, preferably 110% or less. Within this range, the layer containing the insolubilized polymer can be kept from mixing with a layer formed on the organic layer by a wet film formation method, and no effect is advantageously imposed on the characteristics of the obtained device.

[7-1. Method for Measuring Insolubilization Ratio]

The insolubilization ratio as used in the present invention is a value obtained by measuring film thicknesses L1 and L2 by the following methods and calculating L2/L1.

[7-1-1. Deposition Method and Measuring Method of Film Thickness L1]

A glass substrate of 25 mm×37.5 mm in size is washed with ultrapure water, dried with dry nitrogen and then subjected to UV/ozone cleaning.

The measurement sample (usually a solution prepared such that the solid content concentration of the compound to be measured becomes 1 wt %) is spin-coated on the glass substrate to form a film.

Spin coating conditions are as follows.

[Spin Coating Conditions]

Temperature: 23° C.

Relative humidity: 60%

Spinning speed of spinner: 1,500 rpm

Spinning time of spinner: 30 seconds

After coating, the film is dried by heating at 80° C. for 1 minute and then dried by heating at 230° C. for 60 minutes. The obtained film is scraped to a width of about 1 mm and measured for the film thickness L1 (nm) by a film thickness meter (Tencor P-15, manufactured by KLA-Tencor).

[7-1-3. Measuring Method of Film Thickness L2]

The substrate after the measurement of film thickness L1 is set on a spinner, and the same solvent as the solvent used for the measurement sample is dropped on the portion where the film thickness is measured. After 10 seconds, spin coating is performed in the same manner as in <Spin Coating conditions>. Subsequently, the film thickness L2 (nm) of the same portion is again measured, and the insolubilization ratio L2/L1 is calculated.

<8. Composition for Organic Electroluminescence Element>

The composition for organic electroluminescence elements of the present invention is a composition containing at least one kind of the conjugated polymer of the present invention.

In an organic electroluminescence element having an organic layer disposed between an anode and a cathode, the composition for organic electroluminescence elements of the present invention is used as a coating solution usually when forming the organic layer by a wet film formation method. The composition for organic electroluminescence elements of the present invention is preferably used to form a hole transport layer out of the organic layers.

Incidentally, in an organic electroluminescence element, when one layer is provided between an anode and a light emitting layer, the layer is referred to as a "hole transport layer"; and when two or more layers are provided, the layer adjacent to the anode is referred to as a "hole injection layer", and other layers are collectively referred to as a "hole transport layer". Also, the layers provided between an anode and a light emitting layer are sometimes collectively referred to as a "hole injection/transport layer".

The composition for organic electroluminescence elements of the present invention is characterized by containing the conjugated polymer of the present invention and usually further contains a solvent.

The solvent preferably dissolves the conjugated polymer of the present invention, and this is usually a solvent capable of dissolving the conjugated polymer in an amount of 0.05 wt % or more, preferably 0.5 wt % or more, more preferably 1 wt % or more, at ordinary temperature.

Incidentally, the composition for organic electroluminescence elements of the present invention may contain only one kind of the conjugated polymer of the present invention or may contain two or more kinds thereof.

The composition for organic electroluminescence elements of the present invention contains the conjugated polymer of the present invention in an amount of usually 0.01 wt % or more, preferably 0.05 wt % or more, more preferably 0.1 wt % or more, and usually 50 wt % or less, preferably 20 wt % or less, more preferably 10 wt % or less.

The composition for organic electroluminescence elements of the present invention may contain an electron-accepting compound, if desired. Also, the composition may contain an additive such as various additives for accelerating the insolubilization reaction to reduce the solubility of the layer formed using the composition and enable coating of other layers on the hole transport layer. In this case, it is preferred to use a solvent capable of dissolving the conjugated polymer of the present invention and the additive both in an amount of 0.05 wt % or more, preferably 0.5 wt % or more, more preferably 1 wt % or more.

Examples of the additive for accelerating the insolubilization reaction of the conjugated polymer of the present invention, which is contained in the composition for organic electroluminescence elements of the present invention, include a polymerization initiator and a polymerization accelerator, such as alkylphenone compound, acylphosphine oxide compound, metallocene compound, oxime ester compound, azo compound and onium salt; and a photosensitizer such as condensed polycyclic hydrocarbon, porphyrin compound and diaryl ketone compound. One of these may be used alone, or two or more thereof may be used in combination.

The composition for organic electroluminescence elements of the present invention, when used for forming a hole injection layer, preferably further contains an electron-accepting compound so as to reduce the resistance.

The electron-accepting compound is preferably a compound having oxidizing power and capability of accepting one electron from the above-described hole-transporting compound. Specifically, a compound having an electron affinity of 4 eV or more is preferred, and a compound having an electron affinity of 5 eV or more is more preferred.

Examples of the electron-accepting compound include an organic group-substituted onium salt such as 4-isopropyl-4'-methyldiphenyliodonium tetrakis(pentafluorophenyl)borate, iron(III) chloride (JP-A-11-251067), a high-valence inorganic compound such as ammonium peroxodisulfate, a cyano compound such as tetracyanoethylene, an aromatic boron compound such as tris(pentafluorophenyl)borane (JP-A-2003-31365), a fullerene derivative, and iodine.

Among these compounds, an organic group-substituted onium salt and a high-valence inorganic compound are preferred because of their strong oxidizing power. Also, an organic group-substituted onium salt, a cyano compound, an aromatic boron compound and the like are preferred in view of their high solubility for various solvents to allow application to form a film by a wet film formation method.

Specific examples of the organic group-substituted onium salt, the cyano compound and the aromatic boron compound, which are suitable as an electron-accepting compound, include those described in International Publication WO2005/089024, pamphlet, and preferred examples thereof are also the same. For example, the electron-accepting compound includes a compound represented by the following structural formula, but the present invention is not limited thereto.

[Chem. 38]

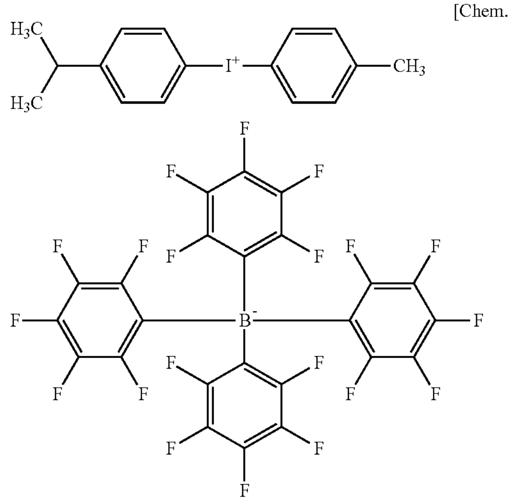

As for the electron-accepting compound, one kind of a compound may be used alone, or two or more kinds of compounds may be used in an arbitrary combination and an arbitrary ratio.

The solvent contained in the composition for organic electroluminescence elements of the present invention is not particularly limited, but the solvent needs to dissolve the conjugated polymer of the present invention and in this respect, preferred examples of the solvent include an organic solvent including an aromatic compound such as toluene, xylene, mesitylene and cyclohexylbenzene; a halogen-containing solvent such as 1,2-dichloroethane, chlorobenzene and o-dichlorobenzene; an ether-based solvent such as aliphatic ether (e.g., ethylene glycol dimethyl ether, ethylene glycol diethyl ether, propylene glycol-1-monomethyl ether acetate (PGMEA)) and aromatic ether (e.g., 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole); an aliphatic ester such as ethyl acetate, n-butyl acetate, ethyl lactate and n-butyl lactate; and an ester-based solvent such as phenyl acetate, phenyl propionate, methyl benzoate, ethyl benzoate, isopropyl benzoate, propyl benzoate and n-butyl benzoate. One of these solvents may be used alone, or two or more thereof may be used in combination.

In the composition for organic electroluminescence elements of the present invention, the concentration of the solvent contained in the composition is usually 10 wt % or more, preferably 50 wt % or more, more preferably 80 wt % or more.

Incidentally, it is widely known that water is likely to promote performance deterioration of an organic electroluminescence element, particularly luminance reduction at the continuous driving. In order to reduce the water remaining in the coating film as much as possible, out of the solvents above, the solvent is preferably a solvent in which the solubility of water at 25° C. is 1 wt % or less, more preferably 0.1 wt % or less.

The solvent contained in the composition for organic electroluminescence elements of the present invention includes a solvent having a surface tension at 20° C. of less than 40 dyn/cm, preferably 36 dyn/cm or less, more preferably 33 dyn/cm or less.

That is, in the case of forming an insolubilized layer in the present invention by a wet film formation method, affinity for the underlying layer is important. The uniformity of film quality greatly affects the luminous uniformity and stability of an organic electroluminescence element and therefore, the coating solution used in the wet film formation method is required to have a surface tension sufficiently low to enable formation of a uniform coating film with high leveling. By using such a solvent, the insolubilized layer in the present invention can be uniformly formed.

Specific examples of the solvent having such a low surface tension include an aromatic solvent such as toluene, xylene, methylene and cyclohexylbenzene; an ester-based solvent such as ethyl benzoate; an ether-based solvent such as anisole; trifluoromethoxyanisole; pentafluoromethoxybenzene; 3-(trifluoromethyl)anisole; and ethyl(pentafluorobenzoate), which are described above.

The concentration of such a solvent in the composition is usually 10 wt % or more, preferably 30 wt % or more, more preferably 50 wt % or more.

The solvent contained in the composition for organic electroluminescence elements of the present invention also includes a solvent having a vapor pressure at 25° C. of 10 mmHg or less, preferably 5 mmHg or less, and usually 0.1 mmHg or more. By using such a solvent, a composition suitable for the process of producing an organic electroluminescence element by a wet film formation method and adequate for the property of the conjugated polymer of the present invention can be prepared. Specific examples of this solvent include an aromatic solvent such as toluene, xylene and methylene, an ether-based solvent and an ester-based solvent, which are described above. The concentration of the solvent in the composition is usually 10 wt % or more, preferably 30 wt % or more, more preferably 50 wt % or more.

The solvent contained in the composition for organic electroluminescence elements of the present invention includes a mixed solvent of a solvent having a vapor pressure at 25° C. of 2 mmHg or more, preferably 3 mmHg or more, more preferably 4 mmHg or more (the upper limit is preferably 10 mmHg or less), and a solvent having a vapor pressure at 25° C. of less than 2 mmHg, preferably 1 mmHg or less, more preferably 0.5 mmHg or less. By using such a mixed solvent, a homogenous layer containing the conjugated polymer of the present invention and further containing an electron-accepting compound can be formed by a wet film formation method. The concentration of such a mixed solvent in the composition is usually 10 wt % or more, preferably 30 wt % or more, more preferably 50 wt % or more.

In an organic electroluminescence element, a large number of layers composed of an organic compound are formed by stacking the layers and therefore, uniform film quality is very important. In the case of forming a layer by a wet film formation method, a known deposition method such as coating method (e.g., spin coating, spray) and printing method (e.g., inkjet, screen) may be applied according to the material or the property of the underlying layer. For example, the spray method is effective for formation of a uniform film on an uneven surface and therefore, is preferably used when providing a layer composed of an organic compound on a surface left with unevenness due to partition between electrodes or pixels. In the case of coating by spray method, the droplet of the coating solution jetted to the coated surface from a nozzle is preferably as small as possible, because a uniform film quality is obtained. In this respect, it is preferred to mix a solvent having high vapor pressure in the coating solution and provide a state where the solvent is partially volatilized from the coating droplet after jetting in the coating atmosphere and a fine droplet is thereby produced immediately before attaching to the substrate. Furthermore, in order to obtain a more uniform film quality, the time for leveling of the liquid film produced on the substrate immediately after coating needs to be ensured and for achieving this purpose, a technique of incorporating a solvent harder to dry, that is, a solvent having low vapor pressure, to a certain extent is employed.

Specific examples of the solvent having a vapor pressure at 25° C. of 2 to 10 mmHg include an organic solvent such as xylene, anisole, cyclohexanone and toluene. Specific examples of the solvent having a vapor pressure at 25° C. of less than 2 mmHg include ethyl benzoate, methyl benzoate, tetralin and phenetole.

In the mixed solvent, the ratio of the solvent having a vapor pressure at 25° C. of 2 mm Hg or more is 5 wt % or more, preferably 25 wt % or more, but less than 50 wt %, based on the total amount of the mixed solvent, and the ratio of the solvent having a vapor pressure at 25° C. of less than 2 mm Hg is 30 wt % or more, preferably 50 wt % or more, more preferably 75 wt % or more, but less than 95 wt %, based on the total amount of the mixed solvent.

Incidentally, in an organic electroluminescence element, a large number of layers composed of an organic compound are formed by stacking them and therefore, all of these layers are required to be a uniform layer. In the case of layer formation by a wet film formation method, water is mixed in the solution (composition) for layer formation and in turn, water may be mixed in the coating film to impair the film uniformity. Therefore, the water content in the solution is preferably as small as possible. More specifically, the amount of water contained in the organic electroluminescence element composition is preferably 1 wt % or less, more preferably 0.1 wt % or less, more preferably 0.05 wt % or less.

Furthermore, in an organic electroluminescence element, many materials that are seriously deteriorated by water, such as cathode, are used and also in view of device deterioration, the presence of water is not preferred. Examples of the method for reducing the amount of water in the solution include the use of a nitrogen gas seal or a desiccant, the dehydration of a solvent in advance, and the use of a solvent in which the solubility of water is low. Above all, in the case of using a solvent in which the solubility of water is low, a phenomenon that a solution coating film absorbs water in the atmosphere and is whitened during the coating process can be prevented, and this is preferred.

From such a viewpoint, in the composition for organic electroluminescence elements of the present invention, a solvent in which the solubility of water at 25° C. is, for example, 1 wt % or less (preferably 0.1 wt % or less), is preferably contained in an amount of 10 wt % or more based on the composition. The solvent satisfying the above-described solubility condition is more preferably contained in an amount of 30 wt % or more, still more preferably 50 wt % or more.

As for the solvent contained in the composition for organic electroluminescence elements of the present invention, in addition to the above-described solvents, other various solvents may be contained, if desired. Examples of other solvents include amides such as N,N-dimethylformamide and N,N-dimethylacetamide; and dimethylsulfoxide.

Furthermore, the composition for organic electroluminescence elements of the present invention may contain various additives such as coatability improver (e.g., leveling agent, antifoaming agent).

[Deposition Method]

As described above, in an organic electroluminescence element, a large number of layers composed of an organic compound are formed by stacking them and therefore, uniform film quality is very important. In the case of forming a layer by a wet film formation method, a known deposition method such as coating method (e.g., spin coating, spray) and printing method (e.g., inkjet, screen) may be employed according to the material or the property of the underlying layer.

In the case of using a wet film formation method, the conjugated polymer of the present invention and other components (for example, an electron-accepting compound, an additive for accelerating the insolubilization reaction, and a coatability improver) used, if desired, are dissolved in an appropriate solvent to prepare the above-described composition for an organic electroluminescence element. This composition is coated on a layer working out to the underlying layer of the layer to be formed, by a method such as spin coating or dip coating, and the coating is dried and then insolubilized, whereby the insolubilized layer in the present invention is formed.

In converting the conjugated polymer of the present invention into an insolubilized polymer by insolubilization reaction, heating is usually performed.

The method for heating is not particularly limited but, for example, drying by heating is employed. As for the conditions in drying by heating, the layer formed using the composition for organic electroluminescence elements of the present invention is heated usually at 120° C. or more and preferably at 400° C. or less.

The heating time is usually 1 minute or more and preferably 24 hours or less. The heating device is not particularly limited but, for example, the stack having the formed layer is placed on a hot plate or heated in an oven. For example, conditions such as heating on a hot plate at 120° C. or more for 1 minute or more may be used.

The method for heating is not particularly limited but as for the conditions in drying by heating, the layer formed using the composition for organic electroluminescence elements is heated usually at 100° C. or more, preferably 120° C. or more, more preferably 150° C. or more, and usually at 400° C. or less, preferably 350° C. or less, more preferably 300° C. or less. The heating time is usually 1 minute or more and preferably 24 hours or less. The heating device is not particularly limited but, for example, the stack having the formed layer is placed on a hot plate or heated in an oven. For example, conditions such as heating on a hot plate at 120° C. or more for 1 minute or more may be used.

In the case of irradiation with active energy such as light, examples of the method include a method of irradiating light by directly using an ultraviolet-visible-infrared light source such as ultrahigh pressure mercury lamp, high pressure mercury lamp, halogen lamp and infrared lamp, and a method of irradiating light by using a mask aligner having incorporated thereinto the light source described above or a conveyor-type light irradiation apparatus. The method for irradiation with active energy other than light includes, for example, irradiation using an apparatus capable of irradiating a microwave generated by a magnetron, that is, a so-called microwave oven.

As for the irradiation time, conditions necessary to cause a sufficient insolubilization reaction are preferably set, but the active energy is irradiated usually for 0.1 second or more and preferably for 10 hours or less.

Heating and irradiation with active energy such as light may be performed individually or in combination. In the case of combining these treatments, the order of practicing them is not particularly limited.

Heating and irradiation with active energy such as light are preferably performed in an atmosphere free of water, for example, in a nitrogen gas atmosphere, so as to decrease the amount of water contained in the layer and/or water adsorbed on the surface after practicing such a treatment. In the case of performing heating and/or irradiation with active energy such as light in combination, for the same purpose, it is particularly preferred that at least a process immediately before formation of a light emitting layer is performed in an atmosphere free of water, such as nitrogen gas atmosphere.

<9. Organic Electroluminescence Element>

The organic electroluminescence element of the present invention is an organic electroluminescence element comprising a substrate having thereon an anode, a cathode and one organic layer or two or more organic layers between the anode and the cathode, wherein at least one layer of the organic layers contains the insolubilized polymer of the present invention.

Furthermore, in the organic electroluminescence element of the present invention, the organic layer containing the insolubilized polymer of the present invention (insolubilized layer) is preferably a hole injection layer and/or a hole transport layer.

The insolubilized layer of the present invention is preferably formed by a wet film formation method using the composition for organic electroluminescence elements of the present invention.

Also, the organic electroluminescence element of the present invention preferably has, on the cathode side of the hoe transport layer, a light emitting layer formed by a wet film formation method and further has, on the cathode side of the hole transport layer, a hole injection layer formed by a wet film formation method. That is, in the organic electroluminescence element of the present invention, all of the hole injection layer, the hole transport layer and the light emitting layer are preferably formed by a wet film formation method. In particular, the light emitting layer formed by a wet film formation method is preferably a layer composed of a low molecular material.

FIG. 1 is a cross-sectional view schematically showing one example of the structure of the organic electroluminescence element of the present invention. The organic electroluminescence element shown in FIG. 1 is fabricated by stacking, on a substrate, an anode, a hole injection layer, a hole transport layer, a light emitting layer, a hole blocking layer, an electron injection layer and a cathode in this order. In the case of this configuration, the hole transport layer usually comes under the above-described organic compound-containing layer of the present invention.

[1] Substrate

The substrate works out to a support of the organic electroluminescence element, and, for example, a quartz or glass plate, a metal plate or foil, or a plastic film or sheet is used therefor. Above all, a glass plate or a transparent plate formed of a synthetic resin such as polyester, polymethacrylate, polycarbonate and polysulfone, is preferred. In the case of using a synthetic resin substrate, gas barrier property needs to be noted. If the gas barrier property of the substrate is too small, the organic electroluminescence element may be disadvantageously deteriorated due to outer air passed through the substrate. Therefore, a method of providing a dense silicon oxide film or the like on at least one surface of the synthetic resin substrate and thereby ensuring gas barrier property, is also one of preferred methods.

[2] Anode

The anode fulfills the role of injecting a hole into a layer (for example, a hole injection layer or a light emitting layer) on the later-described light emitting layer side. The anode is usually composed of a metal such as aluminum, gold, silver, nickel, palladium and platinum, a metal oxide such as indium and/or tin oxide, a metal halide such as copper iodide, carbon black, or an electrically conductive polymer such as poly(3-methylthiophene), polypyrrole and polyaniline. Formation of the anode is usually performed by a sputtering method or a vacuum deposition method. In the case of, for example, a fine metal particle such as silver, a fine particle of copper iodide or the like, carbon black, a fine electrically conductive metal oxide particle or a fine electrically conductive polymer powder, the anode can also be formed by dispersing the fine particle in an appropriate binder resin solution and coating the dispersion on the substrate. Furthermore, in the case of an electrically conductive polymer, the anode can also be formed by forming a thin film directly on the substrate through electrolytic polymerization or coating the electrically conductive polymer on the substrate (see, *Applied Physics Letters*, Vol. 60, page 2711, 1992). Also, the anode can be formed by stacking layers composed of different substances.

The thickness of the anode varies depending on the required transparency. In the case where transparency is required, the transmittance for visible light is desirably set to usually 60% or more, preferably 80% or more. In this case, the thickness is usually 5 nm or more, preferably 10 nm or more, and is usually 1,000 nm or less, preferably 500 nm or less. In the case where the anode can be opaque, the anode may be the same as the substrate. Also, a different electrically conductive material may be further stacked on the anode.

For the purpose of removing impurities attached to the anode and adjusting the ionization potential to improve the hole injection performance, the anode surface is preferably subjected to an ultraviolet (UV)/ozone treatment or an oxygen plasma or argon plasma treatment.

[3] Hole Injection Layer

A hole injection layer is formed on the anode.

The hole injection layer is a layer for transporting a hole to a layer adjacent to the cathode side of the anode.

Incidentally, the organic electroluminescence device of the present invention may have a configuration where a hole injection layer is omitted.

The hole injection layer preferably contains a hole-transporting compound, more preferably a hole-transporting compound and an electron-accepting compound. Furthermore, the hole injection layer preferably contains a cation radical compound, more preferably a cation radial compound and a hole-transporting compound.

The hole injection layer may contain, if desired, a binder resin or a coatability improve. The binder resin is preferably a resin hardly acting as a trap for electric charge.

Furthermore, the hole injection layer may also be stacked by depositing only an electron-accepting compound by a wet film formation method on the anode and coating a charge transport material composition directly thereon. In this case, a part of the charge transport material composition interacts with the electron-accepting compound, whereby a layer excellent in the hole injection performance is formed.

(Hole Transporting Compound)

The hole-transporting compound is preferably a compound having an ionization potential of 4.5 to 6.0 eV. However, in the case of using a wet film formation method, a compound having high solubility in the solvent used for the wet film formation method is preferred.

The hole-transporting compound is preferably the conjugated polymer of the present invention because of its high depositability and high charge transportability. That is, the layer is preferably formed using the composition for an electroluminescent device of the present invention.

In the case where a compound other than the conjugated polymer of the present invention is used as the hole-transporting compound, examples of the hole-transporting compound include an aromatic amine compound, a phthalocyanine derivative, a porphyrin derivative, an oligothiophene derivative and a polythiophene derivative. Among these, an aromatic amine compound is preferred in view of amorphous nature and transmittance of visible light.

The aromatic amine compound is not limited in its kind and may be a low molecular compound or a polymer compound but from the standpoint of surface smoothing effect, is preferably a polymer compound having a weight average molecular weight of 1,000 to 1,000,000 (a polymerized hydrocarbon compound where repeating units are connected).

Preferred examples of the aromatic tertiary amine polymer compound also include a polymer compound having a repeating unit represented by the following formula (i):

[Chem. 39]

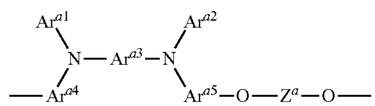

(i)

(wherein each of $Ar^{a1}$ and $Ar^{a2}$ independently represents an aromatic hydrocarbon group which may have a substituent, or an aromatic heterocyclic group which may have a substituent, each of $Ar^{a3}$ to $Ar^{a5}$ independently represents an aromatic hydrocarbon group which may have a substituent, or an aromatic heterocyclic group which may have a substituent, $Z^{a}$ represents a linking group selected from the following linking group family, and out of $Ar^{a1}$ to $Ar^{a5}$, two groups bonded to the same N atom may combine with each other to form a ring).

[Chem. 40]

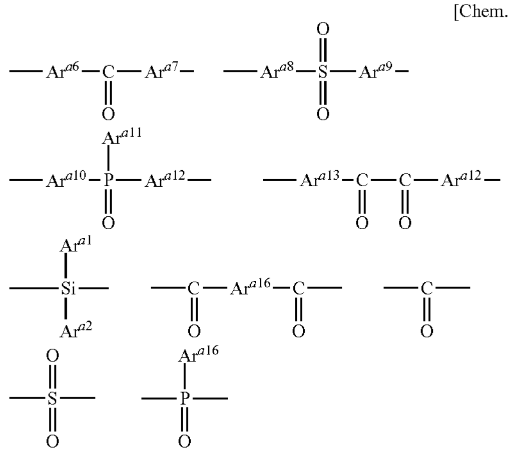

(wherein each of $Ar^{a6}$ to $Ar^{a16}$ independently represent a mono- or di-valent group derived from an aromatic hydrocarbon ring which may have a substituent or an aromatic heterocyclic ring which may have a substituent, and each of $R^{a1}$ and $R^{a2}$ independently represents a hydrogen atom or an arbitrary substituent).

As for $Ar^{1a}$ to $Ar^{a16}$, a mono- or di-valent group derived from an arbitrary aromatic hydrocarbon ring or aromatic heterocyclic ring may be applied. These groups may be the same or different. Also, these groups may further have an arbitrary substituent.

Specific examples of the aromatic tertiary amine polymer compound having a repeating unit represented by formula (i) include the compounds described in International Publication No. 2005/089024, pamphlet.

With respect to the hole-transporting compound used as the material of the hole injection layer, any one kind of a compound out of these compounds may be contained alone, or two or more kinds thereof may be contained.

In the case of containing two or more kinds of hole-transporting compounds, the compounds may be arbitrarily combined, but one kind of or two or more kinds of aromatic tertiary amine polymer compounds and one kind of or two or more kinds of other hole-transporting compounds are preferably used in combination.

(Electron-Accepting Compound)

The electron-accepting compound is the same as that described in <Composition for Organic electroluminescence element>. Specific preferred examples are also the same.

(Cation Radical Compound)

The cation radical compound is preferably an ionic compound composed of a cation radical that is a chemical species produced by removing one electron from a hole-transporting compound, and a counter anion. However, in the case where the cation radical is derived from a hole-transportable polymer compound, the cation radical becomes a structure produced by removing one electron from a repeating unit of the polymer compound.

The cation radical is preferably a chemical species produced by removing one electron from the compound described above as the hole-transporting compound. In view of amorphous nature, transmittance of visible light, heat resistance, solubility and the like, a chemical species produced by removing one electron from the compound preferred as the hole-transporting compound is suitable.

The cation radical compound can be produced by mixing the above-described hole-transporting compound and the above-described electron-accepting compound. That is, when the above-described hole-transporting compound and the above-described electron-accepting compound are mixed, transfer of an electron from the hole-transporting compound to the electron-accepting compound occurs, as a result, a cation ionic compound composed of a cation radical of the hole-transporting compound and a counter anion is produced.

A polymer compound-derived cation radical compound such as PEDOT/PSS (*Adv. Mater.*, Vol. 12, page 481, 2000) and emeraldine hydrochloride (*J. Phys. Chem.*, Vol. 94, page 7716, 1990) is also produced by oxidative polymerization (dehydrogenative polymerization).

The oxidative polymerization as used herein means to chemically or electrochemically oxidize a monomer in an acidic solution by using peroxodisulfate or the like. In the case of oxidative polymerization (dehydrogenative polymerization), the monomer is polymerized by oxidation and at the same time, a cation radical in which one electron is removed from a repeating unit of the polymer, with the counter anion being an anion derived from the acidic solution, is produced.

The hole injection layer is formed by the method described in [Deposition Method] above or may also be formed by a dry deposition method such as vacuum deposition.

The film thickness of the hole injection layer is usually 5 nm or more, preferably 10 nm or more, and is usually 1,000 nm or less, preferably 500 nm or less.

Incidentally, the content of the electron-accepting compound in the hole injection layer is, based on the hole-injecting compound, usually 0.1 mol % or more, preferably 1 mol % or more, but is usually 100 mol % or less, preferably 40 mol % or less.

(Other Constituent Materials)

With respect to the material of the hole injection layer, in addition to the above-described hole-transporting compound and electron-accepting compound, other components may be further contained as long as the effects of the present invention are not seriously impaired. Examples of other components include various light emitting materials, electron-transporting compounds, binder resins and coatability improvers. Incidentally, as for the other component, only one kind of a component may be used, or two or more kinds of components may be used in an arbitrary combination and an arbitrary ratio.

(Solvent)

Out of the solvents in the composition for the formation of a hole injection layer used in a wet film formation method, at least one solvent is preferably a compound capable of dissolving the above-described constituent materials of the hole injection layer. Also, the boiling point of this solvent is usually 110° C. or more, preferably 140° C. or more, more preferably 200° C. or more, and is usually 400° C. or less, preferably 300° C. or less. If the boiling point of the solvent is too low, drying proceeds at a too high rate and the film quality may deteriorate, whereas if the boiling point of the solvent is excessively high, the temperature in the drying step needs to be raised and this may adversely affect other layers or substrate.

Examples of the solvent include an ether-based solvent, an ester-based solvent, an aromatic hydrocarbon-based solvent and an amide-based solvent.

Examples of the ether-based solvent include an aliphatic ether such as ethylene glycol dimethyl ether, ethylene glycol diethyl ether and propylene glycol-1-monomethyl ether acetate (PGMEA); and an aromatic ether such as 1,2-dimethoxybenzene, 1,3-dimethoxybenzene, anisole, phenetole, 2-methoxytoluene, 3-methoxytoluene, 4-methoxytoluene, 2,3-dimethylanisole and 2,4-dimethylanisole.

Examples of the ester-based solvent include an aromatic ester such as phenyl acetate, phenyl propionate, methyl benzoate, ethyl benzoate, propyl benzoate and n-butyl benzoate.

Examples of the aromatic hydrocarbon-based solvent include toluene, xylene, cyclohexylbenzene, 3-isopropylbiphenyl, 1,2,3,4-tetramethylbenzene, 1,4-diisopropylbenzene, cyclohexylbenzene and methylnaphthalene.

Examples of the amide-based solvent include N,N-dimethylformamide and N,N-dimethylacetamide.

In addition, dimethyl sulfoxide and the like may also be used.

Only one of these solvents may be used, or two or more thereof may be used in an arbitrary combination and an arbitrary ratio.

(Deposition Method)

After the preparation of the composition for the formation of a hole injection layer, the composition is coated by wet deposition on a layer (usually node) working out to the underlying layer of the hole injection layer and dried, whereby the hole injection layer is formed.

The temperature in the deposition process is preferably 10° C. or more and preferably 50° C. or less so as to prevent the film from damage due to production of a crystal in the composition.

The relative humidity in the deposition process is not limited as long as the effects of the present invention are not seriously impaired, but the relative humidity is usually 0.01 ppm or more and is usually 80% or less.

After the coating, the film of the composition for the formation of a hole injection layer is usually dried by heating or the like. As for the drying method, a heating process is usually performed. Examples of the heating device used in the heating process include a clean oven, a hot plate, an infrared ray, a halogen heater, and microwave irradiation. Above all, for evenly applying heat to the entire film, a clean oven and a hot plate are preferred.

With respect to the heating temperature in the heating process, as long as the effects of the present invention are not seriously impaired, the film is preferably heated at a temperature not lower than the boiling point of the solvent used in the composition for the formation of a hole injection layer. In the case where the organic electroluminescence element material of the present invention is contained in the hole injection layer, the film is preferably heated at a temperature not lower than the temperature at which the dissociable group dissociates. Also, in the case of containing a mixed solvent, that is, containing two or more kinds of solvents in the composition for the formation of a hole injection layer, the film is preferably heated at a temperature not lower than the boiling point of at least one kind of the solvent. Considering the rise in the boiling point of the solvent, the heating in the heating process is preferably performed at 120° C. or more and preferably 410° C. or less.

In the heating process, as long as the heating temperature is not lower than the boiling solvent in the composition for the formation of a hole injection layer and full insolubilization of the coated film does not occur, the heating time is not limited but is preferably 10 seconds or more and usually 180 minutes or less. If the heating time is too long, the components in other layers tend to diffuse, whereas if it is excessively short, the hole injection layer is liable to be inhomogeneous. Heating may be performed in two parts.

<Formation of Hole Injection Layer by Vacuum Deposition>

In the case of forming the hole injection layer by vacuum deposition, one material or two or more materials out of the constituent materials (for example, the above-described hole-transporting compound and electron-accepting compound) of the hole injection layer are put in a crucible (when using two or more materials, in respective crucibles) placed in a vacuum vessel, the vacuum vessel is evacuated to about $10^{-4}$ Pa by an appropriate vacuum pump, and then the crucible is heated (when using two or more materials, respective crucibles are heated) for evaporation while controlling the amount of evaporation (when using two or more materials, while independently controlling respective amounts of evaporation), whereby a hole injection layer is formed on the anode of the substrate placed to face the crucible. Incidentally, in the case of using two or more materials, a mixture of these materials may be put in a crucible, heated and evaporated to form a hole injection layer.

The degree of vacuum at the vapor deposition is not limited as long as the effects of the present invention are not seriously impaired, but the degree of vacuum is usually $0.1\times10^{-6}$ Torr ($0.13\times10^{-4}$ Pa) or more and is usually $9.0\times10^{-6}$ Torr ($12.0\times10^{-4}$ Pa) or less. The vapor deposition rate is not limited as long as the effects of the present invention are not seriously impaired, but the vapor deposition rate is usually 0.1 Å/sec or more and is usually 5.0 Å/sec or less. The deposition temperature at the vapor deposition is not limited as long as the effects of the present invention are not seriously impaired, but the vapor deposition is performed preferably at 10° C. or more and preferably at 50° C. or less.

The film thickness of the hole injection layer is usually 5 nm or more, preferably 10 nm or more, and is usually 1,000 nm or less, preferably 500 nm or less.

The content of the electron-accepting compound in the hole injection layer is, based on the hole-injecting compound, usually 0.1 mol % or more, preferably 1 mol % or more, but usually 100 mol % or less, preferably 40 mol % or less.

[4] Hole Transport Layer

The hole transport layer can be formed on the hole injection layer when the hole injection layer is provided and can be formed on the anode when the hole injection layer is not provided. Also, the organic electroluminescence element of the present invention may have a configuration where the hole transport layer is omitted.

The material for forming the hole transport layer is preferably a material having high hole transportability and being capable of efficiently transporting the injected hole. Accordingly, the material preferably has small ionization potential, high transparency to visible light, large hole mobility and excellent stability and scarcely generates impurities working out to a trap, during production or use. Also, in many cases, the hole transport is in contact with a light emitting layer and therefore, the material preferably involves no quenching of light emitted from the light emitting layer or no formation of an exciplex with the light emitting layer to reduce the efficiency.

In view of these points, the hole-transporting compound is preferably the conjugated polymer of the present invention. In the case of using, as the hole-transporting compound, a compound other than the conjugated polymer of the present invention, a material conventionally used as a constituent material of the hole transport layer may be used. Examples of the conventionally used material include those described above as examples of the hole-transporting compound for use in the hole injection layer. Other examples include an aromatic diamine containing two or more tertiary amines typified by 4,4'-bis[N-(1-naphthyl)-N-phenylamino]biphenyl, where two or more condensed aromatic rings are substituted on the nitrogen atom (JP-A-5-234681); an aromatic amine compound having a starburst structure, such as 4,4',4"-tris(1-naphthylphenylamino)triphenylamine (*J. Lumin*., Vol. 72-74, page 985, 1997); an aromatic amine compound composed of a tetramer of triphenylamine (*Chem. Commun*., page 2175, 1996); a spiro compound such as 2,2',7,7'-tetrakis-(diphenylamino)-9,9'-spirobifluorene (*Synth. Metals*, Vol. 91, page 209, 1997); and a carbazole derivative such as 4,4'-N,N'-dicarbazolebiphenyl. Still other examples include polyvinylcarbazole, polyvinyltriphenylamine (JP-A-7-53953), and tetraphenylbenzidine-containing polyarylene ether sulfone (*Polym. Adv. Tech*., Vol. 7, page 33, 1996).

In the case of forming the hole transport layer by wet deposition, similarly to the formation of the hole injection layer, a composition for the formation of a hole transport layer is prepared, then coated and dried by heating.

The composition for the formation of a hole transport layer contains a solvent in addition to the above-described hole-transporting compound. The solvent used is the same as that used in the composition for the formation of a hole injection layer. The coating conditions, heating and drying conditions and the like are also the same as in the case of forming the hole injection layer.

Also when forming the hole transport layer by vacuum deposition, the deposition conditions and the like are the same as in the case of forming the hole injection layer.

The hole transport layer may contain, in addition to the hole-transporting compound, various light emitting materials, electron-transporting compounds, binder resins, coatability improvers and the like.

The hole transport layer may also be a layer formed by crosslinking a crosslinking compound. The crosslinking group is a compound having a crosslinking group and forms a polymer by undergoing crosslinking.

Examples of the crosslinking group include a cyclic ether such as oxetane and epoxy; an unsaturated double bond such as vinyl group, trifluorovinyl group, styryl group, acryl group, methacryloyl and cinnamoyl; and benzocyclobutane.

The crosslinking compound may be any of a monomer, an oligomer and a polymer. Only one kind of a crosslinking compounds may be used, or two or more kinds of crosslinking compounds may be used in an arbitrary combination and an arbitrary ratio.

Examples of the crosslinking group include a cyclic ether such as oxetane and epoxy; an unsaturated double bond such as vinyl group, trifluorovinyl group, styryl group, acryl group, methacryloyl and cinnamoyl; and benzocyclobutane.

As for the crosslinking compound, a hole-transporting compound having a crosslinking group is preferably used. Examples of the hole-transporting compound include a nitrogen-containing aromatic compound derivative such as pyridine derivative, pyrazine derivative, pyrimidine derivative, triazine derivative, quinoline derivative, phenanthroline derivative, carbazole derivative, phthalocyanine derivative and porphyrin derivative; a triphenylamine derivative; a silole derivative; an oligothiophene derivative; a condensed polycyclic aromatic derivative; and a metal complex. Among these, a nitrogen-containing aromatic derivative such as pyridine derivative, pyrazine derivative, pyrimidine derivative, triazine derivative, quinoline derivative, phenanthroline derivative and carbazole derivative, a triphenylamine derivative, a silole derivative, a condensed polycyclic aromatic derivative, and a metal complex are preferred, and a triphenylamine derivative is more preferred.

For forming the hole transport layer by crosslinking a crosslinking compound, usually, a composition for the formation of a hole transport layer is prepared by dissolving or dispersing the crosslinking compound in a solvent, then coated by wet deposition and crosslinked.

The composition for the formation of a hole transport layer may contain, in addition to the crosslinking compound, an additive for accelerating the crosslinking reaction. Examples of the additive for accelerating the crosslinking reaction include a polymerization initiator and a polymerization accelerator, such as alkylphenone compound, acylphosphine oxide compound, metallocene compound, oxime ester compound, azo compound and onium salt; and a photosensitizer such as condensed polycyclic hydrocarbon, porphyrin compound and diaryl ketone compound.

Furthermore, the composition may contain, for example, a coatability improver such as leveling agent and antifoaming agent, an electron-accepting compound, and a binder resin.

The composition for the formation of a hole transport layer contains the crosslinking compound in an amount of usually 0.01 wt % or more, preferably 0.05 wt % or more, more preferably 0.1 wt % or more, and usually 50 wt % or less, preferably 20 wt % or less, more preferably 10 wt % or less.

The composition for the formation of a hole transport layer, containing a crosslinking compound in such a concentration, is deposited on the underlying layer (usually, the hole injection layer), and the crosslinking compound is crosslinked under heating and/or irradiation with active energy such as light to produce a network polymer compound.

The conditions such as temperature and humidity at the deposition are the same as those at the wet deposition of the hole injection layer.

The method for heating after deposition is not limited, but examples thereof include drying by heating and drying under reduced pressure. In the case of drying by heating, the heating temperature condition is usually 120° C. or more and preferably 400° C. or less.

The heating time is usually 1 minute or more and preferably 24 hours or less. The heating device is not particularly limited but, for example, the stack having the deposited layer is placed on a hot plate or heated in an oven. For example, conditions such as heating on a hot plate at 120° C. or more for 1 minute or more may be used.

In the case of irradiation with active energy such as light, examples of the method include a method of irradiating light by directly using an ultraviolet-visible-infrared light source such as ultrahigh pressure mercury lamp, high pressure mercury lamp, halogen lamp and infrared lamp, and a method of irradiating light by using a mask aligner having incorporated thereinto the light source described above or a conveyor-type light irradiation apparatus. The method for irradiation with active energy other than light includes, for example, irradiation using an apparatus capable of irradiating a microwave generated by a magnetron, that is, a so-called microwave oven. As for the irradiation time, conditions necessary to reduce the solubility of the film are preferably set, but the active energy is irradiated usually for 0.1 second or more and preferably for 10 hours or less.

Heating and irradiation with active energy such as light may be performed individually or in combination. In the case of combining these treatments, the order of practicing them is not particularly limited.

The film thickness of the hole transport layer is usually 5 nm or more, preferably 10 nm or more, and is usually 1,000 nm or less, preferably 500 nm or less.

[5] Light Emitting Layer

The light emitting layer is formed on the hole transport layer when the hole transport layer is provided, formed on the hole injection layer when the hole transport layer is not provided and the hole injection layer is provided, and formed on the anode when the hole transport layer and the hole injection layer are not provided.

The light emitting layer may be a layer independent of, for example, the above-described hole injection layer and hole transport layer and the later-described hole blocking layer and electron transport layer, but without forming an independent light emitting layer, other organic layers such as hole transport layer and electron transport layer may take the role of the light emitting layer.

The light emitting layer is a layer that is excited and becomes a main luminous source when an electric field is applied between electrodes to induce recombination of a hole injected directly from the anode or through a hole injection layer, a hole transport layer or the like and an electron injected directly from the cathode or through a cathode buffer layer, an electron transport layer, a hole blocking layer or the like.

The light emitting layer can be formed by an arbitrary method as long as the effects of the present invention is not seriously impaired, but the light emitting layer is formed on the anode, for example, by wet deposition of vacuum deposition. However, in the case of producing a luminescent device having a large area, a wet film formation method is preferred. The wet film formation method and the vacuum deposition method may be performed using the same methods for the hole injection layer.

The light emitting layer contains at least a material having a property of emitting light (light emitting material) and preferably contains a material having a property of transporting a hole (hole-transporting compound) or a material having a property of transporting an electron (electron-transporting compound). Furthermore, the light emitting layer may other components without departing from the scope of the invention. From the standpoint of forming the light emitting layer by a wet film formation method as described later, all of these materials are preferably a low molecular material.

As for the light emitting material, an arbitrary known material is applicable. For example, the material may be a fluorescent material or a phosphorescent material, but in view of internal quantum efficiency, a phosphorescent material is preferred.

Incidentally, for the purpose of enhancing the solubility in solvent, it is also important to decrease the molecular symmetry or rigidity of the light emitting material or introduce a lipophilic substituent such as alkyl group.

Examples of the fluorescent dye out of light emitting materials are set forth below, but the fluorescent dye is not limited to the following materials.

Examples of the fluorescent dye giving blue light emission (blue fluorescent dye) include naphthalene, chrysene, perylene, pyrene, anthracene, coumarin, p-bis(2-phenylethenyl)benzene, and derivatives thereof.

Examples of the fluorescent dye giving green light emission (green fluorescent dye) include a quinacridone derivative, a coumarin derivative and an aluminum complex such as Al $(C_9H_6NO)_3$.

Examples of the fluorescent dye giving yellow light emission (yellow fluorescent dye) include rubrene and a perimidone derivative.

Examples of the fluorescent dye giving red light emission (red fluorescent dye) include a DCM (4-(dicyanomethylene)-2-methyl-6-(p-dimethylaminostyryl)-4H-pyran)-based compound, a benzopyran derivative, a rhodamine derivative, a benzothioxanthene derivative and an azabenzothioxanthene.

Specific examples of the phosphorescent material include tris(2-phenylpyridine)indium, tris(2-phenylpyridine)ruthenium, tris(2-phenylpyridine)palladium, bis(2-phenylpyridine)platinum, tris(2-phenylpyridine)osmium, tris(2-phenylpyridine)rhenium, octaethyl platinum porphyrin, octaphenyl platinum porphyrin, octaethyl palladium porphyrin and octaphenyl palladium porphyrin.

Examples of the polymer-based light emitting material include a polyfluorene-based material such as poly(9,9-dioctylfluorene-2,7-diyl), poly[(9,9-dioctylfluorene-2,7-diyl)-co-(4,4'-(N-(4-sec-butylphenyWdiphenylamine)] and poly[(9,9-dioctylfluorene-2,7-diyl)-co-(1,4-benzo-2{2,1'-3}-triazole)], and a polyphenylenevinylene-based material such as poly[2-methoxy-5-(2-ethylhexyloxy)-1,4-phenylenevinylene.

The conjugated polymer of the present invention can also be used as the light emitting material.

The molecular weight of the compound used as the light emitting material is not limited as long as the effects of the present invention are not seriously impaired, but the molecular weight is usually 10,000 or less, preferably 5,000 or less, more preferably 4,000 or less, still more preferably 3,000 or less, and is usually 100 or more, preferably 200 or more, more preferably 300 or more, still more preferably 400 or more. If the molecular weight of the light emitting material is too small, this may incur significant reduction of the heat resistance, generation of gas, deterioration of film quality of the film formed, or change in morphology of the organic electroluminescence element due to migration or the like. On the other hand, if the molecular weight of the light emitting material is excessively large, purification of an organic compound may be difficult or dissolution in solvent tends to take a long time.

Only one of the above-described light emitting materials may be used, or two or more thereof may be used in an arbitrary combination and an arbitrary ratio.

The proportion of the light emitting material in the light emitting layer is not limited as long as the effects of the present invention are not seriously impaired, but the proportion is preferably 0.05 wt % or more and preferably 35 wt % or less. If the proportion of the light emitting material is too small, uneven luminescence may occur, whereas if it is excessively large, the luminous efficiency may decrease. In the case of using two or more kinds of light emitting materials in combination, the total content thereof is adjusted to fall in the range above.

Examples of the low molecular hole-transporting compound include various compounds described above as examples of the hole-transporting compounds in the hole transport layer; an aromatic diamine containing two or more tertiary amines typified by 4,4'-bis[N-(1-naphthyl)-N-phenylamino]biphenyl, where two or more condensed aromatic rings are substituted on the nitrogen atom (JP-A-5-234681); an aromatic amine compound having a starburst structure, such as 4,4',4"-tris(1-naphthylphenylamino)triphenylamine (*Journal of Luminescence*, Vol. 72-74, page 985, 1997); an aromatic amine compound composed of a tetramer of triphenylamine (*Chemical Communications*, page 2175, 1996); and a spiro compound such as 2,2',7,7'-tetrakis-(diphenylamino)-9,9'-spirobifluorene (*Synthetic Metals*, Vol. 91, page 209, 1997).

Examples of the low molecular electron-transporting compound include 2,5-bis(1-naphthyl)-1,3,4-oxadiazole (BND), 2,5-bis(6'-(2',2"-bipyridyl))-1,1-dimethyl-3,4-diphenylsilole (PyPySPyPy), bathophenanthroline (BPhen), 2,9-dimethyl-4,7-diphenyl-1,10-phenanthroline (BCP, bathocuproine), 2-(4-biphenylyl)-5-(p-tert-butylphenyl)-1,3,4-oxadiazole (tBu-PBD), 4,4'-bit(9-carbazole)-biphenyl (CBP), and 9,10-di-(2-naphthyl)anthracene (AND).

Such a hole-transporting compound or electron-transporting compound is preferably used as a host material in the light emitting layer. Specific examples of the host material include those described in JP-A-2007-067383, JP-A-2007-88433 and JP-A-2007-110093, and suitable examples thereof are also the same.

The method for forming the light emitting layer includes a wet film formation method and a vacuum deposition method, but as described above, a wet film formation method is preferred in that a homogeneous and defect-free thin film is easily obtained, the time for formation is short, and the effect of insolubilization of the hole transport layer formed using the organic compound of the present invention can be enjoyed. In the case of forming the light emitting layer by a wet film formation method, the materials described above are dissolved in an appropriate solvent to prepare a coating solution, the coating solution is coated/deposited on the hole transport layer formed as above, and the solvent is removed by drying, whereby the light emitting layer is formed. The forming method is the same as the forming method of the hole transport layer.

The film thickness of the light emitting layer is usually 3 nm or more, preferably 5 nm or more, and is usually 300 nm or less, preferably 100 nm or less.

[6] Hole Blocking Layer

A hole blocking layer is provided between the light emitting layer and the electron transport layer in FIG. 1, but the hole blocking layer may be omitted.

The hole blocking layer is stacked on the light emitting layer to come into contact with the interface on the cathode side of the light emitting layer and is formed of a compound that plays the role of blocking a hole moving from the anode to reach the cathode and can efficiently transport an electron injected from the cathode toward the light emitting layer.

The physical properties required of the material constituting the hole blocking layer include high electron mobility, low hole mobility, large energy gap (difference between HOMO and LUMO) and high excited triplet level (T1).

Examples of the hole blocking material satisfying these conditions include a mixed ligand complex such as bis(2-methyl-8-quinolinolate)(phenolate)aluminum and bis(2-methyl-8-quinolinolate)(triphenylsilanolate)aluminum, a metal complex such as bis(2-methyl-8-quinolate)aluminum-μ-oxo-bis-(2-methyl-8-quinolilate)aluminum binuclear metal complex, a styryl compound such as distyrylbiphenyl derivative (JP-A-11-242996), a triazole derivative such as 3-(4-biphenylyl)-4-phenyl-5(4-tert-butylphenyl)-1,2,4-triazole (JP-A-7-41759), and a phenanthroline derivative such as bathocuproine (JP-A-10-79297). Furthermore, a compound having at least one pyridine ring substituted at 2-, 4- and 6-positions described in International Publication No. 2005-022962, pamphlet, is also preferred as the hole blocking material.

Specific examples thereof include a compound shown below.

[Chem. 4 ]

(C-4)

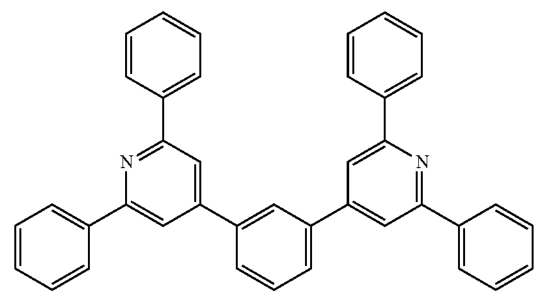

The hole blocking layer may also be formed by a wet film formation method, similarly to the hole injection layer and the light emitting layer but is usually formed by a vacuum deposition method. Details of the procedure of the vacuum deposition method are the same as in the case of the later-described electron injection layer.

The film thickness of the hole blocking layer is usually 0.5 nm or more, preferably 1 nm or more, and is usually 100 nm or less, preferably 50 nm or less.

[7] Electron Transport Layer]

The electron transport layer is provided between the light emitting layer and the electron injection layer for the purpose of further enhancing the luminous efficacy of the device.

The electron transport layer is formed of a compound capable of efficiently transporting an electron injected from the cathode toward the light emitting layer between the electrodes to which an electric field is applied. The electron-transporting compound used in the electron transport layer need to be a compound having high electron injection efficiency from the cathode or electron injection layer and high electron mobility and being capable of efficiently transporting the injected electron.

Examples of the material satisfying these conditions include a metal complex such as aluminum complex of 8-hydroxyquinoline (JP-A-59-194393), a metal complex of 10-hydroxybenzo[h]quinoline, an oxadiazole derivative, a distyrylbiphenyl derivative, a silole derivative, a 3- or 5-hydroxyflavone metal complex, a benzoxazole metal complex, a benzothiazole metal complex, tris(benzimidazolyl)benzene (U.S. Pat. No. 5,645,948), a quinoxaline compound (JP-A-6-207169), a phenanthroline derivative (JP-A-5-331459), 2-tert-butyl-9,10-N,N-dicyanoanthraquinonediimine, n-type hydrogenated amorphous silicon carbide, n-type zinc sulfide, and n-type zinc selenide.

The film thickness of the electron transport layer has a lower limit of usually 1 nm, preferably about 5 nm, and an upper limit of usually 300 nm, preferably about 100 nm.

The electron transport layer is formed by stacking it on the hole blocking layer by a wet film formation method or a vacuum deposition method in the same manner as described above. A vacuum deposition method is usually used.

[8] Electron Injection Layer

The electron injection layer plays the role of efficiently injecting an electron injected from the cathode, into the electron transport layer or the light emitting layer.

For performing the electron injection efficiently, the material forming the electron injection layer is preferably a metal having a low work function. Examples thereof include an alkali metal such as sodium and cesium, and an alkaline earth metal such as barium and calcium. The film thickness of the electron injection layer is usually 0.1 nm or more and preferably 5 nm or less.

The later-described organic electron transport material typified by a nitrogen-containing heterocyclic compound such as bathophenanthroline and a metal complex such as aluminum complex of 8-hydroxyquinoline is preferably doped with an alkali metal such as sodium, potassium, cesium, lithium and rubidium (as described, for example, in JP-A-10-270171, JP-A-2002-100478 and JP-A-2002-100482), because both enhanced electron injection/transport performance and excellent film quality can be achieved. In this case, the film thickness is usually 5 nm or more, preferably 10 nm or more, and is usually 200 nm or less, preferably 100 nm or less.

The electron injection layer is formed by stacking it on the light emitting layer or the hole blocking layer thereon by a wet film formation method or a vacuum deposition method.

Details of the wet film formation method are the same as in the case of the hole injection layer and the light emitting layer.

On the other hand, in the case of a vacuum deposition method, a vapor deposition source is put in a crucible or metal boat disposed in a vacuum vessel, the vacuum vessel is evacuated to about $10^{-4}$ Pa by an appropriate vacuum pump, and then the crucible or metal boat is heated for evaporation, whereby the electron injection layer is formed on the light emitting layer, hole blocking layer or electron transport layer on the substrate placed to face the crucible or metal boat.

Vapor deposition of an alkali metal as the electron injection layer is performed using an alkali metal dispenser where nichrome is filled with an alkali metal chromate and a reducing agent. The dispenser is heated in a vacuum vessel to reduce the alkali metal chromate and evaporate the alkali metal. In the case of co-depositing an organic electron transport material and an alkali metal, the organic electron transport material is put in a crucible disposed in a vacuum vessel, the vacuum vessel is evacuated to about $10^{-4}$ Pa by an appropriate vacuum pump, and the crucible and the dispenser are simultaneously heated for evaporation, whereby the electron injection layer is formed on the substrate disposed to face the crucible and the dispenser.

At this time, co-deposition uniformly proceeds in the thickness direction of the electron injection layer, but a concentration distribution is allowed to be created in the thickness direction.

[9] Cathode

] The cathode fulfills the role of injecting an electron into the layer (for example, the electron injection layer or the light emitting layer) on the light emitting layer side. As for the material of the cathode, a material for use in the anode may be used, but in order to efficiently perform the electron injection, a metal having a low work function is preferred, and an appropriate metal such as tin, magnesium, indium, calcium, aluminum and silver, or an alloy thereof is used. Specific examples thereof include an alloy electrode having a low work function, such as magnesium-silver alloy, magnesium-indium alloy and aluminum-lithium alloy.

The film thickness of the cathode is usually the same as that of the anode.

For the purpose of protecting the cathode formed of a metal having a low work function, a metal layer having a high work function and being stable to the air is preferably further stacked thereon, because the stability of the device is increased. A metal such as aluminum, silver, copper, nickel, chromium, gold and platinum is used to this end.

[10] Others

While an organic electroluminescence element having the layer configuration shown in FIG. 1 has been described above by way of example, the organic electroluminescence element of the present invention may have other configurations without departing from the scope of the invention. For example, the device may have an arbitrary layer between the anode and the cathode in addition to the layers described above, as long as its performance is not impaired. Also, an arbitrary layer may be omitted.

In the present invention, by using the conjugated polymer of the present invention for the hole transport layer, all of the hole injection layer, the hole transport layer and the light emitting layer can be stacked and formed by a wet film formation method. This allows the production of a display having a large area.

Incidentally, the device may also have a reverse structure from that shown in FIG. 1, that is, a cathode, an electron injection layer, a light emitting layer a hole injection layer and an anode may be stacked in this order on the substrate. As described above, it is also possible to provide the organic electroluminescence element of the present invention between two substrates with at least one substrate being highly transparent. Similarly, the layers may be stacked in a reverse structure from the layer configuration shown in FIG. 1.

Furthermore, a structure where a plurality of layer configurations shown in FIG. 1 are laminated (a structure where a plurality of light emitting units are stacked) may be also employed. At this time, when, for example, $V_2O_5$ is used as a charge generating layer (CGL) in place of an interface layer (when the anode is ITO and the cathode is Al, these two layers) between layer configurations (between light emitting units), the barrier between layer configurations is reduced and this more preferred in view of luminous efficiency and drive voltage.

The present invention can be applied in all cases where the organic electroluminescence element is a single device, where the device is composed of an array of organic electroluminescence elements, and where the anode and the cathode are disposed in the form of an X—Y matrix.

<Organic EL Display and Organic EL Lighting>

The organic EL display and organic EL lighting of the present invention each uses the above-described organic electroluminescence element of the present invention. The organic EL display of the present invention is not particularly limited in its mode or structure and can be fabricated according to a conventional method by using the organic electroluminescence element of the present invention.

For example, the organic EL display and organic EL lighting of the present invention can be fabricated by such a method as described in Seishi Tokito, Chihaya Adachi and Hideyuki Murata, *Yuki EL Display* (*Organic EL Display*), Ohm-Sha (Aug. 20, 2004).

EXAMPLES

The present invention is described in greater detail below by referring to Examples, but the present invention is not limited to the following Examples as long as the scope of the present invention is defended.

Synthesis Example 1

[Chem. 42]

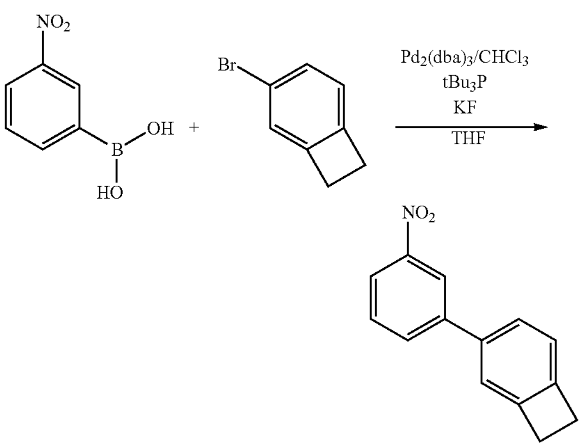

Target 1

Potassium fluoride (23.01 g) was charged into a reaction vessel, and drying by heating and nitrogen purging were repeated under reduced pressure to create a nitrogen atmosphere in the system. 3-Nitrophenylboronic acid (6.68 g), 4-bromo-benzocyclobutene (7.32 g) and dehydrated tetrahydrofuran (50 ml) were charged and stirred, and tris(dibenzylideneacetone)dipalladium chloroform complex (0.21 g) was added thereto. The system was further thoroughly purged with nitrogen, and tri-tert-butylphosphine (0.47 g) was added at room temperature. After the completion of addition, stirring was continued for 1 hour, and when the reaction was completed, water was added to the reaction solution. The organic layer was extracted with ethyl acetate, and the obtained organic layer was washed with water twice and concentrated through dehydration and drying by adding sodium sulfate. The crude product was purified by silica gel column chromatography (hexane/ethyl acetate) to obtain Target 1 (8.21 g).

Synthesis Example 2

[Chem. 43]

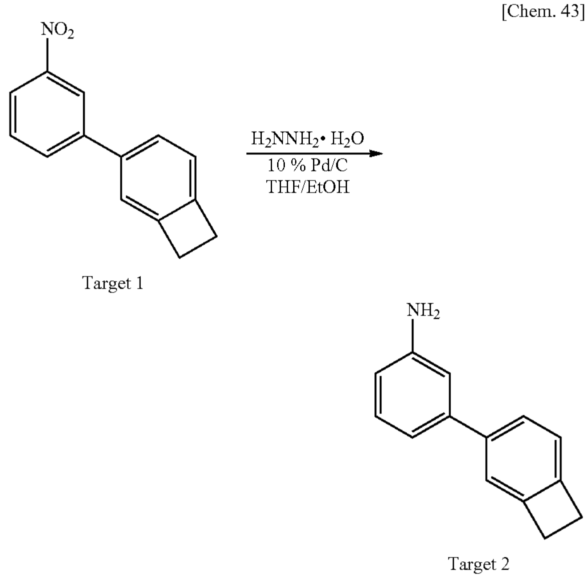

Target 1 (8.11 g), 36 ml of tetrahydrofuran, 36 ml of ethanol and 10% Pd/C (1.15 g) were charged and stirred under heating at 70° C. Hydrazine monohydrate (10.81 g) was gradually added dropwise thereto, and the mixture was reacted for 2 hours. The reaction solution was allowed to cool and filtered through celite, and the filtrate was concentrated. Ethyl acetate was added to the resulting filtrate and after washing with water, the organic layer was concentrated. The obtained crude product was purified by column chromatography (hexane/ethyl acetate) to obtain Target 2 (4.90 g).

Synthesis Example 3

[Chem. 44]

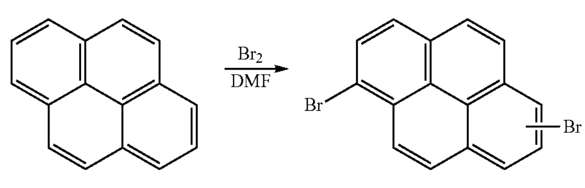

Target 3

In a nitrogen stream, N,N'-dimethylformamide (400 ml) was added to pyrene (10.11 g) and stirred under cooling at 0° C. in an ice bath, and bromine (15.18 g) dissolved in 50 ml of N,N'-dimethylformamide was added dropwise. After raising the temperature to room temperature and stirring for 8 hours, the system was left standing overnight. The precipitated crystal was collected by filtration, suspension-washed with ethanol and recrystallized from toluene to obtain Target 3 (5.8 g).

Synthesis Example 4

[Chem. 45]

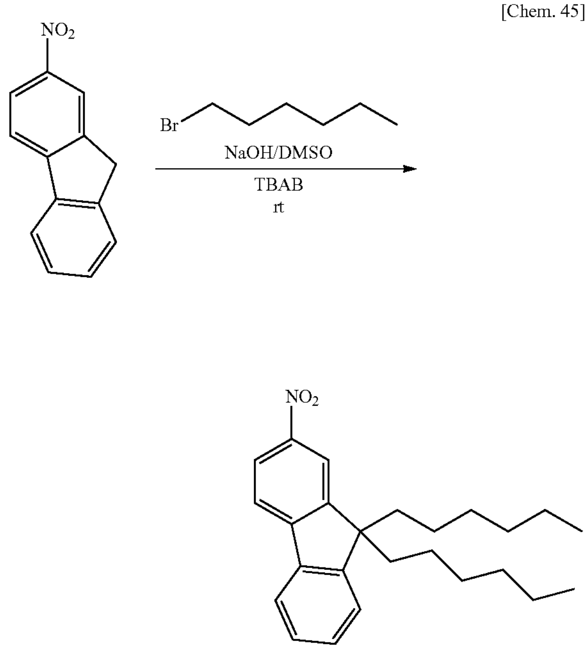

Target 4

2-Nitrofluorene (25.0 g), 1-bromohexane (58.61 g), tetrabutylammonium bromide (7.63 g) and dimethyl sulfoxide (220 ml) were charged, and an aqueous 17 M sodium hydroxide solution (35 ml) was gradually added dropwise. The mixture was reacted at room temperature for 3 hours and after adding ethyl acetate (200 ml) and water (100 ml) and stirring, the reaction solution was subjected to liquid separation. The aqueous layer was extracted with ethyl acetate and combined with the organic layer, and the combined layer was dried over magnesium sulfate and concentrated. The obtained crude product was purified by silica gel column chromatography (hexane/ethyl acetate) to obtain Target 4 (44.0 g).

Synthesis Example 5

[Chem. 46]

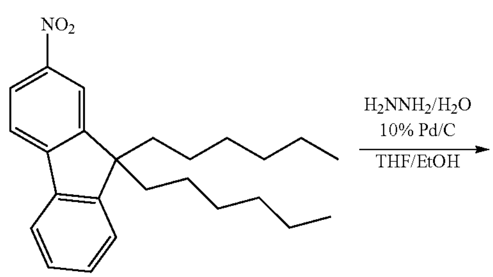

Target 4

-continued

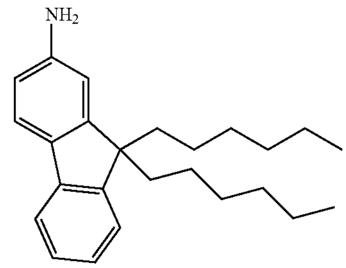

Target 5

10% Pd/C (8.6 g) was added to Target 4 (44.0 g), tetrahydrofuran (120 ml) and ethanol (120 ml), and the mixture was stirred under heating at 50° C. Hydrazine monohydrate (58.0 g) was gradually added dropwise thereto, and the mixture was reacted at this temperature for 3 hours. The reaction solution was allowed to cool and filtered through celite under pressure, and the filtrate was concentrated. The residue was added to methanol, and the crystallized crystal was collected by filtration and dried to obtain Target 5 (34.9 g).

Synthesis Example 6

[Chem. 47]

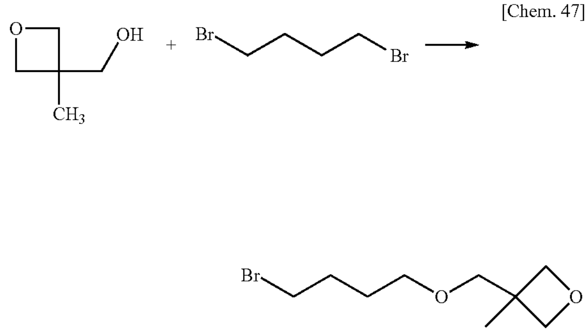

Target 6

A mixed solution of an aqueous 50% sodium hydroxide solution (300 g) and hexane (250 mL) was charged, and tetrabutylammonium bromide (4.98 g) was added. The mixture was cooled to 5° C., a mixture of oxetane (31 g) and 1,4-dibromobutane (200 g) was added dropwise with vigorous stirring. After the completion of dropwise addition, the temperature was raised to room temperature over 15 minutes, and the reaction solution was stirred for 15 minutes, put in an oil bath at 80° C. and after refluxing started, stirred for 15 minutes. The oil bath was removed, and the resulting solution was stirred for 15 minutes and directly transferred to a separation funnel. The organic layer was separated, washed with water and dried over magnesium sulfate, and the solvent was removed under pressure. The residue was subjected to distillation under reduced pressure (0.42 mmHg, 72° C.) to obtain Target 6 (52.2 g).

Synthesis Example 7

[Chem. 48]

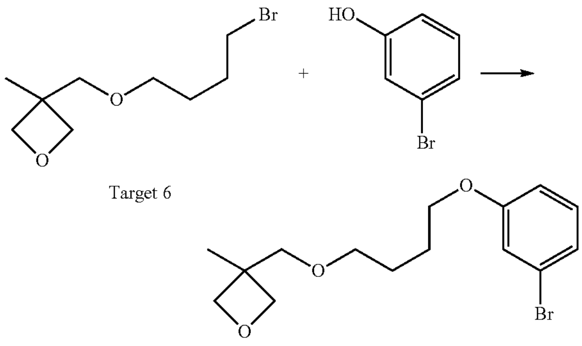

Target 6

Target 7

In a nitrogen stream, ground potassium hydroxide (8.98 g) was added to a solution of dimethyl sulfoxide (50 ml), and m-bromophenol (6.92 g) was added thereto. The mixture was stirred for 30 minutes, and Target 6 (12.33 g) was added. The resulting mixture was stirred at room temperature for 6 hours, and the precipitate was collected by filtration, and the organic layer was extracted with methylene oxide and concentrated. The obtained crude product was purified by silica gel column chromatography (hexane/ethyl acetate) to obtain Target 7 (11.4 g).

Synthesis Example 8

[Chem. 49]

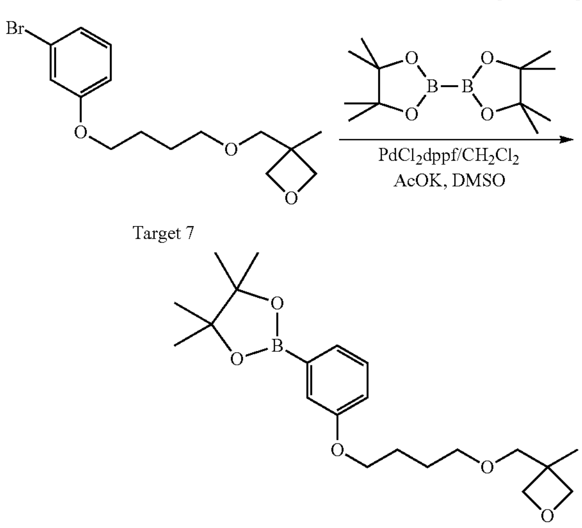

Target 7

Target 8

In a nitrogen stream, Target 7 (10.0 g), bis(pinacolato) diborane (10.8 g), potassium acetate (10.13 g) and dimethyl sulfoxide (150 ml) were charged, and the mixture was heated at 60° C. and then stirred for 30 minutes. (Bisdiphenylphosphinoferrocene)dichloropalladium complex (0.74 g) was added, and the mixture was reacted at 80° C. for 6 hours. Following the reaction, the reaction solution was allowed to cool to room temperature and after adding toluene (100 ml) and water (120 ml), the solution was stirred and subjected to liquid separation. The aqueous layer was extracted with toluene and combined with the organic layer, and the combined layer was dried over magnesium sulfate and concentrated.

The obtained crude product was purified by silica gel column chromatography (n-hexane/ethyl acetate) to obtain Target 8 (7.9 g).

Synthesis Example 9

[Chem. 50]

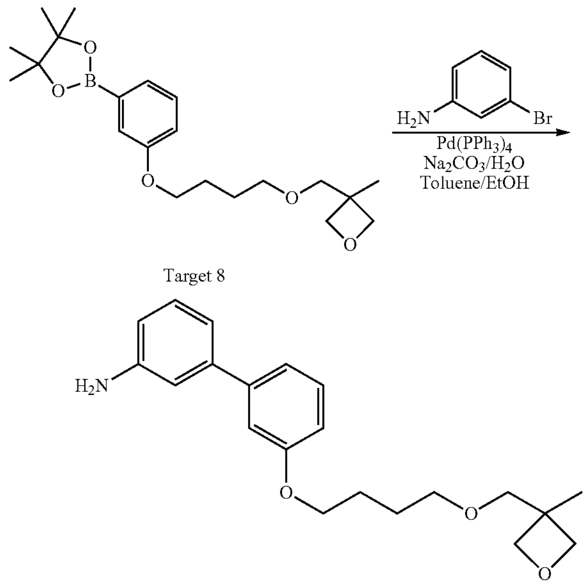

Target 8

Target 9

In a nitrogen stream, Target 8 (7.9 g), 3-bromoaniline (3.47 g), toluene:ethanol (60 ml:30 ml) and an aqueous 2 M sodium carbonate solution (20 ml) were charged, and the mixture was stirred under heating at 60° C. for 30 minutes. The system was deaerated, and tetrakis(triphenylphosphine)palladium (0.7 g) was added. The mixture was refluxed for 6 hours and allowed to cool to room temperature. After adding toluene (100 ml) and water (120 ml), the reaction solution was stirred and subjected to liquid separation. The aqueous layer was extracted with toluene and combined with the organic layer, and the combined layer was dried over magnesium sulfate and concentrated. The obtained crude product was purified by silica gel column chromatography (n-hexane/ethyl acetate) to obtain Target 9 (3.8 g).

Synthesis Example 10

[Chem. 51]

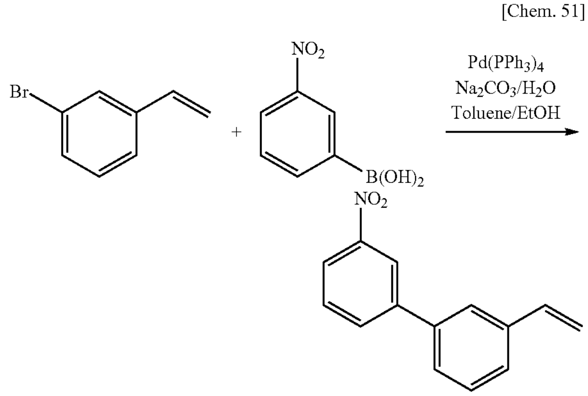

Target 10

In a nitrogen stream, 3-bromostyrene (5.0 g), 3-nitrophenylboronic acid (5.5 g), toluene:ethanol (80 ml:40 ml) and an aqueous 2 M sodium carbonate solution (20 ml) were charged, and the mixture was stirred under heating at 60° C. for 30 minutes. The system was deaerated, and tetrakis(triphenylphosphine)palladium (0.95 g) was added. The mixture was refluxed for 6 hours and allowed to cool to room temperature. After adding methylene chloride (100 ml) and water (100 ml), the reaction solution was stirred and subjected to liquid separation. The aqueous layer was extracted with methylene chloride and combined with the organic layer, and the combined layer was dried over magnesium sulfate and concentrated. The obtained crude product was purified by silica gel column chromatography (n-hexane/methylene chloride) to obtain Target 10 (5.5 g).

Synthesis Example 11

[Chem. 52]

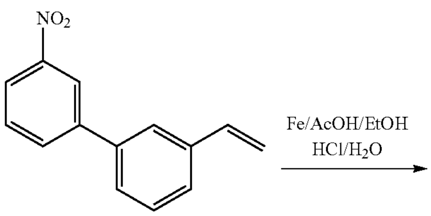

Target 10

-continued

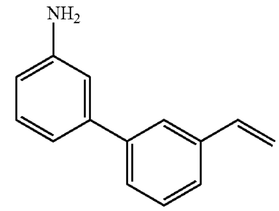

Target 11

In a nitrogen stream, Target 10 (2.5 g), acetic acid (60 ml), ethanol (60 ml), 1 N hydrochloric acid (2 ml), water (8 ml) and reduced iron (12.4 g) were charged, and the mixture was refluxed under heating for 1 hour. The reaction solution was filtered at room temperature and after adding ethyl acetate (100 ml) and water (100 ml), the resulting solution was stirred, neutralized with an aqueous saturated sodium hydrogencarbonate solution and subjected to liquid separation. The aqueous layer was extracted with ethyl acetate and combined with the organic layer, and the combined layer was dried over magnesium sulfate and concentrated. The obtained crude product was purified by silica gel column chromatography (n-hexane/ethyl acetate) to obtain Target 11 (2.1 g).

Synthesis Example 12

[Chem. 53]

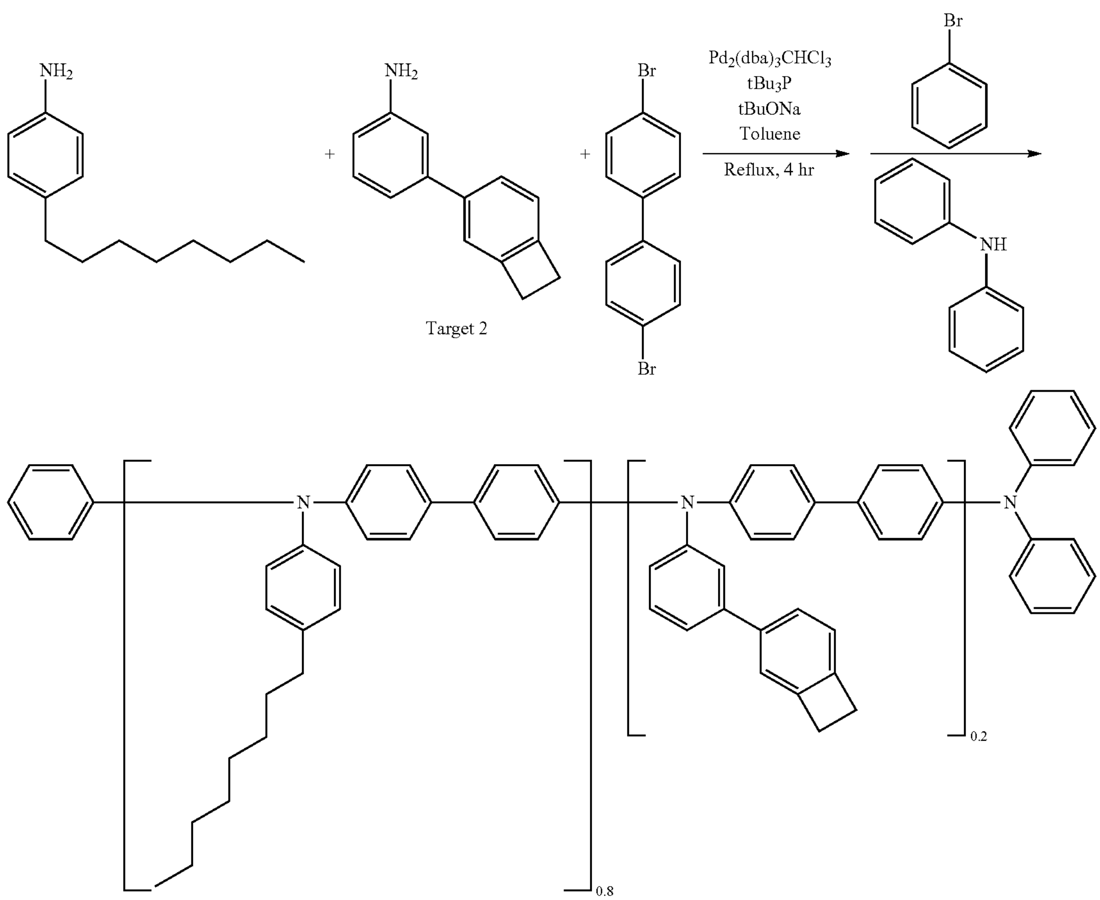

Target 12

4-n-Octylaniline (3.71 g, 18.1 mmol), Target 2 (0.90 g, 4.5 mmol) obtained in Synthesis Example 2,4,4'-dibromobiphenyl (3.53 g, 11.3 mmol), tert-butoxy sodium (6.95 g, 72.3 mmol) and toluene (51 ml) were charged and after thoroughly purging the system with nitrogen, the mixture was heated to 50° C. (Solution A). Tri-tert-butylphosphine (0.37 g, 1.8 mmol) was added to a 15 ml toluene solution of tris(dibenzylideneacetone)dipalladium chloroform complex (0.23 g, 0.2 mmol), and the mixture was heated to 50° C. (Solution B). In a nitrogen stream, Solution B was added to Solution A, and the mixed solution was reacted by refluxing under heating for 1 hour. Disappearance of raw materials was confirmed, and 4,4'-dibromobiphenyl (3.31 g, 10.6 mmol) was additionally added. The mixture was refluxed under heating for 1 hour and since start of polymerization was confirmed, 4,4'-dibromobiphenyl (0.07 g, 0.2 mmol) was additionally added every 40 minutes three times in total (0.21 g in total). After the addition of the entire amount of 4,4'-dibromobiphenyl, the mixture was further refluxed under heating for 1 hour, and the reaction solution was allowed to cool and then added dropwise in 300 ml of ethanol to crystallize Crude Polymer 1.

Crude Polymer 1 obtained was dissolved in 180 ml of toluene, and bromobenzene (0.71 g, 4.5 mmol) and tert-butoxy sodium (3.5 g, 36.4 mmol) were charged. After thoroughly purging the system with nitrogen, the mixture was heated to 50° C. (Solution C). Tri-tert-butylphosphine (0.18 g, 0.9 mmol) was added to a 10 ml toluene solution of tris(dibenzylideneacetone)dipalladium chloroform complex (0.12 g, 0.1 mmol), and the mixture was heated to 50° C. (Solution D). In a nitrogen stream, Solution D was added to Solution C, and the mixed solution was reacted by refluxing under heating for 2 hours. To this reaction solution, a toluene (2 ml) solution of N,N-diphenylamine (3.82 g, 22.6 mmol) was added, and the mixture was further reacted by refluxing under heating for 8 hours. The reaction solution was allowed to cool and then added dropwise in an ethanol/water (250 ml/50 ml) solution to obtain Crude Polymer 1 with the terminal residue being capped.

Crude Polymer 1 with the terminal residue being capped was dissolved in toluene and reprecipitated with acetone, and the precipitated polymer was separated by filtration. The obtained polymer was dissolved in toluene, and the solution was washed with dilute hydrochloric acid and reprecipitated with ammonia-containing ethanol. The polymer collected by filtration was purified by column chromatography to obtain Target 12 (0.7 g).

Weight average molecular weight (Mw)=63,900

Number average molecular weight (Mn)=40,300

Dispersity (Mw/Mn)=1.59

Synthesis Example 13

[Chem. 54]

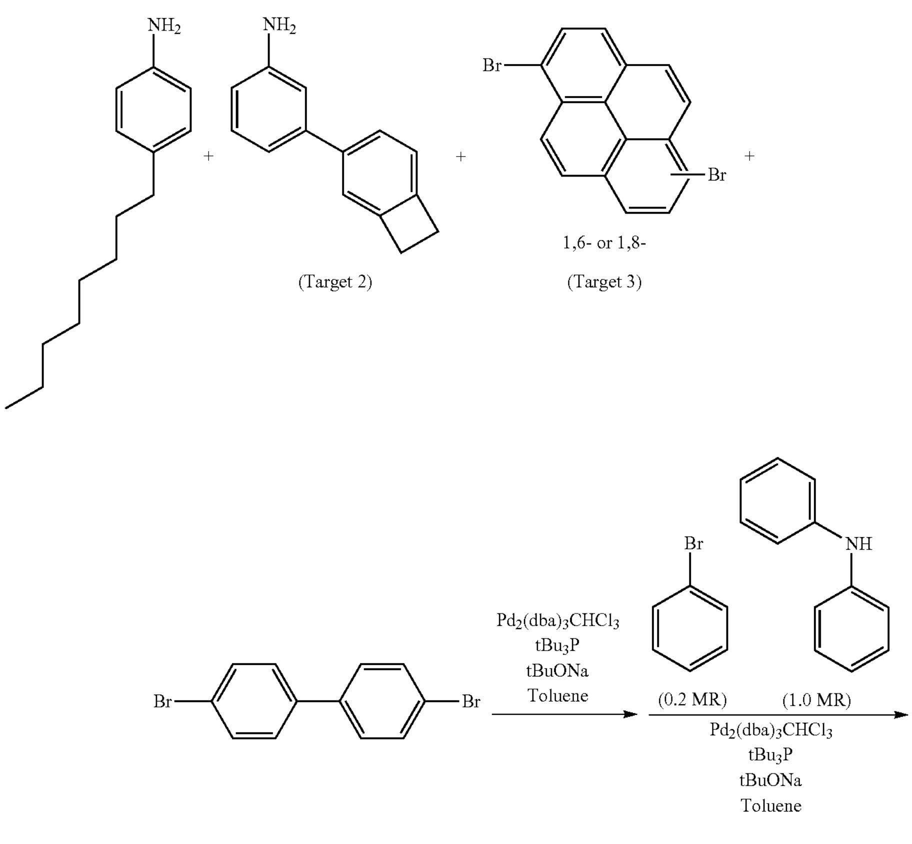

-continued

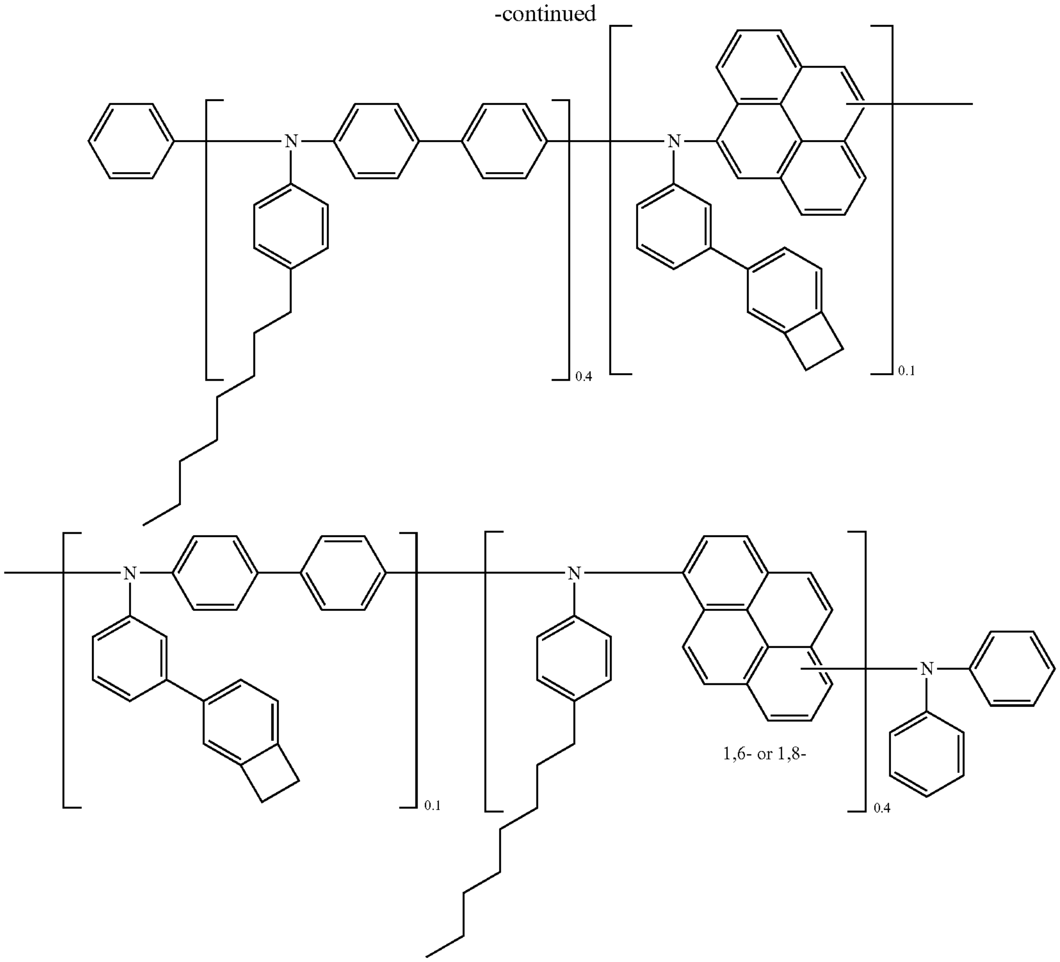

(Target 13)

4-n-Octylaniline (1.31 g, 6.4 mmol), Target 2 (0.31 g, 1.6 mmol) obtained in Synthesis Example 2,4,4'-dibromobiphenyl (1.25 g, 4.0 mmol), tert-butoxy sodium (2.88 g, 30.0 mmol) and toluene (20 ml) were charged and after thoroughly purging the system with nitrogen, the mixture was heated to 50° C. (Solution A). Tri-tert-butylphosphine (0.129 g, 0.064 mmol) was added to a 5 ml toluene solution of tris(dibenzylideneacetone)dipalladium chloroform complex (0.09 g, 0.0088 mmol), and the mixture was heated to 50° C. (Solution B). In a nitrogen stream, Solution B was added to Solution A, and the mixed solution was reacted by refluxing under heating for 1 hour. Disappearance of raw materials was confirmed, and Target 3 (1.305 g, 4.0 mmol) obtained in Synthesis Example 3 was additionally added. The mixture was reacted by refluxing under heating for 1 hour and since start of polymerization was confirmed, Target 3 (0.013 g, 0.04 mmol) obtained in Synthesis Example 3 was additionally added every 1 hour four times in total (0.52 g in total). After the addition of the entire amount of Target 3, the mixture was further refluxed under heating for 1 hour. The reaction solution was allowed to cool and then added dropwise in 200 ml of methanol to crystallize Crude Polymer 2.

Crude Polymer 2 obtained was dissolved in 150 ml of toluene, and bromobenzene (0.25 g, 1.6 mmol) and tert-butoxy sodium (0.77 g, 8 mmol) were charged. After thoroughly purging the system with nitrogen, the mixture was heated to 50° C. (Solution C). Tri-tert-butylphosphine (0.016 g, 0.008 mmol) was added to a 10 ml toluene solution of tris(dibenzylideneacetone)dipalladium chloroform complex (0.066 g, 0.0064 mmol), and the mixture was heated to 50° C. (Solution D). In a nitrogen stream, Solution D was added to Solution C, and the mixed solution was reacted by refluxing under heating for 2 hours. To this reaction solution, N,N-diphenylamine (1.35 g, 8 mmol) was added, and the mixture was further reacted by refluxing under heating for 4 hours. The reaction solution was allowed to cool and then added dropwise in methanol to obtain Crude Polymer 2 with the terminal residue being capped.

Crude Polymer 2 with the terminal residue being capped was dissolved in toluene and reprecipitated with acetone, and the precipitated polymer was separated by filtration. The obtained polymer was dissolved in toluene, and the solution was washed with dilute hydrochloric acid and reprecipitated with ammonia-containing ethanol. The polymer collected by filtration was purified by column chromatography to obtain Target 13 (0.53 g).

Weight average molecular weight (Mw)=39,700

Number average molecular weight (Mn)=17,600

Dispersity (Mw/Mn)=2.26

Synthesis Example 14

[Chem. 55]

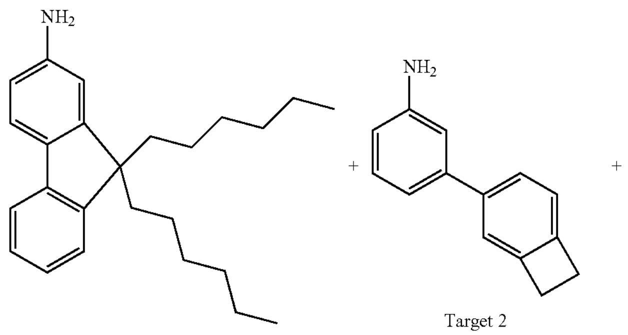

Target 5

Target 2

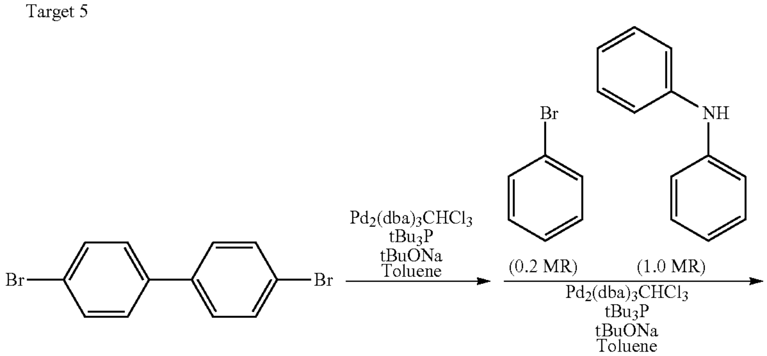

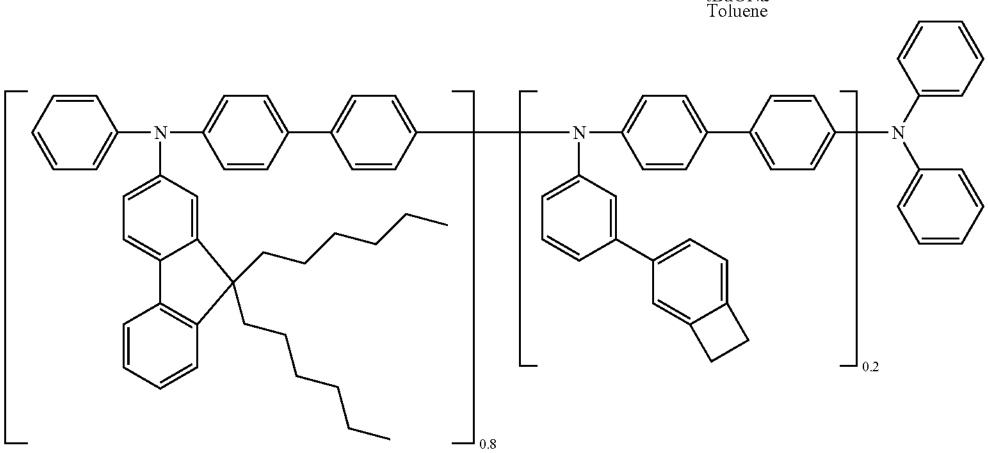

Target 14

Target 5 (3.64 g, 10.4 mmol) obtained in Synthesis Example 5, Target 2 (0.51 g, 2.6 mmol) obtained in Synthesis Example 2,4,4'-dibromobiphenyl (2.03 g, 13 mmol), tert-butoxy sodium (2.88 g, 30.0 mmol) and toluene (20 ml) were charged and after thoroughly purging the system with nitrogen, the mixture was heated to 50° C. (Solution A). Tri-tert-butylphosphine (0.210 g, 0.104 mmol) was added to a 15 ml toluene solution of tris(dibenzylideneacetone)dipalladium chloroform complex (0.148 g, 0.0143 mmol), and the mixture was heated to 50° C. (Solution B). In a nitrogen stream, Solution B was added to Solution A, and the mixed solution was reacted by refluxing under heating for 1 hour. Disappearance of raw materials was confirmed, and 4,4'-dibromobiphenyl (1.91 g, 6.1 mmol) was additionally added. The mixture was refluxed under heating for 1 hour and since start of polymerization was confirmed, 4,4'-dibromobiphenyl (0.041 g, 0.13 mmol) was additionally added. The mixture was further reacted by refluxing under heating for 1 hour, and the reaction solution was allowed to cool and then added dropwise in 200 ml of methanol to crystallize Crude Polymer 3.

Crude Polymer 3 obtained was dissolved in 200 ml of toluene, and bromobenzene (2.04 g, 13 mmol) and tert-butoxy sodium (1.50 g, 16 mmol) were charged. After thoroughly purging the system with nitrogen, the mixture was heated to 50° C. (Solution C). Tri-tert-butylphosphine (0.026 g, 13 mmol) was added to a 10 ml toluene solution of tris (dibenzylideneacetone)dipalladium chloroform complex (0.108 g, 10.4 mmol), and the mixture was heated to 50° C. (Solution D). In a nitrogen stream, Solution D was added to Solution C, and the mixed solution was reacted by refluxing under heating for 2 hours. To this reaction solution, a toluene (2 ml) solution of N,N-diphenylamine (3.82 g, 22.6 mmol) was added, and the mixture was further reacted by refluxing under heating for 8 hours. The reaction solution was allowed to cool and then added dropwise in methanol to obtain Crude Polymer 3 with the terminal residue being capped.

Crude Polymer 3 with the terminal residue being capped was dissolved in toluene and reprecipitated with acetone, and the precipitated polymer was separated by filtration. The obtained polymer was dissolved in toluene, and the solution was washed with dilute hydrochloric acid and reprecipitated with ammonia-containing ethanol. The polymer collected by filtration was purified by column chromatography to obtain Target 14 (1.01 g).

Weight average molecular weight (Mw)=43,300

Number average molecular weight (Mn)=36,400

Dispersity (Mw/Mn)=1.19

Synthesis Example 15

[Chem. 56]

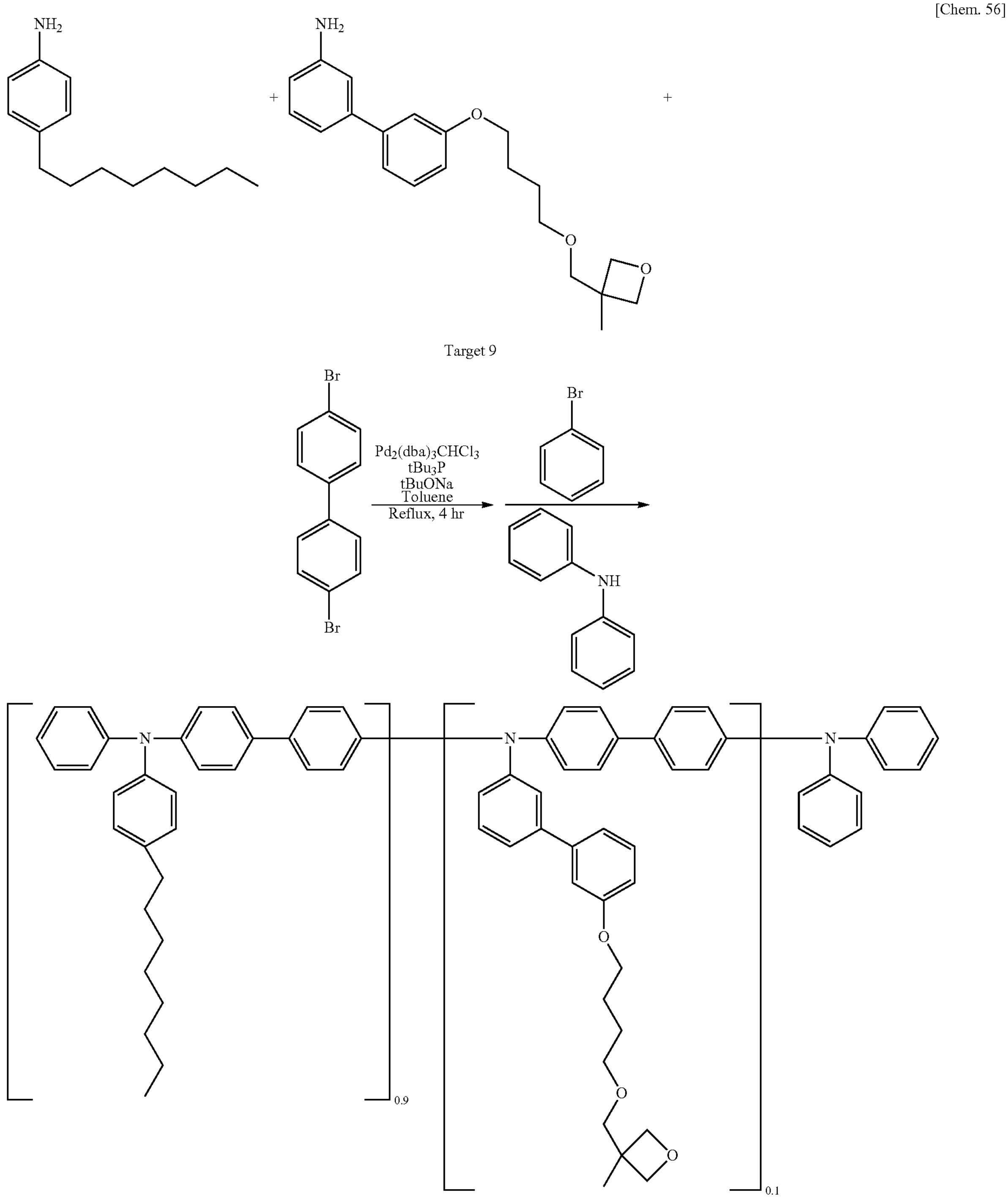

Target 15

4-n-Octylaniline (2.96 g, 14.42 mmol), Target 9 (0.547 g, 1.603 mmol) obtained in Synthesis Example 9, 4,4'-dibromobiphenyl (2.5 g, 8.013 mmol), tert-butoxy sodium (4.93 g, 51.28 mmol) and toluene (50 ml) were charged and after thoroughly purging the system with nitrogen, the mixture was heated to 50° C. (Solution A). Tri-tert-butylphosphine (0.26 g, 1.3 mmol) was added to a 10 ml toluene solution of tris (dibenzylideneacetone)dipalladium chloroform complex (0.166 g, 0.16 mmol), and the mixture was heated to 50° C. (Solution B). In a nitrogen stream, Solution B was added to Solution A, and the mixed solution was reacted by refluxing under heating for 1 hour. Disappearance of raw materials was confirmed, and 4,4'-dibromobiphenyl (2.35 g, 7.532 mmol) was additionally added. The mixture was refluxed under heating for 1 hour and since start of polymerization was confirmed, 4,4'-dibromobiphenyl (0.05 g, 0.16 mmol) was additionally added every 40 minutes three times in total (0.15 g in total). After the addition of the entire amount of 4,4'-dibromobiphenyl, the mixture was further refluxed under heating for 1 hour, and the reaction solution was allowed to cool and then added dropwise in 300 ml of ethanol to crystallize Crude Polymer 4.

Crude Polymer 4 obtained was dissolved in 110 ml of toluene, and bromobenzene (0.24 g, 1.539 mmol) and tert-butoxy sodium (4.7 g, 49.25 mmol) were charged. After thoroughly purging the system with nitrogen, the mixture was heated to 50° C. (Solution C). Tri-tert-butylphosphine (0.25 g, 1.23 mmol) was added to a 10 ml toluene solution of tris(dibenzylideneacetone)dipalladium chloroform complex (0.32 g, 0.31 mmol), and the mixture was heated to 50° C. (Solution D). In a nitrogen stream, Solution D was added to Solution C, and the mixed solution was reacted by refluxing under heating for 2 hours. To this reaction solution, a toluene (2 ml) solution of N,N-diphenylamine (0.52 g, 3.08 mmol) was added, and the mixture was further reacted by refluxing under heating for 6 hours. The reaction solution was allowed to cool and then added dropwise in an ethanol/water (250 ml/50 ml) solution to obtain Crude Polymer 4 with the terminal residue being capped.

Crude Polymer 4 with the terminal residue being capped was dissolved in toluene and reprecipitated with acetone, and the precipitated polymer was separated by filtration. The obtained polymer was dissolved in toluene, and the solution was washed with dilute hydrochloric acid and reprecipitated with ammonia-containing ethanol. The polymer collected by filtration was purified by column chromatography to obtain Target 15 (0.5 g).

Weight average molecular weight (Mw)=40,400
Number average molecular weight (Mn)=26,700
Dispersity (Mw/Mn)=1.51

Synthesis Example 16

[Chem. 57]

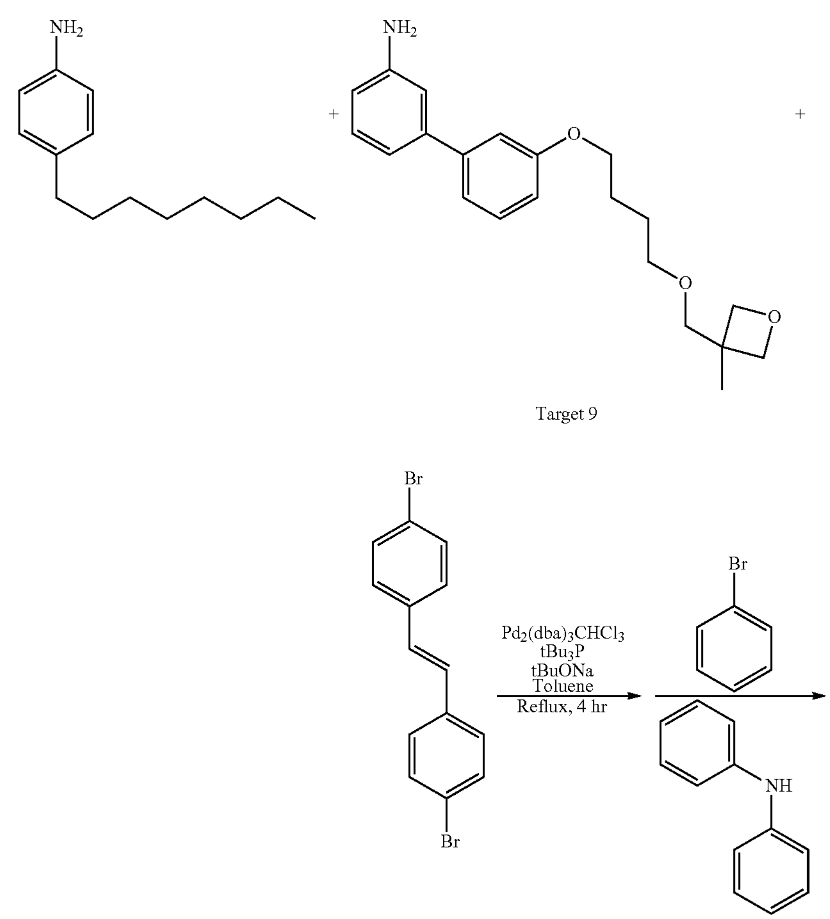

-continued

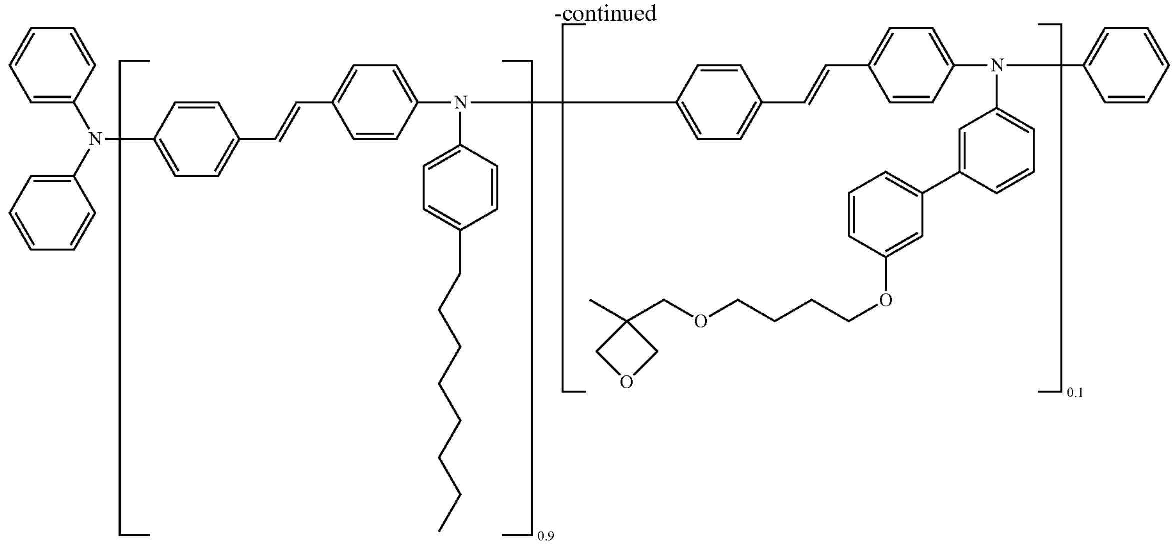

Target 16

4-n-Octylaniline (4.18 g, 20.3 mmol), Target 9 (0.77 g, 2.3 mmol) obtained in Synthesis Example 9, 4,4'-dibromostilbene (3.71 g, 11.3 mmol), tert-butoxy sodium (6.95 g, 72.3 mmol) and toluene (120 ml) were charged and after thoroughly purging the system with nitrogen, the mixture was heated to 50° C. (Solution A). Tri-tert-butylphosphine (0.33 g, 0.45 mmol) was added to a 5 ml toluene solution of tris (dibenzylideneacetone)dipalladium chloroform complex (0.06 g, 0.06 mmol), and the mixture was heated to 50° C. (Solution B). In a nitrogen stream, Solution B was added to Solution A, and the mixed solution was reacted by refluxing under heating for 3 hours. Disappearance of raw materials was confirmed, and 4,4'-dibromostilbene (3.49 g, 10.6 mmol) was additionally added. The mixture was refluxed under heating for 1.5 hours and since start of polymerization was confirmed, 4,4'-dibromostilbene (0.07 g, 0.2 mmol) was additionally added every 1.5 hours three times in total. After the addition of the entire amount of 4,4'-dibromostilbene, the mixture was further refluxed under heating for 1 hour, and the reaction solution was allowed to cool and then added dropwise in 300 ml of ethanol to crystallize Crude Polymer 5.

Crude Polymer 5 obtained was dissolved in 180 ml of toluene, and bromobenzene (0.71 g, 4.5 mmol) and tert-butoxy sodium (3.5 g, 36.4 mmol) were charged. After thoroughly purging the system with nitrogen, the mixture was heated to 50° C. (Solution C). Tri-tert-butylphosphine (0.18 g, 0.9 mmol) was added to a 10 ml toluene solution of tris (dibenzylideneacetone)dipalladium chloroform complex (0.12 g, 0.1 mmol), and the mixture was heated to 50° C. (Solution D). In a nitrogen stream, Solution D was added to Solution C, and the mixed solution was reacted by refluxing under heating for 2 hours. To this reaction solution, a toluene (2 ml) solution of N,N-diphenylamine (3.82 g, 22.6 mmol) was added, and the mixture was further reacted by refluxing under heating for 8 hours. The reaction solution was allowed to cool and then added dropwise in an ethanol/water (250 m/50 ml) solution to obtain Crude Polymer 5 with the terminal residue being capped.

Crude Polymer 5 with the terminal residue being capped was dissolved in toluene and reprecipitated with acetone, and the precipitated polymer was separated by filtration. The obtained polymer 5 was dissolved in toluene, and the solution was washed with dilute hydrochloric acid and reprecipitated with ammonia-containing ethanol. The polymer collected by filtration was purified by column chromatography to obtain Target 16 (1.8 g).

Weight average molecular weight (Mw)=42,000

Number average molecular weight (Mn)=23,300

Dispersity (Mw/Mn)=1.80

Synthesis Example 17

[Chem. 58]

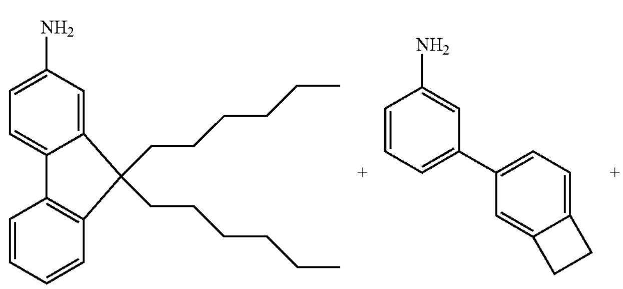

Target 5 Target 2

-continued

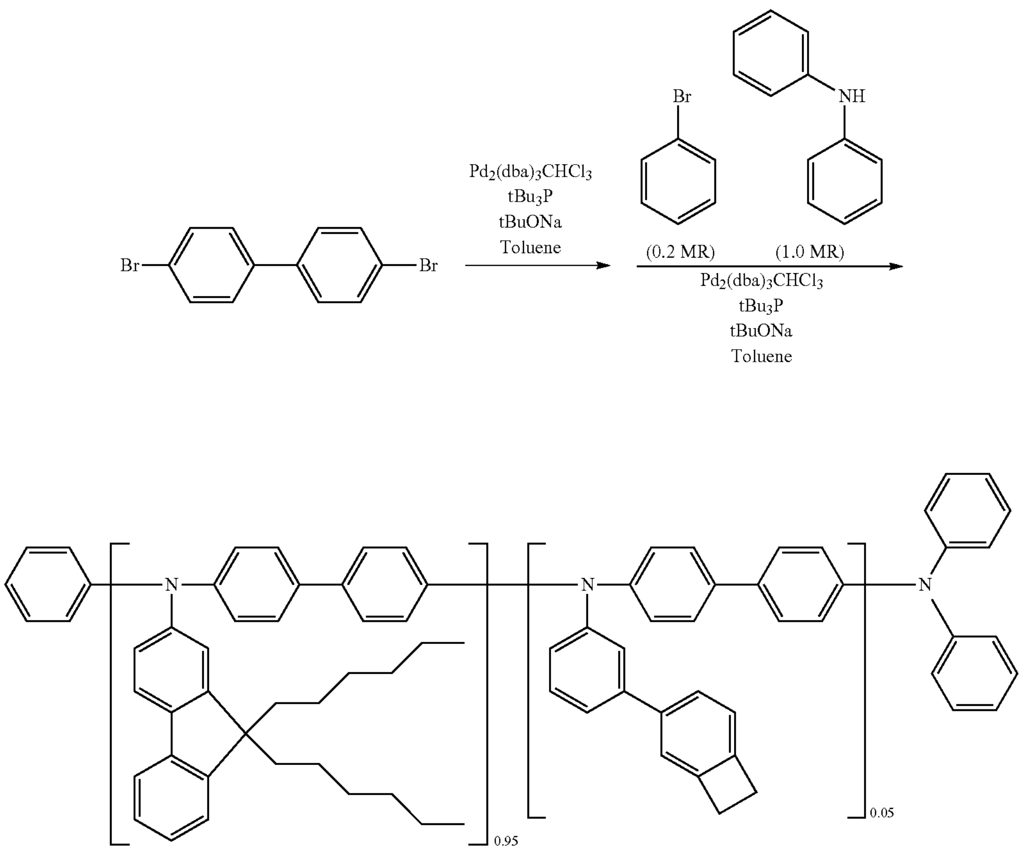

Target 17

Target 5 (7.5 g, 21.5 mmol) obtained in Synthesis Example 5, Target 2 (0.22 g, 1.1 mmol) obtained in Synthesis Example 2,4,4'-dibromobiphenyl (3.53 g, 11.3 mmol), tert-butoxy sodium (6.95 g, 72.3 mmol) and toluene (120 ml) were charged and after thoroughly purging the system with nitrogen, the mixture was heated to 50° C. (Solution A). Tri-tert-butylphosphine (0.33 g, 0.45 mmol) was added to a 5 ml toluene solution of tris(dibenzylideneacetone)dipalladium chloroform complex (0.06 g, 0.06 mmol), and the mixture was heated to 50° C. (Solution B). In a nitrogen stream, Solution B was added to Solution A, and the mixed solution was reacted by refluxing under heating for 3 hours. Disappearance of raw materials was confirmed, and 4,4'-dibromobiphenyl (3.31 g, 10.6 mmol) was additionally added. The mixture was refluxed under heating for 1.5 hours and since start of polymerization was confirmed, 4,4'-dibromobiphenyl (0.07 g, 0.2 mmol) was additionally added every 1.5 hours three times in total. After the addition of the entire amount of 4,4'-dibromobiphenyl, the mixture was further refluxed under heating for 1 hour, and the reaction solution was allowed to cool and then added dropwise in 300 ml of ethanol to crystallize Crude Polymer 6.

Crude Polymer 6 obtained was dissolved in 180 ml of toluene, and bromobenzene (0.71 g, 4.5 mmol) and tert-butoxy sodium (3.5 g, 36.4 mmol) were charged. After thoroughly purging the system with nitrogen, the mixture was heated to 50° C. (Solution C). Tri-tert-butylphosphine (0.18 g, 0.9 mmol) was added to a 10 ml toluene solution of tris (dibenzylideneacetone)dipalladium chloroform complex (0.12 g, 0.1 mmol), and the mixture was heated to 50° C. (Solution D). In a nitrogen stream, Solution D was added to Solution C, and the mixed solution was reacted by refluxing under heating for 2 hours. To this reaction solution, a toluene (2 ml) solution of N,N-diphenylamine (3.82 g, 22.6 mmol) was added, and the mixture was further reacted by refluxing under heating for 8 hours. The reaction solution was allowed to cool and then added dropwise in an ethanol/water (250 ml/50 ml) solution to obtain Crude Polymer 6 with the terminal residue being capped.

Crude Polymer 6 with the terminal residue being capped was dissolved in toluene and reprecipitated with acetone, and the precipitated polymer was separated by filtration. The obtained polymer 6 was dissolved in toluene, and the solution was washed with dilute hydrochloric acid and reprecipitated with ammonia-containing ethanol. The polymer collected by filtration was purified by column chromatography to obtain Target 17 (1.2 g).

Weight average molecular weight (Mw)=35,000

Number average molecular weight (Mn)=19,000

Dispersity (Mw/Mn)=1.84

Synthesis Example 18

[Chem. 59]

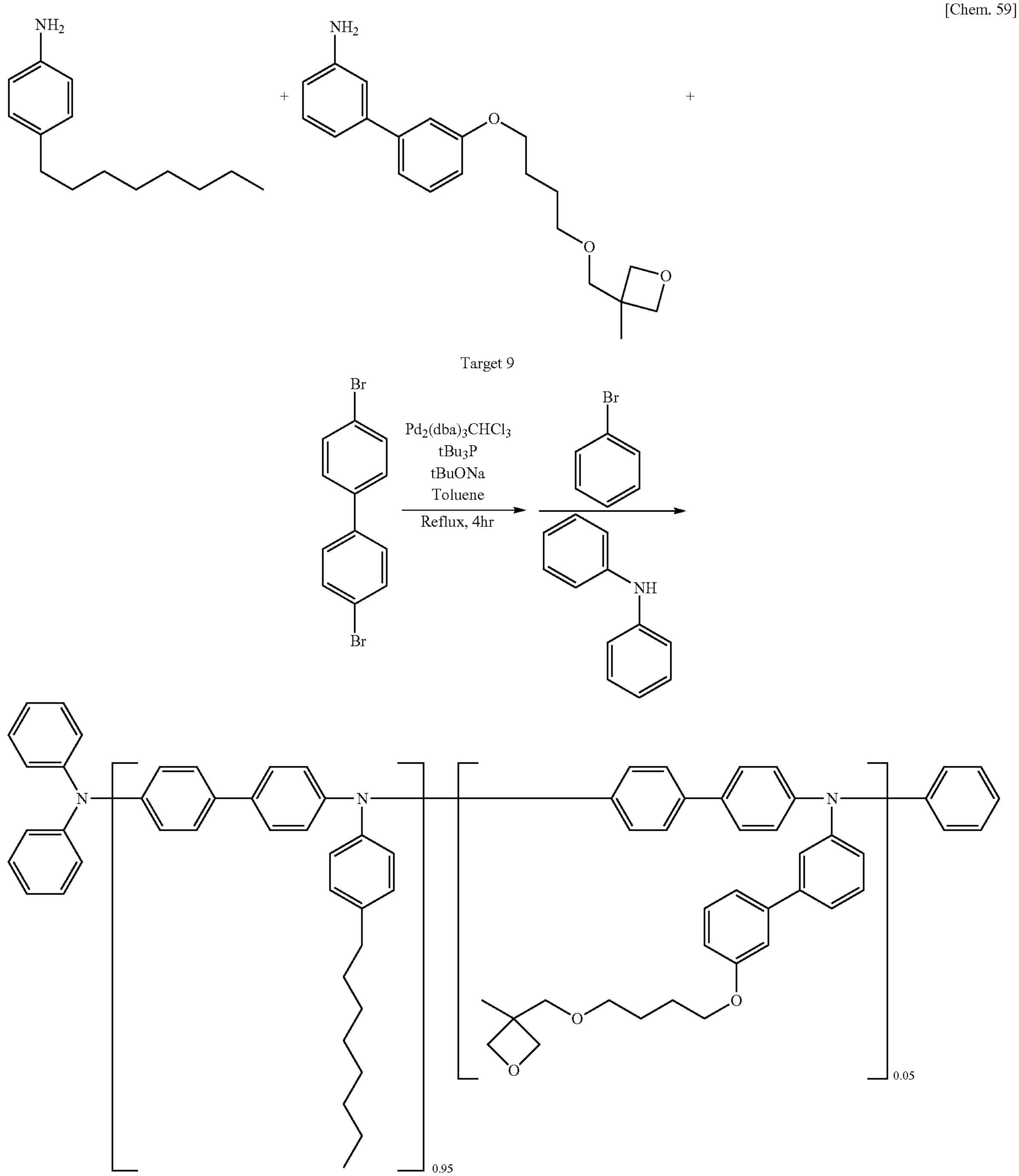

Target 18

4-n-Octylaniline (2.285 g, 11.13 mmol), Target 9 (0.2 g, 0.59 mmol) obtained in Synthesis Example 9, 4,4'-dibromobiphenyl (1.83 g, 5.86 mmol), tert-butoxy sodium (3.6 g, 37.49 mmol) and toluene (20 ml) were charged and after thoroughly purging the system with nitrogen, the mixture was heated to 50° C. (Solution A). Tri-tert-butylphosphine (0.189 g, 0.94 mmol) was added to a 10 ml toluene solution of tris(dibenzylideneacetone)dipalladium chloroform complex (0.12 g, 0.12 mmol), and the mixture was heated to 50° C. (Solution B). In a nitrogen stream, Solution B was added to Solution A, and the mixed solution was reacted by refluxing under heating for 1 hour. Disappearance of raw materials was confirmed, and 4,4'-dibromobiphenyl (1.72 g, 5.51 mmol) was additionally added. The mixture was refluxed under heating for 1 hour and since start of polymerization was confirmed, 4,4'-dibromobiphenyl (0.036 g, 0.12 mmol) was additionally added every 40 minutes three times in total (0.11 g in total). After the addition of the entire amount of 4,4'-dibromobiphenyl, the mixture was further refluxed under heating for 1 hour, and the reaction solution was allowed to cool and then added dropwise in 300 ml of ethanol to crystallize Crude Polymer 7.

Crude Polymer 7 obtained was dissolved in 110 ml of toluene, and bromobenzene (0.39 g, 2.48 mmol) and tert-butoxy sodium (3.8 g, 39.74 mmol) were charged. After thoroughly purging the system with nitrogen, the mixture was heated to 50° C. (Solution C). Tri-tert-butylphosphine (0.2 g, 0.99 mmol) was added to a 10 ml toluene solution of tris(dibenzylideneacetone)dipalladium chloroform complex (0.13 g, 0.12 mmol), and the mixture was heated to 50° C. (Solution D). In a nitrogen stream, Solution D was added to Solution C, and the mixed solution was reacted by refluxing under heating for 2 hours. To this reaction solution, a toluene (2 ml) solution of N,N-diphenylamine (2.1 g, 12.4 mmol) was added, and the mixture was further reacted by refluxing under heating for 6 hours. The reaction solution was allowed to cool and then added dropwise in an ethanol/water (250 ml/50 ml) solution to obtain Crude Polymer 7 with the terminal residue being capped.

Crude Polymer 7 with the terminal residue being capped was dissolved in toluene and reprecipitated with acetone, and the precipitated polymer was separated by filtration. The obtained polymer was dissolved in toluene, and the solution was washed with dilute hydrochloric acid and reprecipitated with ammonia-containing ethanol. The polymer collected by filtration was purified by column chromatography to obtain Target 18 (0.84 g).

Weight average molecular weight (Mw)=51,600

Number average molecular weight (Mn)=26,500

Dispersity (Mw/Mn)=1.95

Synthesis Example 19

[Chem. 60]

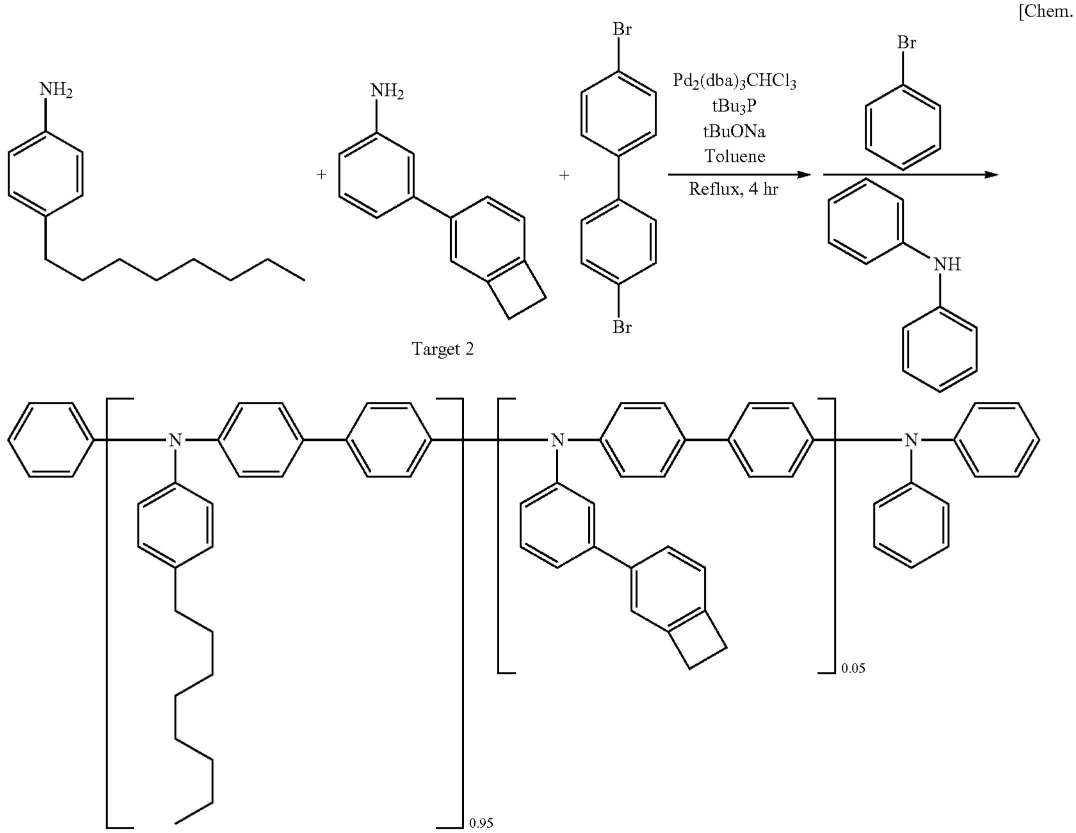

Target 19

4-n-Octylaniline (1.798 g, 8.755 mmol), Target 2 (0.090 g, 0.461 mmol) obtained in Synthesis Example 2,4,4'-dibromobiphenyl (1.438 g, 4.609 mmol), tert-butoxy sodium (2.83 g, 29.4 mmol) and toluene (25 ml) were charged and after thoroughly purging the system with nitrogen, the mixture was heated to 50° C. (Solution A). Tri-tert-butylphosphine (0.149 g, 0.736 mmol) was added to a 5 ml toluene solution of tris(dibenzylideneacetone)dipalladium chloroform complex (0.095 g, 0.092 mmol), and the mixture was heated to 60° C. (Solution B). In a nitrogen stream, Solution B was added to Solution A, and the mixed solution was reacted by refluxing under heating for 1 hour. Disappearance of raw materials was confirmed, and 4,4'-dibromobiphenyl (1.351 g, 4.330 mmol) was additionally added. The mixture was refluxed under heating for 1 hour and by confirming the start of polymerization, 4,4'-dibromobiphenyl (0.030 g, 0.096 mmol) was additionally added. After the addition of 4,4'-dibromobiphenyl, the mixture was further refluxed under heating for 1 hour, and the reaction solution was allowed to cool and then added dropwise in 200 ml of ethanol to crystallize Crude Polymer 8.

Crude Polymer 8 obtained was dissolved in 120 ml of toluene, and bromobenzene (0.289 g, 1.84 mmol) and tert-butoxy sodium (1.41 g, 14.7 mmol) were charged. After thoroughly purging the system with nitrogen, the mixture was heated to 50° C. (Solution C). Tri-tert-butylphosphine (0.075 g, 0.353 mmol) was added to a 5 ml toluene solution of tris(dibenzylideneacetone)dipalladium chloroform complex (0.048 g, 0.046 mmol), and the mixture was heated to 60° C. (Solution D). In a nitrogen stream, Solution D was added to Solution C, and the mixed solution was reacted by refluxing under heating for 2 hours. To this reaction solution, a toluene (2 ml) solution of N,N-diphenylamine (1.528 g, 9.030 mmol) was added, and the mixture was further reacted by refluxing under heating for 5 hours. The reaction solution was allowed to cool and then added dropwise in an ethanol (300 ml) solution to obtain Crude Polymer 8 with the terminal residue being capped.

Crude Polymer 8 with the terminal residue being capped was dissolved in toluene and reprecipitated with acetone, and the precipitated polymer was separated by filtration. The obtained polymer was dissolved in toluene, and the solution was washed with dilute hydrochloric acid and reprecipitated with ammonia-containing ethanol. The polymer collected by filtration was purified by column chromatography to obtain Target 19 (0.37 g).

Weight average molecular weight (Mw)=46,500

Number average molecular weight (Mn)=28,300

Dispersity (Mw/Mn)=1.64

Synthesis Example 20

[Chem. 61]

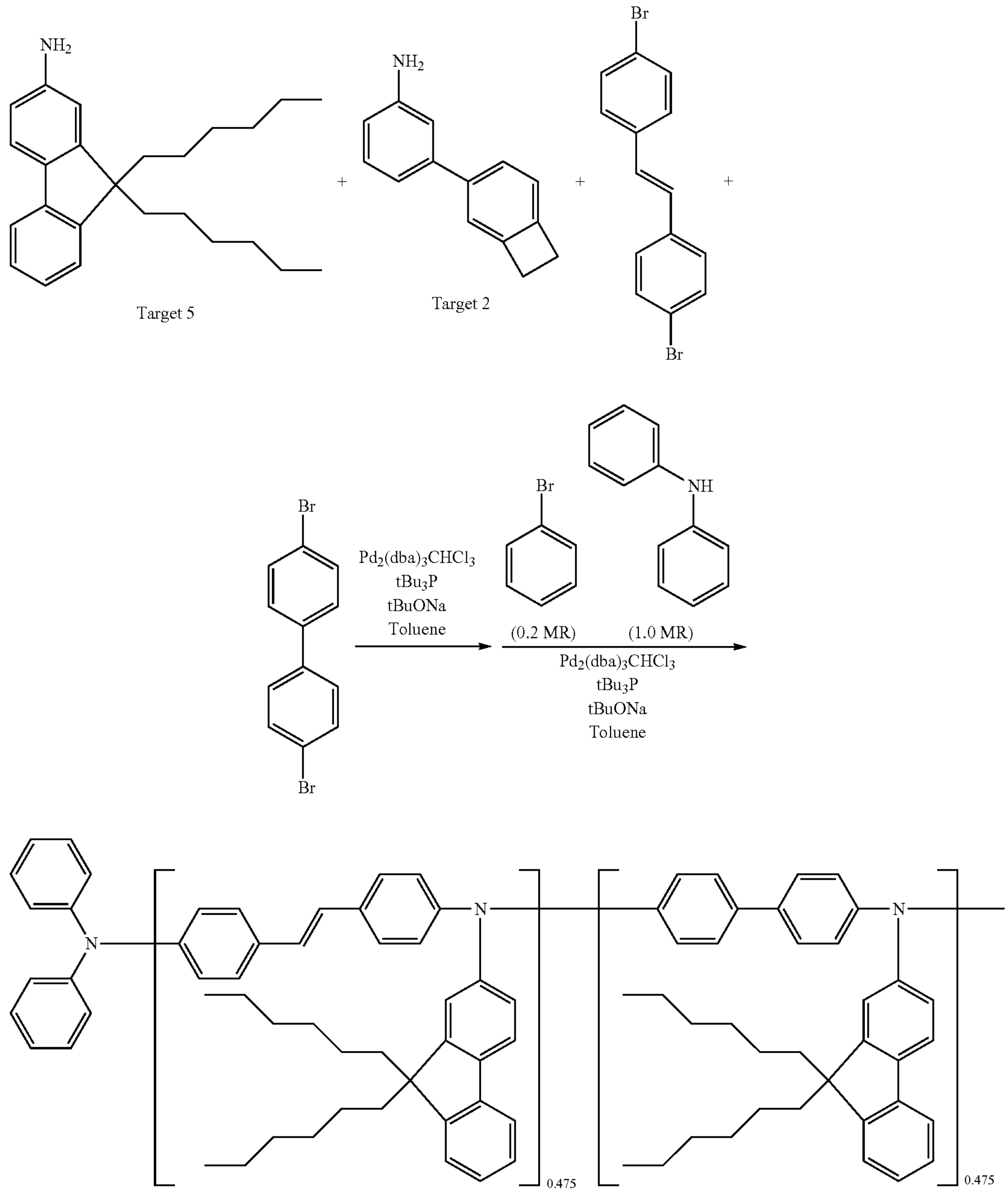

-continued

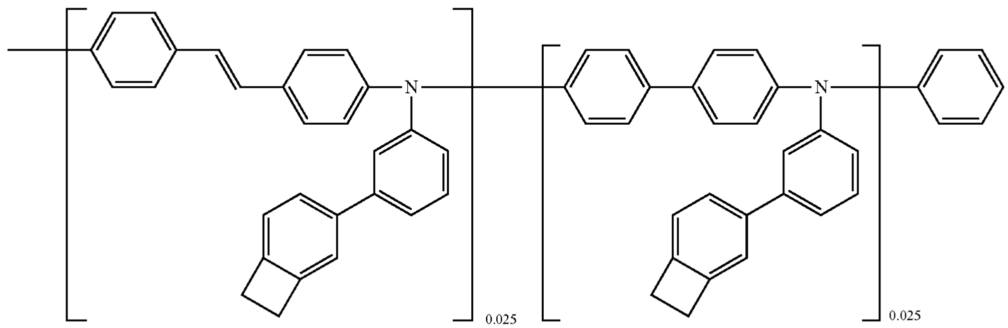

Target 20

Target 5 (7.5 g, 21.5 mmol) obtained in Synthesis Example 5, Target 2 (0.22 g, 1.1 mmol) obtained in Synthesis Example 2,4,4'-dibromostilbene (3.82 g, 11.3 mmol), tert-butoxy sodium (6.95 g, 72.3 mmol) and toluene (120 ml) were charged and after thoroughly purging the system with nitrogen, the mixture was heated to 50° C. (Solution A). Tri-tert-butylphosphine (0.33 g, 0.45 mmol) was added to a 5 ml toluene solution of tris(dibenzylideneacetone)dipalladium chloroform complex (0.06 g, 0.06 mmol), and the mixture was heated to 50° C. (Solution B). In a nitrogen stream, Solution B was added to Solution A, and the mixed solution was reacted by refluxing under heating for 3 hours. Disappearance of raw materials was confirmed, and 4,4'-dibromobiphenyl (3.31 g, 10.6 mmol) was additionally added. The mixture was refluxed under heating for 1.5 hours and since start of polymerization was confirmed, 4,4'-dibromobiphenyl (0.07 g, 0.2 mmol) was additionally added every 1.5 hours three times in total. After the addition of the entire amount of 4,4'-dibromobiphenyl, the mixture was further refluxed under heating for 1 hour, and the reaction solution was allowed to cool and then added dropwise in 300 ml of ethanol to crystallize Crude Polymer 9.

Crude Polymer 9 obtained was dissolved in 180 ml of toluene, and bromobenzene (0.71 g, 4.5 mmol) and tert-butoxy sodium (3.5 g, 36.4 mmol) were charged. After thoroughly purging the system with nitrogen, the mixture was heated to 50° C. (Solution C). Tri-tert-butylphosphine (0.18 g, 0.9 mmol) was added to a 10 ml toluene solution of tris (dibenzylideneacetone)dipalladium chloroform complex (0.12 g, 0.1 mmol), and the mixture was heated to 50° C. (Solution D). In a nitrogen stream, Solution D was added to Solution C, and the mixed solution was reacted by refluxing under heating for 2 hours. To this reaction solution, a toluene (2 ml) solution of N,N-diphenylamine (3.82 g, 22.6 mmol) was added, and the mixture was further reacted by refluxing under heating for 8 hours. The reaction solution was allowed to cool and then added dropwise in an ethanol/water (250 ml/50 ml) solution to obtain Crude Polymer 9 with the terminal residue being capped.

Crude Polymer 9 with the terminal residue being capped was dissolved in toluene and reprecipitated with acetone, and the precipitated polymer was separated by filtration. The obtained polymer 9 was dissolved in toluene, and the solution was washed with dilute hydrochloric acid and reprecipitated with ammonia-containing ethanol. The polymer collected by filtration was purified by column chromatography to obtain Target 20 (0.9 g).

Weight average molecular weight (Mw)=60,000

Number average molecular weight (Mn)=27,000

Dispersity (Mw/Mn)=2.22

Synthesis Example 21

[Chem. 62]

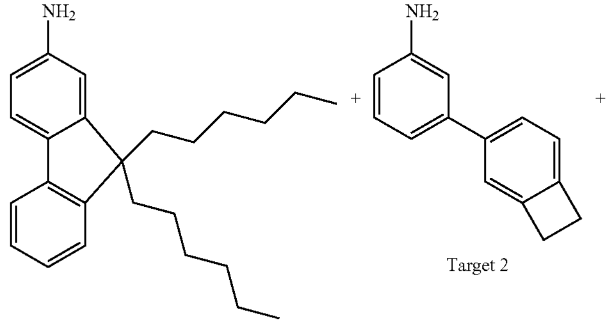

Target 5

Target 2

-continued

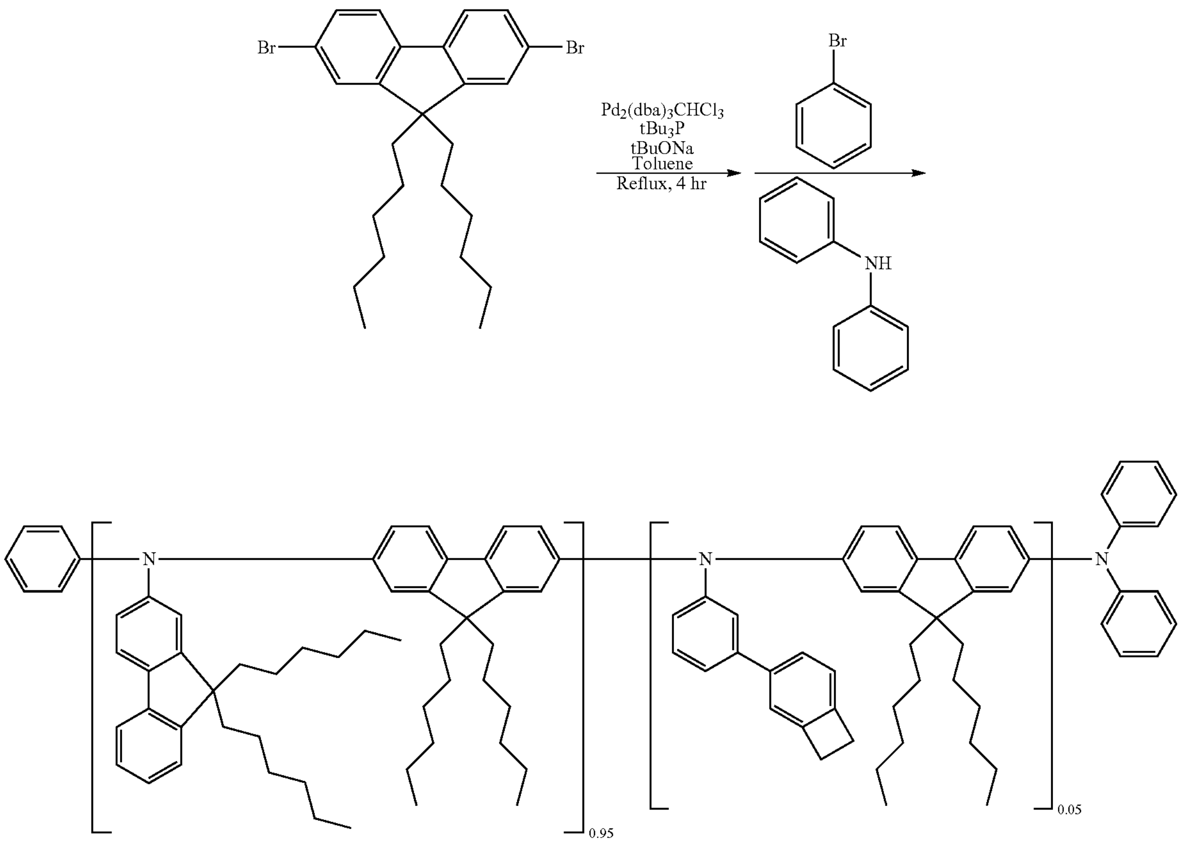

Target 21

Target 5 (2.99 g, 8.6 mmol) obtained in Synthesis Example 5, Target 2 (0.09 g, 0.5 mmol) obtained in Synthesis Example 2, 2,7-dibromo-9,9-dihexylfluorene (2.22 g, 4.5 mmol), tert-butoxy sodium (3.24 g, 34.0 mmol) and toluene (20 ml) were charged and after thoroughly purging the system with nitrogen, the mixture was heated to 60° C. (Solution A). Tri-tert-butylphosphine (0.146 g, 7.2 mmol) was added to a 5 ml toluene solution of tris(dibenzylideneacetone)dipalladium chloroform complex (0.10 g, 0.01 mmol), and the mixture was heated to 60° C. (Solution B). In a nitrogen stream, Solution B was added to Solution A, and the mixed solution was reacted by refluxing under heating for 1 hour. Disappearance of raw materials was confirmed, and 2,7-dibromo-9,9-dihexylfluorene (2.08 g, 4.2 mmol) was additionally added. The mixture was refluxed under heating for 1 hour and since start of polymerization was confirmed, 2,7-dibromo-9,9-dihexylfluorene (0.044 g, 0.1 mmol) was additionally added every 1 hour three times in total (0.13 g in total). After the addition of the entire amount of 2,7-dibromo-9,9-dihexylfluorene, the mixture was reacted by refluxing under heating for 2 hours, and the reaction solution was allowed to cool and then added dropwise in 300 ml of methanol to crystallize Crude Polymer 10.

Crude Polymer 10 obtained was dissolved in 150 ml of toluene, and bromobenzene (1.41 g, 9 mmol) and tert-butoxy sodium (1.04 g, 11 mmol) were charged. After thoroughly purging the system with nitrogen, the mixture was heated to 50° C. (Solution C). Tri-tert-butylphosphine (0.016 g, 0.9 mmol) was added to a 10 ml toluene solution of tris(dibenzylideneacetone)dipalladium chloroform complex (0.075 g, 0.0071 mmol), and the mixture was heated to 50° C. (Solution D). In a nitrogen stream, Solution D was added to Solution C, and the mixed solution was reacted by refluxing under heating for 2 hours. To this reaction solution, a toluene (2 ml) solution of N,N-diphenylamine (1.52 g, 9 mmol) was added, and the mixture was further reacted by refluxing under heating for 4 hours. The reaction solution was allowed to cool and then added dropwise in methanol to obtain Crude Polymer 10 with the terminal residue being capped.

Crude Polymer 10 with the terminal residue being capped was dissolved in toluene and reprecipitated with acetone, and the precipitated polymer was separated by filtration. The obtained polymer was dissolved in toluene, and the solution was washed with dilute hydrochloric acid and reprecipitated with ammonia-containing ethanol. The polymer collected by filtration was purified by column chromatography to obtain Target 21 (0.87 g).

Weight average molecular weight (Mw)=39,000

Number average molecular weight (Mn)=24,400

Dispersity (Mw/Mn)=1.60

Synthesis Example 22

[Chem. 63]

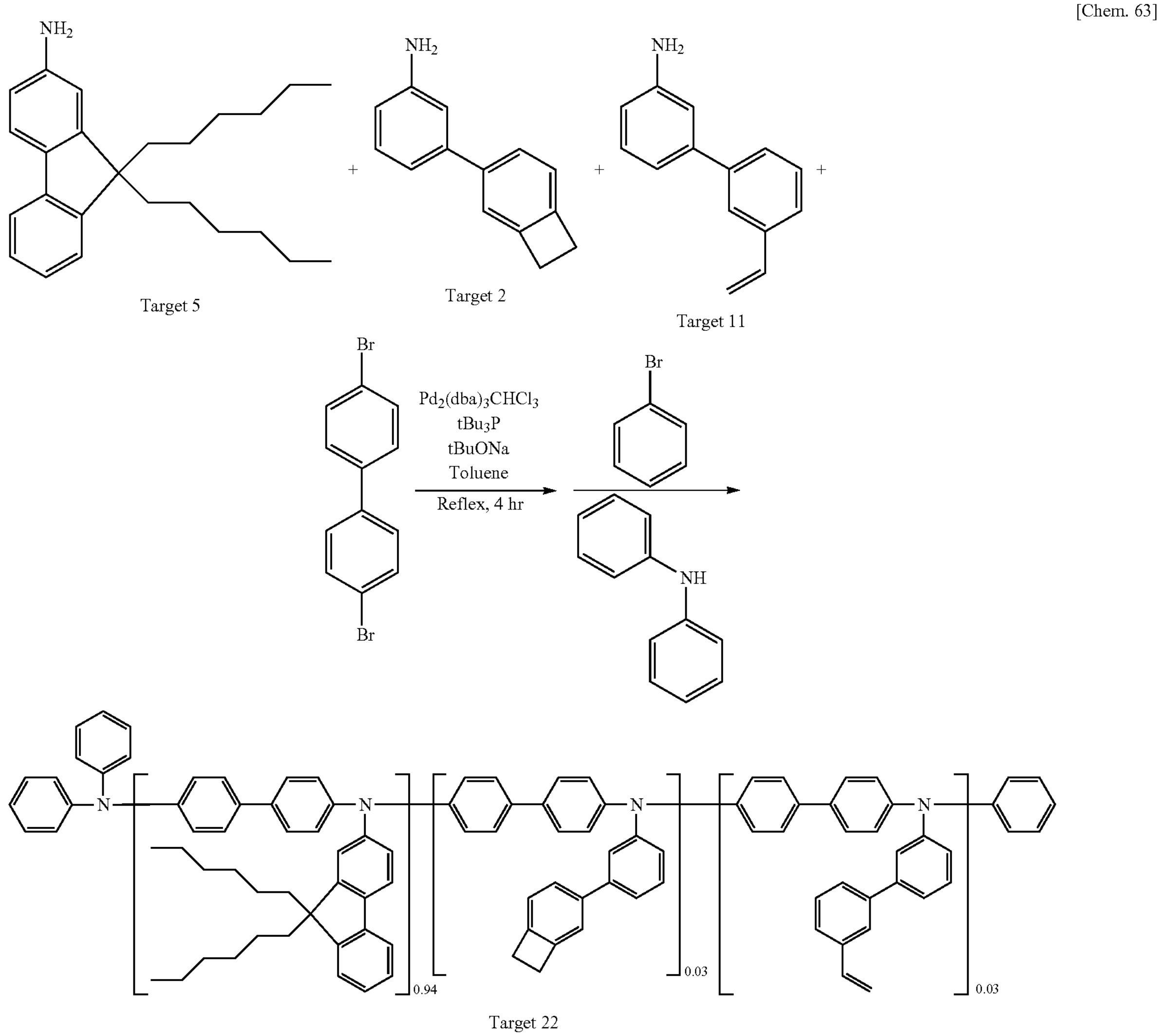

Target 5 (2.63 g, 7.532 mmol) obtained in Synthesis Example 5, Target 2 (0.047 g, 0.2404 mmol) obtained in Synthesis Example 2, Target 11 (0.047 g, 0.2404 mmol) obtained in Synthesis Example 11, 4,4'-dibromobiphenyl (1.25 g, 4.0 mmol), tert-butoxy sodium (2.9 g, 30.45 mmol) and toluene (20 ml) were charged and after thoroughly purging the system with nitrogen, the mixture was heated to 50° C. (Solution A). Tri-tert-butylphosphine (0.13 g, 0.64 mmol) was added to a 10 ml toluene solution of tris(dibenzylideneacetone)dipalladium chloroform complex (0.083 g, 0.0801 mmol), and the mixture was heated to 50° C. (Solution B). In a nitrogen stream, Solution B was added to Solution A, and the mixed solution was reacted by refluxing under heating for 2 hours. Disappearance of raw materials was confirmed, and 4,4'-dibromobiphenyl (1.175 g, 3.77 mmol) was additionally added. The mixture was refluxed under heating for 2 hours and since start of polymerization was confirmed, 4,4'-dibromobiphenyl (0.025 g, 0.08 mmol) was additionally added. After refluxing under heating for 1 hour, the reaction solution was allowed to cool and then added dropwise in 300 ml of ethanol to crystallize Crude Polymer 11.

Crude Polymer 11 (4.1 g, 8.36 mmol) obtained was dissolved in 110 ml of toluene, and bromobenzene (0.26 g, 1.76 mmol) and tert-butoxy sodium (3.1 g, 31.77 mmol) were charged. After thoroughly purging the system with nitrogen, the mixture was heated to 50° C. (Solution C). Tri-tert-butylphosphine (0.135 g, 0.669 mmol) was added to a 10 ml toluene solution of tris(dibenzylideneacetone)dipalladium chloroform complex (0.173 g, 0.167 mmol), and the mixture was heated to 50° C. (Solution D). In a nitrogen stream, Solution D was added to Solution C, and the mixed solution was reacted by refluxing under heating for 2 hours. To this reaction solution, a toluene (2 ml) solution of N,N-diphenylamine (1.4 g, 8.36 mmol) was added, and the mixture was further reacted by refluxing under heating for 6 hours. The reaction solution was allowed to cool and then added dropwise in an ethanol/water (250 ml/50 ml) solution to obtain Crude Polymer 11 with the terminal residue being capped.

Crude Polymer 11 with the terminal residue being capped was dissolved in toluene and reprecipitated with acetone, and the precipitated polymer was separated by filtration. The obtained polymer was dissolved in toluene, and the solution was washed with dilute hydrochloric acid and reprecipitated with ammonia-containing ethanol. The polymer collected by filtration was purified by column chromatography to obtain Target 22 (0.91 g).

Weight average molecular weight (Mw)=31,300

Number average molecular weight (Mn)=15,100

Dispersity (Mw/Mn)=2.07

Synthesis Example 23

[Chem. 64]

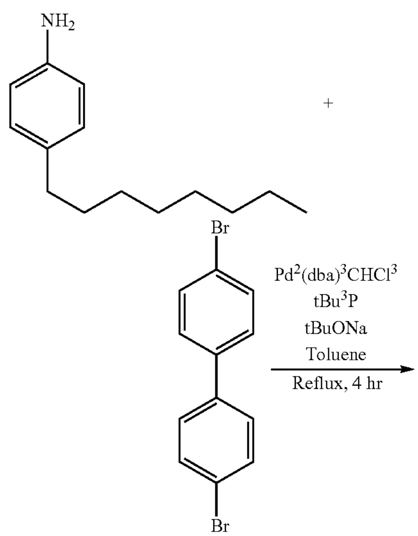

-continued

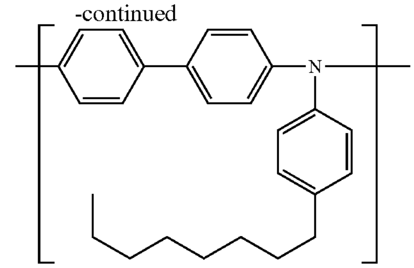

Target 23

4-n-Octylaniline (3.0 g, 14.6 mmol), 4,4'-dibromobiphenyl (2.28 g, 7.3 mmol), tert-butoxy sodium (4.49 g, 46.8 mmol) and toluene (33 ml) were charged and after thoroughly purging the system with nitrogen, the mixture was heated to 50° C. (Solution A). Tri-tert-butylphosphine (0.24 g, 1.17 mmol) was added to a 10 ml toluene solution of tris(dibenzylideneacetone)dipalladium chloroform complex (0.151 g, 0.146 mmol), and the mixture was heated to 50° C. (Solution B). In a nitrogen stream, Solution B was added to Solution A, and the mixed solution was reacted by refluxing under heating for 1 hour. Disappearance of raw materials was confirmed, and 4,4'-dibromobiphenyl (2.14 g, 6.9 mmol) was additionally added. The mixture was refluxed under heating for 2 hours and since start of polymerization was confirmed, 4,4'-dibromobiphenyl (0.05 g, 0.2 mmol) was additionally added every 1 hour three times in total. Thereafter, the mixture was refluxed under heating for 1 hour, and the reaction solution was allowed to cool and then added dropwise in 200 ml of ethanol to crystallize Target 23.

Weight average molecular weight (Mw)=59,000

Number average molecular weight (Mn)=30,800

Dispersity (Mw/Mn)=1.92

Synthesis Example 24

[Chem. 65]

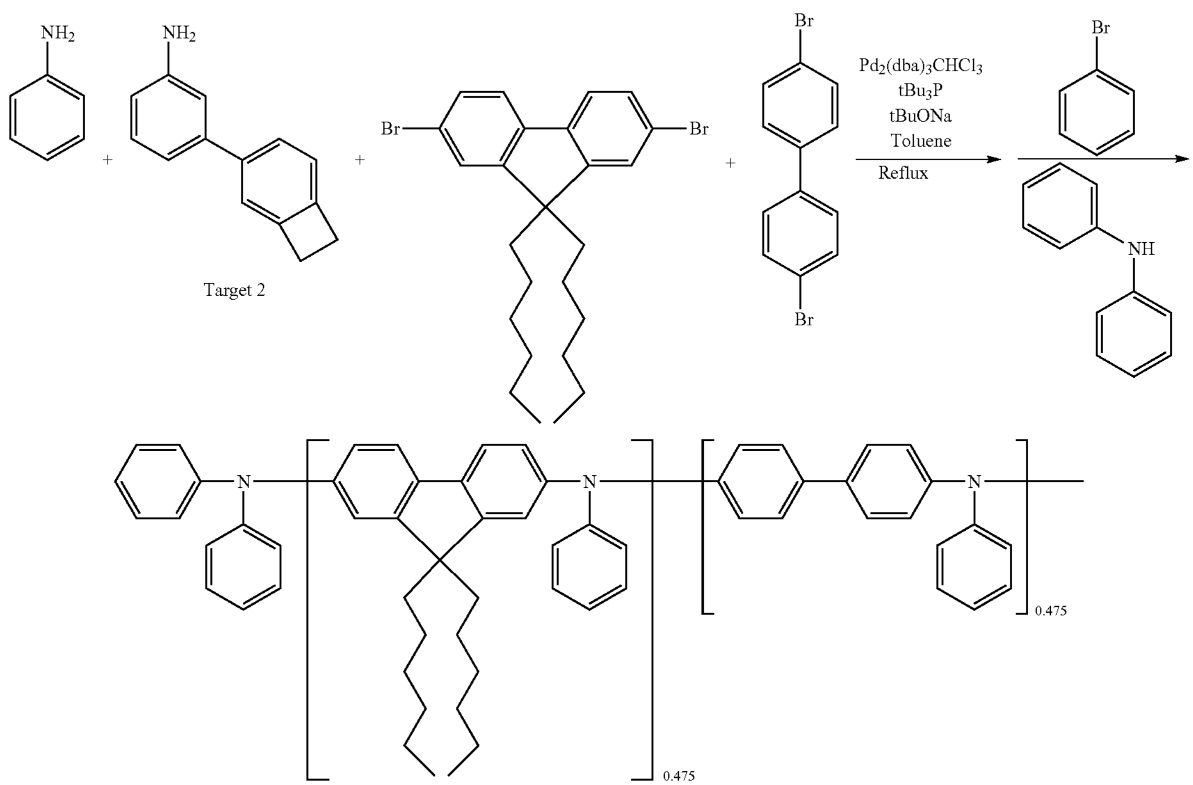

-continued

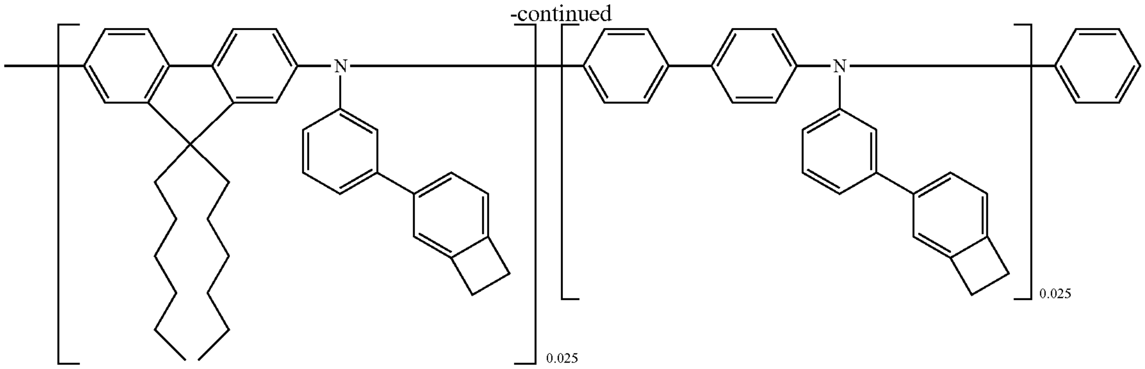

Target 24

Aniline (1.98 g, 21.3 mmol), Target 2 (0.22 g, 1.1 mmol) obtained in Synthesis Example 2, 2,7-dibromo-9,9-dihexylfluorene (5.52 g, 11.2 mmol), tert-butoxy sodium (6.90 g, 71.8 mmol) and toluene (51 ml) were charged and after thoroughly purging the system with nitrogen, the mixture was heated to 50° C. (Solution A). Tri-tert-butylphosphine (0.37 g, 1.8 mmol) was added to a 15 ml toluene solution of tris (dibenzylideneacetone)dipalladium chloroform complex (0.23 g, 0.2 mmol), and the mixture was heated to 50° C. (Solution B). In a nitrogen stream, Solution B was added to Solution A, and the mixed solution was reacted by refluxing under heating for 1 hour. Disappearance of raw materials was confirmed, and 4,4'-dibromobiphenyl (3.29 g, 10.5 mmol) was additionally added. The mixture was refluxed under heating for 1 hour and since start of polymerization was confirmed, 4,4'-dibromobiphenyl (0.07 g, 0.2 mmol) was additionally added every 1 hour three times in total (0.21 g in total). After the addition of the entire amount of 4,4'-dibromobiphenyl, the mixture was further refluxed under heating for 30 minutes, and the reaction solution was allowed to cool and then added dropwise in an aqueous ethanol solution (300 ml of ethanol+50 ml of water) to crystallize Crude Polymer 12.

Crude Polymer 12 obtained was dissolved in 140 ml of toluene, and bromobenzene (0.70 g, 4.5 mmol) and tert-butoxy sodium (3.45 g, 35.9 mmol) were charged. After thoroughly purging the system with nitrogen, the mixture was heated to 50° C. (Solution C). Tri-tert-butylphosphine (0.19 g, 0.9 mmol) was added to a 8 ml toluene solution of tris (dibenzylideneacetone)dipalladium chloroform complex (0.11 g, 0.1 mmol), and the mixture was heated to 50° C. (Solution D). In a nitrogen stream, Solution D was added to Solution C, and the mixed solution was reacted by refluxing under heating for 2 hours. To this reaction solution, a toluene (2 ml) solution of N,N-diphenylamine (3.80 g, 22.5 mmol) was added, and the mixture was further reacted by refluxing under heating for 6 hours. The reaction solution was allowed to cool and then added dropwise in an aqueous ethanol solution (300 ml of ethanol+50 ml) to obtain Crude Polymer 12 with the terminal residue being capped.

Crude Polymer 12 with the terminal residue being capped was dissolved in toluene and reprecipitated with toluene, and the precipitated polymer was separated by filtration. The obtained polymer was dissolved in toluene, and the solution was washed with dilute hydrochloric acid and reprecipitated with ammonia-containing ethanol. The polymer collected by filtration was purified by column chromatography twice to obtain Target 24 (1.38 g).

Weight average molecular weight (Mw)=67,850
Number average molecular weight (Mn)=35,400
Dispersity (Mw/Mn)=1.92

Synthesis Example 25

[Chem. 66]

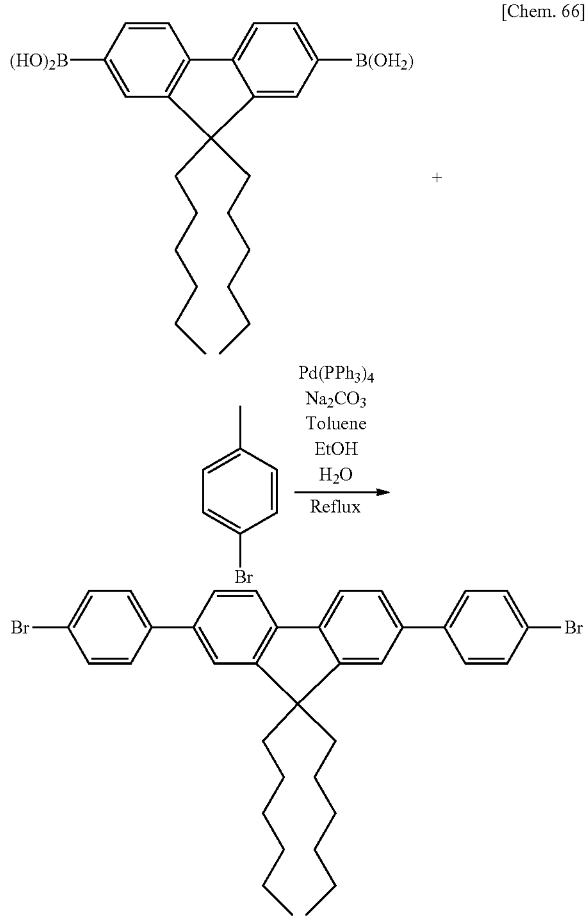

Target 25

9,9-Dihexylfluorene-2,7-diboronic acid (3.0 g, 7.1 mmol), 4-bromoiodobenzene (4.42 g, 15.6 mmol), toluene (45 ml) and ethanol (45 ml) were charged into a reaction vessel, and nitrogen purging was repeated under reduced pressure to create a nitrogen atmosphere in the system. The system was further thoroughly purged with nitrogen, and tetrakis(triphenylphosphine)palladium (0.54 g, 0.5 mmol) was added. Furthermore, an aqueous solution (22 ml) of degassed sodium carbonate (4.52 g, 43 mmol) was added, and the mixture was reacted for 6 hours. After the completion of reaction, water was added to the reaction solution, and the organic layer was extracted with toluene. The obtained organic layer was washed with water twice and concentrated through dehydration and drying by adding sodium sulfate. The crude product was washed with n-hexane, purified by silica gel column chromatography (hexane/methylene chloride) and further suspension-washed with methylene chloride/methanol to obtain Target 25 (3.15 g).

Synthesis Example 26

[Chem. 67]

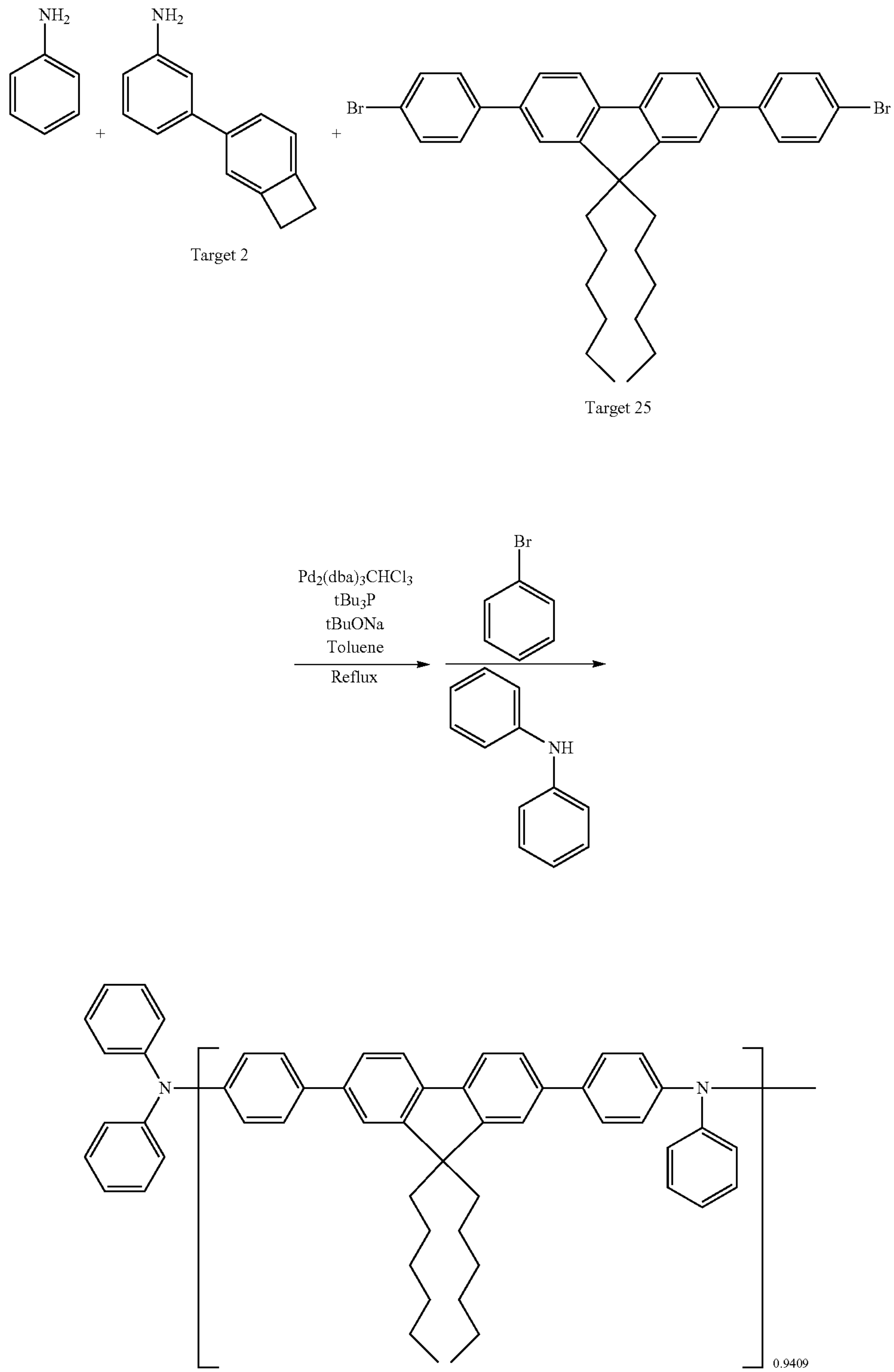

-continued

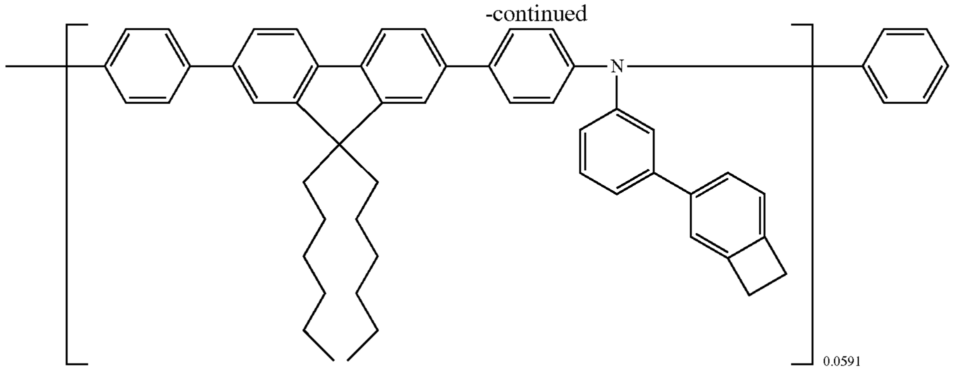

Target 26

Aniline (0.951 g, 10.2 mmol), Target 2 (0.125 g, 0.642 mmol) obtained in Synthesis Example 2, Target 25 (3.50 g, 5.43 mmol) obtained in Synthesis Example 25, tert-butoxy sodium (3.34 g, 34.8 mmol) and toluene (25 ml) were charged and after thoroughly purging the system with nitrogen, the mixture was heated to 50° C. (Solution A). Tri-tert-butylphosphine (0.18 g, 0.87 mmol) was added to a 5 ml toluene solution of tris(dibenzylideneacetone)dipalladium chloroform complex (0.11 g, 0.11 mmol), and the mixture was heated to 50° C. (Solution B). In a nitrogen stream, Solution B was added to Solution A, and the mixed solution was reacted by refluxing under heating for 1.5 hours. Disappearance of raw materials was confirmed, and Target 25 (3.22 g, 5.00 mmol) was additionally added. The mixture was refluxed under heating for 2 hours and after confirming the start of polymerization, Target 25 (0.07 g, 0.11 mmol) was additionally added. The mixture was further refluxed under heating for 2 hours, and the reaction solution was allowed to cool and then added dropwise in ethanol (250 ml) to crystallize Crude Polymer 13.

Crude Polymer 13 obtained was dissolved in 200 ml of toluene, and bromobenzene (0.34 g, 2.1 mmol) and tert-butoxy sodium (3.34 g, 34.8 mmol) were charged. After thoroughly purging the system with nitrogen, the mixture was heated to 50° C. (Solution C). Tri-tert-butylphosphine (0.09 g, 0.48 mmol) was added to a 5 ml toluene solution of tris (dibenzylideneacetone)dipalladium chloroform complex (0.06 g, 0.06 mmol), and the mixture was heated to 50° C. (Solution D). In a nitrogen stream, Solution D was added to Solution C, and the mixed solution was reacted by refluxing under heating for 2.5 hours. To this reaction solution, a toluene (2 ml) solution of N,N-diphenylamine (1.84 g, 10.9 mmol) and Solution D prepared again were added, and the mixture was further reacted by refluxing under heating for 6 hours. The reaction solution was allowed to cool and after removing toluene by distillation, added dropwise in ethanol (300 ml) to obtain Crude Polymer 13.

Crude Polymer 13 was dissolved in toluene and reprecipitated with acetone, and the precipitated polymer was separated by filtration. The obtained polymer was dissolved in toluene, and the solution was washed with dilute hydrochloric acid and reprecipitated with ammonia-containing ethanol. The polymer collected by filtration was purified by column chromatography three times to obtain Target 26 (3.59 g).

Weight average molecular weight (Mw)=67,850

Number average molecular weight (Mn)=35,400

Dispersity (Mw/Mn)=1.92

Out of Targets 12 to 26, with respect to targets coming under the following structure, the weight average molecular weight (Mw) and the dispersity (Mw/Mn) are shown together in Table 1.

[Chem. 68]

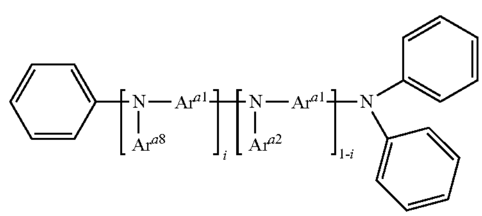

TABLE 1
| Synthesis Example | Target | $Ar^{a8}$ | $Ar^{a1}$ | $Ar^{a2}$ | i | Mw | Mn | Mw/Mn |
|---|---|---|---|---|---|---|---|---|
| 12 | 12 | 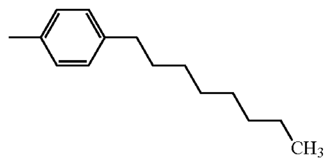 | 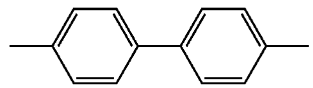 | 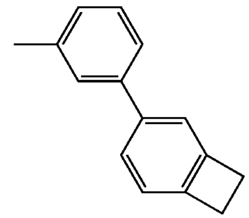 | 0.8 | 63900 | 40300 | 1.59 |
| 19 | 19 | " | " | " | 0.95 | 46500 | 28300 | 1.64 |
| 14 | 14 | 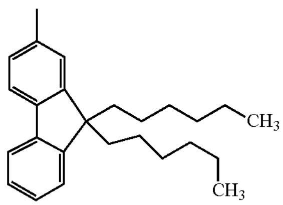 | 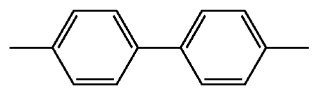 | 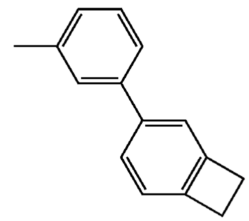 | 0.8 | 43300 | 36400 | 1.19 |
| 17 | 17 | " | " | " | 0.95 | 35000 | 19000 | 1.84 |
| 15 | 15 | 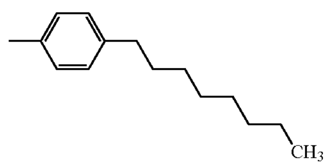 | 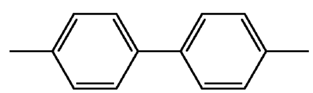 | 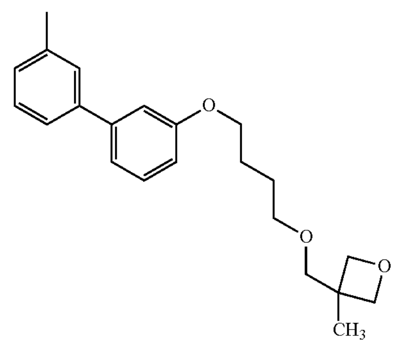 | 0.9 | 40400 | 26700 | 1.51 |
| 18 | 18 | " | " | " | 0.95 | 51600 | 26500 | 1.95 |

TABLE 1-continued
| Synthesis Example | Target | $Ar^{a8}$ | $Ar^{a1}$ | $Ar^{a2}$ | i | Mw | Mn | Mw/Mn |
|---|---|---|---|---|---|---|---|---|
| 16 | 16 | 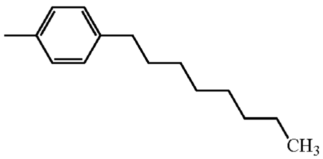 | 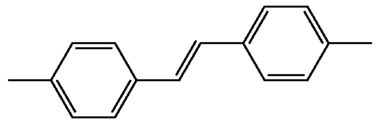 | 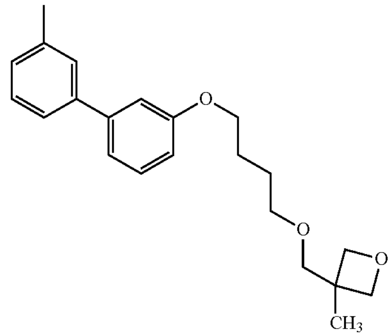 | 0.9 | 42000 | 23300 | 1.80 |
| 21 | 21 | 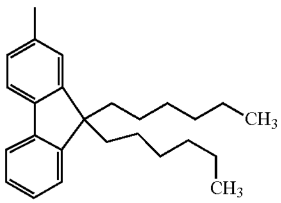 | 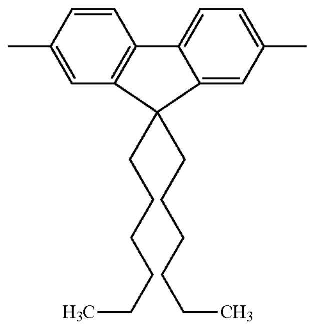 | 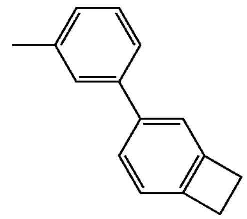 | 0.95 | 39000 | 24400 | 1.60 |
| 26 | 26 | 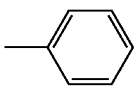 | 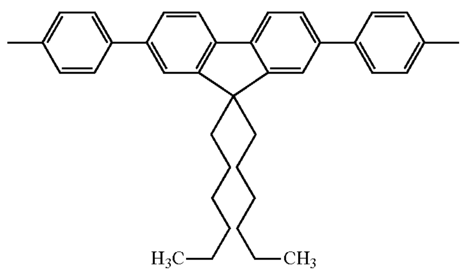 | 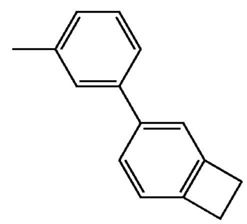 | 0.9409 | 67850 | 35400 | 1.92 |

Synthesis Example 27

[Chem. 69]

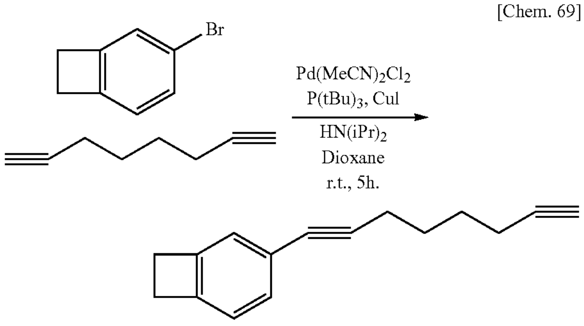

Target 27

Dichlorobis(acetonitrile) palladium(II) (212 mg, 0.03 equivalent) and copper iodide (104 mg, 0.02 equivalent) were charged into a 200 mL-volume four-neck flask through which nitrogen flowed, and 75 mL of dioxane previously degassed by bubbling nitrogen was added, followed by stirring. To this solution, tri-tert-butylphosphine (331 mg, 0.06 equivalent) was added, and the mixture was stirred at room temperature for 15 minutes. To this solution, di-i-propylamine (3.31 g, 1.2 equivalent), 5.00 g of 4-bromobenzocyclobutene (1.0 equivalent) and 20.3 g of 1,7-octadiine (7.0 equivalent) were added, and the mixture was reacted at room temperature for 9 hours. The obtained reaction mixture was distilled under reduced pressure of 400 Pa at a bath temperature of 60° C. to remove light boiling fraction, and 50 mL of saturated brine and 5 mL of 1 N hydrochloric acid were added to the residue. The resulting solution was extracted with ethyl acetate (30 mL) three times, and the obtained ethyl acetate layer was washed with saturated brine (30 mL) twice and concentrated to obtain a crude product (7.7 g). This crude product was purified by silica gel column chromatography (solvent: a mixed solvent of n-hexane/ethyl acetate) to obtain 2.78 g (yield: 48.9%, purity analyzed by gas chromatography: 95.4%) of Target 27 as a colorless oily product.

Synthesis Example 28

[Chem. 70]

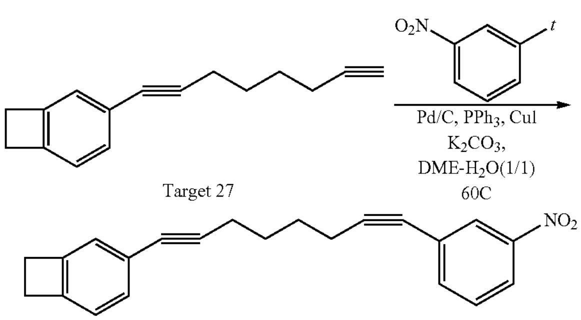

Target 27

Target 28 m-Iodonitrobenzene (3.64 g, 1.1 equivalent), potassium carbonate (5.06 g, 2.75 equivalent), copper iodide (111 mg, 0.044 equivalent), 307 mg of triphenylphosphine (0.088 equivalent) and 623 mg of 5% Pd/C (0.022 equivalent as Pd) were charged into a 100 mL-volume four-neck flask through which nitrogen flowed, and 95 mL of a mixed solvent of dimethoxyethane/water=1/1 (by volume) previously degassed by bubbling nitrogen was added, followed by stirring at room temperature for 1 hour. To this solution, a solution obtained by dissolving Target 27 (2.77 g, 1.0 equivalent) in 2 mL of dimethoxyethane was added, and the mixture was reacted in a bath at 70° C. (inner temperature: 63° C.) for 7 hours. The obtained reaction mixture was filtered through celite and then concentrated by evaporator, and 25 mL of 1 N hydrochloric acid was added. The resulting solution was extracted with ethyl acetate (30 mL) three times, and the obtained ethyl acetate layer was washed with saturated brine (20 mL) three times. The crude product obtained by concentrating the ethyl acetate layer was recrystallized from a mixed solvent of ethyl/n-hexane to obtain 2.50 g (yield: 57.1%, purity analyzed by liquid chromatography: 99.5%) of Target 28 as a very light yellow needle-like crystal.

Synthesis Example 29

[Chem. 71]

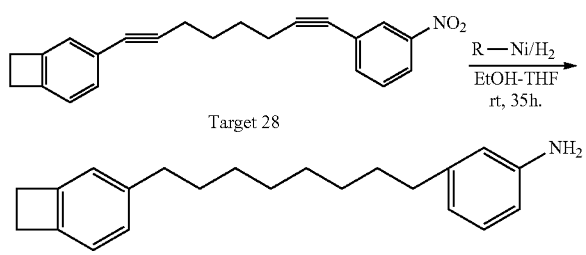

Target 28

Target 29

Target 28 (2.31 g), 15 mL of tetrahydrofuran and 15 mL of ethanol were added to a 100 mL-volume Kjeldahl flask and dissolved. To this solution, 1.07 g (R-200, produced by Nikko Rica Corporation) was added as a hydrogenation catalyst. After displacement with hydrogen three times, the mixture was reacted at room temperature for 35 hours under hydrogen, and the reaction solution was filtered through celite and concentrated to obtain 2.8 g of a crude product. This crude product was purified by silica gel column chromatography (solvent: a mixed solvent of n-hexane/ethyl acetate) to obtain 1.72 g (yield: 80.1%, purity analyzed by liquid chromatography: 99.1%) of Target 29 as a white needle-like crystal.

Synthesis Example 30

[Chem. 72]

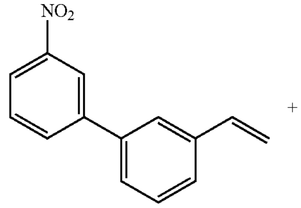

Target 10

-continued

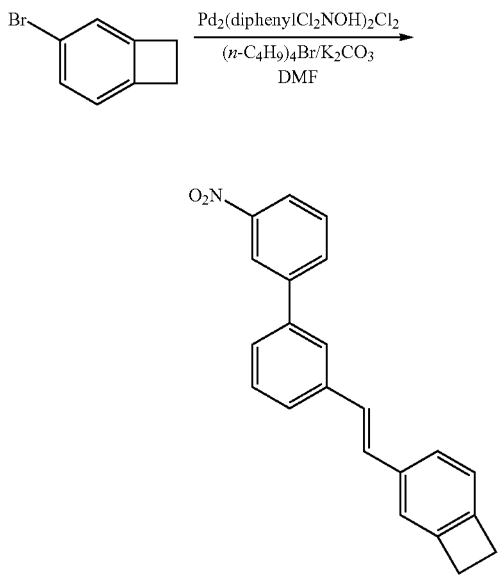

Target 30

In a nitrogen stream, Target 10 (2.8 g), 4-bromobenzocyclobutene (3.65 g), potassium carbonate (2.73 g), $(n\text{-}C_4H_9)_4Br$ (2.67 g), dehydrated DMF (76 ml) and 15.1 mg of palladium catalyst $Pd_2$(diphenyl $Cl_2NOH)_2Cl_2$ were reacted at 130° C. for 8 hours, and after adding ethyl acetate (100 ml) and water (100 ml) at room temperature, the reaction solution was stirred and subjected to liquid separation. The aqueous layer was extracted with ethyl acetate (100 ml) twice and combined with the organic layer, and the combined layer was dried over magnesium sulfate and concentrated. The obtained product was purified by silica gel column chromatography (n-hexane/ethyl acetate=10/1) to obtain Target 30 (trans, 1.7 g, LC: 98%).

Synthesis Example 31

[Chem. 73]

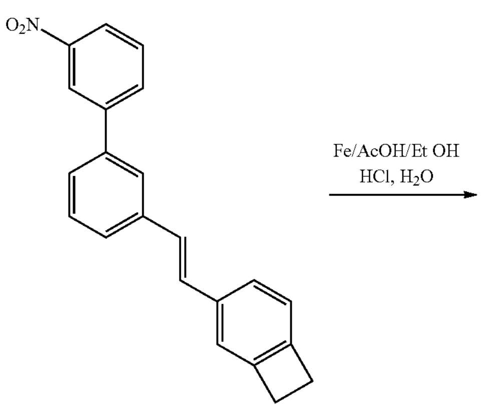

Target 30

-continued

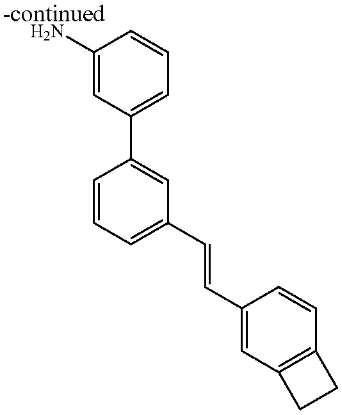

Target 31

In a nitrogen stream, Target 30 (1.6 g), acetic acid (30 ml), ethanol (30 ml), hydrochloric acid (1 N, 1 ml), water (4 ml) and reduced iron (5.5 g) were refluxed for 2 hours. The reaction solution was filtered at room temperature and after adding ethyl acetate (100 ml) and water (100 ml), the resulting solution was stirred, neutralized with an aqueous saturated sodium hydrogencarbonate solution and subjected to liquid separation. The aqueous layer was extracted with ethyl acetate (50 ml) twice and combined with the organic layer, and the combined layer was dried over magnesium sulfate and concentrated. The obtained product was purified by silica gel column chromatography (n-hexane/ethyl acetate=3/1) to obtain Target 31 (1.3 g).

Synthesis Example 32

[Chem. 74]

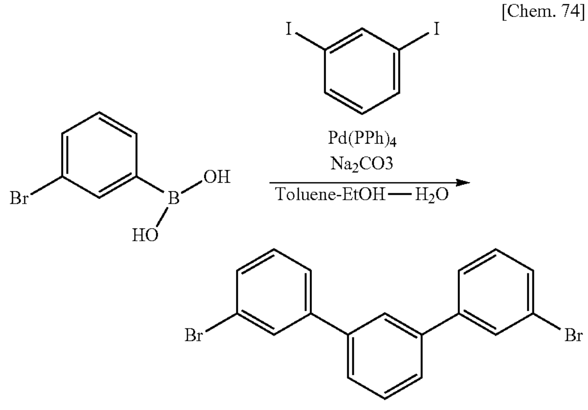

Target 32

3-Bromophenylboronic acid (10.0 g), m-diiodobenzene (8.21 g), sodium carbonate (15.83 g), toluene (150 mL), ethanol (150 mL) and water (75 mL) were charged into a reaction vessel and after deaeration under reduced pressure, tetrakis(triphenylphosphine)palladium(0) (1.726 g) was added in a nitrogen atmosphere. The mixture was stirred at 80° C. for about 4.5 hours and then allowed to cool to room temperature. Water was added to the reaction solution, and the organic layer was extracted with an ethyl acetate-hexane mixed solvent and then concentrated. The crude product was purified by silica gel column chromatography (hexane) to obtain Target 32 (7.39 g).

Synthesis Example 33

[Chem. 75]

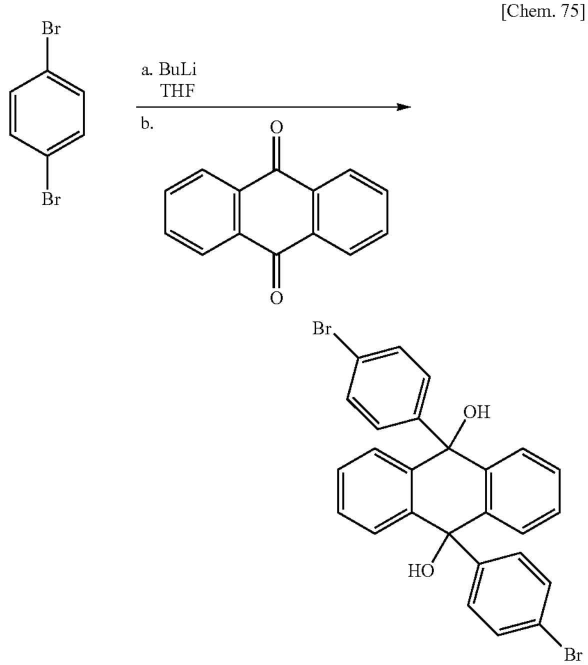

Target 33

In a nitrogen stream, p-dibromobenzene (50 g) and THF (740 mL) were charged and cooled to −78° C., and a 1.55 M n-butyllithium hexane solution (125.7 mL) was added dropwise over about 40 minutes. The mixture was further stirred for about 1 hour, and anthraquinone (15.44 g) was added. The mixture was further stirred for about 3 hours, and the temperature was raised to room temperature over about 1 hour. The reaction mixture was further stirred for about 3.5 hours and after adding water (100 mL), THF was removed by distillation under reduced pressure. The organic layer was extracted with ethyl acetate, washed with water, dried over anhydrous sodium sulfate, filtered and concentrated. The obtained crude produce was suspension-washed with a methylene chloride-hexane mixed solvent and then suspension-washed with methanol to obtain Target 33 (25.8 g).

Synthesis Example 34

[Chem. 76]

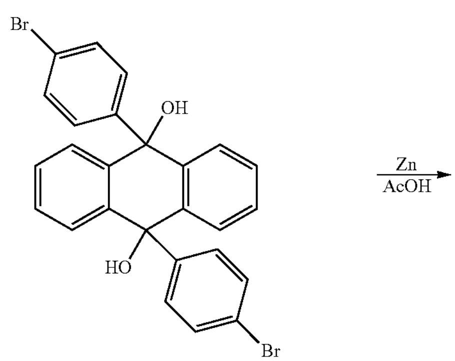

Target 33

-continued

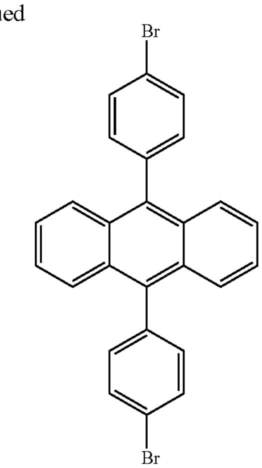

Target 34

In a nitrogen stream, Target 33 (25.7 g), acetic acid (400 mL) and zinc powder (27.4 g) were charged and refluxed under heating. After 8 hours, acetic acid (190 mL) was added, and the mixture was further refluxed under heating for about 8 hours and then allowed to cool to room temperature. Water (400 mL) was added, and the resulting solution was filtered and washed with water. The obtained solid was suspended in methylene chloride (2.5 L), and insoluble matters were removed by filtration. The filtrate was concentrated, and the obtained crude product was dissolved in methylene chloride (3 L). The resulting solution was purified by silica gel column chromatography (methylene chloride), suspension-washed with methylene chloride and then suspension-washed with chloroform to obtain Target 34 (10.7 g).

Synthesis Example 35

[Chem. 77]

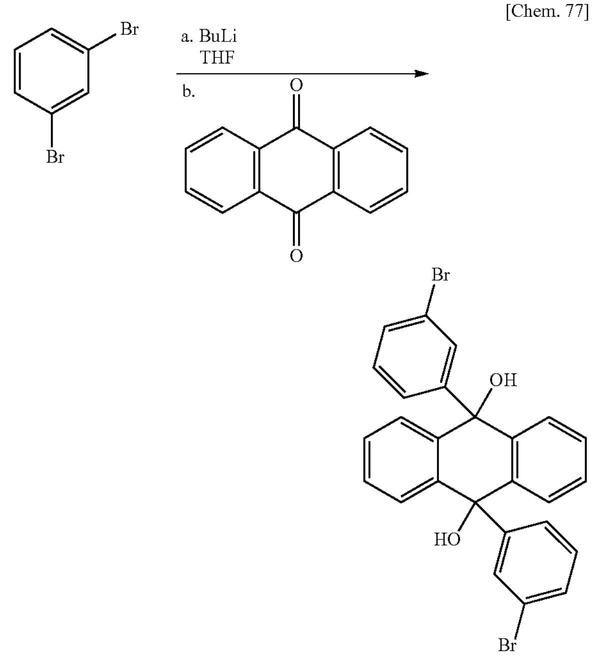

Target 35

In a nitrogen stream, m-dibromobenzene (25 g) and THF (370 mL) were charged and cooled to −78° C., and a 1.6 M n-butyllithium hexane solution (61 mL) was added dropwise over about 10 minutes. The mixture was further stirred for about 1 hour, and anthraquinone (7.72 g) was added. The mixture was further stirred for about 1 hour, and the temperature was raised to room temperature over about 1 hour. The reaction mixture was further stirred for about 3.5 hours and after adding water (150 mL), THF was removed by distillation under reduced pressure. The organic layer was extracted with ethyl acetate, washed with water, dried over anhydrous sodium sulfate, filtered and concentrated. The obtained crude produce was suspension-washed with a methylene chloride-hexane mixed solvent to obtain Target 35 (17.4 g).

Synthesis Example 36

[Chem. 78]

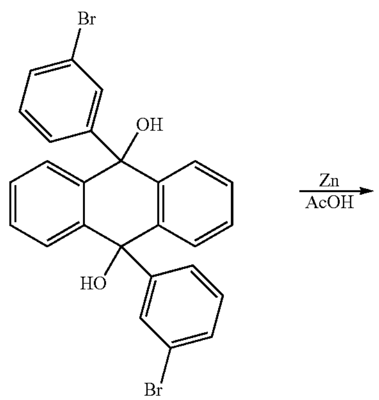

Target 35

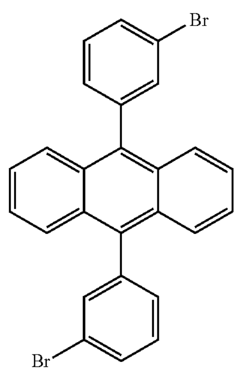

Target 36

In a nitrogen stream, Target 35 (17.4 g), acetic acid (242 mL) and zinc powder (18.6 g) were charged and refluxed under heating. After 10.5 hours, the system was allowed to cool to room temperature. Water (250 mL) was added, and the resulting solution was filtered and washed with water. The obtained solid was suspended in methylene chloride (500 mL), and insoluble matters were removed by filtration. The filtrate was concentrated and suspension-washed with hexane, and the obtained crude product was dissolved in methylene chloride (200 mL). The resulting solution was subjected to silica gel column chromatography (methylene chloride), and the obtained solid was completely dissolved in 1,2-dimethoxyethane (102 mL) by refluxing under heating, and the solution was gradually cooled to room temperature. The precipitated solid was collected by filtration to obtain Target 36 (3.7 g).

Synthesis Example 37

[Chem. 79]

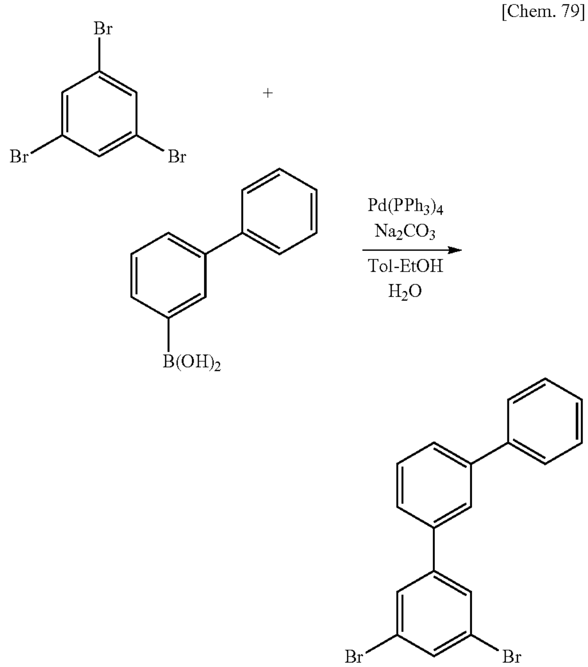

Target 37

1,3,5-Tribromobenzene (22 g), 3-biphenylboronic acid (4.95 g), toluene (110 ml) and ethanol (100 ml) were charged into a reaction vessel, and deaeration was performed by nitrogen bubbling for 10 minutes. Sodium carbonate (7.9 g) and water (38 ml) were added to a different vessel, and deaeration by nitrogen bubbling was performed with stirring. This aqueous solution was added to the reaction vessel, and immediately tetrakis(triphenylphosphine)palladium(0) (866 mg) was added. The mixture was refluxed under heating by raising the temperature and after the completion of reaction, water was added to the reaction solution. The organic layer was extracted with toluene, dried through dehydration by adding sodium sulfate and concentrated. The crude product was purified by silica gel column chromatography (hexane/dichloromethane) to obtain Target 37 (7.51 g).

Synthesis Example 38

[Chem. 80]

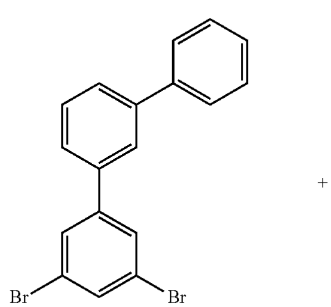

Target 37

-continued

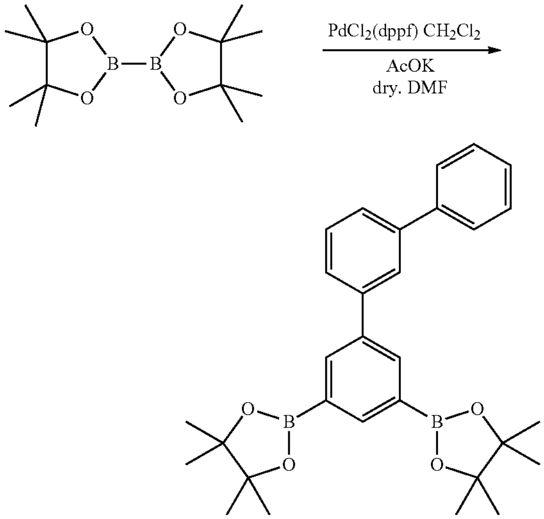

Target 38

Target 37 (7.0 g), bis(pinacolato)diboron (11.68 g), potassium acetate (9.71 g) and dimethylformamide (100 ml) were added, and stirring was started while bubbling nitrogen. After 15 minutes, bubbling of nitrogen was changed to flow, and $PdCl_2(dppf).CH_2Cl_2$ (660 mg) was added. The temperature was raised to 80° C. and after the completion of reaction, the reaction solution was allowed to cool and then subjected to extraction and washing by using dichloromethane and water. The extract was dried over sodium sulfate and then concentrated, and the obtained product was purified by column chromatography (hexane/ethyl acetate) to obtain Target 38 (10 g).

Synthesis Example 39

[Chem. 81]

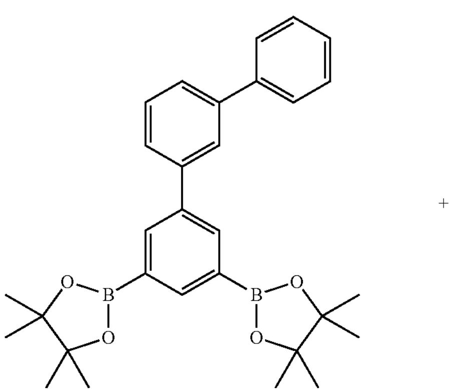

Target 38

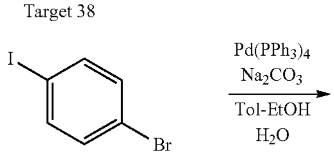

-continued

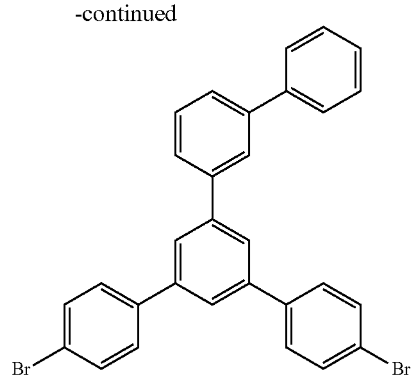

Target 39

Target 38 (5.8 g), 4-bromobenzene (7.5 g), toluene (72 ml) and ethanol (72 ml) were charged into a reaction vessel, and deaeration was performed by nitrogen bubbling for 10 minutes. Sodium carbonate (7.6 g) and water (36 ml) were added to a different vessel, and deaeration by nitrogen bubbling was performed with stirring. This aqueous solution was added to the reaction vessel, and immediately tetrakis(triphenylphosphine)palladium(0) (1.0 g) was added. The mixture was refluxed under heating by raising the temperature and after the completion of reaction, water was added to the reaction solution. The organic layer was extracted with dichloromethane, dried through dehydration by adding sodium sulfate and concentrated. The crude product was purified by silica gel column chromatography (hexane/ethyl acetate) to obtain Target 39 (3.9 g).

Synthesis Example 40

[Chem. 82]

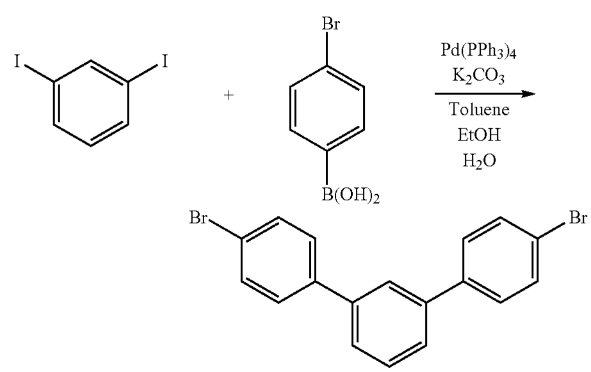

Target 40

Toluene (100 ml), ethanol (50 ml), 4-bromophenylboronic acid (9.99 g), 1,3-diiodobenzene (8.41 g), sodium carbonate (8.41 g) and 35 ml of water were charged into a reaction vessel, and nitrogen was blown to put the system in a full nitrogen atmosphere. The mixture was stirred, and tetrakis (triphenylphosphine)palladium (0.884 g) was added thereto. The mixture was refluxed under heating for 7 hours by raising the temperature.

After the completion of reaction, water was added to the reaction solution, and the organic layer was extracted with toluene, washed with water twice, dried through dehydration by adding sodium sulfate and concentrated. The crude product was purified by silica gel column chromatography (hexane/toluene) to obtain Target 40 (3.54 g).

Synthesis Example 41

[Chem. 83]

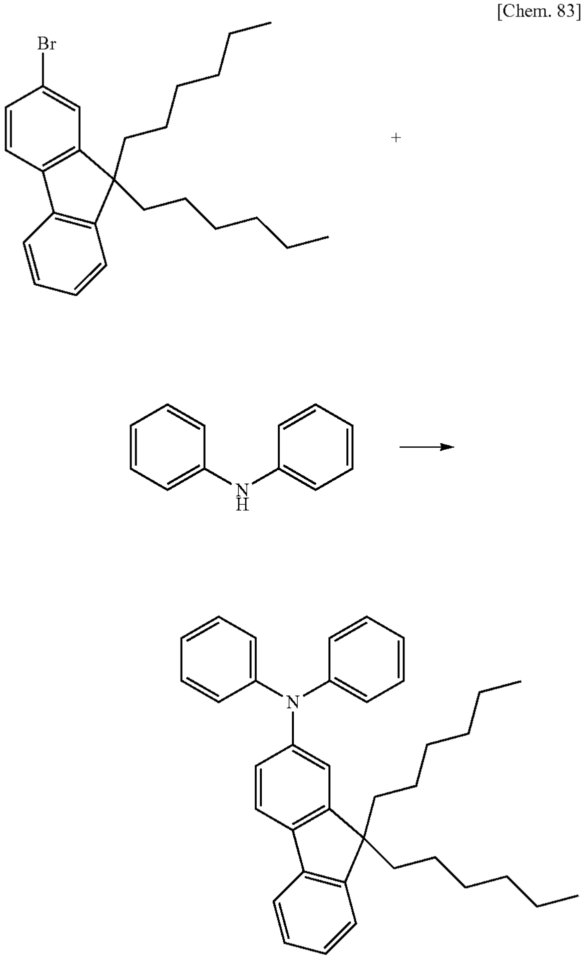

Target 41

2-Bromo-9,9-dihexylfluorene (5.91 g), diphenylamine (2.37 g), tert-butoxy potassium (2.8 g) and 1,4-dioxane (100 ml) were charged and after thoroughly purging the system with nitrogen, the mixture was heated to 50° C. (Solution A).

Separately, tri-tert-butylphosphine (0.303 g) was added to a 25 ml 1,4-dioxane solution of tris(dibenzylideneacetone) dipalladium chloroform complex (0.34 g), and the mixture was heated to 50° C. (Solution B).

In a nitrogen stream, Solution B was added to Solution A, and the mixed solution was reacted by refluxing under heating for 3 hours. Furthermore, 2-bromo-9,9-dihexylfluorene (1.2 g) was added, and the mixture was reacted by refluxing under heating for 3 hours. The reaction solution was allowed to cool and after removing insoluble matters by filtration, purified by column chromatography to obtain Target 41 (12 g).

Synthesis Example 42

[Chem. 84]

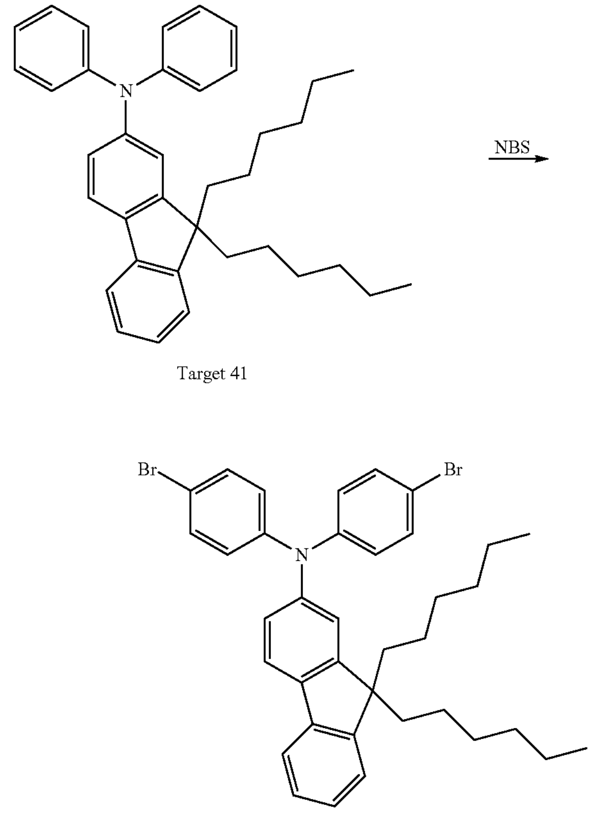

Target 42

Target 41 (5.7 g) and N,N-dimethylformamide (100 ml) were charged and after thoroughly purging the system with nitrogen, the mixture was cooled to −5° C. In a nitrogen stream, an N,N-dimethylformamide (40 ml) solution of N-bromosuccinimide (4.02 g) was added dropwise while keeping the temperature of reaction solution at 0° C. or less. The mixture was stirred at −5° C. for 2.5 hours and after the reaction, ethyl acetate and water were added. The organic layer was concentrated and purified by column chromatography to obtain Target 42 (6.4 g).

Synthesis Example 43

[Chem. 85]

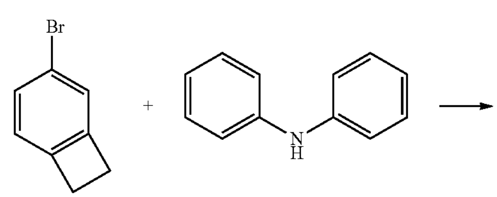

-continued

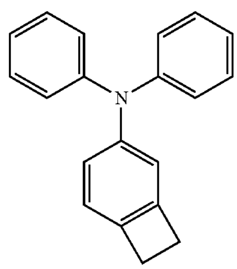

Target 43

4-Bromo-benzocyclobutene (1.4 g), diphenylamine (1.3 g) tert-butoxy sodium (1.6 g) and toluene (50 ml) were charged and after thoroughly purging the system with nitrogen, the mixture was heated to 50° C. (Solution A).

Separately, tri-tert-butylphosphine (0.19 g) was added to a toluene (7 ml) solution of tris(dibenzylideneacetone)dipalladium chloroform complex (0.16 g), and the mixture was heated to 50° C. (Solution B).

In a nitrogen stream, Solution B was added to Solution A, and the mixed solution was reacted by refluxing under heating for 8.5 hours. The reaction solution was allowed to cool and after removing insoluble matters by filtration, purified by column chromatography to obtain Target 43 (1.77 g).

Synthesis Example 44

[Chem. 86]

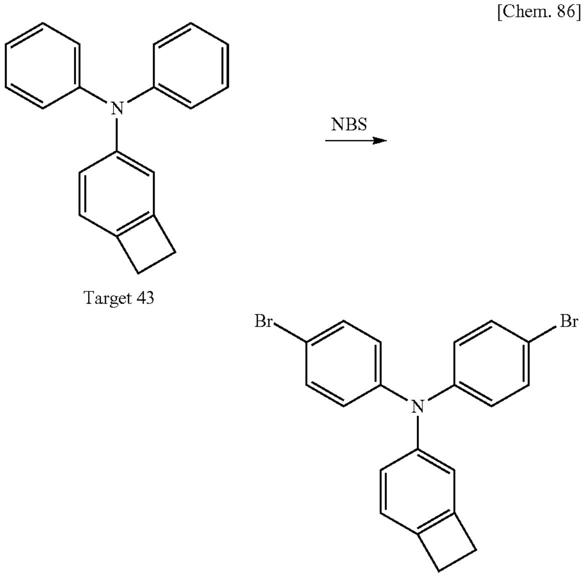

Target 43

Target 44

Target 43 (1.65 g) and N,N-dimethylformamide (10 ml) were charged and after thoroughly purging the system with nitrogen, the mixture was cooled to −5° C. In a nitrogen stream, an N,N-dimethylformamide (5 ml) solution of N-bromosuccinimide (2.16 g) was added dropwise while keeping the temperature of reaction solution at 0° C. or less. The mixture was stirred at −5° C. for 1 hour and after the reaction, methylene chloride and water were added. The organic layer was concentrated and purified by column chromatography to obtain Target 44 (2.13 g).

Synthesis Example 45

[Chem. 87]

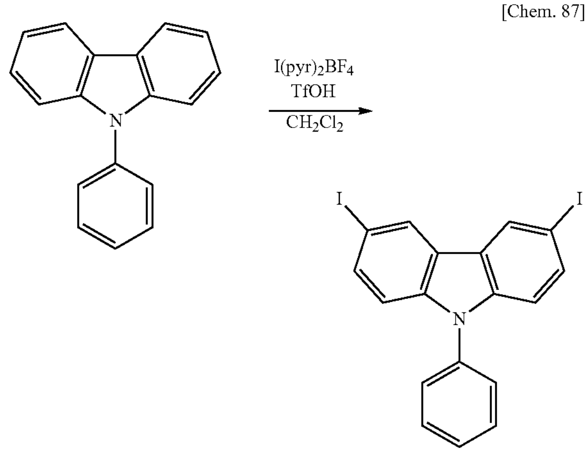

Target 45

In a nitrogen stream, dichloromethane (200 ml) was added to a reaction vessel, and N-phenylcarbazole (2.29 g) and bis(pyridine)iodonium tetrafluoroborate (7.76 g) were dissolved. Subsequently, trifluoromethanesulfonic acid (1.75 ml) was added dropwise under ice cooling and stirred for one day and one night while gradually lowering the temperature to room temperature. After the completion of reaction, an aqueous 0.5 M sodium thiosulfate solution was added to the reaction solution, and the organic layer was extracted with dichloromethane, then washed with water, dried through dehydration by adding sodium sulfate and concentrated. Methanol was added to a dichloromethane solution of the crude product to again cause precipitation, and the precipitate was washed under the methanol reflux condition to obtain Target 45 (4.00 g).

Synthesis Example 46

[Chem. 88]

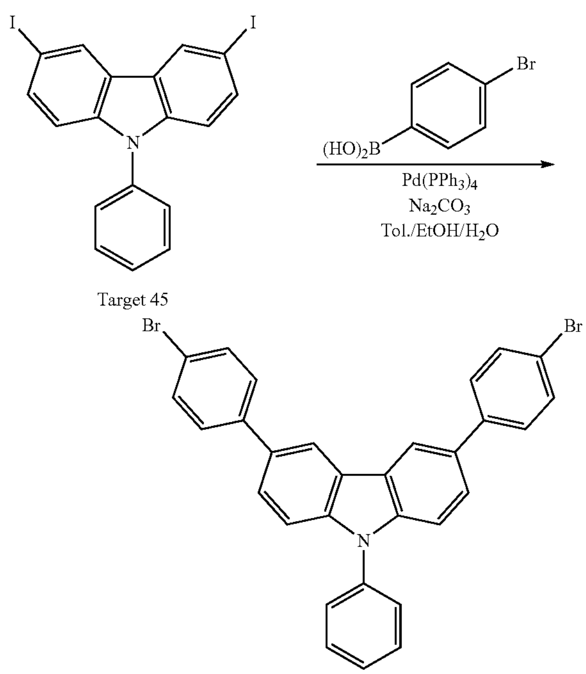

Target 45

Target 46

Target 45 (4.00 g), p-bromophenylboronic acid (3.05 g), toluene (30 ml), ethanol (15 ml) and an aqueous 2.6 M sodium carbonate solution (20 ml) were added, and the system was vacuum deaerated while applying vibration by an ultrasonic cleaner and purged with nitrogen. Tetrakis(triphenylphosphine)palladium (0.27 g) was added thereto, and the mixture was stirred under heating at 75° C. for 3 hours. After the completion of reaction, water was added to the reaction solution, and the organic layer was extracted with dichloromethane, then dried through dehydration by adding sodium sulfate and concentrated. The crude product was isolated by silica gel column chromatography (hexane/dichloromethane) and purified by recrystallization from hot dimethoxyethane to obtain Target 46 (2.25 g).

Synthesis Example 47

[Chem. 89]

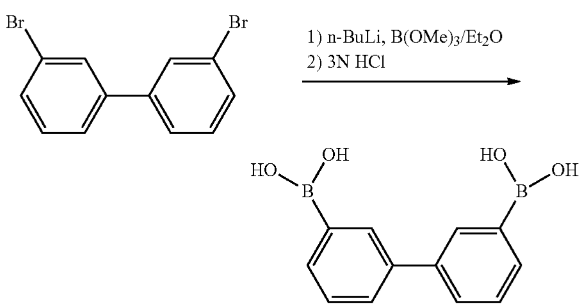

Target 47

In a nitrogen stream, diethyl ether (100 ml) was added to a reaction vessel, and 3,3'-dibromo-1,1'-biphenyl (9.00 g) was dissolved. The solution was cooled to −78° C., and a 1.6 M n-butyllithium hexane solution (40 ml) was added dropwise over 15 minutes. The mixture was stirred at −78° C. for 1 hour and after raising the temperature to 0° C., further stirred for 2 hours. Separately, a solution obtained by dissolving trimethyl borate (33 ml) in diethyl ether (160 ml) in a nitrogen atmosphere and cooling the solution to −78° C. was prepared in a different vessel. The mixed solution above was added dropwise thereto over 45 minutes, and the mixture was stirred for 4 hours while gradually returning the liquid temperature to room temperature. After the completion of reaction, 3 N hydrochloric acid (144 ml) was gradually added to the reaction solution at 0° C., and the mixture was stirred at room temperature for 4 hours. The white precipitate was collected using a 3G glass funnel, washed with water and diethyl ether, and dried to obtain Target 47 (3.16 g).

Synthesis Example 48

[Chem. 90]

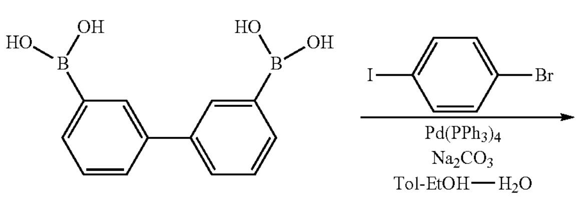

Target 47

-continued

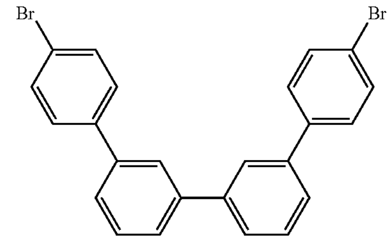

Target 48

Target 47 (2.85 g), p-iodobromobenzene (6.68 g), toluene (40 ml), ethanol (20 ml) and an aqueous 2.6 M sodium carbonate solution (30 ml) were added, and the system was vacuum deaerated while applying vibration by an ultrasonic cleaner and purged with nitrogen. Tetrakis(triphenylphosphine)palladium (0.41 g) was added thereto, and the mixture was stirred under heating at 75° C. for 6 hours. After the completion of reaction, water and toluene were added to the reaction solution, and the toluene layer was washed with 0.1 N hydrochloric acid and water, dried through dehydration by adding sodium sulfate and concentrated. The crude product was isolated by silica gel column chromatography (hexane/chloroform) to obtain Target 48 (3.01 g).

Synthesis Examples 49 to 52

Targets 49 to 52 were obtained in accordance with the synthesis method of Synthesis Example 14 by changing the monomers (that is, Target 5, Target 2 and 4,4'-dibromobiphenyl) to the compounds shown in Table 2 below. The obtained targets are shown together in Table 2.

[Chem. 91]

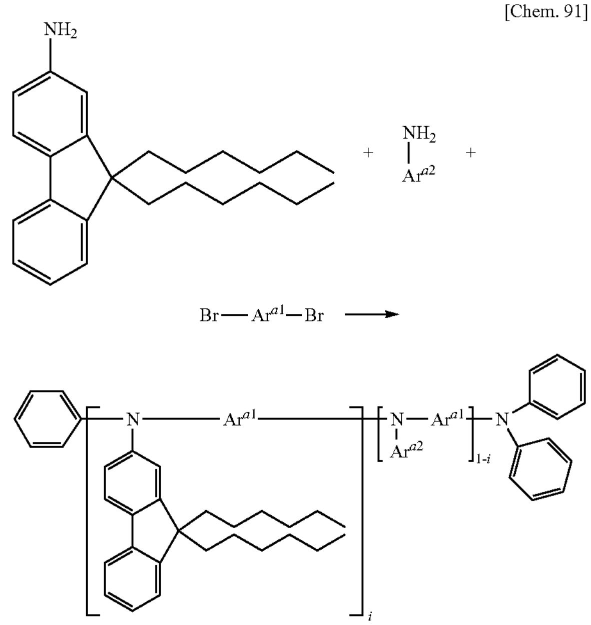

TABLE 2
(Table 2: Charge Amounts and Molecular Weights of Monomers and Polymers)
| Synthesis Example | Target | Charge Amount of Fluorene Amine | $Ar^{a1}$ | Charge Amount of Br—$Ar^{a1}$—Br | $Ar^{a2}$ |
|---|---|---|---|---|---|
| 49 | 49 | 1.485 g | 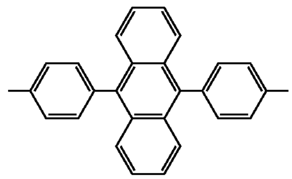 | 2.425 g | 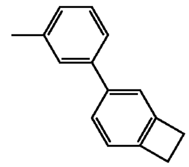 |
| 50 | 50 | 0.863 g | 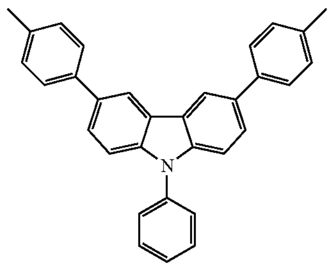 | 1.680 g | 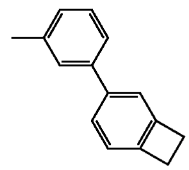 |
| 51 | 51 | 1.06 g | 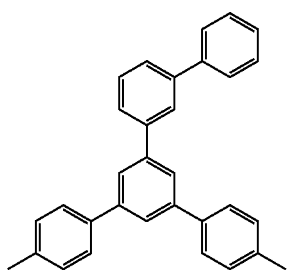 | 1.776 g | 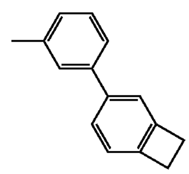 |
| 52 | 52 | 0.875 g | 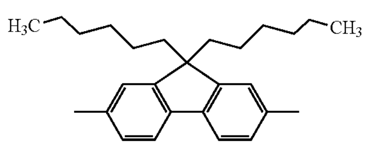 | 3.0 g | 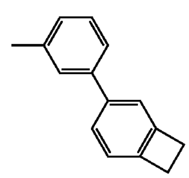 |
| Synthesis Example | Target | Charge Amount of $Ar^{a2}$—$NH_2$ | i | Yield of Target Polymer | Mw | Mn | Mw/Mn |
|---|---|---|---|---|---|---|---|
| 49 | 49 | 0.17 g | 0.83 | 0.27 g | 68000 | 27400 | 2.5 |
| 50 | 50 | 0.111 g | 0.81 | 0.88 g | 25000 | 11900 | 2.1 |
| 51 | 51 | 0.046 g | 0.9272 | 0.921 g | 24000 | 11800 | 2.0 |
| 52 | 52 | 0.7 g | 0.41 | 1.9 g | 47900 | 29500 | 1.6 |

Synthesis Example 53
[Chem. 92]
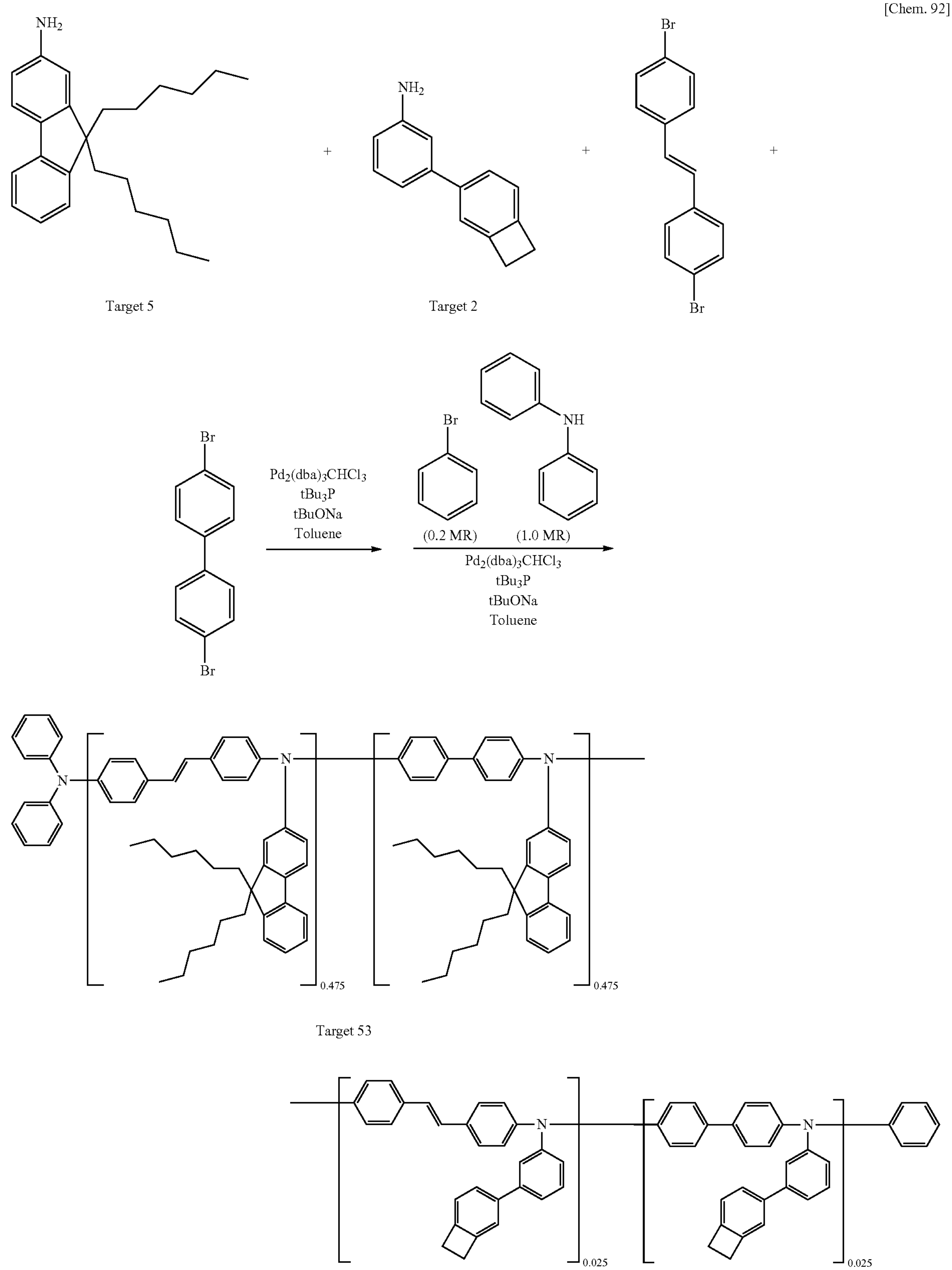

Target 5 (7.5 g, 21.5 mmol) obtained in Synthesis Example 5, Target 2 (0.22 g, 1.1 mmol) obtained in Synthesis Example 2, 4,4'-dibromostilbene (3.82 g, 11.3 mmol), tert-butoxy sodium (6.95 g, 72.3 mmol) and toluene (120 ml) were charged and after thoroughly purging the system with nitrogen, the mixture was heated to 50° C. (Solution A).

Separately, tri-tert-butylphosphine (0.33 g, 0.45 mmol) was added to a 5 ml toluene solution of tris(dibenzylideneacetone)dipalladium chloroform complex (0.06 g, 0.06 mmol), and the mixture was heated to 50° C. (Solution B).

In a nitrogen stream, Solution B was added to Solution A, and the mixed solution was reacted by refluxing under heating for 3 hours. Disappearance of raw materials was confirmed, and 4,4'-dibromobiphenyl (3.31 g, 10.6 mmol) was additionally added. The mixture was refluxed under heating for 1.5 hours and since start of polymerization was confirmed, 4,4'-dibromobiphenyl (0.07 g, 0.2 mmol) was additionally added every 1.5 hours three times in total. After the addition of the entire amount of 4,4'-dibromobiphenyl, the mixture was further refluxed under heating for 1 hour, and the reaction solution was allowed to cool and then added dropwise in 300 ml of ethanol to crystallize Crude Polymer 18.

Crude Polymer 18 obtained was dissolved in 180 ml of toluene, and bromobenzene (0.71 g, 4.5 mmol) and tert-butoxy sodium (3.5 g, 36.4 mmol) were charged. After thoroughly purging the system with nitrogen, the mixture was heated to 50° C. (Solution C).

Separately, tri-tert-butylphosphine (0.18 g, 0.9 mmol) was added to a 10 ml toluene solution of tris(dibenzylideneacetone)dipalladium chloroform complex (0.12 g, 0.1 mmol), and the mixture was heated to 50° C. (Solution D).

In a nitrogen stream, Solution D was added to Solution C, and the mixed solution was reacted by refluxing under heating for 2 hours. To this reaction solution, a toluene (2 ml) solution of N,N-diphenylamine (3.82 g, 22.6 mmol) was added, and the mixture was further reacted by refluxing under heating for 8 hours. The reaction solution was allowed to cool and then added dropwise in an ethanol/water (250 ml/50 ml) solution to obtain end-capped Crude Polymer 18.

This end-capped Crude Polymer 18 was dissolved in toluene and reprecipitated with acetone, and the precipitated polymer was separated by filtration. The obtained polymer was dissolved in toluene, and the solution was washed with dilute hydrochloric acid and reprecipitated with ammonia-containing ethanol. The polymer collected by filtration was purified by column chromatography to obtain Target 53 (0.9 g). The weight average molecular weight and number average molecular weight of Target 53 were measured and found to be as follows.

Weight average molecular weight (Mw)=60,000

Number average molecular weight (Mn)=27,000

Dispersity (Mw/Mn)=2.2

Synthesis Examples 54 to 57

Targets 54 to 57 were obtained as a conjugated polymer in accordance with the synthesis method of Synthesis Example 53 by changing the monomers to the compounds shown in Table 3 below. The obtained target polymers are also shown together in Table 3.

[Chem. 93]

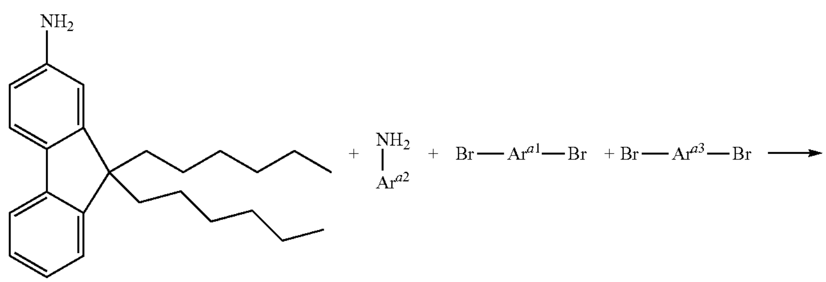

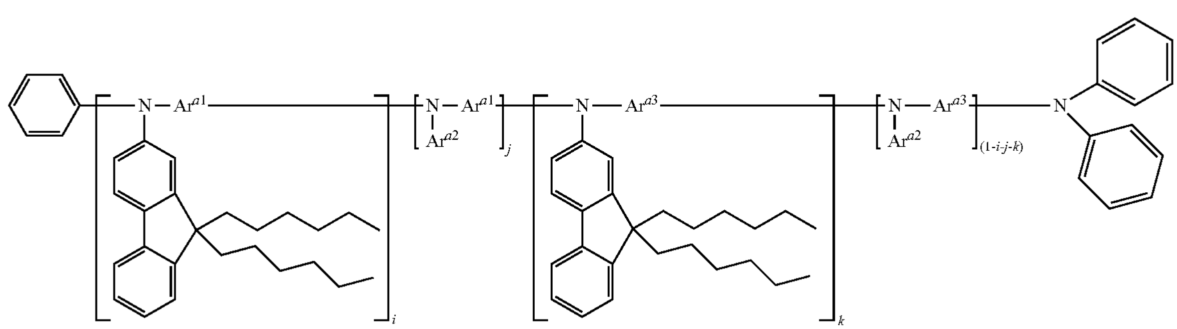

TABLE 3
(Table 3: Charge Amounts and Molecular Weights of Monomers and Polymers)
| Synthesis Exmple | Target | Charge Amount of Fluorene Amine | $Ar^{a1}$ | Charge Amount of Br—$Ar^{a1}$—Br | $Ar^{a2}$ | Charge Amount of $Ar^{a2}$—$NH_2$ |
|---|---|---|---|---|---|---|
| 54 | 54 | 1.16 g | 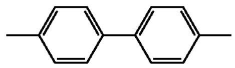 | 0.55 g | 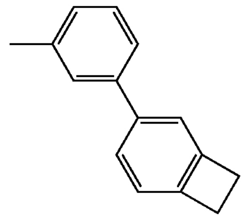 | 0.0404 g |
| 55 | 55 | 1.645 g | 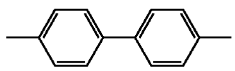 | 0.748 g | 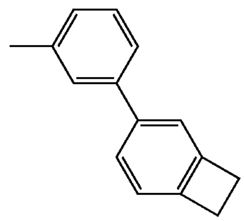 | 0.057 g |
| 56 | 56 | 2.02 g | 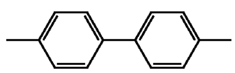 | 0.92 g | 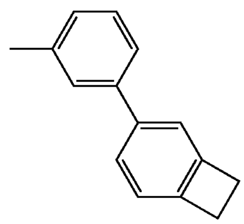 | 0.073 g |
| 57 | 57 | 1.852 g | 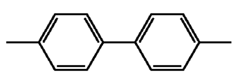 | 0.874 g | 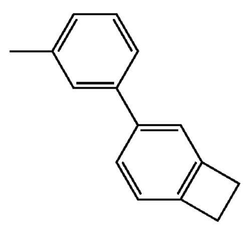 | 0.0589 g |
| Synthesis Example | Target | $Ar^{a3}$ | Charge Amount of Br—$Ar^{a3}$—Br | i | j | k | Yield of Target Polymer |
|---|---|---|---|---|---|---|---|
| 54 | 54 | 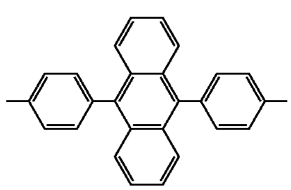 | 0.86 g | 0.47 | 0.03 | 0.47 | 0.73 g |

TABLE 3-continued (Table 3: Charge Amounts and Molecular Weights of Monomers and Polymers)

| | | | | | | | |
|---|---|---|---|---|---|---|---|
| 55 | 55 | 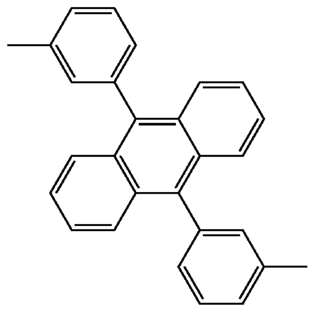 | 1.22 g | 0.471 | 0.029 | 0.471 | 1.24 g |
| 56 | 56 | 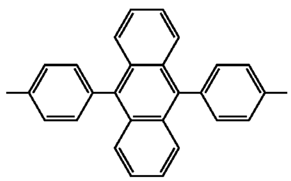 | 1.50 g | 0.471 | 0.029 | 0.471 | 1.86 g |
| 57 | 57 | 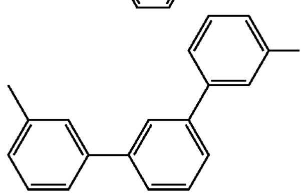 | 1.089 g | 0.47 | 0.03 | 0.47 | 0.83 g |

| Synthesis Example | Target | Mw | Mn | Mw/Mn |
|---|---|---|---|---|
| 54 | 54 | 52000 | 24700 | 2.1 |
| 55 | 55 | 56500 | 34900 | 1.6 |
| 56 | 56 | 76100 | 34600 | 2.2 |
| 57 | 57 | 84400 | 55900 | 1.5 |

Synthesis Examples 58 to 65

Targets 58 to 65 were obtained in the same manner as in the synthesis method of Synthesis Examples 14 and 53 by changing such various monomers as in the following reaction formula in accordance with the reaction formula and Table 4 below. The obtained polymers are also shown together in Table 4.

[Chem. 94]

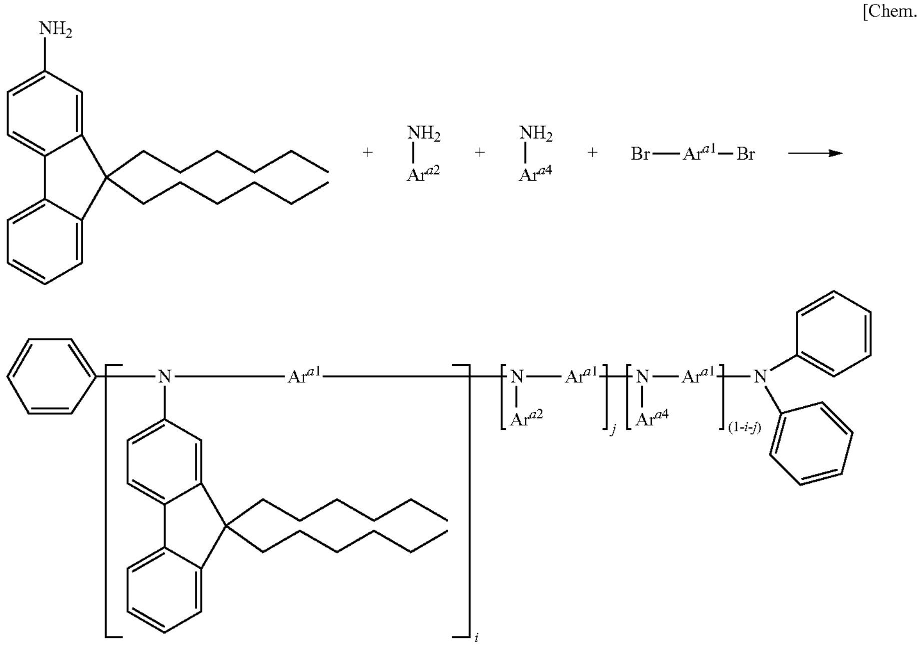

TABLE 4
| (Table 4: Charge Amounts and Molecular Weights of Monomers and Polymers) | | | | | |
|---|---|---|---|---|---|
| Synthesis Example | Target | Charge Amount of Fluorene Amine | $Ar^{a1}$ | Charge Amount of Br—$Ar^{a1}$—Br | $Ar^{a2}$ |
| 58 | 58 | 1.754 g | 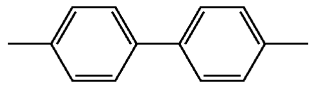 | 3.000 g | 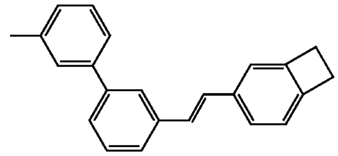 |
| 59 | 59 | 1.68 g | 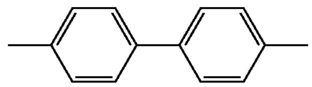 | 3.0 g | 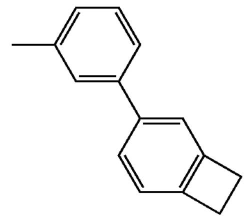 |
| 60 | 60 | 2.065 g | 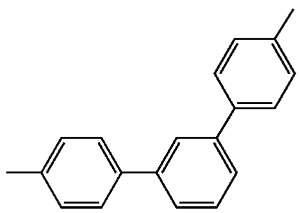 | 3.493 g | 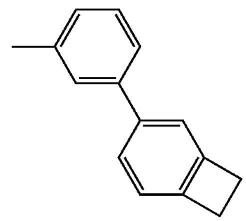 |
| 61 | 61 | 2.241 g | 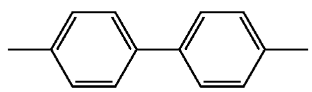 | 4.0 g | 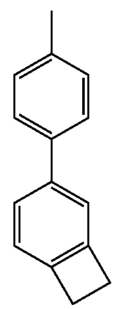 |
| 62 | 62 | 1.153 g | 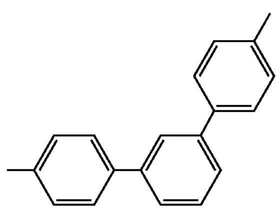 | 2.0 g | 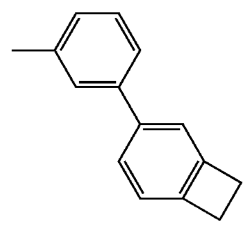 |
| 63 | 63 | 1.086 g | 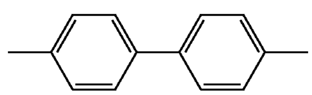 | 1.774 g | 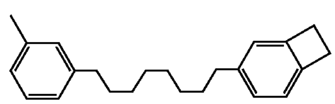 |
| 64 | 64 | 0.918 g | 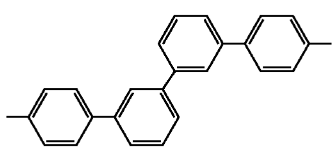 | 1.5 g | 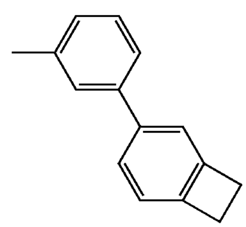 |

TABLE 4-continued (Table 4: Charge Amounts and Molecular Weights of Monomers and Polymers)

| | | | | | |
|---|---|---|---|---|---|
| 65 | 65 | 2.097 g | 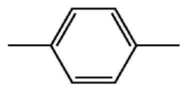 | 3.538 g | 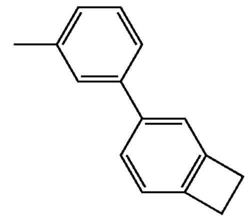 |

| Synthesis Example | Target | Charge Amount of $Ar^{a2}$—$NH_2$ | $Ar^{a4}$ | Charge Amount of $Ar^{a4}$—$NH_2$ | i | j | Yield of Target Polymer | Mw | Mn | Mw/Mn |
|---|---|---|---|---|---|---|---|---|---|---|
| 58 | 58 | 0.299 g | 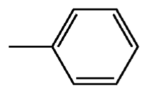 | 0.335 g | 0.51 | 0.10 | 0.7 g | 26200 | 15000 | 1.7 |
| 59 | 59 | 0.19 g | 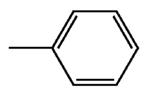 | 0.36 g | 0.5 | 0.1 | 1.71 g | 46800 | 20100 | 2.3 |
| 60 | 60 | 0.178 g | 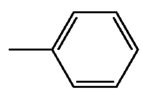 | 0.231 g | 0.66 | 0.131 | 0.7 g | 31700 | 21100 | 1.5 |
| 61 | 61 | 0.250 g | 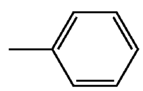 | 0.478 g | 0.5 | 0.1 | 2.7 g | 57000 | 30000 | 1.9 |
| 62 | 62 | 0.050 g | 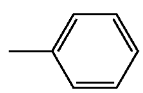 | 0.149 g | 0.64 | 0.05 | 0.5 g | 29000 | 12600 | 2.3 |
| 63 | 63 | 0.184 g | 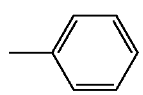 | 0.197 g | 0.54 | 0.105 | 2.2 g | 27300 | 14400 | 1.9 |
| 64 | 64 | 0.1026 g | 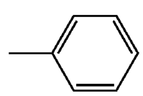 | 0.0074 g | 0.81 | 0.16 | 0.54 g | 42000 | 20400 | 2.1 |
| 65 | 65 | 0.880 g | 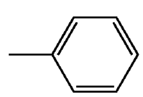 | 0.418 g | 0.4 | 0.301 | 0.476 g | 23100 | 13500 | 1.7 |

Synthesis Examples 66 and 67

Targets 66 and 67 were obtained in the same manner as in the synthesis method of Synthesis Examples 14 and 53 by changing such various monomers as in the following reaction formula in accordance with the reaction formula and Table 5 below. The obtained polymers are also shown together in Table 5.

[Chem. 95]

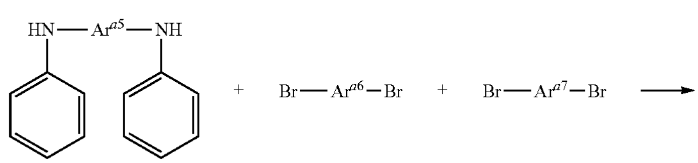

-continued
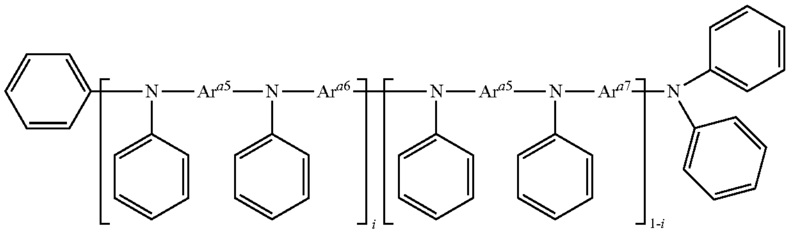
TABLE 5
(Table 5: Charge Amounts and Molecular Weights of Monomers and Polymers)
| Synthesis Example | Target | Ar$^{a5}$ | Charge Amount of NHPh—Ar$^{a5}$—NHPh | Ar$^{a6}$ | Charge Amount of Br—Ar$^{a6}$—Br |
|---|---|---|---|---|---|
| 66 | 66 | 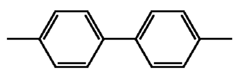 | 1.68 g | 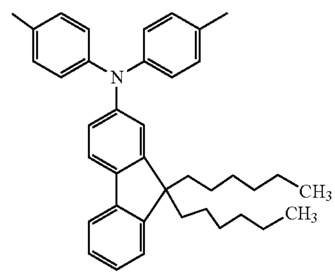 | 2.64 g |
| 67 | 67 | 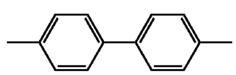 | 10.09 g | 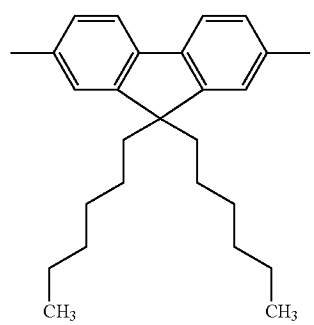 | 13.30 g |
| Synthesis Example | Target | Ar$^{a7}$ | Charge Amount of Br—Ar$^{a7}$—Br | i | Yield of Target Polymer | Mw | Mn | Mw/Mn |
|---|---|---|---|---|---|---|---|---|
| 66 | 66 | 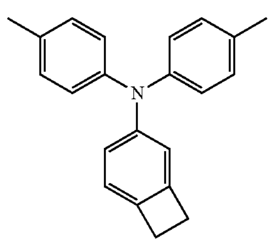 | 0.43 g | 0.8 | 0.82 g | 23400 | 15200 | 1.5 |

TABLE 5-continued (Table 5: Charge Amounts and Molecular Weights of Monomers and Polymers)

| | | | | | | | | |
|---|---|---|---|---|---|---|---|---|
| 67 | 67 | 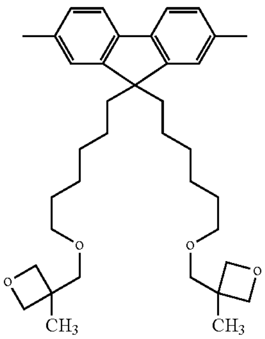 | 2.08 g | 0.9 | 11.27 g | 47500 | 23700 | 2.0 |

Synthesis Example 68

Arylamine Polymer Target 68 was obtained in the same manner as in the synthesis method of Synthesis Examples 14 and 53 by changing such various monomers as in the following reaction formula in accordance with the reaction formula and Table 6 below. The obtained polymer is also shown together in Table 6.

TABLE 6

(Table 6: Charge Amounts and Molecular Weights of Monomers and Polymer)

| Synthesis Example | Target | Charge Amount of Fluorene Amine | $Ar^{a1}$ | Charge Amount of $Br—Ar^{a1}—Br$ | $Ar^{a2}$ | Charge Amount of $Br—Ar^{a3}—Br$ |
|---|---|---|---|---|---|---|
| 68 | 68 | 1.9 g | 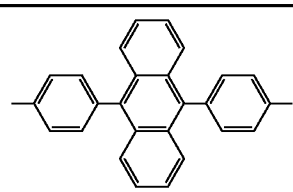 | 1.565 g | 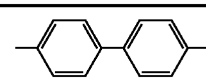 | 1.0 g |

| Synthesis Example | Target | $Ar^{a2}$ | Charge Amount of $Ar^{a2}NH_2$ | $Ar^{a4}$ | Charge Amount of $Ar^{a4}NH_2$ | i | j |
|---|---|---|---|---|---|---|---|
| 68 | 68 | 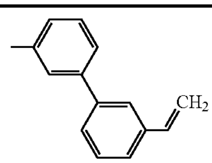 | 0.094 g | 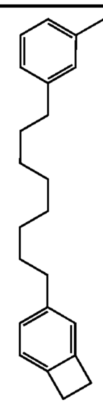 | 0.148 g | 0.425 | 0.425 |

| Synthesis Example | Target | k | o | p | Yield of Target Polymer | Mw | Mn | Mw/Mn |
|---|---|---|---|---|---|---|---|---|
| 68 | 68 | 0.0375 | 0.0375 | 0.0375 | 1.6 g | 109000 | 48000 | 2.3 |

Synthesis Example 69

Arylamine Polymer Target 69 was obtained in the same manner as in the synthesis method of Synthesis Examples 14 and 53 by changing such various monomers as in the following reaction formula in accordance with the reaction formula and Table 7 below. The obtained polymer is also shown together in Table 7.

[Chem. 96]

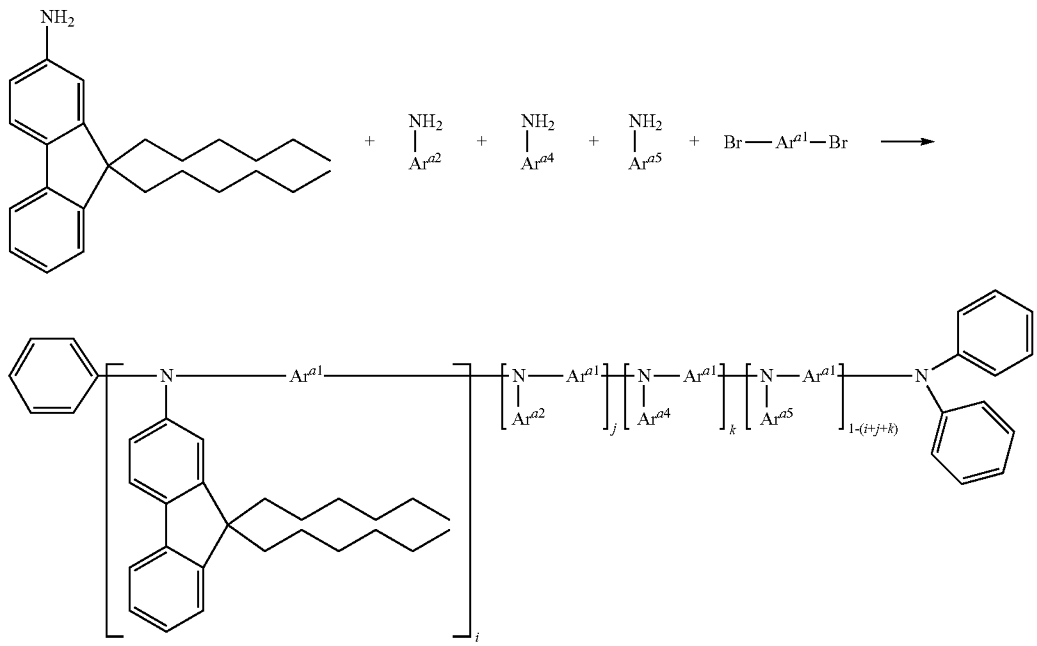

TABLE 7

(Table 7: Charge Amounts and Molecular Weights of Monomers and Polymer)

| Synthesis Example | Target | Charge Amount of Fluorene Amine | $A^{a1}$ | Charge Amount of Br—$Ar^{a1}$—Br | $Ar^{a2}$ | Charge Amount of $Ar^{a2}$—$NH_2$ | $Ar^{a4}$ |
|---|---|---|---|---|---|---|---|
| 69 | 69 | 2.0 g | 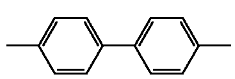 | 3.57 g | 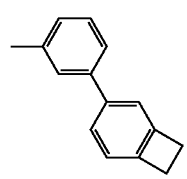 | 0.112 g | 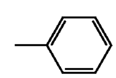 |

| Synthesis Example | Target | Charge Amount of $Ar^{a4}$—$NH_2$ | $Ar^{a5}$ | Charge Amount of $Ar^{a5}$—$NH_2$ | i | j | k | Yield of Target | Mw | Mn | Mw/Mn |
|---|---|---|---|---|---|---|---|---|---|---|---|
| 69 | 69 | 0.426 g | 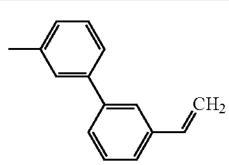  | 0.112 g | 0.5 | 0.05 | 0.4 | 1.4 g | 23800 | 12100 | 1.96 |

Synthesis Example 70
[Chem. 97]
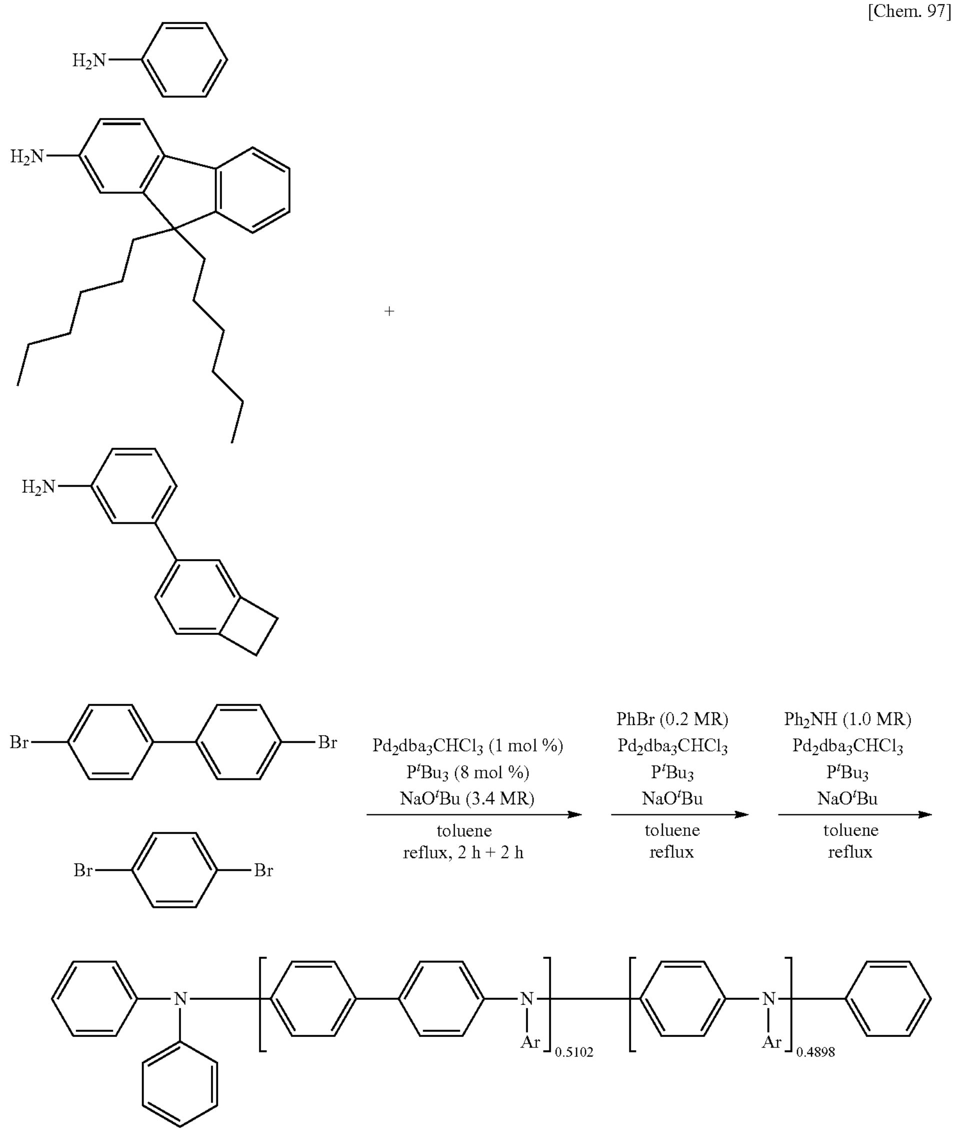
Target 70
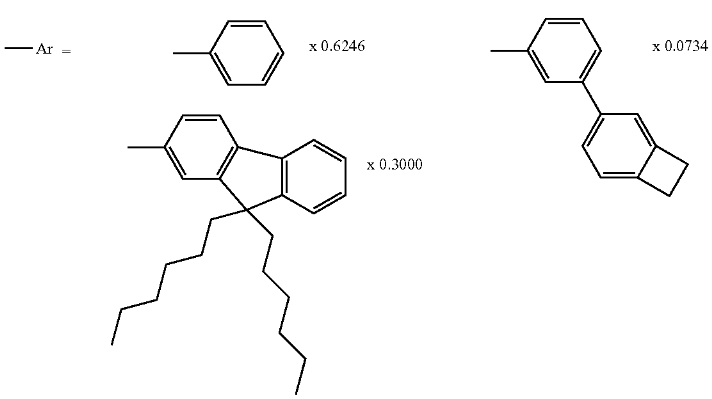

(Operation X)

Aniline (0.9307 g, 9.99 mmol), Target 5 (1.677 g, 4.80 mmol), Target 2 (0.2293 g, 1.17 mmol), 4,4'-dibromobiphenyl (2.496 g, 8.00 mmol) as bromide, tert-butoxy sodium (5.23 g, 54.4 mmol) and toluene (25 ml) were charged and after thoroughly purging the system with nitrogen, the mixture was heated to 60° C. (Solution A). Tri-tert-butylphosphine (0.26 g, 1.28 mmol) was added to a 2 ml toluene solution of tris(dibenzylideneacetone)dipalladium chloroform complex (0.17 g, 0.16 mmol), and the mixture was heated to 60° C. (Solution B). In a nitrogen stream, Solution B was added to Solution A, and the mixed solution was reacted by refluxing under heating for 2 hours.

(Operation Y)

1,4-Dibromobenzene (1.774 g, 7.52 mmol) as bromide was additionally added, and the mixture was refluxed under heating for 1.5 hours.

(Operation Z)

Furthermore, 1,4-dibromobenzene (0.038 g, 0.16 mmol) was additionally added, and the mixture was further refluxed under heating for 0.5 hours. The reaction solution was allowed cool and added dropwise in ethanol/water (200 ml/20 ml) to crystallize Crude Polymer X1. Crude Polymer X1 obtained was dissolved in 100 ml of toluene, and bromobenzene (0.502 g) and tert-butoxy sodium (2.62 g) were charged. After thoroughly purging the system with nitrogen, the mixture was heated to 60° C. (Solution C). Tri-tert-butylphosphine (0.130 g) was added to a 4 ml toluene solution of tris(dibenzylideneacetone)dipalladium chloroform complex (0.083 g), and the mixture was heated to 60° C. (Solution D). In a nitrogen stream, Solution D was added to Solution C, and the mixed solution was reacted by refluxing under heating for 2 hours. To this reaction solution, N,N-diphenylamine (2.72 g) was added, and the mixture was further reacted by refluxing under heating for 5 hours. The reaction solution was allowed to cool and then added dropwise in an ethanol/water (300 ml/30 ml) solution to obtain Crude Polymer 34 with the terminal residue being capped. Crude Polymer 34 with the terminal residue being capped was dissolved in toluene and reprecipitated with acetone, and the precipitated polymer was collected by filtration. The obtained polymer 39 was dissolved in toluene, and the solution was washed with dilute hydrochloric acid and reprecipitated with ammonia-containing ethanol. The polymer 39 collected by filtration was purified by column chromatography to obtain Target 70 (2.58 g).

Weight average molecular weight (Mw)=68,300

Number average molecular weight (Mn)=33,300

Dispersity (Mw/Mn)=2.05

Synthesis Example 71

Target 71 that is a polymer represented by the same structural formula as Target 70 was obtained by synthesizing the polymer in the same manner as in Synthesis Example 70 except that in Synthesis Example 70, 4,4'-dibromobiphenyl (2.496 g, 8.00 mmol) and 1,4-dibromobenzene (0.377 g, 1.60 mmol) were charged as bromide in (Operation X) and 1,4-dibromobenzene (1.397 g, 5.92 mmol) as bromide was additionally added in (Operation Y).

Weight average molecular weight (Mw)=67,900

Number average molecular weight (Mn)=28,900

Dispersity (Mw/Mn)=2.35

Synthesis Example 72

[Chem. 98]

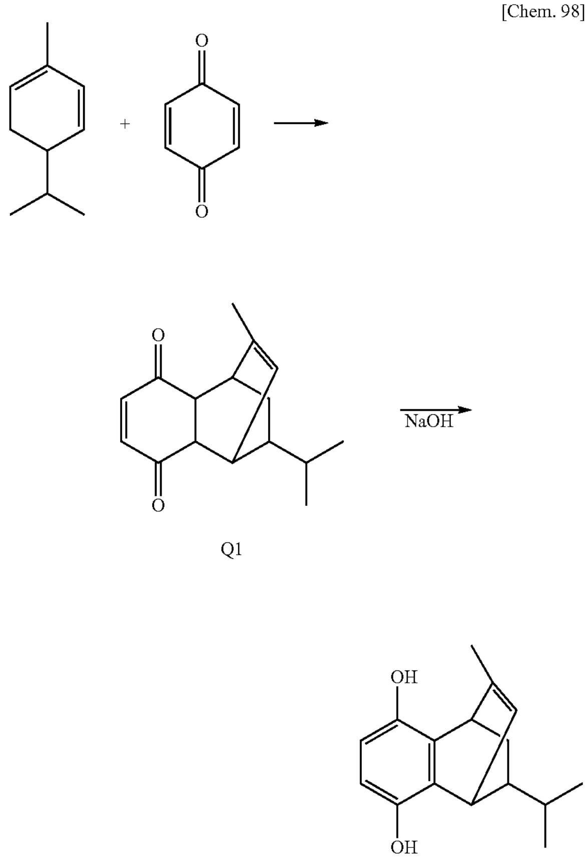

Target 72

In an air stream, α-phellandrene (42.12 g) and α-phellandrene (33.8 g) were added to water (4,500 ml), and the mixture was stirred with an ultrasonic waver at room temperature for 2 days. The precipitated crystal was collected by filtration, washed with water and dried to obtain Compound Q1.

Subsequently, Compound Q1 (39 g) was dissolved in ethanol (200 ml) with stirring, and 0.1 g of a 35% NaOH solution was added. After keeping stirring for 30 minutes, water (400 ml) was added, and the precipitated crystal was collected by filtration, washed with water and dried to obtain Target 72 (39 g).

(Results of NMR Measurement)

Target 72: $^1$H NMR ($CDCl_3$, 400 MHz), δ 0.84 (d, 3H), 0.93 (d, 3H), 1.04-1.118 (m, 1H), 1.19-1.23 (m, 3H), 1.80 (s, 3H), 3.94-3.97 (m, 1H), 4.22 (d, 1H), 5.84 (d, 1H), 6.45 (s, 2H).

Synthesis Example 73

[Chem. 99]

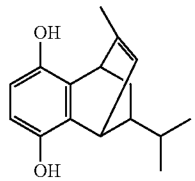

Target 72

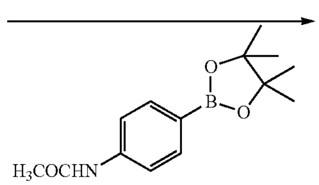

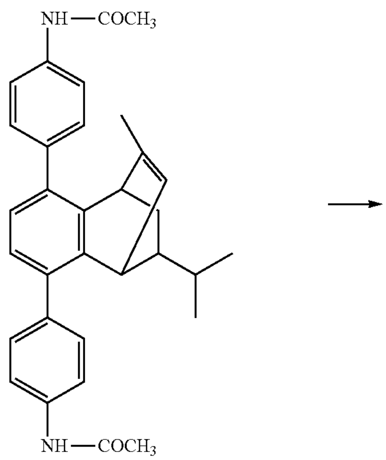

Q8

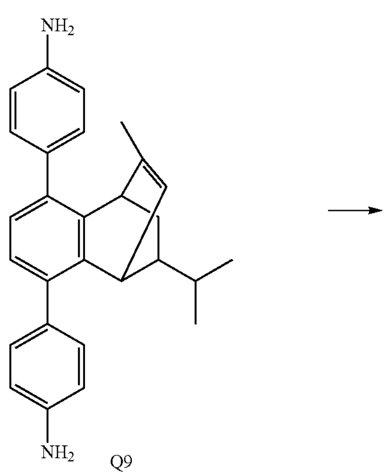

Q9

-continued

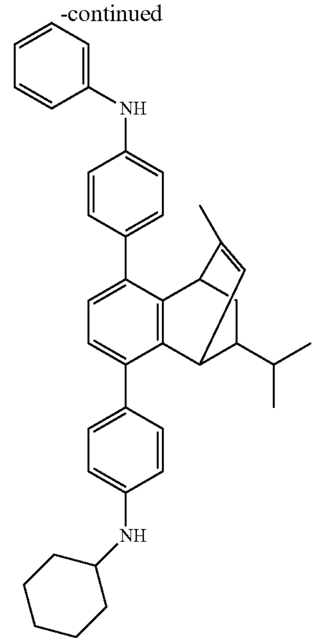

Eq. A5

Target 73

In a nitrogen stream, Target 72 (5.08 g), 4-(4,4,5,5-tetramethyl-1,3,2-dioxaboran-2-yl)acetanilide (5.2 g) and sodium carbonate (4.3 g) were dissolved in a mixed solvent of toluene (260 ml), ethanol (130 ml) and water (240 ml), and the resulting solution was subjected to nitrogen bubbling for 40 minutes. Thereafter, 0.25 g of tetrakis(triphenylphosphine)palladium was added, and the mixture was reacted at 100° C. for 6 hours. Subsequently, the reaction solution was returned to room temperature and left standing overnight to precipitate a crystal. The crystal was collected by filtration and washed with ethanol to obtain Compound Q8 (4.3 g).

Compound Q8 (4.3 g) and potassium hydroxide (15 g) were dissolved in an aqueous 75% ethanol solution (250 ml), and the solution was heated at 100° C. for 10 hours and then returned to room temperature. Thereafter, 100 ml of water was added, and the precipitated crystal was collected by filtration to obtain Compound Q9 (2 g).

Dipalladiumtris(dibenzylideneacetone) chloroform (0.015 g) and 1,1'-ferrocenebis(diphenylphosphine) (0.056 g) were dissolved in toluene (10 g) subjected to nitrogen bubbling for 10 minutes, and the solution was heated at 70° C. for 10 minutes. Subsequently, this palladium catalyst solution was added to a solution obtained by dissolving Compound Q9 (2 g), bromobenzene (1.6 g) and tertiary butoxy sodium (3.4 g) in toluene (200 ml) and subjecting the solution to nitrogen bubbling for 40 minutes, and in a nitrogen stream, the resulting solution was stirred at 100° C. for 4 hours and then returned to room temperature. After adding 100 ml of water, the precipitated crystal was collected by filtration and washed with methanol to obtain Target 73 (1.3 g).

(Results of Mass Measurement)

MASS Analysis of Target 73 was performed by the following method:

DEI method, DCI method (mass analyzer, JMS-700/MStation, manufactured by JEOL), ionization method, DEI method (positive ion mode), DCI (positive ion mode)—isobutane gas, Accelerating voltage: 70 eV, Variation of emitter current: from 0 A to 0.9 A, Scanned mass number range: m/z 100-800, 2.0 sec/scan, The results was m/z=M+546.

Synthesis Example 74

[Chem. 100]

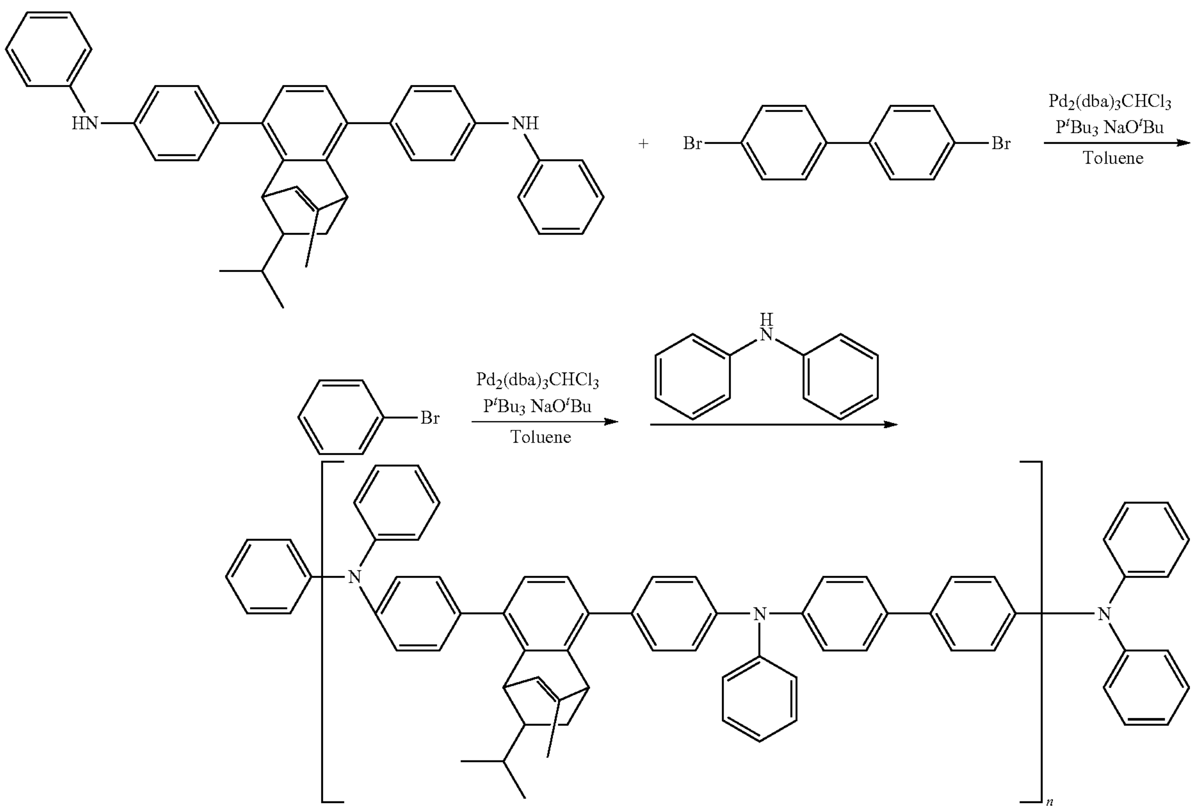

Target 74

Target 73 (0.71 g, 1.30 mmol) synthesized above, 4,4'-dibromobiphenyl (0.39 g, 1.26 mmol), tert-butoxy sodium (0.47 g, 4.86 mmol) and toluene (7 ml) were charged and after thoroughly purging the system with nitrogen, the mixture was heated to 50° C. (Solution A).

Tri-tert-butylphosphine (0.0210 g, 0.0104 mmol) was added to a 2 ml toluene solution of tris(dibenzylideneacetone) dipalladium chloroform complex (0.013 g, 0.0013 mmol), and the mixture was heated to 50° C. (Solution B).

In a nitrogen stream, Solution B was added to Solution A, and the mixed solution was reacted by refluxing under heating for 2 hours. The reaction solution was allowed to cool and then added dropwise in 200 ml of ethanol to crystallize Crude Polymer 36.

Crude Polymer 36 was dissolved in toluene and reprecipitated with acetone, and the precipitated polymer was separated by filtration. Crude Polymer 36 obtained was dissolved in 45 ml of toluene, and bromobenzene (0.041 g, 0.3 mmol) and tert-butoxy sodium (1.80 g, 2 mmol) were charged. After thoroughly purging the system with nitrogen, the mixture was heated to 50° C. (Solution C).

Tri-tert-butylphosphine (0.003 g, 1.6 mmol) was added to a 5 ml toluene solution of tris(dibenzylideneacetone)dipalladium chloroform complex (0.013 g, 1.2 mmol), and the mixture was heated to 50° C. (Solution D).

In a nitrogen stream, Solution D was added to Solution C, and the mixed solution was reacted by refluxing under heating for 2 hours. To this reaction solution, a toluene (34 ml) solution of N,N-diphenylamine (0.22 g, 1.3 mmol) was added, and the mixture was further reacted by refluxing under heating for 8 hours. The reaction solution was allowed to cool and then added dropwise in methanol to obtain Crude Polymer 2.

Crude Polymer 2 obtained was dissolved in toluene, and the solution was washed with dilute hydrochloric acid and reprecipitated with ammonia-containing ethanol. The polymer collected by filtration was purified by column chromatography to obtain Target 74 (0.29 g).

Weight average molecular weight (Mw)=106,696

Number average molecular weight (Mn)=47,937

Dispersity (Mw/Mn)=2.23

Thermal dissociation of Target 74 was observed by a differential scanning calorimeter (DSC6220, manufactured by SII Nanotechnology). It was confirmed that thermal dissociation efficiently occurs at a temperature of 230° C.

Synthesis Example 75

[Chem. 101]

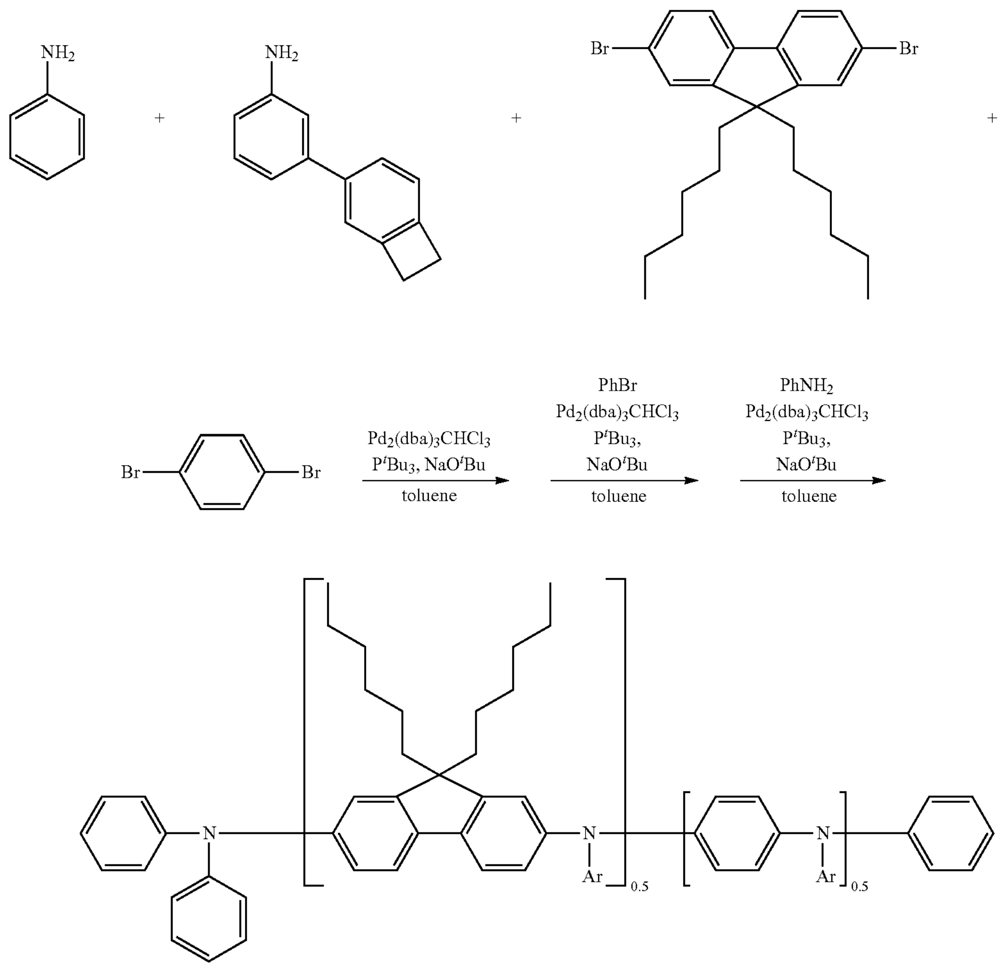

Target 75

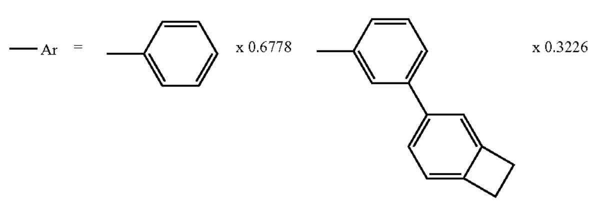

Aniline (1.77 g), Target 2 (1.76 g) obtained in Synthesis Example 2, 9,9-dihexyl-2,7-dibromofluorene (6.89 g), tert-butoxy sodium (8.61 g) and toluene (60 ml) were charged and after thoroughly purging the system with nitrogen, the mixture was heated to 50° C. (Solution A). Tri-tert-butylphosphine (0.45 gl) was added to a 10 ml toluene solution of tris(dibenzylideneacetone)dipalladium chloroform complex (0.29 g), and the mixture was heated to 50° C. (Solution B). In a nitrogen stream, Solution B was added to Solution A, and the mixed solution was reacted by refluxing under heating for 1.5 hours. Disappearance of raw materials was confirmed, and 1,4-dibromobenzene (2.90 g) was additionally added. The mixture was refluxed under heating for 2 hours and by confirming the start of polymerization, 1,4-dibromobenzene (0.06 g, ×2) was additionally added. The mixture was further refluxed under heating for 2 hours, and the reaction solution was allowed to cool and then added dropwise in ethanol (500 ml) to crystallize a crude polymer. Subsequently, in the same manner as in Synthesis Example 70, the reaction for treating the terminal was performed, and the product was further purified to obtain Target 75.

Weight average molecular weight (Mw)=63,600

Number average molecular weight (Mn)=35,100

Dispersity (Mw/Mn)=1.81

Synthesis Example 76
[Chem. 102]
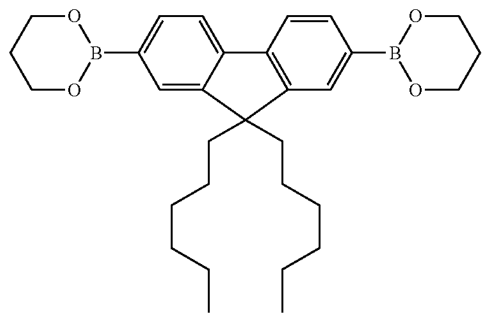
Compound 1
+
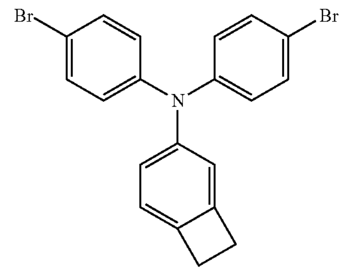
Target 44
+
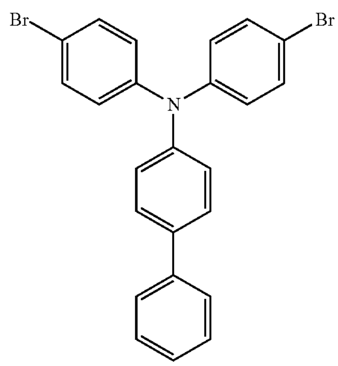
Compound 2
+
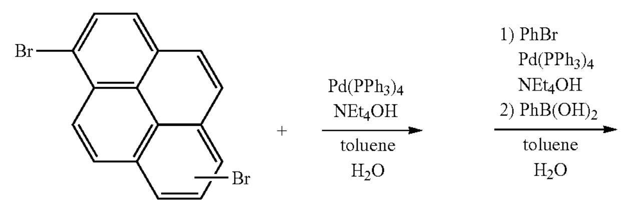
1,6- or 1,8-
Target 3
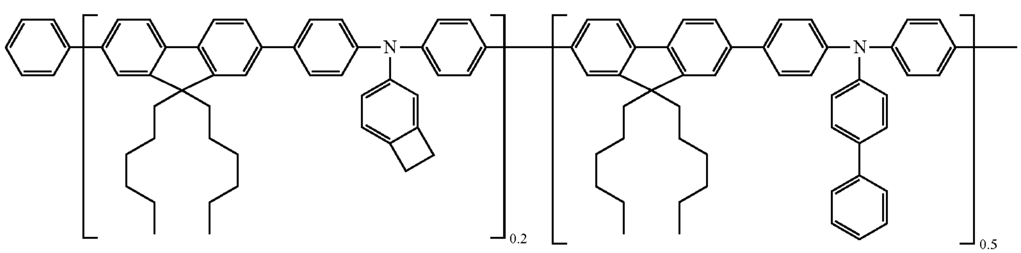
Target 76
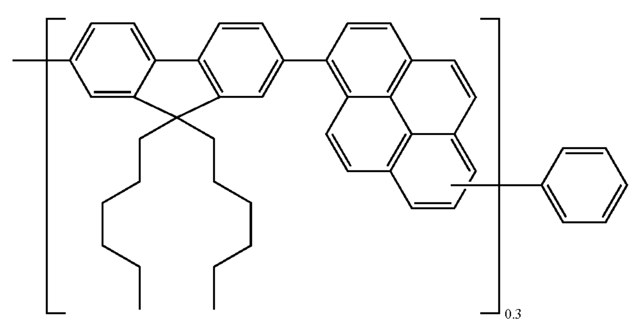

In a nitrogen stream, an aqueous 20% tetraethylammonium hydroxide solution (30 ml) was added to a solution containing Compound 1 (5.024 g), Target 44 (0.885 g), Compound 2 (2.396 g), Target 3 (1.058 g, 1,6-:1,8-=37:63) and toluene (60 ml), and tetrakis(triphenylphosphine)palladium(0) (0.23 g) was added. The mixture was stirred under heating and refluxing for 5 hours. The reaction solution was allowed to cool and then added to ethanol, and the precipitated crude polymer was collected by filtration and dried. In a nitrogen stream, an aqueous 20% tetraethylammonium hydroxide solution (30 ml) was added to a solution containing the obtained crude polymer, bromobenzene (0.33 g) and toluene (60 ml), and tetrakis(triphenylphosphine)palladium(0) (0.12 g) was added. The mixture was stirred under heating and refluxing for 2 hours. Subsequently, phenylboronic acid (1.0 g) was added, and the mixture was stirred under heating and refluxing for 4 hours. The reaction solution was allowed to cool and then added to ethanol, and the precipitated crude polymer was collected by filtration and dried. The polymer was purified by a silica gel column using toluene and tetrahydrofuran as developing solvents, reprecipitated with ethanol from the tetrahydrofuran solution, collected by filtration and dried to obtain Target 76 (3.4 g).

Mw: 41,000
Mn: 21,500
Mw/Mn: 1.90

Synthesis Comparative Example 1

[Chem. 103]

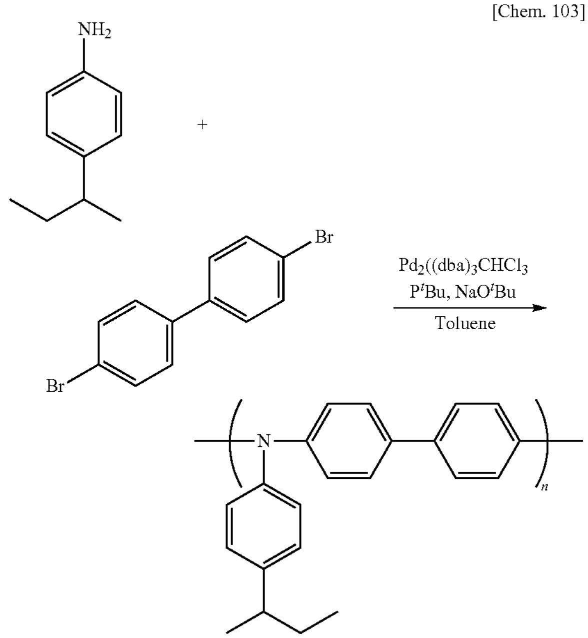

4-sec-Butylaniline (1.27 g, 8.5 mmol), 4,4'-dibromobiphenyl (2.57 g, 8.2 mmol), tert-butoxy sodium (3.27 g, 34.0 mmol) and toluene (20 ml) were charged and after thoroughly purging the system with nitrogen, the mixture was heated to 50° C. (Solution A). Tri-tert-butylphosphine (0.138 g, 0.068 mmol) was added to a 5 ml toluene solution of tris(dibenzylideneacetone)dipalladium chloroform complex (0.088 g, 0.0085 mmol), and the mixture was heated to 50° C. (Solution B). In a nitrogen stream, Solution B was added to Solution A, and the mixed solution was reacted by refluxing under heating for 1 hour, but start of polymerization could not be confirmed.

In Synthesis Example 23, a polymer was synthesized using almost the same compounds as in Synthesis Comparative Example 1, and it is understood that when synthesized by the polymer production process of the present invention, a polymer having a large weight average molecular weight (Mw) and a small dispersity (Mw/Mn) can be synthesized.

Synthesis Comparative Example 2

Comparative Polymer 1 having the following weight average molecular weight (Mw) and dispersity (Mw/Mn), which is a polymer represented by the same structural formula as Target 70, was obtained by synthesizing the polymer in the same manner as in Synthesis Example 70 except that in Synthesis Example 70, 4,4'-dibromobiphenyl (2.496 g, 8.00 mmol) and 1,4-dibromobenzene (1.132 g, 4.80 mmol) were charged as bromide in (Operation X) and 1,4-dibromobenzene (0.642 g, 2.72 mmol) as bromide was additionally added in (Operation Y).

Weight average molecular weight (Mw)=68,000

Number average molecular weight (Mn)=27,600

Dispersity (Mw/Mn)=2.46

[Fabrication of Organic Electroluminescence Element]

Example 1

An organic electroluminescence element shown in FIG. 1 was fabricated.

A glass substrate having stacked thereon an indium tin oxide (ITO) transparent electroconductive film to a thickness of 120 nm (a deposited product by sputtering, produced by Sanyo Vacuum Industries Co., Ltd.) was patterned into 2 mm-wide stripes by normal photolithography technique and hydrochloric acid etching to form an anode. The ITO substrate after pattern formation was washed, in order, by ultrasonic cleaning with an aqueous surfactant solution, washing with ultrapure water, ultrasonic cleaning with ultrapure water and washing with ultrapure water, then dried with compressed air and finally subjected to ultraviolet-ozone cleaning.

A coating solution for the formation of a hole injection layer, containing a hole-transporting polymer material having a repeating structure of structural formula (P1) shown below (weight average molecular weight: 26,500, number average molecular weight: 12,000), 4-isopropyl-4'-methyl diphenyliodonium tetrakis(pentafluorophenyl)borate of structural formula (A1) and ethyl benzoate, was prepared, and the coating solution was deposited on the anode by spin coating under the following conditions to form a 30 nm-thick hole injection layer.

[Chem. 104]

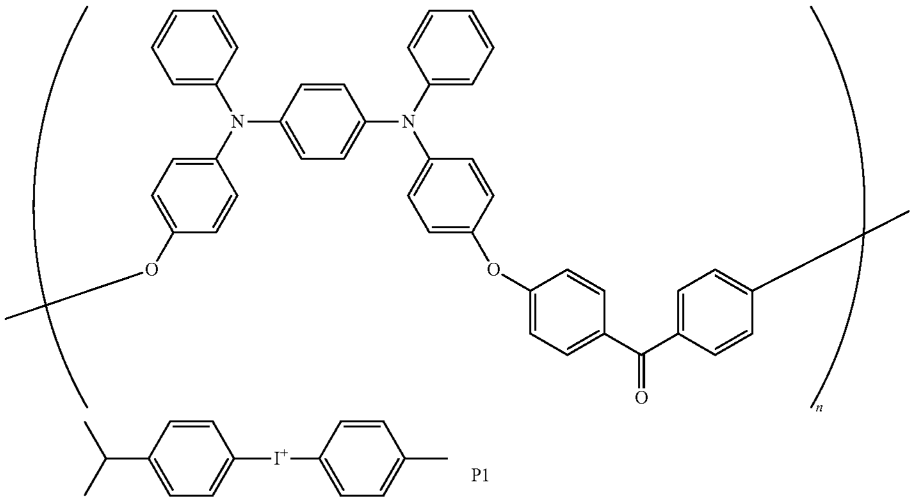

P1

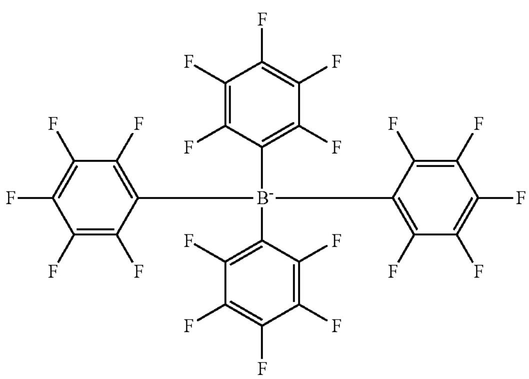

A1

<Coating Solution for Formation of Hole Injection Layer>
Solvent: ethyl benzoate
Concentration of coating solution:
P1: 2.0 wt %
A1: 0.8 wt %

<Deposition Conditions for Hole Injection Layer>
Spinning speed of spinner: 1,500 rpm
Spinning time of spinner: 30 seconds
Spin coating atmosphere: in the atmosphere
Heating conditions: in the atmosphere, 230° C., 3 hours Subsequently, a composition for organic electroluminescence element, containing Conjugated Polymer (H1) (Target 12 obtained in Synthesis Example 12) of the structural formula shown below according to the present invention, was prepared, then coated by spin coating under the following conditions and heated for crosslinking to form a 20 nm-thick hole transport layer.

[Chem. 105]

H1

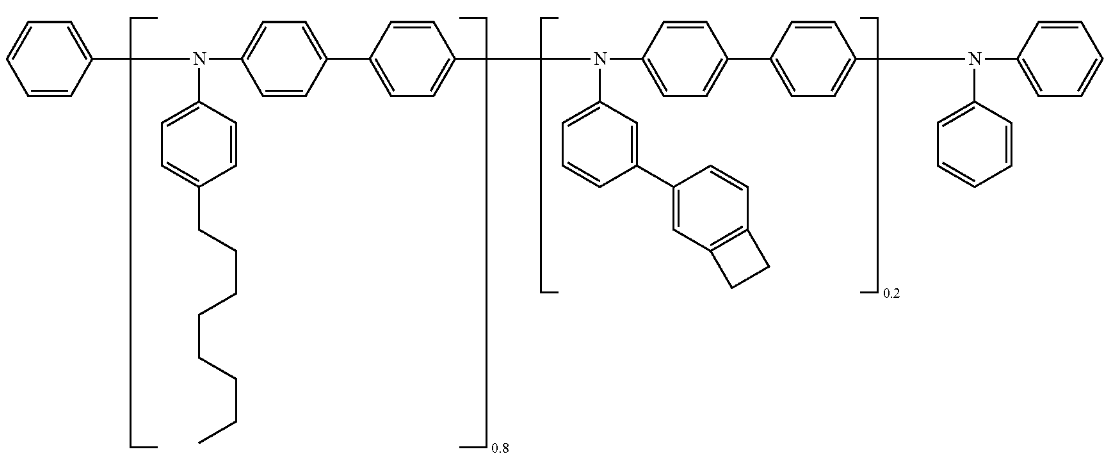

<Composition for Organic Electroluminescence Element>

Solvent: toluene

Solid content concentration: 0.4 wt %

<Deposition Conditions for Hole Transport Layer>

Spinning speed of spinner: 1,500 rpm

Spinning time of spinner: 30 seconds

Spin coating atmosphere: in nitrogen

Heating conditions: in nitrogen, 230° C., 1 hour

Thereafter, in forming a light emitting layer, a coating solution for the formation of a light emitting layer was prepared using Organic Compounds (C1) and (D1) shown below and spin-coated on the hole transport layer under the following conditions to form a 47 nm-thick light emitting layer.

[Chem. 106]

C1

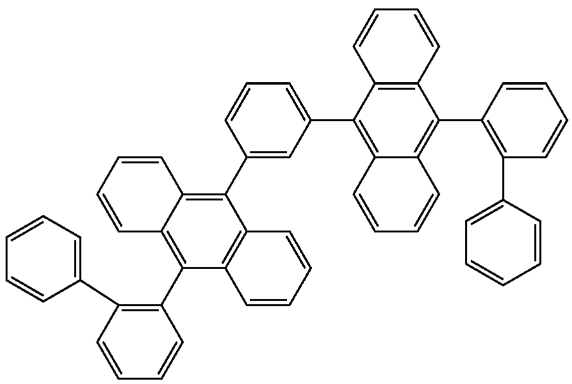

D1

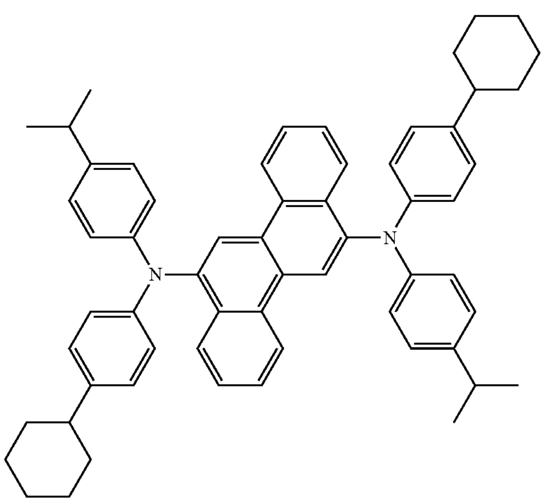

<Coating Solution for Formation of Light Emitting Layer>

Solvent: cyclohexylbenzene

Concentration of coating solution:

C1: 2.30 wt %

D1: 0.23 wt %

<Deposition Conditions for Light Emitting Layer>

Spinning speed of spinner: 1,000 rpm

Spinning time of spinner: 30 seconds

Spin coating atmosphere: in nitrogen

Heating conditions: under reduced pressure (0.1 MPa), 130° C., 1 hour

The substrate after deposition up to the light emitting layer was transferred into a vacuum deposition apparatus, and the apparatus was roughly evacuated by an oil-sealed rotary pump and then evacuated using a cryopump until the degree of vacuum in the apparatus became $2.4\times10^{-4}$ Pa or less. Thereafter, BAlq (C2) was stacked by a vacuum deposition method to obtain a hole blocking layer. The hole blocking layer was formed as a 10 nm-thick film by controlling the vapor deposition rate in the range of 0.7 to 0.8 Å/sec and stacking it on the light emitting layer. The degree of vacuum during vapor deposition was from 2.4 to $2.7\times10^{-4}$ Pa.

[Chem. 107]

C2

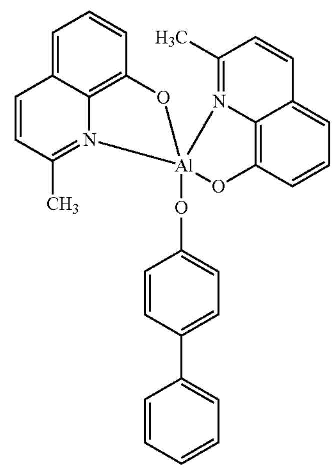

Subsequently, Alq3 (C3) was heated for vapor deposition to deposit an electron transport layer. During vapor deposition, the degree of vacuum and the vapor deposition rage were controlled to be from 0.4 to $1.6\times10^{-4}$ Pa and from 1.0 to 1.5 Å/sec, respectively, and a 30 nm-thick film was stacked on the hole blocking layer, whereby an electron transport layer was formed.

[Chem. 108]

C3

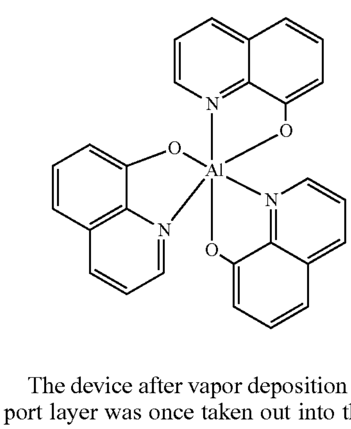

The device after vapor deposition up to the electron transport layer was once taken out into the atmosphere from the vacuum deposition apparatus, and a shadow mask having 2 mm-wide stripes, as a mask for vapor deposition of cathode, was put into close contact with the device such that the stripes run at right angles to the ITO stripes of the anode. The device was placed in another vacuum deposition apparatus, and similarly to that for the organic layer, the apparatus was evacuated until the degree of vacuum in the apparatus became $6.4\times10^{-4}$ Pa or less.

As the electron injection layer, lithium fluoride (LiF) was first deposited on the electron transport layer to a thickness of 0.5 nm by using a molybdenum boat under control at a vapor deposition rate of 0.1 to 0.4 Å/sec and a vacuum degree of 3.2 to $6.7\times10^{-4}$ Pa. Then, aluminum as a cathode was heated on a molybdenum boat in the same manner to form a 80 nm-thick aluminum layer by controlling the vapor deposition rate to be from 0.7 to 5.3 Å/sec and the degree of vacuum to be from 2.8 to $11.1\times10^{-4}$ Pa. During vapor deposition of these two layers, the substrate temperature was kept at room temperature.

[Chem. 109]

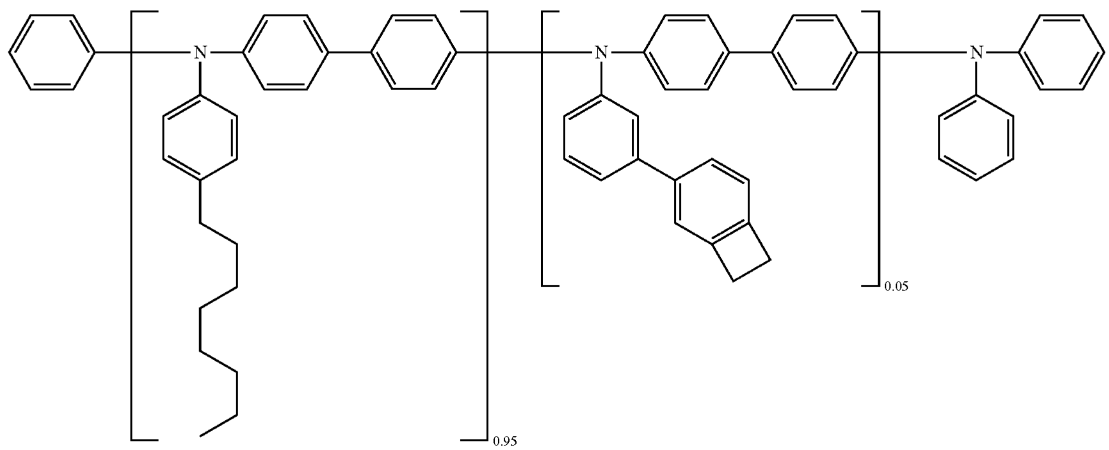

H2

Subsequently, in order to keep the device from deterioration due to water or the like in the atmosphere during storage, an encapsulation treatment was performed by the following method.

In a nitrogen glove box, a photocurable resin (30Y-437, produced by ThreeBond Co., Ltd.) was coated in a width of about 1 mm on the outer periphery of a glass plate of 23 mm×23 mm, and a water getter sheet (produced by Dynic Co.) was disposed in the central part. A substrate after the completion of cathode formation was laminated thereon such that the deposited surface came to face the desiccant sheet. Thereafter, ultraviolet light was irradiated only on the region coated with the photocurable resin to cure the resin.

In this way, an organic electroluminescence element having a luminous area portion of 2 mm×2 mm in size was obtained. The luminescence characteristics of this device are as follows.

Luminance/current: 1.6 [cd/A]@100 $cd/m^2$

Voltage: 8.0 [V]@100 $cd/m^2$

Luminous efficiency: 0.6 [lm/W]@100 $cd/m^2$

The maximum wavelength of emission spectrum of the device was 464 nm, and this was identified to be from Compound (D1). The chromaticity was CIE(x,y)=(0.137,0.150).

Example 2

An organic electroluminescence element shown in FIG. 1 was fabricated in the same manner as in Example 1 except that in Example 1, the hole transport layer was formed as follows.

A composition for organic electroluminescence element, containing Conjugated Polymer (H2) (Target 19 obtained in Synthesis Example 19) according to the present invention, was prepared, then coated by spin coating under the following conditions and heated for crosslinking to form a 20 nm-thick hole transport layer.

<Composition for Organic Electroluminescence Element>

Solvent: toluene

Solid content concentration: 0.4 wt %

<Deposition Conditions for Hole Transport Layer>

Spinning speed of spinner: 1,500 rpm

Spinning time of spinner: 30 seconds

Spin coating atmosphere: in nitrogen

Heating conditions: in nitrogen, 230° C., 1 hour

The luminescence characteristics of the obtained organic electroluminescence element having a luminous area portion of 2 mm×2 mm in size are as follows.

Luminance/current: 2.5 [cd/A]@100 $cd/m^2$

Voltage: 6.5 [V]@100 $cd/m^2$

Luminous efficiency: 1.2 [lm/W]@100 $cd/m^2$

The maximum wavelength of emission spectrum of the device was 462 nm, and this was identified to be from Compound (D1). The chromaticity was CIE(x,y)=(0.142,0.161).

Example 3

An organic electroluminescence element shown in FIG. 1 was fabricated in the same manner as in Example 1 except that in Example 1, the hole transport layer was formed as follows.

A composition for organic electroluminescence element, containing Conjugated Polymer (H3) (Target 14 obtained in Synthesis Example 14) according to the present invention, was prepared, then coated by spin coating under the following conditions and heated for crosslinking to form a 20 nm-thick hole transport layer.

[Chem. 110]

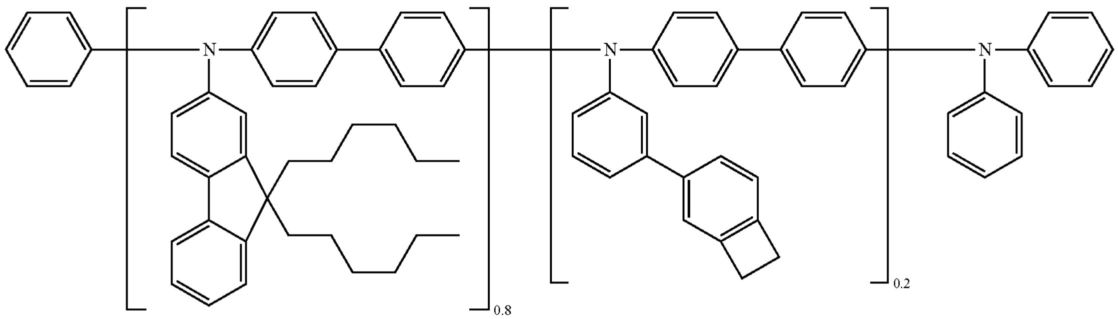
H3

<Composition for Organic Electroluminescence Element>

Solvent: toluene

Solid content concentration: 0.4 wt %

<Deposition Conditions for Hole Transport Layer>

Spinning speed of spinner: 1,500 rpm

Spinning time of spinner: 30 seconds

Spin coating atmosphere: in nitrogen

Heating conditions: in nitrogen, 230° C., 1 hour

The luminescence characteristics of the obtained organic electroluminescence element having a luminous area portion of 2 mm×2 mm in size are as follows.

Luminance/current: 1.9 [cd/A]@100 cd/$m^2$

Voltage: 7.8 [V]@100 cd/$m^2$

Luminous efficiency: 0.8 [lm/W]@100 cd/$m^2$

The maximum wavelength of emission spectrum of the device was 465 nm, and this was identified to be from Compound (D1). The chromaticity was CIE(x,y)=(0.137,0.166).

Example 4

An organic electroluminescence element shown in FIG. 1 was fabricated in the same manner as in Example 1 except that in Example 1, the hole transport layer was formed as follows.

A composition for organic electroluminescence element, containing Conjugated Polymer (H4) (Target 17 obtained in Synthesis Example 17) according to the present invention, was prepared, then coated by spin coating under the following conditions and heated for crosslinking to form a 20 nm-thick hole transport layer.

<Composition for Organic Electroluminescence Element>

Solvent: toluene

Solid content concentration: 0.4 wt %

<Deposition Conditions for Hole Transport Layer>

Spinning speed of spinner: 1,500 rpm

Spinning time of spinner: 30 seconds

Spin coating atmosphere: in nitrogen

Heating conditions: in nitrogen, 230° C., 1 hour

The luminescence characteristics of the obtained organic electroluminescence element having a luminous area portion of 2 mm×2 mm in size are as follows.

Luminance/current: 3.6 [cd/A]@100 cd/$m^2$

Voltage: 5.4 [V]@100 cd/$m^2$

Luminous efficiency: 2.1 [lm/W]@100 cd/$m^2$

The maximum wavelength of emission spectrum of the device was 464 nm, and this was identified to be from Compound (D1). The chromaticity was CIE(x,y)=(0.141,0.168).

Example 5

An organic electroluminescence element shown in FIG. 1 was fabricated in the same manner as in Example 1 except that in Example 1, the hole transport layer was formed as follows.

A composition for organic electroluminescence element, containing Conjugated Polymer (H5) (Target 18 obtained in Synthesis Example 18) according to the present invention, was prepared, then coated by spin coating under the following conditions and heated for crosslinking to form a 20 nm-thick hole transport layer.

[Chem. 111]

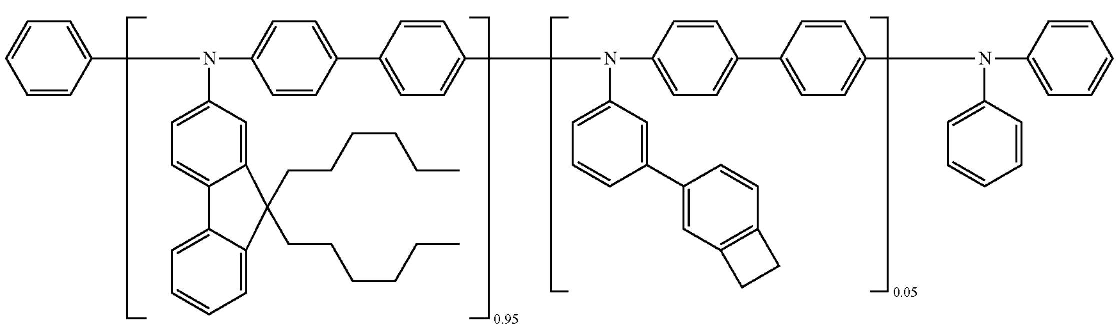
H4

[Chem. 112]

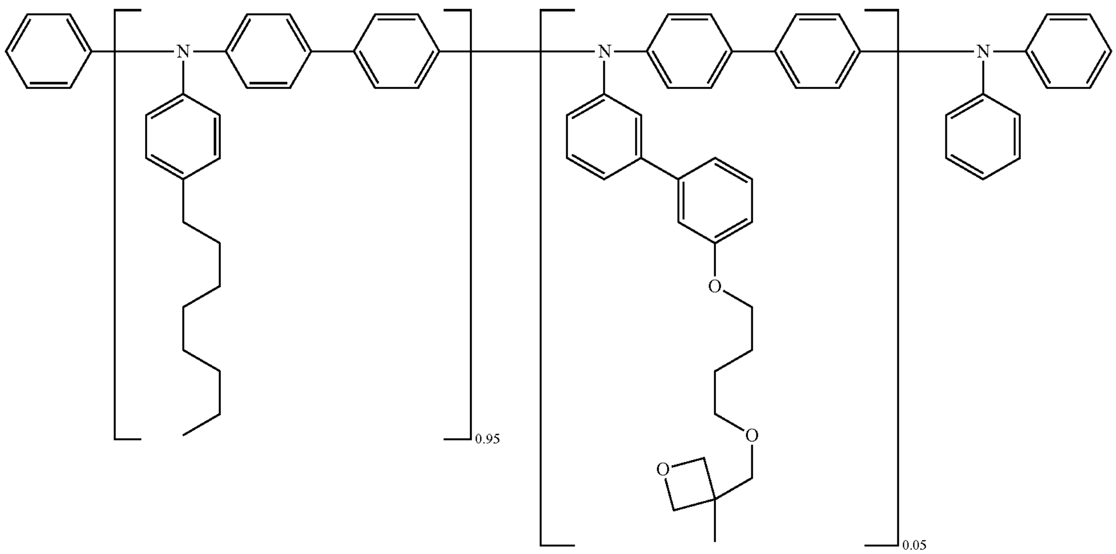

H5

<Composition for Organic Electroluminescence Element>

Solvent: toluene

Solid content concentration: 0.4 wt %

<Deposition Conditions for Hole Transport Layer>

Spinning speed of spinner: 1,500 rpm

Spinning time of spinner: 30 seconds

Spin coating atmosphere: in nitrogen

Heating conditions: in nitrogen, 230° C., 1 hour

The luminescence characteristics of the obtained organic electroluminescence element having a luminous area portion of 2 mm×2 mm in size are as follows.

Luminance/current: 2.1 [cd/A]@100 cd/$m^2$

Voltage: 6.3 [V]@100 cd/$m^2$

Luminous efficiency: 1.1 [lm/W]@100 cd/$m^2$

The maximum wavelength of emission spectrum of the device was 464 nm, and this was identified to be from Compound (D1). The chromaticity was CIE(x,y)=(0.143,0.173).

Example 6

An organic electroluminescence element shown in FIG. 1 was fabricated.

A glass substrate having stacked thereon an indium tin oxide (ITO) transparent electroconductive film to a thickness of 120 nm (a deposited product by sputtering, produced by Sanyo Vacuum Industries Co., Ltd.) was patterned into 2 mm-wide stripes by normal photolithography technique and hydrochloric acid etching to form an anode. The ITO substrate after pattern formation was washed, in order, by ultrasonic cleaning with an aqueous surfactant solution, washing with ultrapure water, ultrasonic cleaning with ultrapure water and washing with ultrapure water, then dried with compressed air and finally subjected to ultraviolet-ozone cleaning.

A 30 nm-thick hole injection layer was obtained in the same manner as in Example 1.

Subsequently, a composition for organic electroluminescence element, containing Conjugated Polymer (H6) (Target 67 obtained in Synthesis Example 67) of the structural formula shown below according to the present invention (Mw: 47,500, Mn: 23,700, Mw/Mn: 2.00), was prepared, then coated by spin coating under the following conditions and heated for crosslinking to form a 20 nm-thick hole transport layer.

[Chem. 113]

(H6)

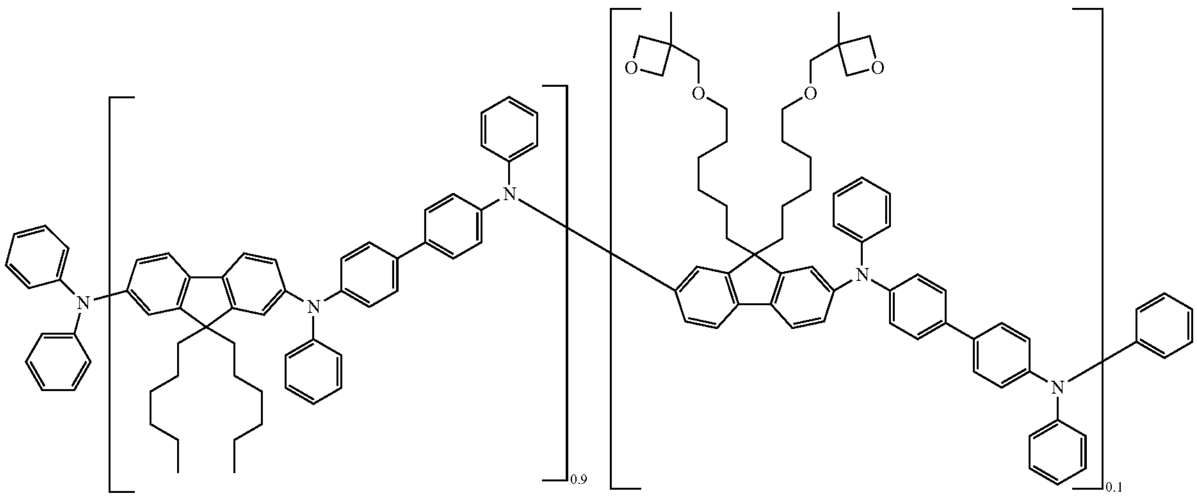

<Composition for Organic Electroluminescence Element>

Solvent: toluene

Solid content concentration: 0.4 wt %

<Deposition Conditions for Hole Transport Layer>

Spinning speed of spinner: 1,500 rpm

Spinning time of spinner: 30 seconds

Spin coating atmosphere: in nitrogen

Heating conditions: in nitrogen, 230° C., 1 hour

Thereafter, in forming a light emitting layer, a coating solution for the formation of a light emitting layer was prepared using Organic Compounds (C4) and (D2) shown below and spin-coated on the hole transport layer under the following conditions to form a 51 nm-thick light emitting layer.

[Chem. 114]

(C4)

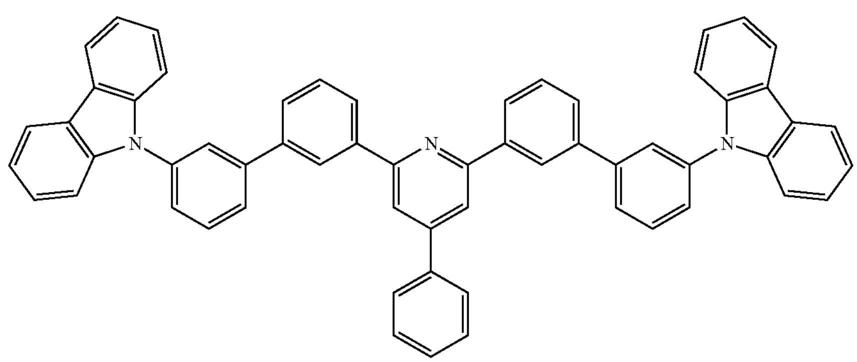

(D2)

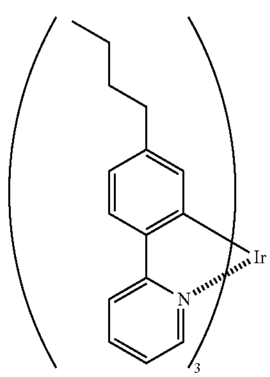

<Coating Solution for Formation of Light Emitting Layer>

Solvent: xylene

Concentration of coating solution:

C4: 2.00 wt %

D2: 0.20 wt %

<Deposition Conditions for Light Emitting Layer>

Spinning speed of spinner: 1,500 rpm

Spinning time of spinner: 30 seconds

Spin coating atmosphere: in nitrogen

Heating conditions: under reduced pressure (0.1 MPa), 130° C., 1 hour

Thereafter, in the same manner as in Example 1, the hole blocking layer, electron transport layer, electron injection layer and cathode were formed, and an encapsulation treatment was performed. The luminescence characteristics of this device are shown in Table 8. It is apparent that the polymer of the present invention has a high charge transportability and therefore, a device having a low drive voltage and a long life is obtained.

Comparative Example 1

An organic electroluminescence element shown in FIG. 1 was fabricated in the same manner as in Example 6 except that in Example 6, Conjugated Polymer (H6) of the present invention used at the formation of the hole transport layer was changed to Comparative Polymer 2 (Mw: 55,000, Mn: 28,900, Mw/Mn: 1.9) of the structural formula shown below.

The luminescence characteristics of this device are shown in Table 8.

TABLE 8

| | Voltage (V) at 100 cd/m$^2$ | Drive Life (normalized) |
|---|---|---|
| Example 6 | 8.3 | 1.67 |
| Comparative Example 1 | 8.8 | 1.00 |

As seen from Table 8, the organic electroluminescence element obtained using the conjugated polymer of the present invention has a low drive voltage and a long drive life.

Example 7

A device shown in FIG. 1 was fabricated in the same manner as in Example 1 except that in Example 1, formation of the hole injection layer, hole transport layer and light emitting layer was changed as follows.

A coating solution for the formation of a hole injection layer, containing Conjugated Polymer (H7) (Target 74 obtained in Synthesis Example 75) of the structural formula shown below according to the present invention (weight average molecular weight Mw: 63,600, number average molecular weight Mn: 35,100, Mw/Mn: 1.81), 4-isopropyl-4'-methyl diphenyliodonium tetrakis(pentafluorophenyl)borate of formula (A1) and ethyl benzoate, was prepared. This coating solution was deposited on the anode by spin coating under the following conditions to obtain a 30 nm-thick hole injection layer.

Comparative Polymer 2:

[Chem. 115]

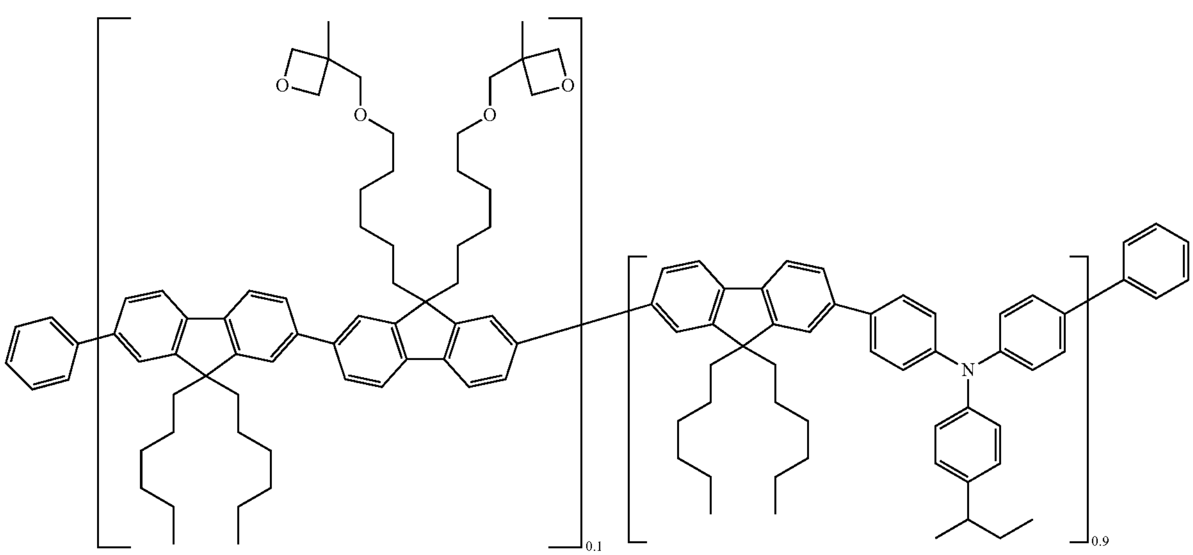

[Chem. 116]

(H7)

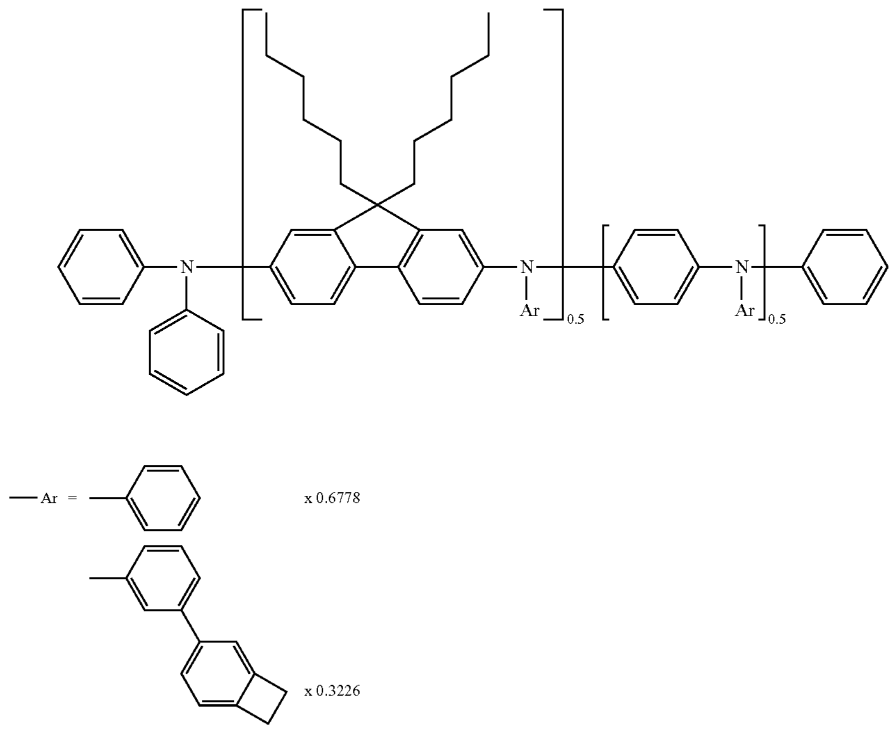

<Coating Solution for Formation of Hole Injection Layer>

Solvent: ethyl benzoate

Concentration of coating solution:

Target 74: 2.0 wt %

A1: 0.8 wt %

<Deposition Conditions for Hole Injection Layer>

Spinning speed of spinner: 1,500 rpm

Spinning time of spinner: 30 seconds

Spin coating atmosphere: in the atmosphere

Heating conditions: in the atmosphere, 230° C., 3 hours

Subsequently, a composition for organic electroluminescence element, containing Conjugated Polymer (H8) (Target 26 obtained in Synthesis Example 26) of the structural formula shown below according to the present invention, was prepared, then coated by spin coating under the following conditions and heated for crosslinking to form a 20 nm-thick hole transport layer.

[Chem. 117]

(H8)

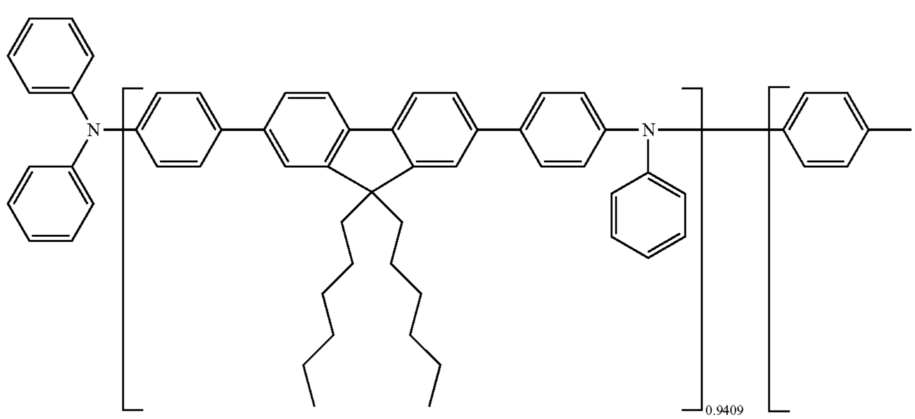

-continued

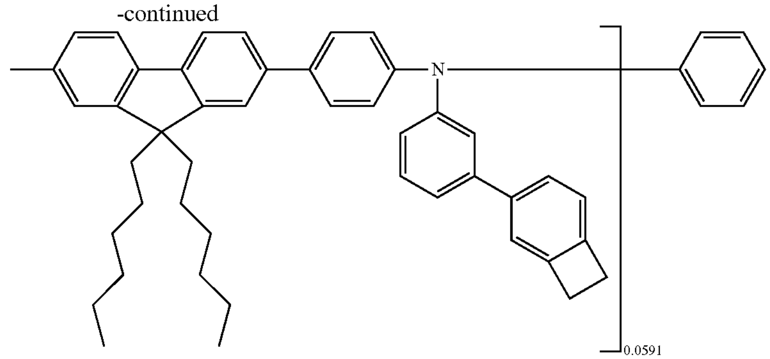

<Composition for Organic Electroluminescence Element>

Solvent: toluene

Solid content concentration: 0.4 wt %

<Deposition Conditions for Hole Transport Layer>

Spinning speed of spinner: 1,500 rpm

Spinning time of spinner: 30 seconds

Spin coating atmosphere: in nitrogen

Heating conditions: in nitrogen, 230° C., 1 hour

Thereafter, in forming a light emitting layer, a coating solution for the formation of a light emitting layer was prepared using Organic Compound (C5) shown below and Organic Compound (D1) and spin-coated on the hole transport layer under the following conditions to form a 40 nm-thick light emitting layer.

[Chem. 118]

(C5)

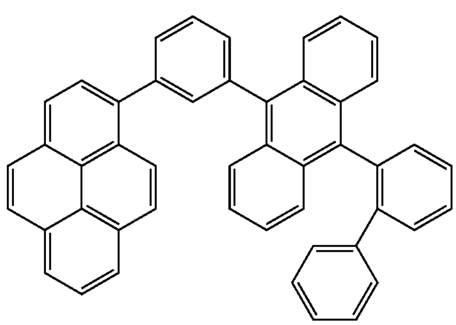

<Coating Solution for Formation of Light Emitting Layer>

Solvent: toluene

Concentration of coating solution:

C5: 0.80 wt %

D1: 0.08 wt %

<Deposition Conditions for Light Emitting Layer>

Spinning speed of spinner: 1,500 rpm

Spinning time of spinner: 30 seconds

Spin coating atmosphere: in nitrogen

Heating conditions: under reduced pressure (0.1 MPa), 130° C., 1 hour

In this way, an organic electroluminescence element having a luminous area portion of 2 mm×2 mm in size was obtained. The luminescence characteristics of this device are shown in Table 9. It is apparent that by using the polymer of the present invention and an electron-accepting compound for the hole injection layer, a device having a long life and a high efficiency is obtained.

Example 8

An organic electroluminescence element shown in FIG. 1 was fabricated in the same manner as in Example 7 except that in Example 7, Target 74 used at the formation of the hole injection layer was changed to Hole-Transporting Polymer Material (P1).

The characteristics of this device are shown in Table 9.

TABLE 9

| | Efficiency (cd/A) at 1000 cd/m$^2$ | Drive Life (normalized) |
|---|---|---|
| Example 7 | 4.4 | 1.86 |
| Example 8 | 3.9 | 1.00 |

Example 9

Using Target 70 obtained in Synthesis Example 70, the insolubilization ratio was measured as follows.

As shown in Table 10, the film formed using the conjugated polymer of the present invention has a high insolubilization ratio.

[Measurement of Insolubilization Ratio]

Film thicknesses L1 and L2 were measured by the following methods, and L2/L1 was defined as the insolubilization ratio.

<Deposition Method and Measuring Method of Film Thickness L1>

A glass substrate of 25 mm×37.5 mm in size was washed with ultrapure water, dried with dry nitrogen and then subjected to UV/ozone cleaning.

A 1 wt % toluene solution of Target 70 (Mw=68,300, Mn=33,300, Mw/Mn=2.05) synthesized in Synthesis Example 70 (composition) was prepared, and the composition was spin-coated on the glass substrate to form a film.

Spin coating was performed in the atmosphere at a temperature of 23° C. and a relative humidity of 60%. The spinning speed of spinner was 1,500 rpm, and the spinning time of spinner was 30 seconds. After deposition, the film was dried by heating in the atmosphere on a hot plate at 80° C. for 1 minute and then dried by heating at 230° C. for 60 minutes in an oven. The obtained film was scraped to a width of about 1 mm and measured for the film thickness L1 (nm) by a film thickness meter (Tencor P-15).

<Measuring Method of Film Thickness L2>

The substrate after the measurement of film thickness L1 was set on a spinner, and toluene was dropped on the portion where the film thickness was measured. After 10 seconds, spin treatment was performed at a spinning speed of spinner of 1,500 rpm for a pinning time of spinner of 30 seconds. Subsequently, the film thickness L2 (nm) of the same portion was again measured, and the film retentivity (insolubilization ratio) L2/L1 after spinning treatment with toluene was calculated.

The measurement result of insolubilization ratio is shown in Table 10.

Example 10

The insolubilization ratio of Target 71 was measured in the same manner as in Example 9 except for using Target 71 (Mw=67,900, Mn=28,900, Mw/Mn=2.35) in place of Target 70.

The measurement result of insolubilization ratio is shown in Table 10.

Comparative Example 2

The insolubilization ratio of Comparative Polymer 1 was measured in the same manner as in Example 9 except for using Comparative Polymer 1 (Mw=68,000, Mn=27,600, Mw/Mn=2.46) synthesized in Synthesis Comparative Example 2, in place of Target 70.

The measurement result of insolubilization ratio is shown in Table 10.

TABLE 10

| | Weight Average Molecular Weight (Mw) | Dispersity (Mw/Mn) | Insolubilization Ratio (%) |
|---|---|---|---|
| Example 9 | 68300 | 2.05 | 100 |
| Example 10 | 67900 | 2.35 | 98.2 |
| Comparative Example 1 | 68000 | 2.46 | 80.3 |

As shown in Table 10, the film obtained using the conjugated polymer of the present invention has high insolubility for the solvent that dissolves the conjugated polymer. In this way, by virtue of having high insolubility for solvent, at the time of forming another layer on the film by a coating method, mixing of layers scarcely occurs. If mixing of layers occurs, the charge transportability decreases and the obtained device suffers from large fluctuation of performance. When the layer is formed using the conjugated polymer of the present invention, such a problem hardly arises.

In particular, when another layer formed on the film by a coating method is a light emitting layer, for example, the film deposited using Comparative Polymer 1 has a relatively low insolubilization ratio, and components of Comparative Polymer 1 are mixed with the light emitting layer at a high rate, as a result, the exciton disappears by the effect of involvement of HOMO or LUMO of the mixture and reduction in the luminous efficiency or drive life is caused.

Also, Comparative Polymer has a large dispersity (Mw/Mn) and therefore, low molecular components contained in the polymer, when mixed into the light emitting layer, work out to a trap site in the light emitting layer and cause a rise in the drive voltage of the obtained device. In addition, the degree of such mixing differs among the devices obtained, and the performance may be not uniform among the devices obtained.

On the other hand, the film formed using the conjugated polymer of the present invention has a high insolubilization ratio and is free from the above-described fears, and functional separation from the light emitting light can be sufficiently maintained. Therefore, the device obtained is drivable at a low voltage and has high luminous efficiency and long drive life.

While the invention has been described in detail and with reference to specific embodiments thereof, it will be apparent to one skilled in the art that various changes and modifications can be made therein without departing from the spirit and scope thereof.

This application is based on Japanese Patent Application (Japanese Patent Application No. 2008-034170) filed on Feb. 15, 2008 and Japanese Patent Application (Japanese Patent Application No. 2008-119941) filed on May 1, 2008, the contents of which are incorporated herein by way of reference.

Industrial Applicability

The conjugated polymer of the present invention has high hole transportability and sufficient solubility for solvent and ensures enhanced surface flatness at the deposition. In turn, the organic electroluminescence element having a layer containing an insolubilized polymer obtained by insolubilizing the conjugated polymer of the present invention is drivable at a low voltage and endowed with high luminous efficiency, high heat resistance and long drive life. Accordingly, the organic electroluminescence element having a layer containing an insolubilized polymer obtained by insolubilizing the conjugated polymer of the present invention is considered to allow application to a flat panel display (for example, a display for OA computers or a wall-hanging television), a light source utilizing the property as a surface light emitter (for example, a light source of copiers or a backlight source of liquid crystal displays or meters/gauges), a display board and marker light, and its technical value is high. In addition, the conjugated polymer of the present invention intrinsically has excellent solubility for solvent and electrochemical durability and therefore, can be effectively used not only for organic electroluminescence elements but also for electrophotographic photoreceptors, photoelectric conversion devices, organic solar cells, organic rectifying devices and the like. Furthermore, the polymer production process of the present invention can produce a polymer having stable performances and a narrow molecular weight distribution.

The invention claimed is:

1. A conjugated polymer comprising a repeating unit represented by formula (I), wherein said conjugated polymer comprises an insolubilizing group as a substituent, and has a weight average molecular weight (Mw) of 20,000 or more and a dispersity, Mw/Mn, where Mn indicates a number average molecular weight, of 2.40 or less:

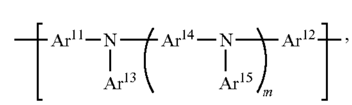

(I)

wherein:

m represents an integer of 0 to 3;

each of $Ar^{11}$ and $Ar^{12}$ independently represents a direct bond, an aromatic hydrocarbon group which may have a substituent, or an aromatic heterocyclic group which may have a substituent; and each of $Ar^{13}$ to $Ar^{15}$ independently represents an aromatic hydrocarbon group which may have a substituent, or an aromatic heterocyclic group which may have a substituent, provided that both $Ar^{11}$ and $Ar^{12}$ do not represent a direct bond, and said conjugated polymer has, as a substituent, a group comprising at least one insolubilizing group in one molecule, wherein said insolubilizing group is a crosslinking group represented by formula (II):

(II)

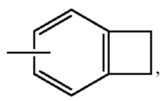

wherein the benzocyclobutene ring may have at least one substituent, and substituents may combine with each other to form a ring.

2. An insolubilized polymer obtained by insolubilizing the conjugated polymer claimed in claim 1.

3. An organic electroluminescence element comprising a substrate comprising thereon an anode, a cathode, and at least one organic layer between said anode and said cathode, wherein at least one layer of said at least one organic layer comprises the insolubilized polymer claimed in claim 2.

4. The organic electroluminescence element as claimed in claim 3, wherein said at least one organic layer comprising the insolubilized polymer is a hole injection layer or a hole transport layer.

5. The organic electroluminescence element as claimed in claim 3, wherein when the organic electroluminescence element comprises, as organic layers, a hole injection layer, a hole transport layer, and a light emitting layer, all of the hole injection layer, the hole transport layer, and the light emitting layer, are formed by a wet film formation method.

6. An organic EL display comprising the organic electroluminescence element claimed in claim 3.

7. An organic EL lighting comprising the organic electroluminescence element claimed in claim 3.

8. An organic electroluminescence element material comprising the conjugated polymer claimed in claim 1.

9. A composition for organic electroluminescence element, comprising the conjugated polymer claimed in claim 1.

10. The composition for organic electroluminescence element as claimed in claim 9, which further comprises an electron-accepting compound.

11. A conjugated polymer comprising a repeating unit represented by formula (I'), wherein said conjugated polymer has, as a substituent, a group comprising a group represented by formula (II), and has a weight average molecular weight (Mw) of 20,000 or more and a dispersity, Mw/Mn, where Mn indicates a number average molecular weight, of 2.40 or less:

(I')

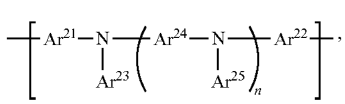

wherein:

n represents an integer of 0 to 3;

each of $Ar^{21}$ and $Ar^{22}$ independently represents a direct bond, an aromatic hydrocarbon group which may have a substituent, or an aromatic heterocyclic group which may have a substituent; and each of $Ar^{23}$ to $Ar^{25}$ independently represents an aromatic hydrocarbon group which may have a substituent, or an aromatic heterocyclic group which may have a substituent, provided that both $Ar^{21}$ and $Ar^{22}$ do not represent a direct bond, and said conjugated polymer has, as a substituent, a group comprising at least one group represented by formula (II) in one molecule:

(II)

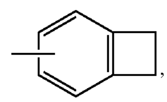

wherein the benzocyclobutene ring may have at least one substituent, and substituents may combine with each other to form a ring.

12. An insolubilized polymer obtained by insolubilizing the conjugated polymer claimed in claim 11.

13. An organic electroluminescence element comprising a substrate comprising thereon an anode, a cathode, and at least one organic layer between said anode and said cathode, wherein at least one layer of said at least one organic layer comprises the insolubilized polymer claimed in claim 12.

14. The organic electroluminescence element as claimed in claim 13, wherein said at least one organic layer comprising the insolubilized polymer is a hole injection layer or a hole transport layer.

15. The organic electroluminescence element as claimed in claim 13, wherein when the organic electroluminescence element comprises, as organic layers, a hole injection layer, a hole transport layer, and a light emitting layer, all of the hole injection layer, the hole transport layer, and the light emitting layer, are formed by a wet film formation method.

16. An organic EL display comprising the organic electroluminescence element claimed in claim 13.

17. An organic EL lighting comprising the organic electroluminescence element claimed in claim 13.

18. An organic electroluminescence element material comprising the conjugated polymer claimed in claim 11.

19. A composition for organic electroluminescence element, comprising the conjugated polymer claimed in claim 11.

20. The composition for organic electroluminescence element as claimed in claim 19, which further comprises an electron-accepting compound.

21. A conjugated polymer comprising:

at least one repeating unit selected from the group consisting of repeating unit family (A),

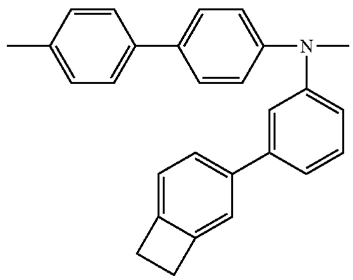
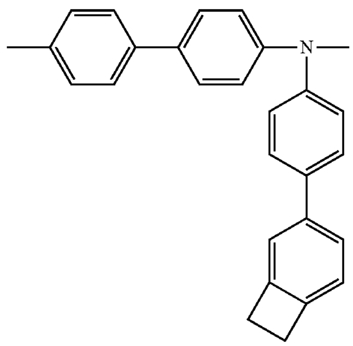
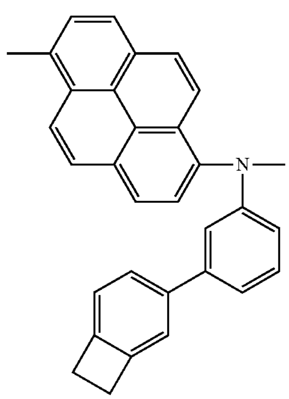
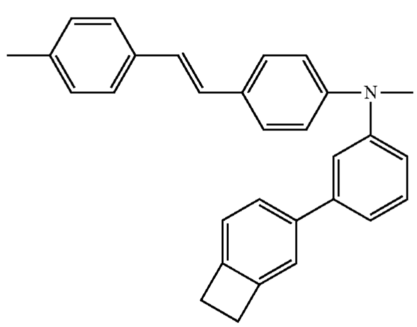
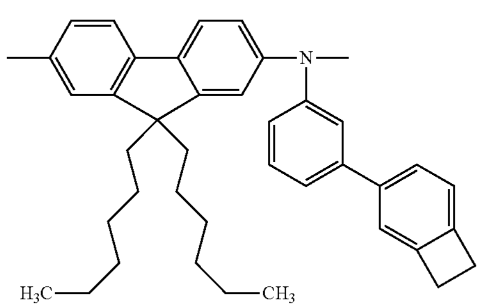
-continued
(A)
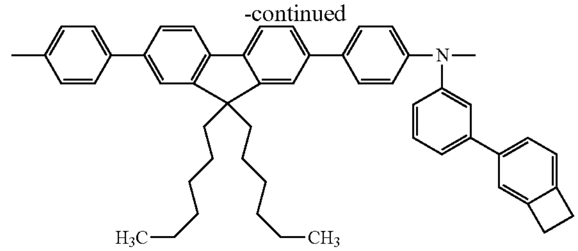
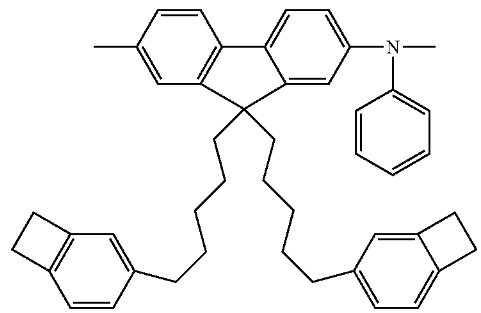
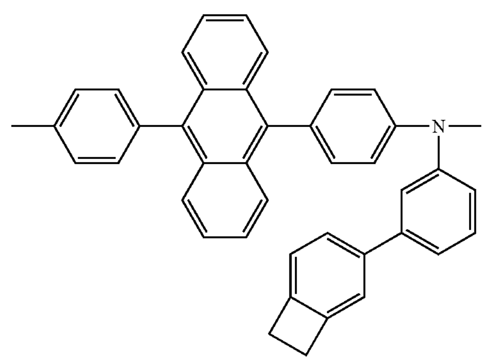
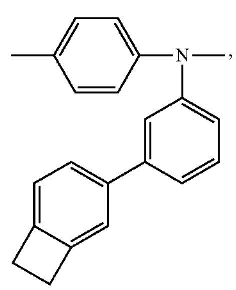
and
at least one repeating unit selected from the group consisting of repeating unit family (B),
(B)
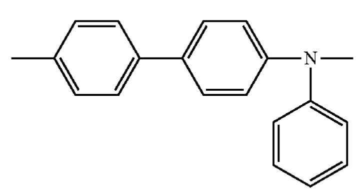

-continued
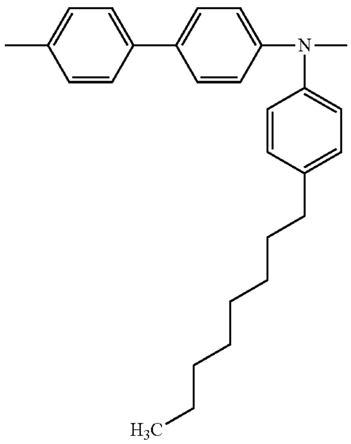
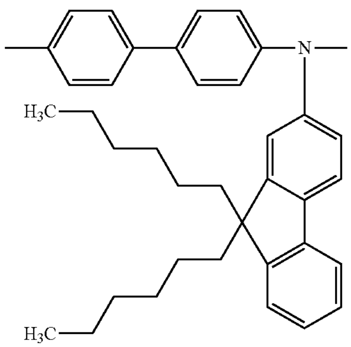
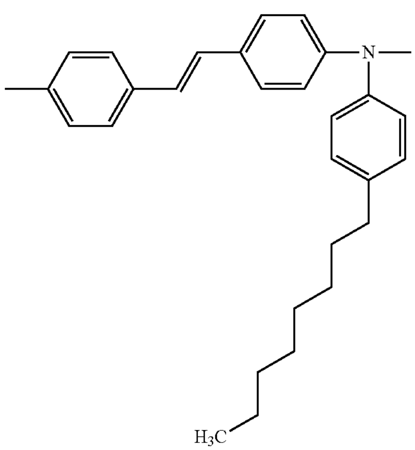
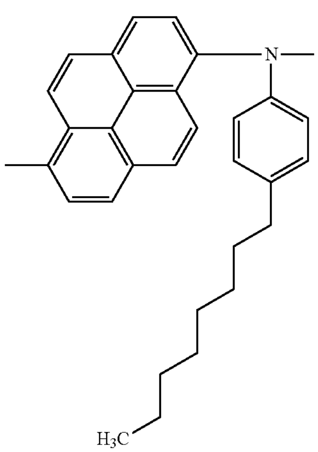
-continued
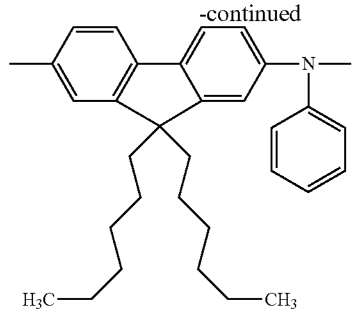
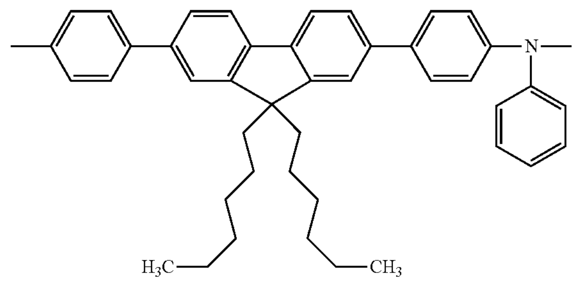
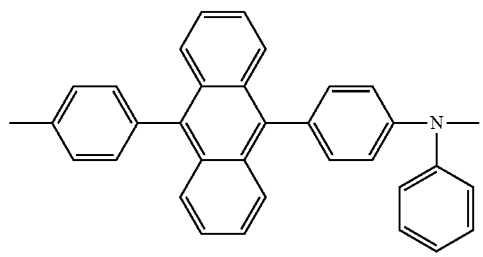
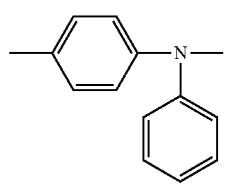
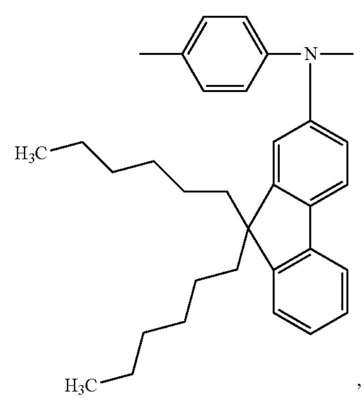 [SMILES: CCCCCCC1(CCCCCC)c2ccccc2-c2ccc(N(C)c3ccc(C)cc3)cc21 ; ","]
,
wherein said conjugated polymer has a weight average molecular weight (Mw) of 20,000 or more and a dispersity, Mw/Mn, where Mn indicates a number average molecular weight, of 2.40 or less.
* * * * *

UNITED STATES PATENT AND TRADEMARK OFFICE
CERTIFICATE OF CORRECTION

PATENT NO. : 8,653,508 B2
APPLICATION NO. : 12/867834
DATED : February 18, 2014
INVENTOR(S) : Endo et al.

It is certified that error appears in the above-identified patent and that said Letters Patent is hereby corrected as shown below:

In the specification

Column 176, line 1,

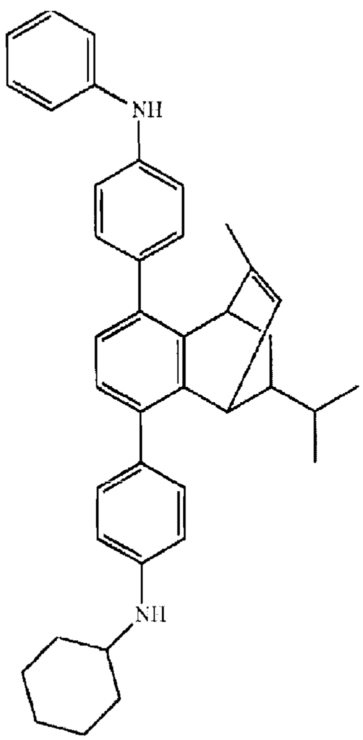

Eq. A5

Target 73 should read

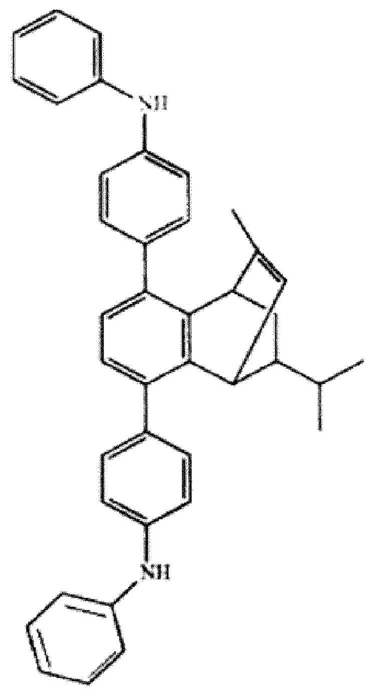

Eq. A5

Target 73

Signed and Sealed this
Tenth Day of May, 2016

Michelle K. Lee
*Director of the United States Patent and Trademark Office*